(12) United States Patent
Nakamura et al.

(10) Patent No.: US 7,518,458 B2
(45) Date of Patent: Apr. 14, 2009

(54) OSCILLATOR AND DATA PROCESSING EQUIPMENT USING THE SAME AND VOLTAGE CONTROL OSCILLATOR AND DATA PROCESSING EQUIPMENT USING VOLTAGE CONTROL OSCILLATOR

(75) Inventors: Takahiro Nakamura, Kokubunji (JP); Toru Masuda, Kokubunji (JP); Tomomitsu Kitamura, Takasaki (JP); Norio Hayashi, Tamamura (JP); Hiroshi Mori, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 100 days.

(21) Appl. No.: 11/594,102

(22) Filed: Nov. 8, 2006

(65) Prior Publication Data

US 2007/0103248 A1  May 10, 2007

(30) Foreign Application Priority Data

Nov. 9, 2005 (JP) ............................. 2005-324515
Mar. 3, 2006 (JP) ............................. 2006-057500
Oct. 6, 2006 (JP) ............................. 2006-275445

(51) Int. Cl.
*H03B 5/08* (2006.01)

(52) U.S. Cl. ................. 331/167; 331/36 C; 331/177 V; 455/77

(58) Field of Classification Search ............... 331/36 C, 331/117 R, 167, 177 V, 177 FE; 455/77
See application file for complete search history.

(56) References Cited

U.S. PATENT DOCUMENTS 5,900,788 A * 5/1999 Hagemeyer ............. 331/117 R 6,172,576 B1 * 1/2001 Endo et al. ............... 331/116 R
6,747,529 B2 * 6/2004 Abe et al. .................... 333/188
6,788,159 B2 * 9/2004 Takahashi et al. ........... 331/176

(Continued)

FOREIGN PATENT DOCUMENTS

JP   2004-015387   1/2004
JP   2006-060029   2/2006

OTHER PUBLICATIONS

Li, Zhenbiao et al; "A Low-Phase-Noise and Low-Power Multiband CMOS Voltage-Controlled Oscillator," IEEE Journal of Solid-State Circuits, vol. 40, No. 6, Jun. 2005. pp. 1296-1302.
Itoh, Nobuyuki et al: "Integrated LC-Tuned VCO in BICMOS Process,"; Toshiba Corporation; 4 pgs.
"2.4 Passive Components," CMOS Technology, pp. 58-67.

*Primary Examiner*—Robert Pascal
*Assistant Examiner*—Levi Gannon
(74) *Attorney, Agent, or Firm*—Antonelli, Terry, Stout & Kraus, LLP.

(57) ABSTRACT

An LC resonant circuit of an oscillator includes a parallel circuit of an inductor, a first fine adjustable capacitor and a first capacitor bank, and a series circuit of a second fine adjustable capacitor and a second capacitor bank. A frequency conversion gain of the oscillator is the sum of a frequency conversion gain of the oscillator based upon the first fine adjustable capacitor which decreases according to increase of a capacitance value of the capacitor bank and a frequency conversion gain based upon the second fine adjustable capacitor which increases according to increase of a capacitance value of the second capacitor bank. Accordingly, an LC resonant circuit for an oscillator with reduced fluctuation of a frequency conversion gain, and an oscillator and a data processing equipment using the same are provided.

18 Claims, 83 Drawing Sheets

U.S. PATENT DOCUMENTS 6,968,168 B1 * 11/2005 Collier et al. ............... 455/264
7,154,349 B2 * 12/2006 Cabanillas .............. 331/117 R
7,221,920 B2 * 5/2007 Abe et al. ................... 455/255
2003/0227341 A1 12/2003 Sawada

* cited by examiner

OSCILLATOR AND DATA PROCESSING EQUIPMENT USING THE SAME AND VOLTAGE CONTROL OSCILLATOR AND DATA PROCESSING EQUIPMENT USING VOLTAGE CONTROL OSCILLATOR

CROSS-REFERENCE TO RELATED APPLICATION

The present application claims priority from Japanese Patent Application No. JP 2005-324515 filed on Nov. 9, 2005, Japanese Patent Application No. JP 2006-057500 filed on Mar. 3, 2006, and Japanese Patent Application No. JP 2006-275445 filed on Oct. 6, 2006, the contents of which are hereby incorporated by reference into this application.

TECHNICAL FIELD OF THE INVENTION

<Technical Field of First Technique>

The present invention relates to a resonant circuit, an oscillator using the same, and a data processing equipment using the same, and in particular to an LC resonant circuit using an resonant operation based upon an inductor and a capacitor, a voltage-controlled oscillator that is a oscillator using the LC resonant circuit, where an oscillation frequency is controlled by a voltage, and a data processing equipment that uses the voltage-controlled oscillator, such as a radio communication equipment, a data communication equipment, or a data storage device.

<Technical Field of Second Technique>

The present invention relates to a configuration of a voltage-controlled oscillator for obtaining low phase noise characteristic at a low current and in a wide band and a technique effectively applied to a data processing equipment using the voltage-controlled oscillator.

DESCRIPTION OF THE RELATED ART

BACKGROUND OF THE INVENTION

<Background Art of First Technique>

In a data processing equipment such as a radio communication equipment or a data storage device, an oscillator whose oscillation frequency is variable is an essential circuit. According to advance of the data processing equipment, an oscillator whose oscillation frequency reaches GHz or so is used recently. When an oscillator is configured using an LC resonant circuit composed of an inductor L and a capacitor C, since values of an inductance or a capacitance become small in such a high frequency, the LC resonant circuit together with a transistor can be easily integrated and formed on a semiconductor substrate. In this case, as the inductor, a narrow line formed in a rectangular shape, a circular shape, or a spiral shape is used, and as the capacitor, a p-n junction capacitor (a diode capacitor), a gate-source/drain capacitor of a MOS (metal oxide semiconductor) transistor (hereinafter, "MOS capacitor"), an MIM (metal insulator metal) capacitor formed between metal layers in a semiconductor device or the like is used. A structure and an operation of the MOS capacitor are disclosed in Sima Dimitrijev, "Understanding Semiconductor Devices," published by Oxford University Press, pp. 121-129, 2000 (Non-Patent Document 1), for example.

Varying of a frequency is performed by changing a control voltage applied to the diode capacitor or the MOS capacitor or performing switching among a plurality of MIM capacitors, or the like but an inductance is further changed in order to obtain a wide frequency variable range.

Japanese Patent Application Laid-Open No. 2004-15387 (Patent Document 1) discloses a voltage-controlled oscillator as a group of variable capacitance circuit. The voltage-controlled oscillator comprises a parallel circuit of a first variable capacitance circuit including a capacitor element whose capacitance value varies continuously according to a voltage value of a frequency control signal and a second variable capacitance circuit including a capacitor element whose capacitance value varies continuously according to a voltage value of a frequency control signal and being serially connected to a switch circuit. The voltage-controlled oscillator uses an LC resonant circuit that can adjust a variable capacitance by opening and closing the switch circuit controlled according to a capacitor selecting signal. According to Patent Document 1, since a relationship between a fixed capacitance component and a variable capacitance component can be adjusted, fluctuation of a frequency conversion gain (KV) at high and low oscillation frequency ranges of an oscillator can be suppressed.

<Background Art of Second Technique>

In a data processing equipment such as a radio communication equipment or a data storage device, for example, an oscillator whose oscillation frequency is variable is an essential circuit. According to advance of the data processing equipment, an oscillator whose oscillation frequency reaches GHz or so is used recently. When an oscillator is configured using an LC resonant circuit composed of an inductor L and a capacitor C, since values of an inductance or a capacitance become small in such a high frequency, the LC resonant circuit together with a transistor can be easily integrated and formed on a semiconductor substrate. In this case, as the inductor, a narrow line formed in a rectangular shape, a circular shape, or a spiral shape is used, and as the capacitor, a p-n junction capacitor (a diode capacitor), a gate-source/drain capacitor of a MOS (metal oxide semiconductor) transistor (hereinafter, "MOS capacitor"), an MIM (metal insulator metal) capacitor formed between metal layers in a semiconductor device or the like is used.

Varying of a frequency is performed by changing a control voltage applied to the diode capacitor or the MOS capacitor or performing switching among a plurality of MIM capacitors, or the like. In an RF-IC (radio frequency-integrated circuit) for a recent radio communication system, a multi-mode operation meeting two or more kinds of standards or a multi-band operation are required. Since different carrier frequencies are generally used in these standards, a wide frequency variable range is required for an oscillator supplying carriers. For example, an oscillator using a capacitance bank disclosed in Zhenbiao Li and Kenneth K. O, "A low-phase-noise and low-power multiband CMOS voltage-controlled oscillator, "IEEE Journal of Solid-State Circuits, Vol. 40(6), pp. 1296-1302, June, 2005 (Non-Patent Document 2), an oscillator where switching among inductances is performed using a switch that is disclosed in Non-Patent Document 2, or the like is used in order to realize a wide frequency variable range.

Further, not only the wide frequency variable range but also low phase noise characteristic for excellent EVM (error vector magnitude) characteristic or operation at low current due to demand for a low power operation for mobile communication are required for the oscillator used in the RF-IC for a radio communication system. In order to obtain low phase noise characteristic at low current, it is necessary to increase a gain of a negative conductance generating circuit in an oscillator composed of a resonant circuit and the negative conductance generating circuit. For example, a CMOS oscillator disclosed in Nobuyuki Itoh, Shin-ichiro Ishizuka, and Kazuhiro Katoh, "Integrated LC-tuned VCO in BiCMOS process, "Proceedings of the 27$^{th}$ European Solid-State Circuits Conference, 2001, pp. 329-332 (Non-Patent Document 3), a BiPMOS oscillator, or the like is used.

SUMMARY OF THE INVENTION

<Problem to be Solved by the Invention of First Technique>

An example of a conventional oscillator using an LC resonator and a problem therein will be explained with reference to the drawings.

FIG. 45 is a circuit diagram showing one example of an ordinary differential LC resonant voltage-controlled oscillator. The differential LC resonant voltage-controlled oscillator includes an LC resonant circuit 10 and a negative conductance generating circuit 1. The LC resonant circuit 10 has inductors L11 and L12, diode capacitors CV1 and CV2 whose capacitance values are variable and are fine adjustable capacitors that continuously change an oscillation frequency, a capacitor bank CM composed of MOS capacitors CM111 to CM11N and CM121 to CM12N and used as a trimming capacitor that changes an oscillation frequency in a stepwise fashion, and a parasitic capacitance (not shown) caused by interconnect and the like. In FIG. 45, a gate of the MOS capacitor is biased by a fixed bias voltage inputted into a terminal VB4, and source-drain is controlled by control voltages applied to terminals VTRM11 to VTRM1N.

An oscillation frequency $f_{osc}$ of such differential LC resonant voltage-controlled oscillator is determined according to a resonant frequency $f_{RES}$ of the LC resonant circuit and is expressed by the following equation (1) using inductance L based upon the inductors L11 and L12, a variable capacitance value $C_V$ based upon the diode capacitors CV1 and CV2, a capacitance value $C_M$ for trimming based upon the MOS capacitors CM111 to CM11N and CM121 to CM12N, and a capacitor value $C_P$ of the interconnect parasitic capacitance.

$$f_{OSC} = \frac{1}{2\pi\sqrt{L(C_V + C_M + C_P)}} \quad (1)$$

Control of the oscillation frequency $f_{osc}$ is performed by controlling the capacitance value $C_V$ of the variable capacitor CV by a control voltage $V_{CONT}$ applied to a frequency control terminal VCONT. The capacitor bank CM is a capacitor used for changing a frequency in a stepwise fashion, where each of the MOS capacitors CM111 to CM11N and CM121 to CM12N constituting the capacitor bank CM can take one of two values of a large capacitance value and a small capacitance value according to control voltages applied to the terminals VTRM11 to VTRM1N. By using N capacitors for trimming, the frequency setting can have $2^N$ states. Since the trimming capacitors CM111 to CM11N and CM121 to CM12N have large capacitance changing ratios, a frequency variable range that can not be achieved by only diodes having small capacitance changing ratio can be realized.

The trimming capacitor $C_M$ constituting the capacitor bank CM may be the MOS capacitor whose capacitance value is switched by controlling a thickness of depletion layer according to the gate-source/drain voltage of the gate-source/drain capacitance of the MOS transistor, as described above, and it may be a switching MIM capacitor where a capacitor such as a capacitor between metal layers in a semiconductor device is switched according to switching operation. The MOS capacitor is normally used in an accumulation state, and it can select one of two large and small capacitance values according to HIGH/LOW of the gate-source/drain voltage.

However, in a wide band VCO using the capacitor bank such as MOS capacitors, the frequency conversion gain (KV) that is a ratio of a frequency changing amount obtained by changing the fine adjustable capacitor to the control voltage $V_{CONT}$ fluctuates due to a capacitance value of the capacitor bank. Since the fluctuation of the KV causes fluctuation of a PLL loop gain, such a problem arises that PLL lock is unlocked. In order to compensate the fluctuation of the PLL loop gain due to fluctuation of KV, a technique for changing a gain in a charge pump circuit that is one of constituent elements for the PLL, but there is a limitation in large change of the gain in the charge pump circuit due to increase in a current consumption. Therefore, it is necessary to provide a technique for suppressing the fluctuation of the KV as much as possible.

This point is explained in detail below.

The KV of VCO in FIG. 45 is expressed utilizing a differential coefficient of the resonant frequency of the LC resonant circuit to $V_{CONT}$ and is expressed by the following equation (2).

$$K_V = \frac{df_{RES}}{dV_{CONT}} \qquad (2)$$
$$= \frac{1}{4\pi L^{1/2}} \cdot \frac{1}{(C_{TOTAL})^{3/2}} \cdot \frac{dC_{TOTAL}}{dV_{CONT}} +$$
$$\frac{1}{4\pi L^{3/2}} \cdot \frac{1}{(C_{TOTAL})^{1/2}} \cdot \frac{dL}{dV_{CONT}}$$

Here, $C_{TOTAL}$ is a total capacitance in the resonant circuit, and as $C_{TOTAL} = C_V + C_M + C_P$ and $dL/dV_{CONT} = 0$ in the oscillator shown in FIG. 45, the equation (2) is expressed by the following equation (3).

$$K_V = \frac{1}{4\pi\sqrt{L}} \cdot \frac{1}{(C_V + C_M + C_P)^{3/2}} \cdot \frac{dC_V}{dV} \qquad (3)$$

When $C_M$ is changed, since a denominator of the equation (3) varies, the KV fluctuates.

For example, in a frequency synthesizer used in RF-IC for WCDMA, a wide frequency range of 3.2 GHz to 4.3 GHz is required for response to a multi-band. At this time, a similar frequency range is also required in the oscillator, where it is necessary to change the maximum value of the capacitor value ($C_P+C_V+C_M$) of the capacitor in the LC resonant circuit 10 to at least twice the minimum value. Therefore, the maximum value of the denominator of the equation (2) becomes 2.7 times the minimum value, so that even if $dCV/dV_{CONT}$ is constant regardless of the $V_{CONT}$, the KV fluctuates in a range of 1~2.7. In fact, when a diode is used as a fine adjustable capacitor, since the KV fluctuates according the $V_{CONT}$, the KV fluctuates further largely.

Though the wide frequency variable range can be realized utilizing the configuration shown in FIG. 45 in this manner, such a problem arises that the KV fluctuates. That is, if an oscillator that can respond to a plurality of applications or a plurality of communication systems operating at an operation frequency of several GHz, cost of a semiconductor chip can be reduced. A wide frequency variable range is required for such an oscillator. By using a resonant circuit having a configuration such as the LC resonant circuit 10 shown in FIG. 45 including the capacitor bank and the fine adjustable capacitor in the oscillator, a wide frequency variable range can be achieved. However, since the KV depends on the capacitance value of the capacitor bank, KV fluctuates according to change of the capacitance value of the capacitor bank. Therefore, such a problem arises in the conventional oscillator shown in FIG. 45 that the changing rate KV of the oscillation frequency to the $V_{CONT}$ lowers according to increase of the capacitance value of the capacitor bank.

The cause lies in that a ratio the fine adjustable capacitance $C_V$ accounts for of the total capacitance $C_{TOTAL}$ lowers according to increase of the capacitance value $C_M$ of the capacitor bank so that the changing rate of the total capacitance to the control voltage $V_{CONT}$ decreases.

FIG. 46 shows control characteristic of the oscillation frequency $f_{OSC}$ when the number of trimming capacitors constituting the capacitor bank is 2 (N=2) in such an LC resonant type voltage-controlled oscillator. In a variable range (V1-V2) of the control voltage $V_{CONT}$, a frequency variable range $\Delta Fc$ can be realized by the maximum capacitor value $C_{Mmax}$ and the minimum capacitor value $C_{Mmini}$ of the trimming capacitors. As apparent from the characteristic diagram, when a required frequency variable range $\Delta Fc$ over a wide range is realized in the variable range of the control voltage $V_{CONT}$, a ratio of the minimum vale $C_{Mmini}$ and the maximum value $C_{Mmax}$ of the trimming capacitors becomes large.

On the other hand, FIG. 47 shows one example of a relationship between the control voltage $V_{CONT}$ and the frequency conversion gain (KV). In the variable range (V1-V2) of the control voltage $V_{CONT}$, the frequency conversion gain (KV) fluctuates by $\Delta KVc$ to the maximum capacitance value $C_{Mmax}$ and the minimum capacitance value $C_{Mmini}$. As apparent from the characteristic diagram, the fluctuation of the frequency conversion gain (KV) becomes large according to increase of the ratio of the minimum value $C_{M1}$ and the maximum value $C_{M2}$ of the trimming capacitors.

FIG. 48 shows a relationship between a ratio of the total capacitance value of the LC resonant type voltage-controlled oscillator (LC-VCO) and the total capacitance (=the capacitances of the capacitor bank+the fine adjustable capacitor) of the resonant circuit in the oscillator shown in FIG. 45. In a band widening using the capacitor bank, since the total capacitance value of the capacitor bank varies according to a selected band, the ratio of the total capacitance value to the total capacitance value of fine adjustable capacitors changes. Therefore, the changing rate due to the capacitance value change of the capacitance value of the fine adjustable capacitor also changes according to the selected band. FIG. 48 shows comparison between the capacitance values at the maximum frequency and the minimum frequency. For example, it is assumed that the capacitance value of the fine adjustable capacitor accounts for 10% of the total capacitance $C_{TOTAL}$ at the time of the minimum frequency and the changing rate is 10%/V. At this time, the capacitance value changing rate at the minimum frequency becomes 1%/V. On the other hand, since capacitance value of the capacitor bank becomes the minimum at the maximum frequency, when it is assumed that the capacitance value of the capacitor bank becomes 33% of the capacitance value at the time of the maximum frequency, the ratio of the capacitance value of the fine adjustable capacitor to the total capacitance value becomes 25% and the capacitance value changing rate becomes 2.5%/V.

Therefore, the higher frequency, the more KV increase and the PLL loop gain fluctuation in the oscillator shown in FIG. 45. As a result, such a problem occurs that the PLL is unlocked.

Next, in the oscillator shown in Patent Literature 1, a variable capacitor circuit group is composed of a parallel circuit of a first variable capacitor circuit and a second variable capacitor circuit, where the second variable capacitor circuit is configured by serially connecting a switch circuit to each of a plurality of capacitor elements for fine frequency adjustment, for example, MOS capacitors. In the oscillator, the fine adjustment capacitance is adjusted to suppress KV fluctuation by selecting one of the plurality of MOS capacitors through the switch circuit. However, since the MOS transistor is used for adjustment of the fine adjustable capacitor, a channel resistance between the source and the drain of the MOS transistor is added to the MOS capacitance in series. Therefore, since power loss due to the channel resistance becomes large, that is, a quality factor (Q) of the resonant circuit lowers, and phase noise in the oscillator deteriorates.

An object of the present invention is to provide an LC resonant circuit that can realize an oscillator where fluctuation of the frequency conversion gain (KV) is reduced and deterioration of phase noise is reduced, and an oscillator or a data processing equipment using the LC resonant circuit.

<Problem to be Solved by the Invention of Second Technique>

In an oscillator whose oscillation frequency reaches GHz or so, it is possible to integrate an inductor and a capacitor together with a transistor on a semiconductor substrate, but it is difficult to improve a quality factor or change a resonance frequency to a wide band and it is also difficult to achieve low phase noise and wider band. The problem to be solved by the present invention is explained referring to an oscillator using an LC resonator.

FIG. 80 is a circuit diagram showing one example of a conventional differential LC resonant type voltage-controlled oscillator with wide band using a capacitor bank. A resonant circuit 20 is a parallel circuit including inductors L1 and L2, capacitor banks CB1 and CB2, and capacitors for oscillation frequency fine adjustment CV1 and CV2. A first voltage is applied to a junction point of the inductors L1 and L2. In FIG. 80, a negative conductance generating circuit is composed of NMOS transistors NM1 and NM2. Generally, it is thought that use of a MOS transistor for formation of a negative conductance generating circuit 10 is superior in phase noise characteristic to use of a bipolar junction transistor (BJT). However, in a MOS transistor on an integrated circuit, since fluctuation of characteristic due to process variations is large and a trans-conductance (gm) lowers at high temperature, flow of large bias current is required for improving yield. Therefore, such a problem arises that a low current operation becomes difficult.

In order to realize a low current operation using the MOS transistor, a circuit configuration of an oscillator such as shown in FIG. 81 is proposed. In FIG. 81, both an NMOS transistor and a PMOS transistor are used in the negative conductance generating circuit 10, and a resonant circuit 20 has the same configuration as that of shown in FIG. 80, but a contact point between the inductors L1 and L2 is opened. Since the PMOS transistor is simultaneously used in the configuration, a negative conductance can be improved as compared with the configuration shown in FIG. 80 using only the NMOS transistor and impedance of the resonant circuit 20 can be further made twice due to current flow of an alternating current through a path indicated by arrow i1, so that an oscillation amplitude can be increased and a low current operation is enabled. A method or means for realizing a low current operation utilizing a negative conductance generating circuit using a BJT whose characteristic fluctuation is smaller than that of the MOS transistor and whose gm is larger than that of the MOS transistor is considered in order to enable an operation at a low current.

FIG. 82 and FIG. 83 are circuit diagrams of conventional differential LC resonant type voltage-controlled oscillators using a BJT. FIG. 82 shows a case that only a BTJ is used in a negative conductance generating circuit 10, and FIG. 83 shows a case that a PMOS transistor and a BJT are used therein. According to the configurations, an operation can be performed at a current lower than that in the configuration using the MOS transistor. By using the configuration shown in FIG. 83, the oscillation amplitude can be made larger than that in the configuration shown in FIG. 82, and an operation can be made possible at a further lower current like the case of the configuration shown in FIG. 81. Examples of bias current dependencies of phase noise characteristics in the wide band oscillators shown in FIG. 82 and FIG. 83 are respectively shown in FIG. 84 and FIG. 85. A plurality of characteristic curves are shown and they correspond to different oscillation frequencies. In both the wide band oscillators using the circuit configuration shown in FIG. 82 and FIG. 83, a bias current where the phase noise characteristic minimized goes lower as the frequency goes higher. In the wide band oscillator shown in FIG. 82, low phase noise characteristic can be obtained with low current for high frequency, but large consumption current is required for low frequency. On the other hand, in the oscillator shown in FIG. 83, low phase noise characteristic can be obtained with low current even for low frequency but phase noise characteristic deteriorates for high frequency, which is different from the wide band oscillator shown in FIG. 82. That is, in the conventional art, there is such a problem that none of wider band and low phase noise with low current over all bands can be realized.

The cause of the problem described above will be analyzed. There are many factors for determining phase noise characteristic in an oscillator using a BJT, where, especially, important factors thereof are a noise index of the BJT and an oscillation amplitude except for the quality factor of the resonant circuit. When the noise index of the BJT increases, noise generated at the BJT increases so that phase noise deteriorates. When the oscillation amplitude increases, since an S/N ratio increases, phase noise is improved but when the oscillation amplitude is increased excessively the phase noise deteriorates due to noise of bias current. It has been generally thought to be optimal that the oscillation amplitude is about a base-emitter voltage VBE (about 900 mV in case of Si). In order to minimize the noise index of the BJT, it is necessary to optimize a bias current flowing in the BJT. FIG. 86 is a graph showing one example of a collector current density dependency of a noise index at a BJT emitter-grounded. Since the noise index of the BJT becomes minimum at a certain collector current density, it is necessary to set the bias current of the oscillator to a current value where the noise index becomes minimum.

Next, in order to optimize the oscillation amplitude, the resonant circuit may be set so as to achieve an optimal oscillation amplitude in view of the above-described optimal bias current. The approach can be applied to a narrow band oscillator, but it is difficult to optimize impedance of the resonant circuit over the whole band in a wide band oscillator. The impedance ZRES of the resonant circuit is a product of an oscillation frequency f, an inductance L, and a quality factor Q ($2\pi fLQ$) of the resonant circuit. That is, when the oscillation frequency f fluctuates, the impedance ZRES varies in proportion to the frequency. Moreover, the quality factor Q of the resonant circuit is not constant over the whole band, but it increases according to rising of the frequency. Therefore, fluctuation of the impedance becomes further large. Accordingly, when the current is set near an optimal current, the oscillation amplitude increases according to the oscillation frequency. The phenomenon appears significantly according to expansion of the band, so that it is difficult to realize low phase noise characteristic over the whole band in a wide band oscillator. That is, when a wide band oscillator including a BJT is manufactured for low current operation, such a problem arises that it is difficult to achieve low phase noise characteristic and it is difficult to realize three characteristics of low current, wide band, and low phase noise characteristic simultaneously.

In view of these circumstances, an object of the present invention is to provide a voltage-controlled oscillator that can realize wide band and low phase noise characteristic at a low current using an LC resonant circuit and a data processing equipment using the same.

The above and other objects and novel characteristics of the present invention will be apparent from the description of this specification and the accompanying drawings.

<Means for Solving the Problem of First Technique>

One exemplary invention of representative ones of the present inventions is described below.

That is, an oscillator of the present invention comprises: first and second power source voltage terminals of parallel capacitors; first and second power source voltage terminals of series capacitor; an inductor connected between the first power source voltage terminal of parallel capacitance and the second power source terminal of parallel capacitor; a parallel capacitor composed of a first capacitor bank and a first fine adjustable capacitor where the first capacitor bank includes variable capacitors which are connected in parallel and whose capacitor values vary from small to large according to a first control signal group and the first fine adjustable capacitor whose capacitance value varies according to a second control signal, and the first capacitor bank and the first fine adjustable capacitor are connected to each other in parallel between the first power source voltage terminal of parallel capacitor and the second power source voltage terminal of parallel capacitor; and a series capacitor composed of a second capacitor bank and a second fine adjustable capacitor where the second capacitor bank includes variable capacitors which are connected in parallel and whose capacitance values vary from small to large according to a third control signal group and the second fine adjustable capacitor whose capacitance value varies according to the second control signal, and the second capacitor bank and the second fine adjustable capacitor are connected to each other in series between the first power source voltage terminal of series capacitor and the second power source voltage terminal of series capacitor. An oscillator according to the present invention comprises the above-described resonant circuit.

A data processing equipment of the present invention comprises: an oscillator; a low noise amplifier that amplifies a reception signal received by an antenna; a modulator that modulates a baseband signal to be transmitted to output two signals orthogonal to each other; an orthogonal modulator that outputs a orthogonal modulation signal of the two signals orthogonal to each other outputted from the modulator using a local oscillation signal outputted from the oscillator; a power amplifier that amplifies the orthogonal modulation signal; and a switch that supplies the reception signal from the antenna to the low noise amplifier at a time of signal reception and supplies the orthogonal modulation signal outputted from the power amplifier to the antenna at a time of signal transmission, wherein the oscillator has the above-described feature.

<Means for Solving the Problem of Second Technique>

The typical ones of the invention disclosed in this application will be briefly described as follows.

A voltage-controlled oscillator of the present invention for achieving the above object comprises: a gain generating circuit that generates a gain required for oscillation; and a resonant circuit that can change a resonant frequency according to a first frequency control signal group, wherein the gain generating circuit comprises a negative conductance generating circuit that generates negative conductance that is a negative current gain to an alternating voltage, and K (K is a positive integer) terminals for controlling negative conductance to be produced according to a negative conductance control signal group. The voltage-controlled oscillator of the present invention can control the negative conductance according to the oscillation frequency to obtain low phase noise at a low current in a wide band.

In order to achieve the above object, a voltage-controlled oscillator of the present invention comprises: a gain generating circuit that generates a gain required for oscillation; a resonant circuit that can change a resonant frequency according to a fourth frequency control signal group; and an impedance control circuit includes an impedance control terminal group and an output terminal thereof is connected to the resonant circuit, wherein impedance of the resonant circuit is controlled by an impedance control signal group inputted into the impedance control terminal group. The voltage-controlled oscillator of the present invention can control effective impedance of the resonant circuit according to an oscillation frequency to obtain low phase noise at a low current in a wide band.

In order to achieve the above object, a data processing equipment of the present invention comprises: a low noise amplifier that amplifies a reception signal received by an antenna; a mixer that coverts a frequency of an output signal from the low noise amplifier; an oscillator that generates a local oscillation signal for frequency conversion to output the same to the mixer; a demodulating circuit that takes a baseband signal of reception out of an output signal from the mixer; a modulating circuit that modulates the baseband signal to be transmitted to output two signals orthogonal to each other; an orthogonal modulator outputs an orthogonal modulation signal of the two orthogonal signals outputted from the oscillator using a local oscillation signal; a power amplifier that amplifies the orthogonal modulation signal; and a switch that supplies the received signal from the antenna to the low noise amplifier at a time of signal reception and supplies the orthogonal modulation signal outputted from the power amplifier to the antenna at a time of signal transmission, wherein the oscillator is the above-described voltage-controlled oscillator of the present invention. The data processing equipment of the present invention can accommodate a plurality of communication systems or applications, when an oscillator that has a wide frequency variable range and operates at a lower current and where phase noise is low is used.

<Effect of the Invention of First Technique>

According to the present invention, an oscillator where fluctuation of a frequency conversion gain to a capacitance value of a capacitor bank is reduced and a variable range of a frequency is wide can be provided.

<Effect of the Invention of Second Technique>

Effects obtained by typical aspects of the present invention is disclosed in this application will be briefly described as follows.

According to the present invention, a voltage-controlled oscillator that can realize wide band and low phase noise characteristics at a low current by controlling negative conductance according to an oscillation frequency or controlling effective impedance of a resonant circuit according to an oscillation frequency, and a data processing equipment using the same can be provided.

BRIEF DESCRIPTIONS OF THE DRAWINGS

DESCRIPTIONS OF THE PREFERRED EMBODIMENTS

<Preferred Embodiments of the First Technique>

Figure 1:
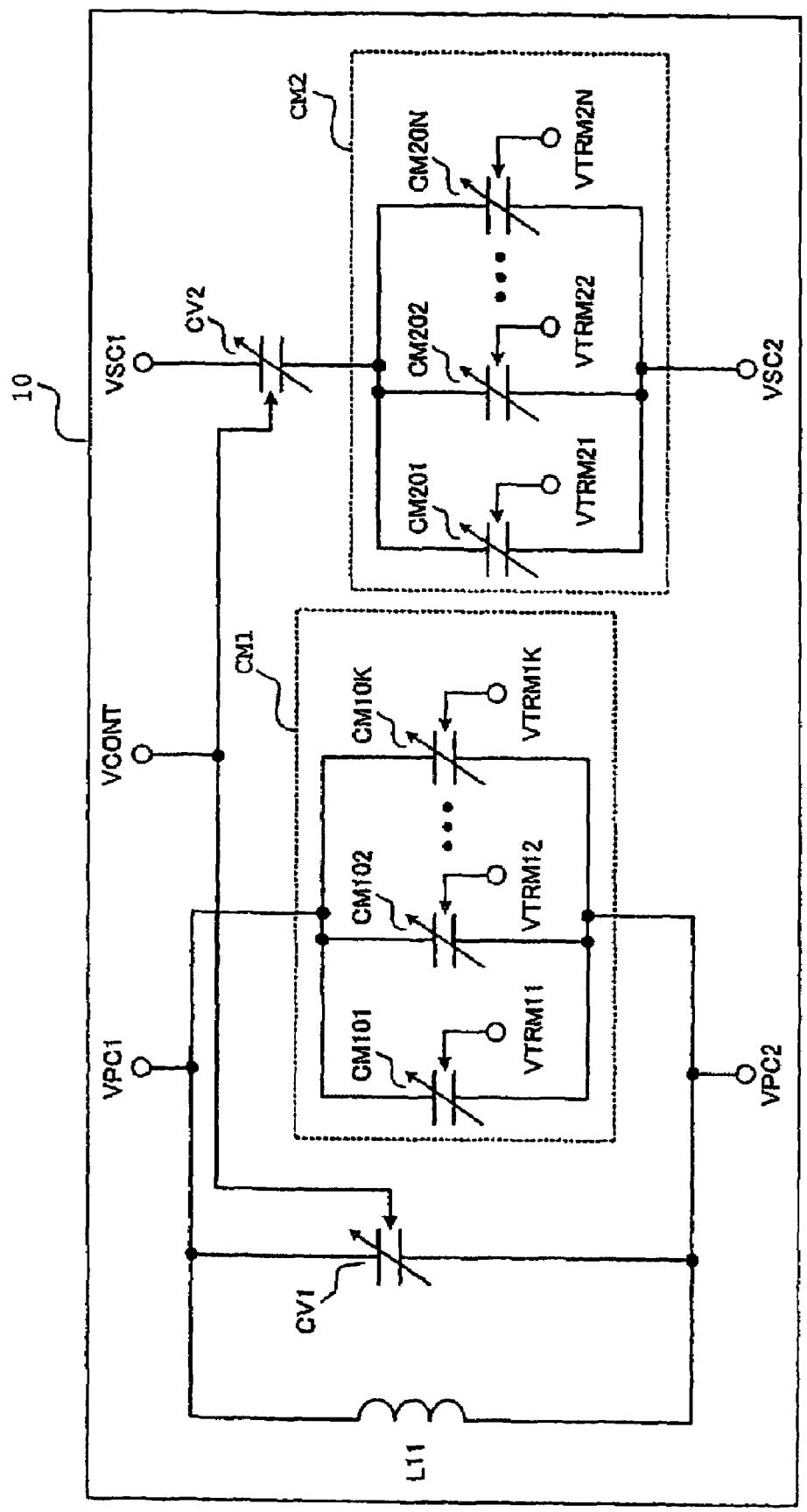
FIG. 1 is a circuit configuration diagram for describing an LC resonant circuit according to a first embodiment of the present invention.

An LC resonant circuit, and an oscillator using the same and a data processing equipment using the same according to the present invention will be further explained in detail below with reference to some embodiments shown in the drawings. Same reference numerals in FIG. 1 to FIG. 44 denote same or similar parts or portions.

First Embodiment

An LC resonant circuit according to a first embodiment will be first explained with reference to FIG. 1, and FIGS. 2A, 2B, and 2C. As shown in FIG. 1, the LC resonant circuit according to the first embodiment includes an inductor L11, a first fine adjustable capacitor CV1 and a second fine adjustable capacitor CV2 for finely adjusting a resonant frequency continuously, a first capacitor bank CM1 composed of a plurality of parallel trimming capacitors, and a second capacitor bank CM2 composed of a plurality of parallel trimming capacitors. The inductor L11, the first fine adjustable capacitor CV1, and the first capacitor bank CM1 are connected in parallel with each other between a first power source voltage terminal of parallel capacitor VPC1 and a second power source voltage terminal of parallel capacitor VPC2, where the first fine adjustable capacitor CV1 and the first capacitor bank CM1 constitutes a parallel capacitor $C_{Pr}$ between the first power source voltage terminal of parallel capacitor VPC1 and the second power source voltage terminal of parallel capacitor VPC2. The first capacitor bank CM1 is composed of a parallel circuit of respective capacitors of a first trimming capacitor group CM101 to CM10K and a first frequency trimming terminal group, where respective capacitances of the respective trimming capacitors in the first trimming capacitor group vary from small to large, for example take two large and small capacitance values, according to first control signals (control voltages VTRM11 to VTRM1K) applied from the first frequency trimming terminal group. The first fine adjustable capacitor CV1 changes its capacitance value according to a second control signal (control voltage $V_{CONT}$) applied from a frequency control terminal VCONT.

In addition, the second capacitor bank CM2 and the second fine adjustable capacitor CV2 are serially connected to each other between a first power source voltage terminal of series capacitor VSC1 and a second power source voltage terminal of series capacitor VSC2, and the second capacitor bank and the second fine adjustable capacitor constitute a serial capacitor $C_{SR}$ between the first power source voltage terminal of series capacitor VSC1 and the second power source voltage terminal of series capacitor VSC2. The second capacitor bank CM2 is composed of a second group of trimming capacitors CM201 to CM20K which are connected in parallel and whose capacitance values vary from small to large, and a second group of frequency trimming terminals. Respective trimming capacitances in the second trimming capacitor group vary from small to large, for example take two large and small capacitance values, according to third control signals (control voltages VTRM21 to VTRM2K) applied from the second group of frequency trimming terminals. The second fine adjustable capacitor CV2 changes its capacitance value according to the second control signal (control voltage $V_{CONT}$) applied from the frequency control terminal VCONT.

The LC resonant circuit including the parallel capacitance $C_{Pr}$ of the first fine adjustable capacitor CV1 and the first capacitor bank CM1 and the series capacitance $C_{SR}$ of the second fine capacitor CV2 and the second capacitor bank CM2 is used as a resonant circuit for the oscillator.

In the resonant circuit according to the first embodiment, in the parallel capacitance $C_{Pr}$, when the sum of the parallel capacitance and the series capacitance is represented as a total capacitance $C_{TOTAL}$, an occupation ratio the capacitance value $C_{V1}$ of the first fine adjustable capacitor accounts for of the parallel capacitance $C_{Pr}$ and, therefore, the total capacitance $C_{TOTAL}$ lowers in accordance with an increase of the capacitance value $C_{M1}$ of the first capacitor bank CM1. Therefore, the changing rate of the total capacitance to the second control signal decreases. On the other hand, in the series capacitance $C_{SR}$, an occupation ratio of the capacitance value $C_{V2}$ of the second fine adjustable capacitor accounts for the total capacitance $C_{TOTAL}$ which increases as the capacitance value $C_{M2}$ of the second capacitor bank increases. Therefore, the changing rate of the total capacitance in response to the second control signal increases.

That is, as described above, the occupation ratio of the first fine adjustment capacitance value $C_{V1}$ in the parallel capacitance $C_{Pr}$ lowers according to increase of the capacitance value $C_{M1}$ of CM1 composed of a plurality of parallel capacitors, so that the parallel capacitance of the CM1 and CV1 $C_{Pr}=C_{M1}+C_{V1}$ is approximated by the following equation.

$$C_{Pr}=C_{M1}+C_{V1}\approx C_{M1}$$

Here, $C_{M1}>>C_{V1}$ is assumed.

Therefore, the changing rate of the first fine adjustment capacitance value $C_{V1}$ to $V_{CONT}$ becomes small.

On the other hand, the series capacitance $C_{SR}$ constituted of CV2 and CM2 is expressed by the following equation (4)

$$C_{SR}=\frac{C_{V2}C_{M2}}{C_{V2}+C_{M2}} \quad (4)$$

The changing rate of the series capacitance $C_{SR}$ to $V_{CONT}$ is expressed by the following equation (5).

$$\frac{dC_{SR}}{dV_{CONT}}=\frac{C_{M2}^2}{C_{V2}+C_{M2}}\cdot\frac{dC_{V2}}{dV_{CONT}} \quad (5)$$

As apparent from Equation (4), the occupation ratio of the second fine adjustment capacitance value $C_{V2}$ in the total capacitance $C_{TOTAL}$ increases according to increase of the capacitance value $C_{M2}$ of the second capacitor bank so that the series capacitance $C_{SR}$ is approximated by $C_{SR}\approx C_{V2}$.

Here, $C_{M2}>>C_{V2}$ is assumed.

Therefore, the changing rate of the second fine adjustment capacitance value $C_{V2}$ to $V_{CONT}$ becomes large according to increase of CM2.

Accordingly, when the total capacitance is represented as $C_{TOTAL}$, the total capacitance is approximated such as $C_{TOTAL}=C_{SR}+C_{Pr}\approx C_{V2}+C_{M1}$ in case of $C_{M1}>>C_{V1}$ and $C_{M2}>>C_{V2}$, while it is approximated such as $C_{TOTAL}=C_{SR}+C_{Pr}\approx C_{M2}+C_{V1}$ in case of $C_{M1}<<C_{V1}$ and $C_{M2}<<C_{V2}$.

According to the first embodiment, regarding the capacitance of the LC resonant circuit, since the parallel circuit composed of the fine adjustable capacitor CV1 and the capacitor bank CM1 and the serial circuit composed of the fine adjustable capacitor CV2 and the capacitor bank CM2 are connected in parallel in this manner, KV depending on the fine adjustable capacitor CV1 decreases according to lowering of a frequency, as described above, while KV depending on the fine adjustable capacitor CV2 increases according to lowering of the frequency. This is because the capacitance value of the capacitor bank CM2 increases according to lowering of the frequency so that the series capacitance of the capacitor bank CM2 and the fine adjustable capacitor CV2 increases, which results in increase of the capacitance value changing rate of the series capacitance.

Figure 2A:
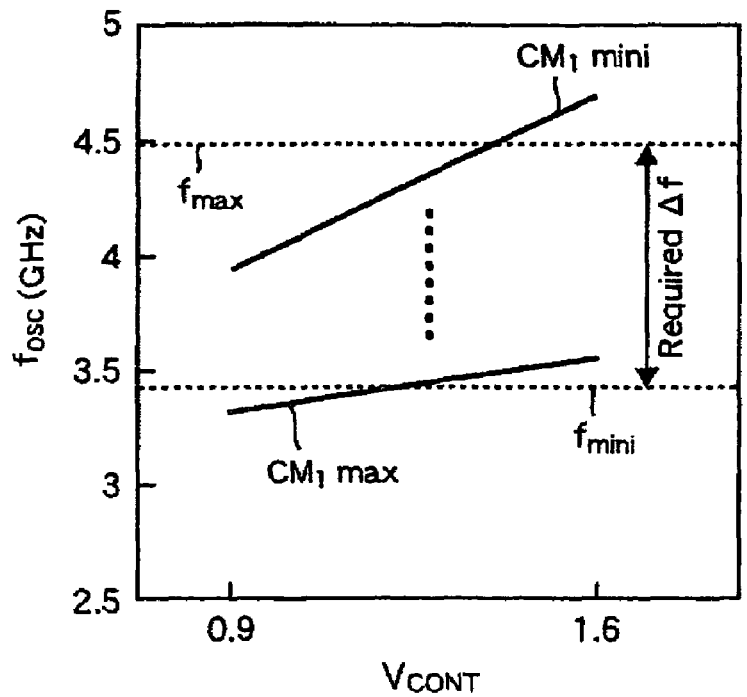
FIG. 2A is a graph showing a relationship between a control voltage $V_{CONT}$ and an oscillation frequency $f_{OSC}$ of an LC resonant circuit including a parallel capacitance of CV1 and CM1 in the first embodiment.
Figure 2B:
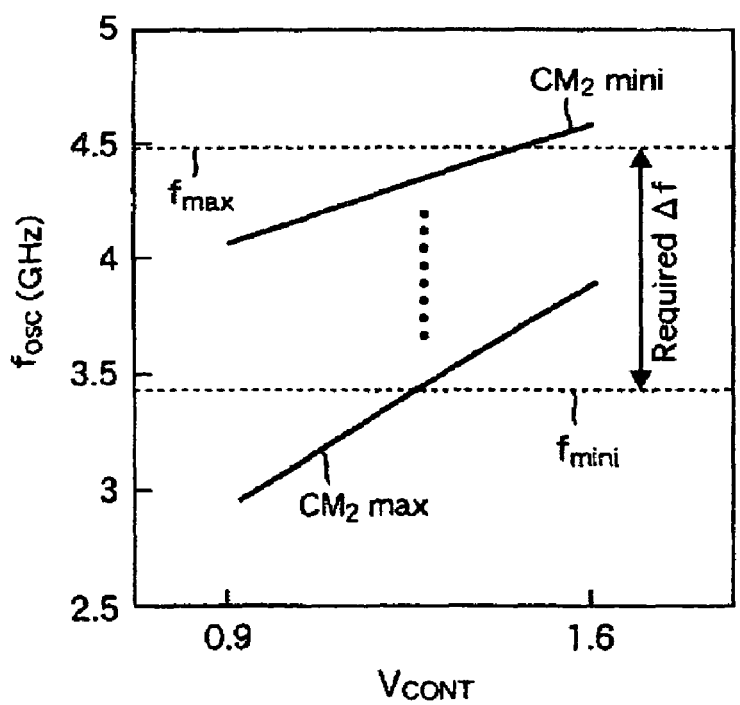
FIG. 2B is a graph showing a relationship between the control voltage $V_{CONT}$ and the oscillation frequency $f_{OSC}$ of the LC resonant circuit including a series capacitance of CV2 and CM2 in the first embodiment.
Figure 2C:
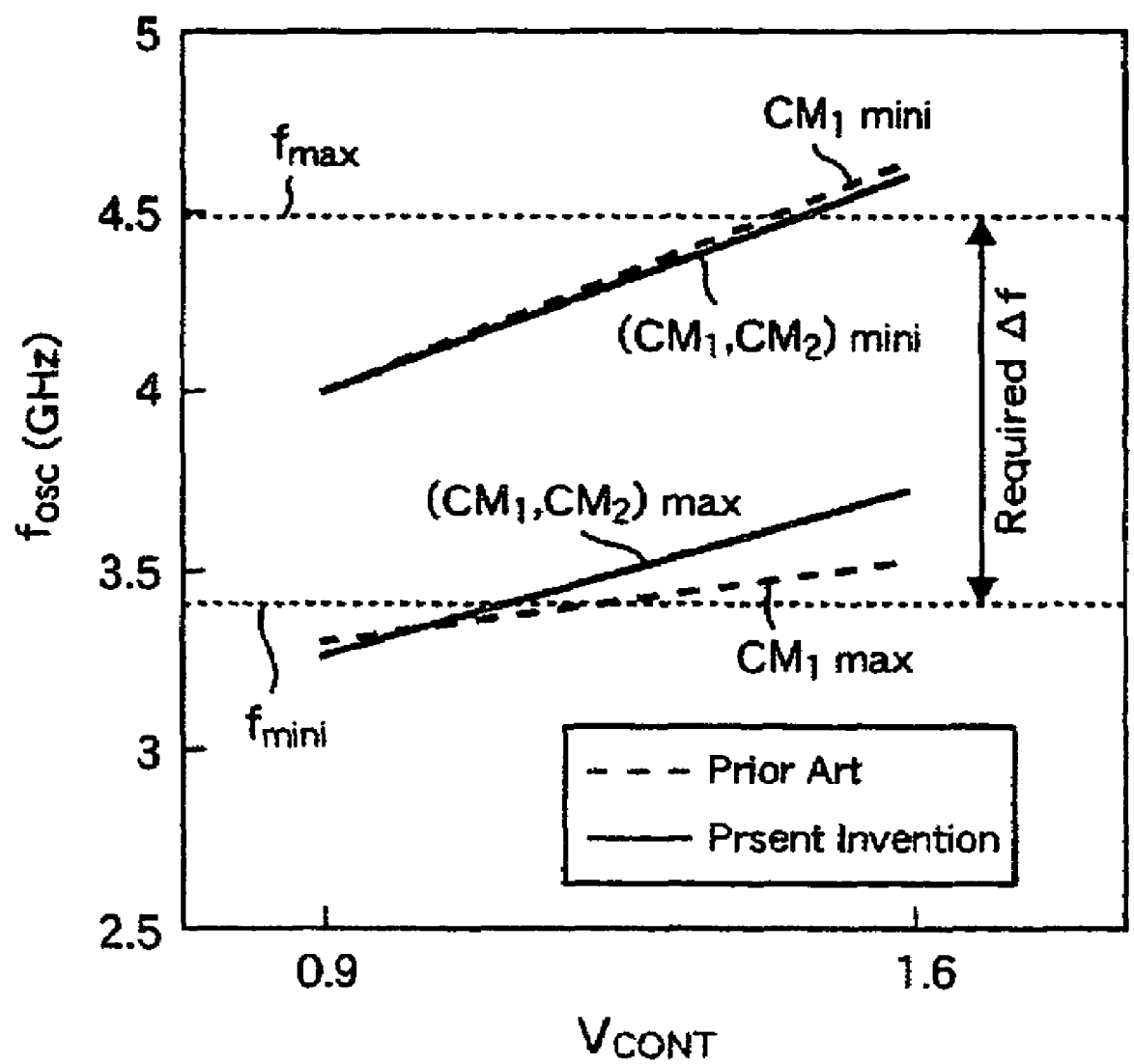
FIG. 2C is a graph showing a relationship between the control voltage $V_{CONT}$ and the oscillation frequency $f_{OSC}$ of the LC resonant circuit in the first embodiment.

A relationship between the control voltage $V_{CONT}$ and the oscillation frequency $f_{OSC}$ of the LC resonant circuit including such parallel capacitance and series capacitance is shown in FIG. 2A, FIG. 2B, and FIG. 2C.

FIG. 2A shows a relationship between the control voltage $V_{CONT}$ and the resonant frequency $f_{OSC}$ in the LC resonant circuit part including the parallel capacitance of CV1 and CM1 according to the first embodiment. FIG. 2B shows a relationship between the control voltage $V_{CONT}$ and the resonant frequency $f_{OSC}$ in the LC resonant circuit part including the series capacitance of CV2 and CM2 according to the first embodiment.

Regarding a fluctuation width of the oscillation frequency $f_{OSC}$ to increase of the control voltage $V_{CONT}$ at a time of minimum capacitance, the fluctuation width at a time of minimum parallel capacitance ($C_{M1}\text{-}_{mini}$) shown in FIG. 2A is larger than that at a time of minimum series capacitance ($C_{M2}\text{-}_{mini}$) shown in FIG. 2B. On the other hand, regarding a fluctuation width of the oscillation frequency $f_{OSC}$ to increase of the control voltage $V_{CONT}$ at a time of maximum capacitance, the fluctuation width at a time of maximum serial capacitance ($C_{M2}\text{-}_{max}$) shown in FIG. 2B is larger than that at a time of maximum parallel capacitance ($C_{M1}\text{-}_{max}$) shown in FIG. 2A.

Accordingly, by adopting the configuration of the first embodiment obtained by combining the parallel capacitor and the series capacitor, the capacitance value changing rates that decreases and increases according to lowering of the frequency are cancelled by each other, so that it becomes possible to cause the total capacitance value changing rate to approach to a constant value, as shown in FIG. 2C.

Therefore, regarding change of the total capacitance to the control voltage $V_{CONT}$, fluctuation of the fine adjustment capacitance $C_V$ can be suppressed more largely in the first embodiment shown by a solid line than in the conventional example system using only the parallel capacitance $C_{Pr}$ shown by a broken line.

By using the LC resonant circuit including the series capacitance $C_{SR}$ of CV2 and CM2 in addition to the parallel capacitance $C_{Pr}$ of CV1 and CM1 as a resonant circuit for an oscillator in this manner, fluctuation of KV can be suppressed or KV can be kept constant. As a result, when the oscillator is used in a charge pump type PLL circuit, it is possible to suppress increase of charge pump current and to reduce current consumption in the whole of PLL circuit.

Second Embodiment

Figure 3:
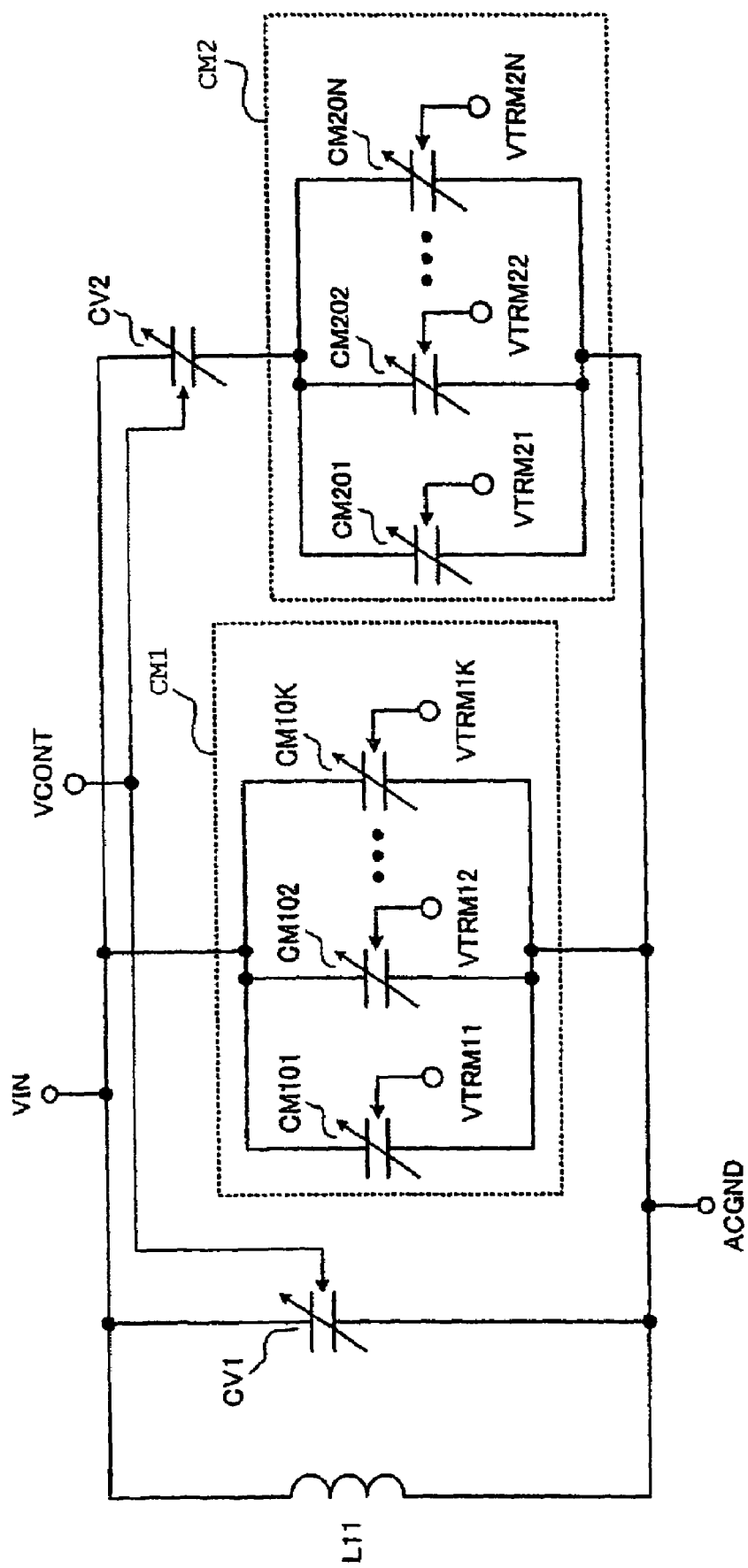
FIG. 3 is a circuit (configuration) diagram for describing an LC resonant circuit according to a second embodiment of the present invention.

An LC resonant circuit according to a second embodiment of the present invention will be explained with reference to FIG. 3 and FIG. 4. As shown in FIG. 3, the LC resonant circuit of the second embodiment is composed of an inductor L11, fine adjustable capacitors CV1 and CV2, and capacitor banks CM1 and CM2. CV2 and CM2 are connected in series and a parallel LC resonant circuit is configured by connecting them and L11, CV1, and CM1 in parallel. The second embodiment is an example where VPC1 and VSC1 in the first embodiment are constituted as a common AC signal input terminal VIN, and VPC2 and VSC2 therein is constituted as a common AC ground terminal ACGND. It is an embodiment obtained by further embodying the concept shown in FIG. 1.

CV1 and CV2 are capacitors with variable capacitance values whose capacitance values can be continuously controlled by a control voltage VCONT (hereinafter, called "variable capacitors"). CM1 and CM2 are composed of K (K is a positive integer) variable capacitors and N (N is a positive integer) variable capacitors respectively, and respective capacitance values of the variable capacitors are set to two large and small values according to control voltages VTRM11 to VTRM1K and VTRM21 to VTRM2N. At this time, it is preferred that setting is performed such that regarding large one of the two large and small capacitance values of CM11 to CM1K, CM11 has a minimum capacitance value ($C_{M11}$), CM12 has a capacitance value of $2 \times C_{M11}$, CM13 has a capacitance of $4 \times C_{M11}$, ..., and CM1K has a capacitance of $2^K \times C_{M11}$, while, regarding large one of the two large and small capacitance values of CM21 to CM2N, CM21 has a minimum capacitance value ($C_{M21}$), CM22 has a capacitance value of $2 \times C_{M21}$, CM23 has a capacitance value of $4 \times C_{M21}$, ..., and CM2N has a capacitance value of $2^N \times C_{M21}$, therefore it is possible that the capacitance value $C_{M1}$ of CM1 and the capacitance value $C_{M2}$ of CM2 are stepwise controlled to $2^K$ kinds of capacitance values and $2^N$ kinds of capacitance values at equal intervals.

The terminal VIN at one end of the LC resonant circuit shown in FIG. 3 is inputted with an AC signal, and the terminal ACGND at the other end is grounded in an AC manner.

A total capacitance value of capacitors in the LC resonant circuit shown in FIG. 3 includes parasitic capacitance Cp due to wiring or the like and it is expressed by the following equation (6).

$$C_{TOTAL} = C_{V1} + C_{M1} + C_P + \frac{C_{V2}C_{M2}}{C_{V2} + C_{M2}} \qquad (6)$$

From Equation (6), it is understood that since the ratio of the fine adjustment capacitance contained in the total capacitance value varies according to change of the capacitance value of CM2, it is made possible to adjust the magnitude of KV by using the LC resonant circuit shown in FIG. 3 as a resonant circuit for an oscillator.

The resonant frequency of the LC resonant circuit shown in FIG. 3 is expressed by the following Equation (7).

$$f_{RES} = \frac{1}{2\pi \sqrt{L\left(C_{V1} + C_{M1} + C_P + \frac{C_{V2}C_{M2}}{C_{V2} + C_{M2}}\right)}} \qquad (7)$$

Accordingly, KV obtained by using the LC resonant circuit shown in FIG. 3 as a resonant circuit for an oscillator is expressed by the following Equations (8), (9), and (10) when substituting Equation (7) for Equation (2).

$$K_V = K_{V1} + K_{V2} \qquad (8)$$

$$K_{V1} = \frac{1}{4\pi\sqrt{L}} \cdot \frac{1}{\left(C_{V1} + C_{M1} + C_P + \frac{C_{V2}C_{M2}}{C_{V2} + C_{M2}}\right)^{3/2}} \cdot \frac{dC_{V1}}{dV_{CONT}} \qquad (9)$$

$$K_{V2} = \frac{1}{4\pi\sqrt{L}} \cdot \qquad (10)$$

$$\frac{1}{\left(C_{V1} + C_{M1} + C_P + \frac{C_{V2}C_{M2}}{C_{V2} + C_{M2}}\right)^{3/2}} \cdot \left(\frac{C_{M2}}{C_{V2} + C_{M2}}\right)^2 \cdot \frac{dC_{V2}}{dV_{CONT}}$$

KV of Equation (8) approaches to KV of the Equation (3), when $C_{M2}$ is sufficiently smaller than $C_{V2}$ ($C_{M2} << C_{V2}$). On the other hand, when $C_{M2}$ is sufficiently larger than $C_{V2}$ ($C_{M2} >> C_{V2}$), KV is expressed by the following Equation (11).

$$K_V = \frac{1}{4\pi\sqrt{L}} \cdot \frac{1}{\left(C_{V1} + C_{M1} + \frac{}{C_P + C_{V2}}\right)^{3/2}} \cdot \left[\frac{dC_{V1}}{dV_{CONT}} + \frac{dC_{V2}}{dV_{CONT}}\right] \qquad (11)$$

That is, KV can be increased according to increase of the capacitance value $C_{M2}$ of CM2, while KV can be decreased according to decrease of the capacitance value $C_{M2}$. Accordingly, it is made possible to control KV between the value of Equation (3) and the value of Equation (11) by controlling $C_{M2}$.

Figure 4:
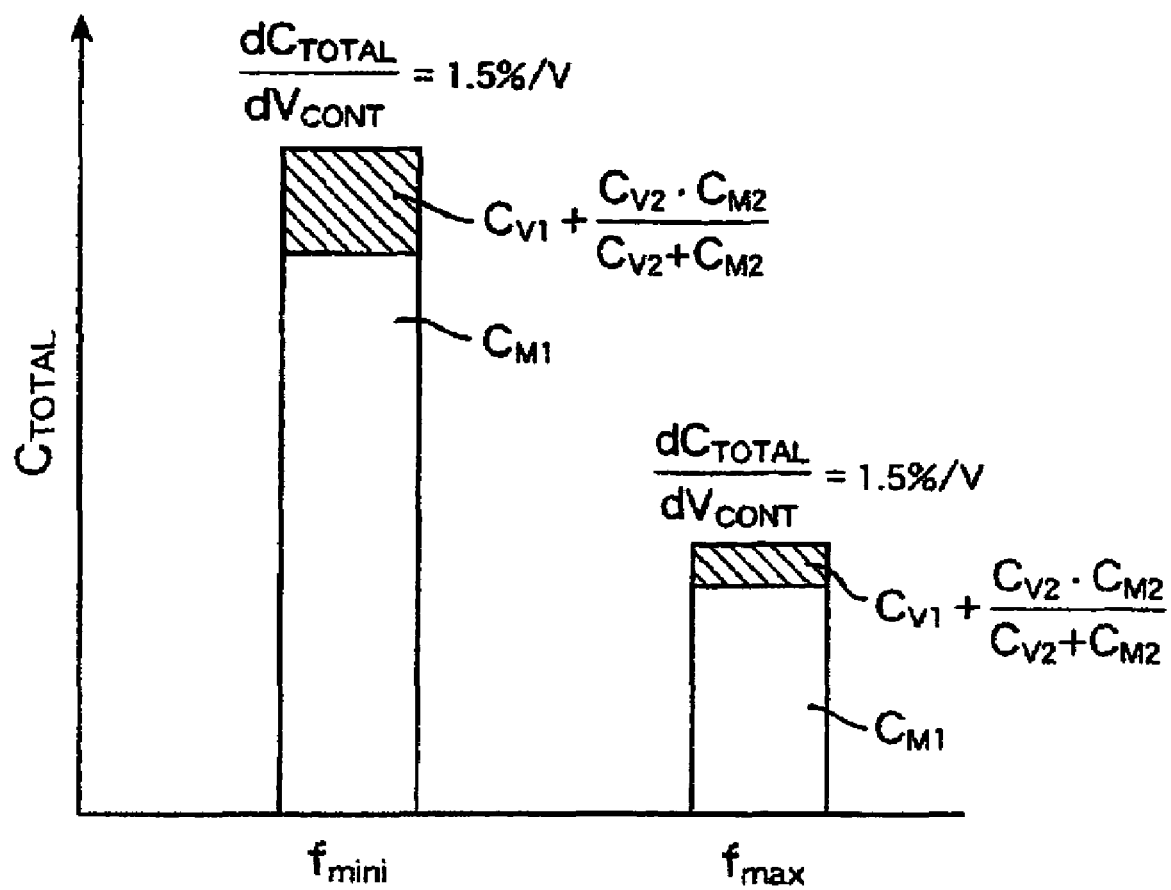
FIG. 4 is a diagram showing a relationship between a ratio of total capacitance value of the whole LC resonant circuit including parallel capacitance and series capacitance and total capacitance (=capacitance of a capacitor bank+fine adjustment capacitance) of the resonant circuit in the second embodiment.

FIG. 4 shows a relationship between a ratio of the total capacitance value of the whole CL resonant circuit including the parallel capacitance and the series capacitance and the total capacitance (=$C_{M1} + C_{V1} + C_{V2} \times C_{M2}/(C_{V2} + C_{M2})$) of the resonant circuit in the second embodiment. A ratio of the fine adjustment capacitance to the total capacitance value is approximately constant such as 1.5%/V at a time of frequency minimum fmini and at a time of frequency maximum fmax. Therefore, fluctuation of the frequency conversion gain (KV) can be suppressed.

By adopting the LC resonant circuit including the parallel capacitance of CV1 and CM1 and the series capacitance of CV2 and CM2 to configure a resonant circuit, it is made possible to realizing an oscillator with reduced KV fluctuation.

Also in the second embodiment, since a configuration that respective capacitances of the capacitors in the capacitor bank and the fine adjustable capacitors are controlled by control voltages is adopted but a configuration where either of the fine adjustable capacitors is selectively used by switching performed in a switch circuit is not adopted, such a problem does not occur that phase noise in the oscillator deteriorates.

As described above, by using an LC resonant circuit including a capacitor that can increase the frequency conversion gain according to increase of the capacitance value of a capacitor bank and a capacitor that can decrease the frequency conversion gain according to increase of the capacitance value of a capacitor bank in an oscillator, an oscillator where fluctuation of the frequency conversion gain KV to the capacitance value of the capacitor bank can be reduced, frequency variable range is wide, and deterioration of phase noise is reduced can be provided. As a result, when the oscillator is used with a charge pump type PLL circuit, it is possible to suppress increase of charge pump current and to reduce consumption current in the whole of the PLL circuit.

Third Embodiment

An LC resonant circuit according to a third embodiment of the present invention will be explained with reference to FIG. 5. In the resonant circuit according to the third embodiment, CM1 and CM2 in the resonant circuit according to the first embodiment are equally composed of K (K is a positive integer) variable capacitors respectively, and respective capacitance values of CM1 and CM2 are set to two large and small values according to control voltages VTRM1 to VTRMK. That is, when setting is performed such that regarding the capacitance values of CM11 to CM1K, CM11 has a minimum capacitance value ($C_{M11}$), CM12 has a capacitance value of $2 \times C_{M11}$, CM13 has a capacitance of $4 \times C_{M11}$, . . . , and CM1K has a capacitance of $2^K \times C_{M11}$, while, regarding the capacitance values of CM21 to CM2K, CM21 has a minimum capacitance value ($C_{M21}$), CM22 has a capacitance value of $2 \times C_{M21}$, CM23 has a capacitance value of $4 \times C_{M21}$, . . . , and CM2K has a capacitance value of $2^K \times C_{M21}$, the capacitance values of CM1 and CM2 are stepwise controlled to $2^K$ kinds of capacitance values at equal intervals, which is desirable. A terminal VIN at one end of the LC resonant circuit shown in FIG. 5 is inputted with an AC signal, and a terminal ACGND at the other end is grounded in an AC manner.

Figure 5:
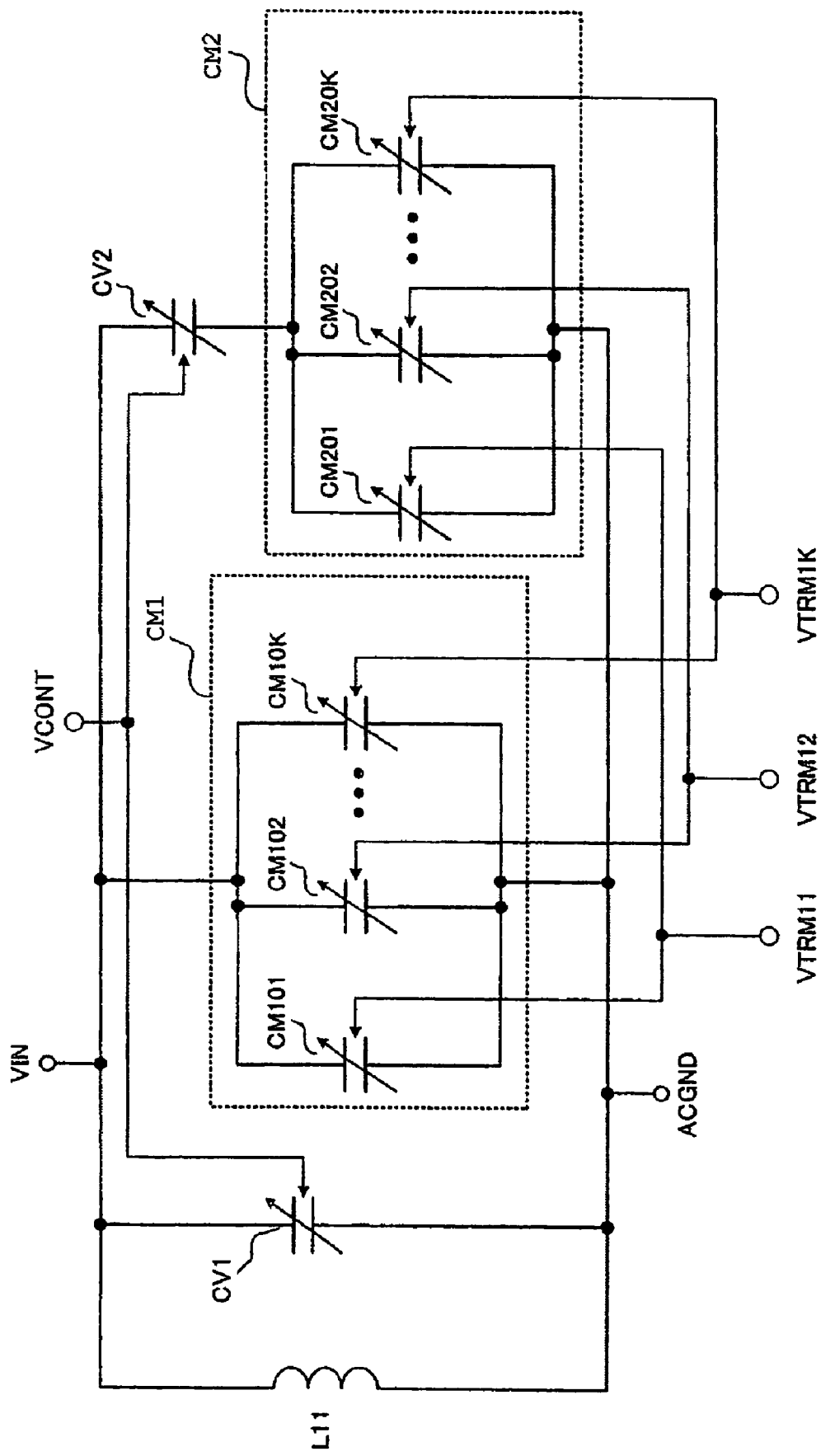
FIG. 5 is a circuit (configuration) diagram for describing an LC resonant circuit according to a third embodiment of the present invention.

A total capacitance value of capacitors in the LC resonant circuit shown in FIG. 5 includes parasitic capacitance Cp due to interconnect or the like and it is expressed by Equation (6). KV of the oscillator shown in FIG. 5 is expressed by Equation (8), (9), and (10), where KV1 lowers according to increases of the capacitance values of CM1 and CM2. On the other hand, KV2 increases according to increase of the capacitance values of CM1 and CM2.

Since KV1 lowers according to increase of the capacitance values of the capacitor banks CM1 and CM2 but KV2 increases according to increase of the capacitance values of the capacitor banks CM1 and CM2, it is made possible to provide a constant KV to fluctuation of CM1 and CM2 or reduce fluctuation of KV by adjusting values of CM1, CM2, CV1, and CV2.

By using the LC resonant circuit according to the third embodiment in an oscillator, an oscillator where fluctuation of the frequency conversion gain KV to the capacitance value of the capacitor bank can be reduced, the frequency variable range is wide, and deterioration of phase noise is reduced can be provided. As a result, when the oscillator is used with a charge pump type PLL circuit, it is possible to suppress increase of charge pump current and to reduce consumption current in the whole of the PLL circuit.

Fourth Embodiment

Figure 6:
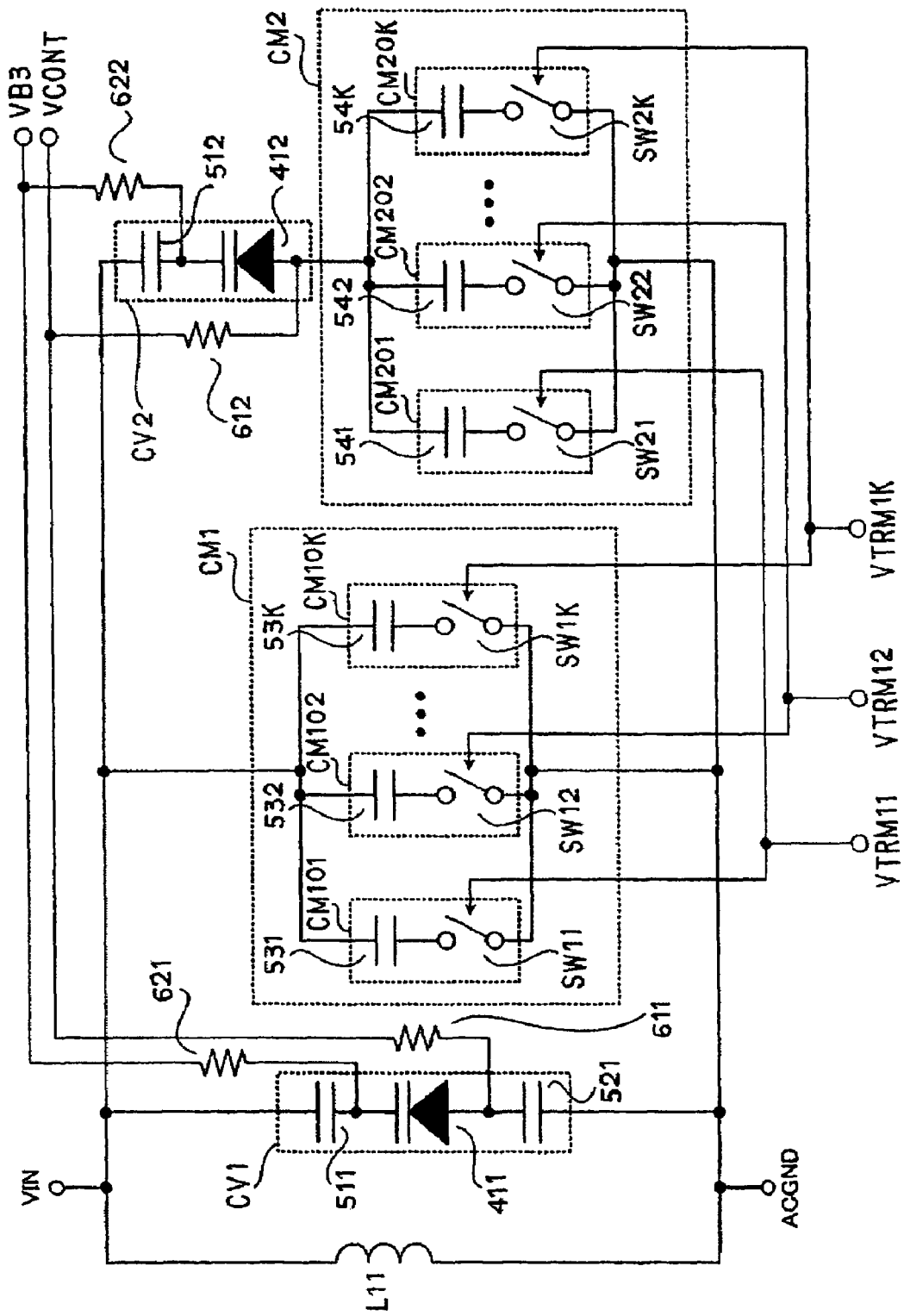
FIG. 6 is a circuit (configuration) diagram for describing an LC resonant circuit according to a fourth embodiment of the present invention.

FIG. 6 shows an LC resonant circuit according to a fourth embodiment of the present invention. In the fourth embodiment, the fine adjustable capacitors CV1 and CV2 in the first and second embodiments are composed of semiconductor p-n junction capacitors 411 and 412. Respective variable capacitors CM101 to CM10K and CM201 to CM20K are composed of K fixed capacitors 531 to 53K and K fixed capacitors 541 to 54K of MIM capacitor that are formed between metal layers through an insulating layer in a semiconductor device, and switches SW11 to SW1K and SW21 to SW2K connected to the fixed capacitors in series.

According to the fourth embodiment, the capacitance value is continuously controlled by controlling voltages applied to sides of the p-n junction capacitors 411 and 412, so that the resonant frequency of the LC resonant circuit is controlled continuously.

Since switching between a large capacitance value and a small capacitance value can be performed by opening or closing the switches, the resonant frequency of the LC resonant circuit can be changed stepwise. A variable capacitor can be realized by using a MOS transistor as the switch in order to obtain a low parasitic resistance and performing switching of a gate-source voltage of the MOS transistor on reaching a threshold voltage. In this case, since capacitance between the gate of the MOS transistor and the substrate or parasitic capacitance between the metal layer of the MIM capacitor and the substrate or the like is present, the capacitance value does not become zero even while the switch is being opened so that slight capacitance remains. However, since the MIM capacitor formed on the semiconductor device has high quality factor and high design precision, it is preferable that the MIM capacitor is used in the capacitor bank in the LC resonant circuit used in the oscillator. A terminal VIN at one end of the LC resonant circuit shown in FIG. 6 is inputted with an AC signal, and a terminal ACGND at the other end is grounded in an AC manner.

In FIG. 6, reference numerals 511, 512, and 521 denote capacitors for blocking direct current, and reference numerals 611, 612, 621, and 622 denote resistors for blocking leakage of high frequency. A fixed bias voltage is applied to a terminal VB3 and the control voltage $V_{CONT}$ is applied to the terminal VCONT. Incidentally, the inductor L11, the p-n junction capacitors 411 and 412, the MIM capacitor, the switch, and peripheral elements can be formed in the same or one semiconductor device in an integrating manner.

By using the LC resonant circuit according to the fourth embodiment in an oscillator, an oscillator where fluctuation of the frequency conversion gain KV to the capacitance value of the capacitor bank can be reduced, and the frequency variable range is wide can be provided. As a result, when the oscillator is used with a charge pump type PLL circuit, it is possible to suppress increase of charge pump current and to reduce consumption current in the whole of the PLL circuit.

Fifth Embodiment

Figure 7:
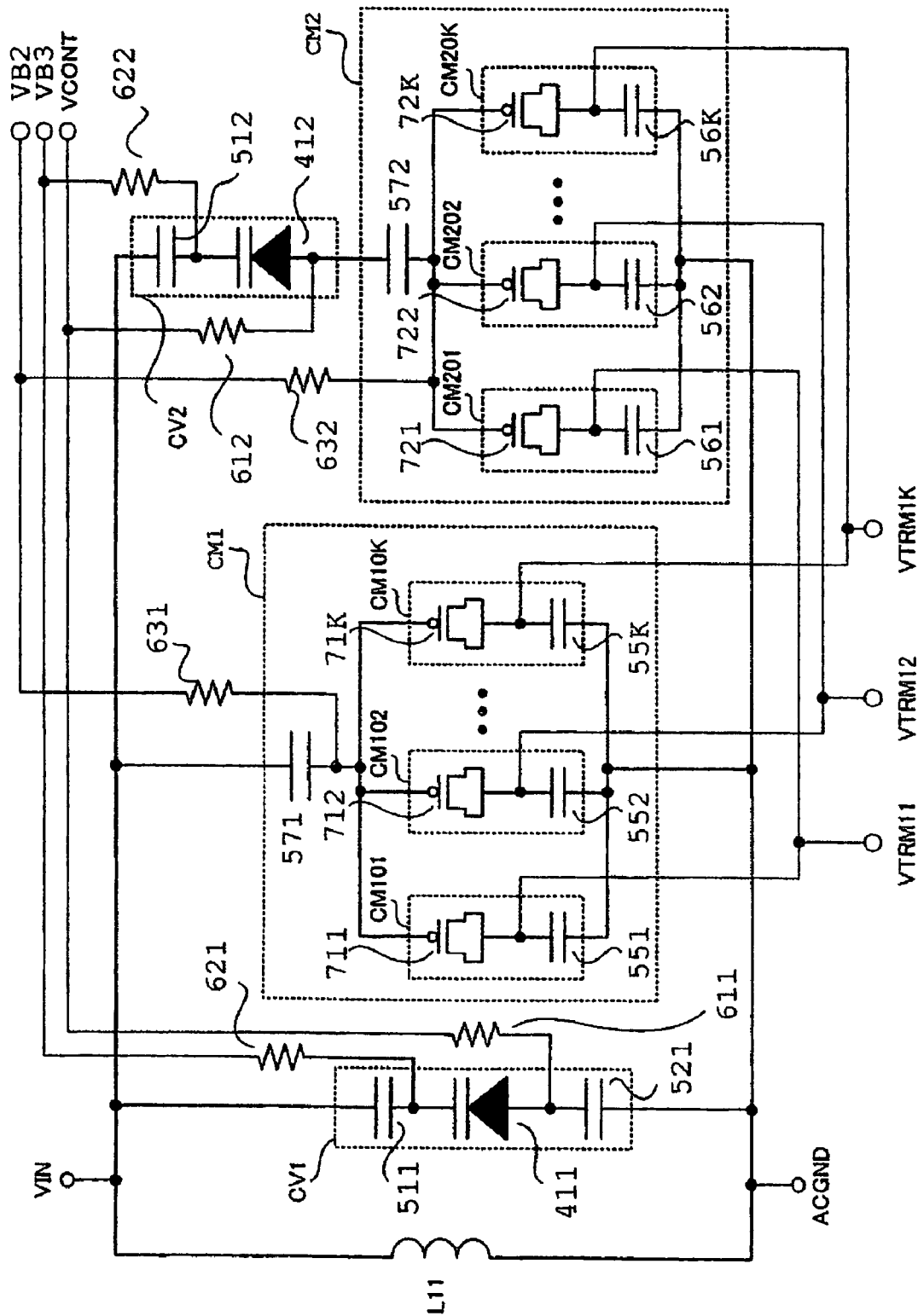
FIG. 7 is a circuit (configuration) diagram for describing an LC resonant circuit according to a fifth embodiment of the present invention.

FIG. 7 shows an LC resonant circuit according to a fifth embodiment of the present invention. In the fifth embodiment, the fine adjustable capacitors CV1 and CV2 in the first to third embodiments are composed of p-n junction capacitors 411 and 412 of semiconductor. Respective variable capacitors 711 to 71K and 721 to 72K of the capacitor banks CM1 and CM2 are composed of MOS capacitors using gate capacitors of MOS transistors, where the capacitance value of the LC resonator is continuously controlled by controlling voltages applied across the p-n junction capacitors 411 and 412, so that the resonant frequency of the LC resonant circuit is controlled continuously. Switching between accumulation state and inversion state of the MOS transistors is performed by controlling voltages between the gates and the sources/drains of the MOS capacitors CM101 to CM10K and CM201 to CM20K so that the capacitance value is controlled between two values and the resonant frequency of the LC resonant circuit is controlled stepwise. A terminal VIN at one end of the LC resonant circuit shown in FIG. 7 is inputted with an AC signal, and a terminal ACGND at the other end is grounded in an AC manner.

In FIG. 7, reference numerals 511, 512, 521, 571, 572, 551 to 55K, and 561 to 56K denote capacitors for blocking direct current, and reference numerals 611, 612, 621, and 622 denote resistors for blocking leakage of high frequency. A fixed bias voltage is applied to a terminal VB3, and the control voltage is applied to the terminal VCONT. A fixed bias voltage is applied to a terminal VB2 and the control voltage is applied to terminals VTRM11 to VTRM1K. Incidentally, the inductor L11, the p-n junction capacitors, the MOS capacitors, and peripheral elements can be formed on the same or one semiconductor device in an integrating manner.

Figure 8:
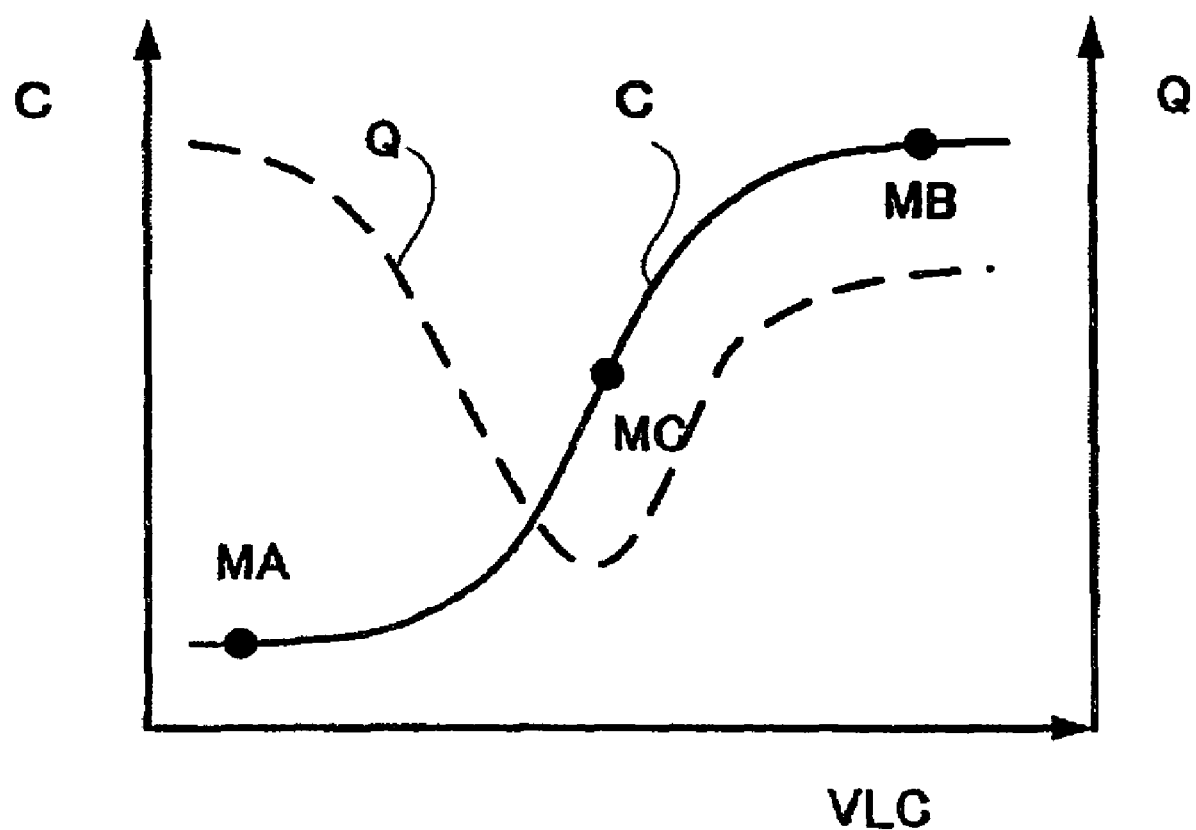
FIG. 8 is a curve diagram for explaining voltage dependency between a gate and a source/drain of a MOS capacitor in the fifth embodiment.

FIG. 8 shows voltage dependencies of the capacitance value (C) and the quality factor (Q) of the MOS capacitor. In FIG. 8, the horizontal axis indicates a voltage VGS between the gate and the source/drain of the MOS transistor, a solid line indicates a capacitance C, and a broken line indicates a quality factor Q.

As shown in FIG. 8, at the MC point in the voltage dependency of the MOS capacitor, namely, in a transition region where the capacitance value changes largely, the quality factor lowers. On the other hand, the quality factor is relatively excellent in such a region where the change of the capacitance value is small at such as the MA point of the inversion state or the MB point of the accumulation state, so that it is preferable that such a region is used as each trimming capacitor of the capacitor bank. Since the MOS capacitor formed on the semiconductor device has a capacitance value per unit area larger than that of the MIM capacitor, an area of the LC resonant circuit can be reduced. Accordingly, by configuring respective trimming capacitors in the capacitor bank in the fifth embodiment using the MOS capacitors 711 to 71K and 721 to 72K as shown in FIG. 7, a preferred LC resonant circuit where KV fluctuation is reduced can be realized.

By using the LC resonant circuit according to the fifth embodiment in an oscillator, an oscillator where fluctuation of the frequency conversion gain KV to the capacitance value of the capacitor bank can be reduced, the frequency variable range is wide, and deterioration of phase noise is reduced can be provided. As a result, when the oscillator is used with a charge pump type PLL circuit, it is possible to suppress increase of charge pump current and to reduce consumption current in the whole of the PLL circuit.

Sixth Embodiment

Figure 9:
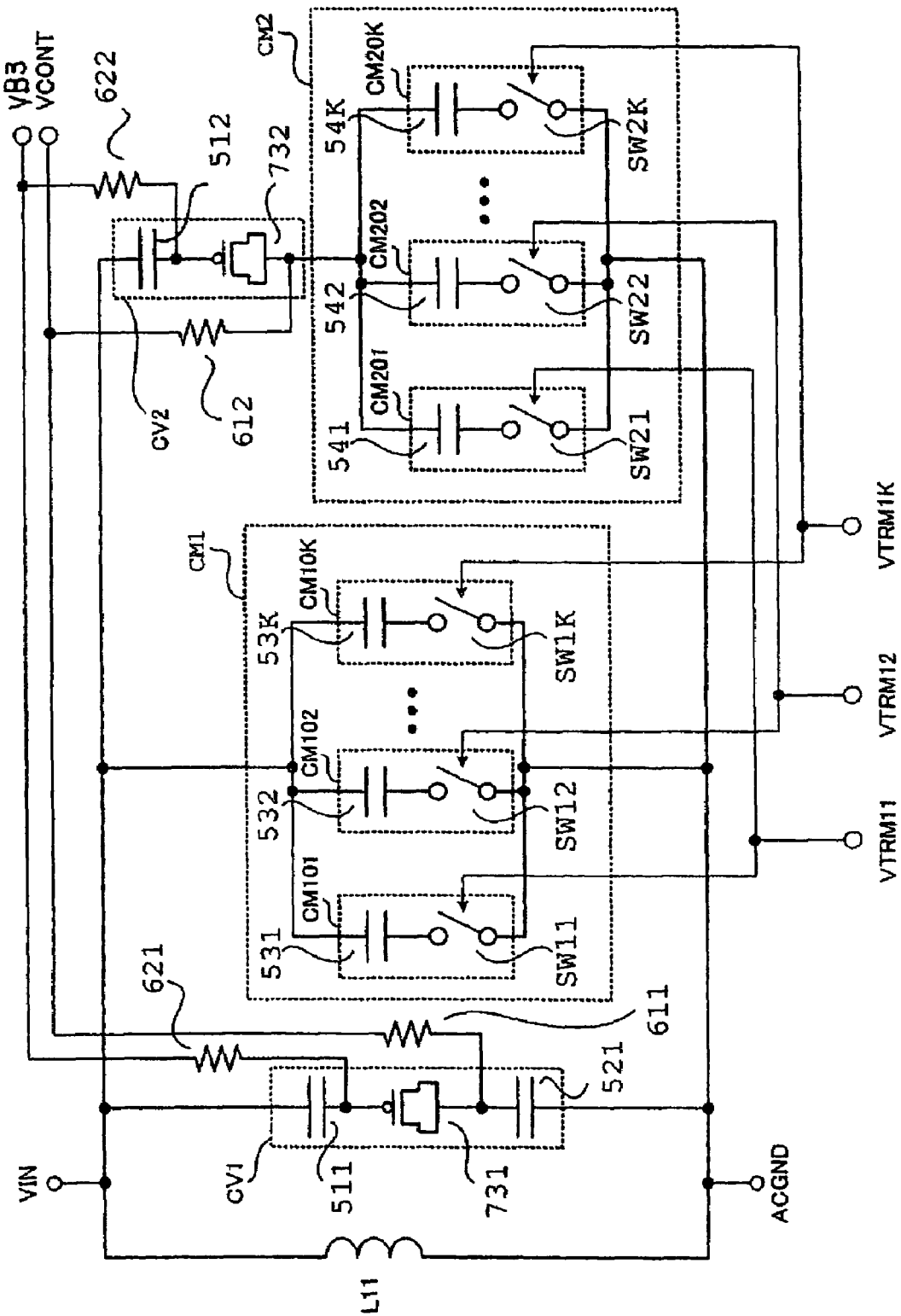
FIG. 9 is a circuit configuration diagram for describing an LC resonant circuit according to a sixth embodiment of the present invention.

FIG. 9 shows an LC resonant circuit according to a sixth embodiment of the present invention. In the sixth embodiment, the fine adjustable capacitors CV1 and CV2 in the first and second embodiments are composed of MOS capacitors 731 and 732 using gate capacitors of MOS transistors. Respective trimming capacitors CM101 to CM10K and CM201 to CM20K are respectively composed of K fixed capacitors 531 to 53K and K fixed capacitors 541 to 54K of MIM capacitors formed between metal layers via an insulating layer in a semiconductor device, and switches SW11 to SW1K and SW21 to SW2K connected to the respective fixed capacitors in series. The capacitance value is controlled continuously by controlling voltages between gates and sources/drains of the MOS capacitors 731 and 732, so that the resonant frequency of the LC resonant circuit can be controlled continuously. Since the capacitance value changing rate of the MOS capacitor is higher than that of the p-n junction capacitor, a wide frequency variable range can be realized by using the MOS capacitor as the fine adjustable capacitor, which is desirable. A terminal VIN at one end of the LC resonant circuit shown in FIG. 9 is inputted with an AC signal, and a terminal ACGND at the other end is grounded in an AC manner.

In FIG. 9, reference numerals 511, 512, and 521 denote capacitors for blocking direct current, and reference numerals 611, 612, 621, and 622 denote resistors for blocking leakage of high frequency. A fixed bias voltage is applied to a terminal VB3 and the control voltage is applied to the terminal VCONT. Incidentally, the inductor L11, the MOS capacitors, the MIM capacitors, the switches, and peripheral elements can be formed in the same or one semiconductor device in an integrating manner.

Seventh Embodiment

Figure 10:
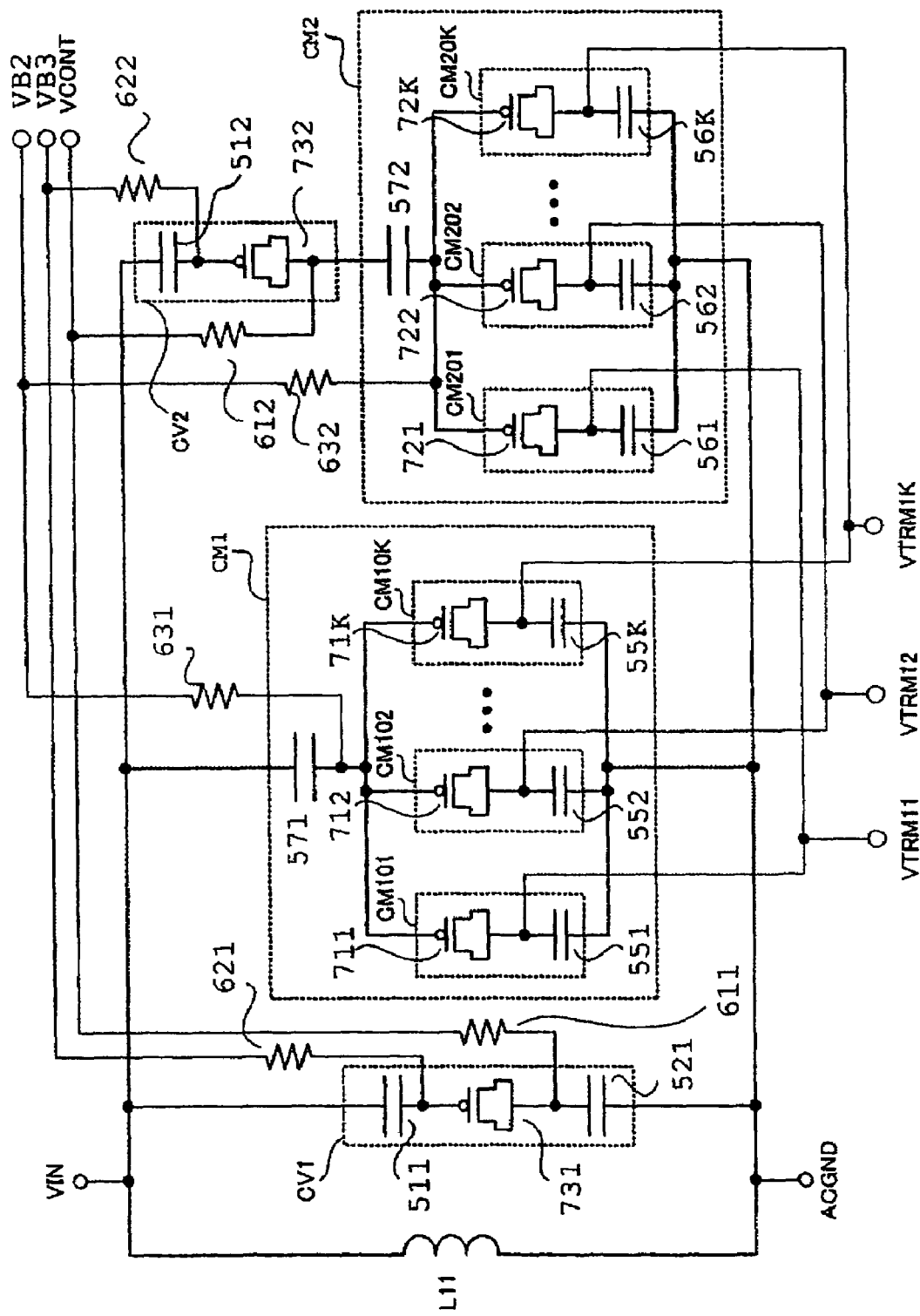
FIG. 10 is a circuit (configuration) diagram for describing an LC resonant circuit according to a seventh embodiment of the present invention.

FIG. 10 shows an LC resonant circuit according to a seventh embodiment of the present invention. In the seventh embodiment, the fine adjustable capacitors CV1 and CV2 in the first to third embodiments are composed of MOS capacitors using gate capacitors of MOS transistors, and respective trimming capacitors CM101 to CM10K and CM201 to CM20K are composed of MOS capacitors using gate capacitors of MOS transistors. The capacitance value is controlled continuously by controlling voltages between gates and sources/drains of the MOS capacitors 731 and 732, so that the resonant frequency of the LC resonant circuit can be controlled continuously. Switching between accumulation state and inversion state of the MOS transistors is performed by controlling voltages between the gates and the sources/drains of the MOS capacitors 711 to 71K and 721 to 72K so that the capacitance value is controlled between two values and the resonant frequency of the LC resonant circuit is controlled stepwise.

Since the MOS capacitor formed on the semiconductor device has a capacitance value per unit area larger than that of the MIM capacitor, an area of the LC resonant circuit can be reduced. Accordingly, by configuring respective variable capacitors in the seventh embodiment using the MOS capacitors 711 to 71K and 721 to 72K, as shown in FIG. 10, a preferred LC resonant circuit can be realized. A terminal VIN at one end of the LC resonant circuit shown in FIG. 10 is inputted with an AC signal, and a terminal ACGND at the other end thereof is grounded in an AC manner.

In FIG. 10, reference numerals 511, 512, 521, 571, 572, 551 to 55K, and 561 to 56K denote capacitors for blocking a direct current, and reference numerals denote 611, 612, 621, and 622 denote resistors for blocking leakage of high frequency. A fixed bias voltage is applied to the terminal VB3, and the control voltage is applied to the terminal VCONT. A fixed bias voltage is applied to the terminal VB2 and the control voltage is applied to the terminals VTRM11 to VTRM1K. Incidentally, the inductor L11, the MOS capacitors, and peripheral elements can be formed in the same or one semiconductor device in an integrating manner.

Eighth Embodiment

An LC resonant circuit according to an eighth embodiment of the present invention will be explained with reference to FIG. 11. The LC resonant circuit according to the eighth embodiment includes an inductor L1, another inductor L2 magnetically coupled to the inductor L1 via mutual inductance, fine adjustable capacitors CV1 and CV2, and capacitor banks CM1 and CM2. A parallel LC resonant circuit is configured by connecting L2, CV2, and CM2 in series and connecting L1, CV1, and CM1 in parallel. CV1 and CV2 are fine adjustable capacitors whose capacitance values are continuously controlled by control voltage $V_{CONT}$. CM1 and CM2 are respectively composed of K (K is a positive integer) variable capacitors and N (N is a positive integer) variable capacitors, and capacitance values of the variable capacitors are each set to two large and small values by control voltages VTRM11 to VTRM1K and VTRM21 to VTRM2N. At this time, setting is performed such that regarding the capacitance values of CM11 to CM1K, CM11 has a minimum capacitance value ($C_{M11}$), CM12 has a capacitance value of $2 \times C_{M11}$, CM13 has a capacitance value of $4 \times C_{M11}$, ..., and CM1K has a capacitance value of $2^K \times C_{M11}$, and regarding the capacitance values of $C_{M21}$ to $C_{M2N}$, CM21 has a minimum capacitance value ($C_{M21}$), CM22 has a capacitance value of $2 \times C_{M21}$, CM23 has a capacitance value of $4 \times C_{M21}$, ..., and CM2K has a capacitance value of $2^N \times C_{M21}$, the capacitance value of CM1 and the capacitance value of CM2 are stepwise controlled to $2^K$ kinds of capacitance values and $2^N$ kinds of capacitance values at equal intervals, which is desirable. A terminal VIN at one end of the LC resonant circuit shown in FIG. 11 is inputted with an AC signal, and a terminal ACGND at the other end is grounded in an AC manner.

Figure 11:
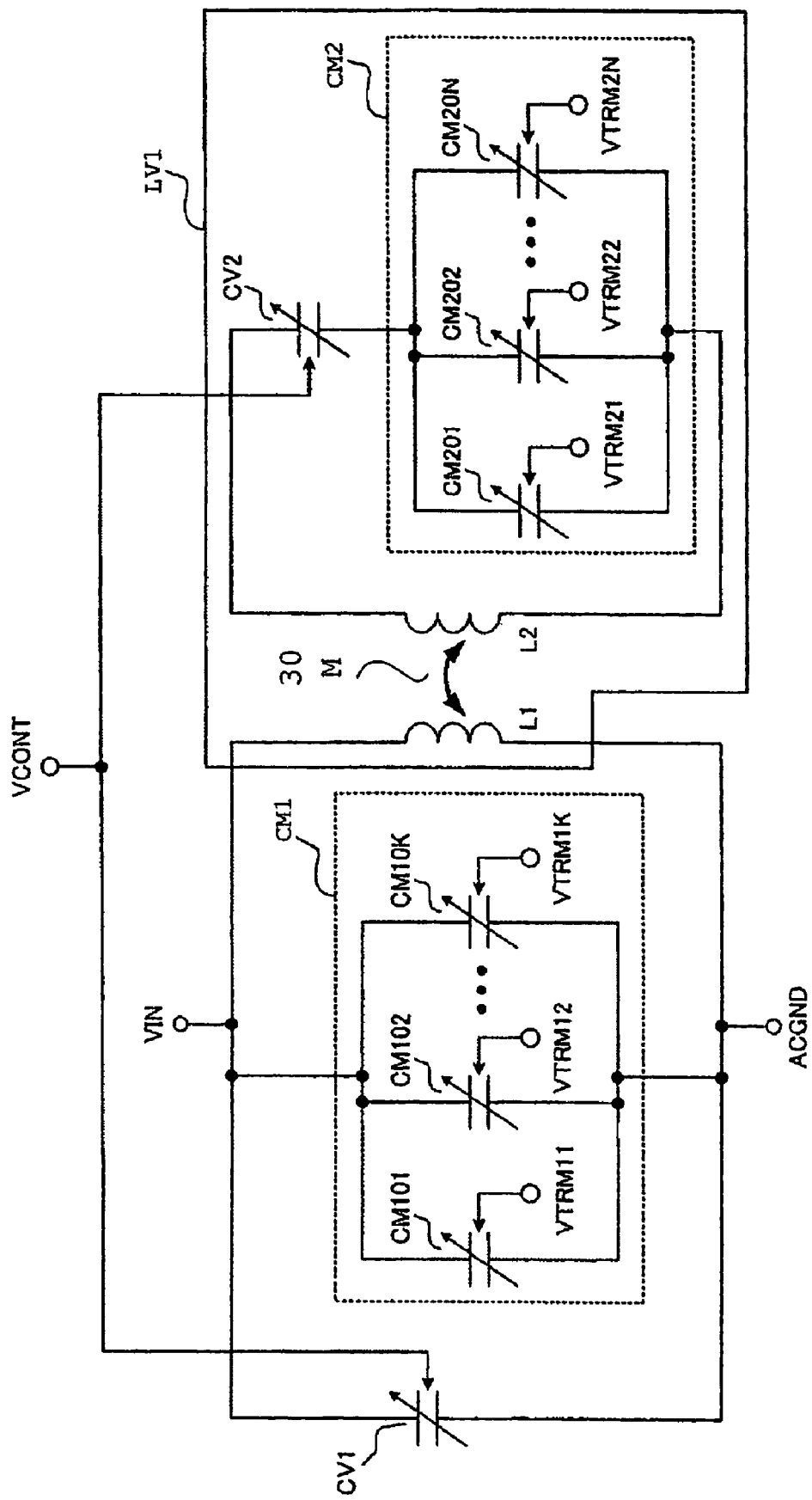
FIG. 11 is a circuit (configuration) diagram for describing an LC resonant circuit according to an eighth embodiment of the present invention.

A circuit composed of L1, L2, CV2, and CM2 shown in FIG. 11 operates as a variable inductor. The principle will be explained with reference to FIG. 12.

Figure 12:
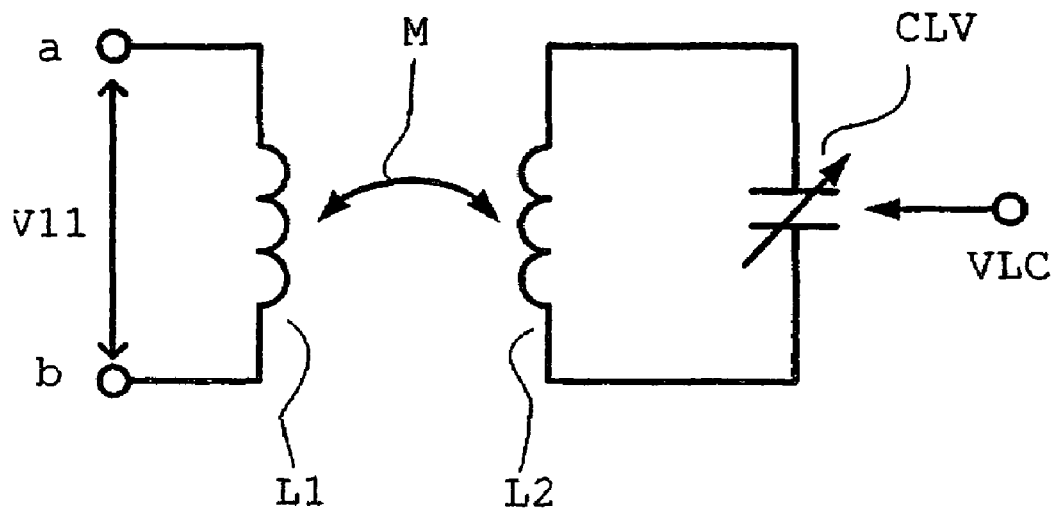
FIG. 12 is a circuit (configuration) diagram for explaining a principle of a variable inductor used in the present invention.

FIG. 12 shows a circuit composed of the inductor L1, the inductor L2 magnetically coupled to the inductor L1 via mutual inductance, and a capacitor connected to the inductor L2 in series so as to configure a loop circuit.

When alternating currents flowing through the inductors L1 and L2 are represented as $I_1$ and $I_2$, inductances of the inductors L1 and L2 are represented as $L_{i1}$ and $L_{i2}$, and mutual inductance between the inductors L1 and L2 is represented as M, an AC voltage $V_{11}$ applied across the inductor L1 is expressed by the following Equation (12).

$$V_{11} = j\omega L_{i1} I_1 + j\omega M I_2 \qquad (12)$$

Since L2 and CLV constitute a loop circuit, a potential going around the loop becomes zero. That is, the following Equation (13) is satisfied.

$$0 = j\omega L_{i2} I_2 + j\omega M I_1 + \frac{I_2}{j\omega C_{LV}} \qquad (13)$$

Accordingly, an alternating current $I_2$ flowing through the inductor L2 is expressed from Equation (13) as the following Equation (14).

$$I_2 = \frac{\omega^2 M C_{LV} \cdot I_1}{1 - \omega^2 L_{i2} C_{LV}} \qquad (14)$$

It is understood from Equation (14) that the alternating current $I_2$ is changed by changing a voltage, a current, or a pulse applied to the control terminal VLC to change the capacitance value $C_{LV}$. The following Equation (15) is obtained by assigning Equation (14) to Equation (12).

$$V_{11} = \left( j\omega L_{i1} + j\omega M \frac{\omega^2 M C_{LV}}{1 - \omega^2 L_{i2} C_{LV}} \right) \cdot I_1 = Z_{eff} I_1 \qquad (15)$$

Here, $Z_{eff}$ is effective impedance between terminals "a" and "b". Accordingly, effective inductance $L_{eff}$ is expressed by the following Equation (16).

$$L_{eff} = Im[Z_{eff}]/\omega = L_{i1} + \frac{\omega^2 M^2 C_{LV}}{1 - \omega^2 L_{i2} C_{LV}} \qquad (16)$$

As shown by Equation (16), $L_{eff}$ can be made variable by changing the capacitance value $C_{LV}$ of the variable capacitor CLV, namely, changing the alternating current $I_2$.

Figure 13:
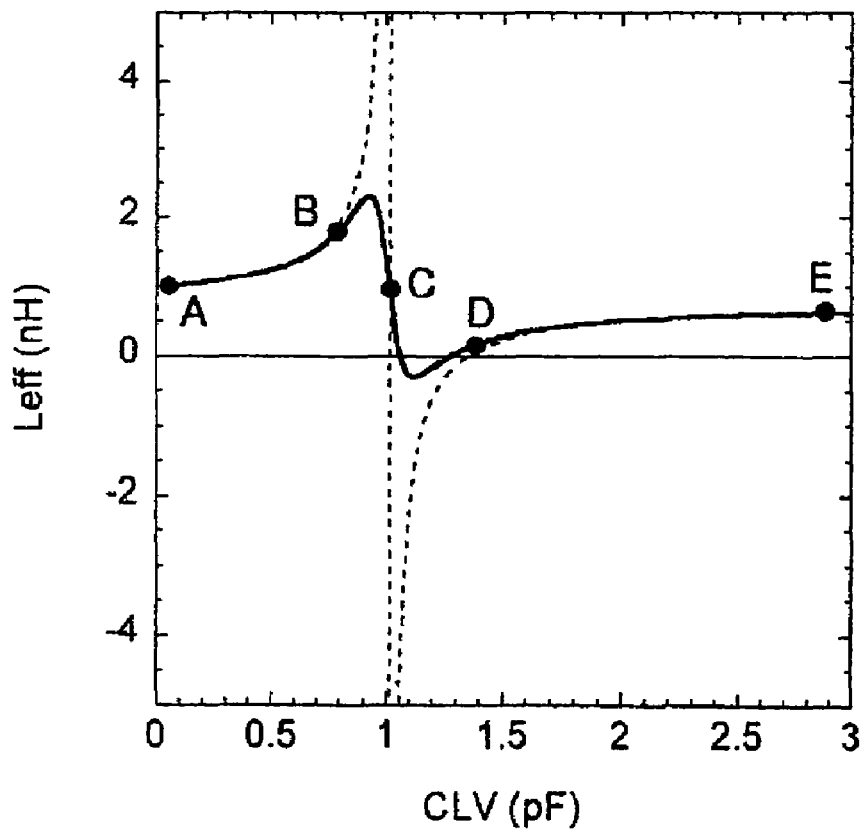
FIG. 13 is a curve diagram for explaining a capacitance value dependency of inductance in the variable inductor used in the present invention.

FIG. 13 shows dependency of the inductance $L_{eff}$ of the variable inductor to the capacitance value $C_{LV}$ shown in FIG. 12. $L_{eff}$ can be increased according to increase of $C_{LV}$ by changing $C_{LV}$ between point A and point B shown in FIG. 13.

By utilizing Equation (16), effective inductance $L_{1eff}$ across the inductor L1 of the variable inductor composed of the inductors L1 and L2, the fine adjustable capacitor CV2, and the capacitor bank CM2 in the LC resonant circuit shown in FIG. 11 is expressed by the following Equation (17).

$$L_{1eff} = L_{i1} + \frac{\omega^2 M^2 \cdot \frac{C_{V2} C_{M2}}{C_{V2} + C_{M2}}}{1 - \omega^2 L_{i2} \cdot \frac{C_{V2} C_{M2}}{C_{V2} + C_{M2}}} \qquad (17)$$

Accordingly, KV of the oscillator obtained when the LC resonant circuit shown in FIG. 11 is used as the resonant circuit in the oscillator is expressed by the following Equation using Equation (2).

$$K_V = \frac{df_{RES}}{dV_{CONT}} = K_{V1} + K_{V3} \qquad (18)$$

Here, KV1 and KV3 are respectively expressed by the following Equations (19) and (20).

$$K_{V1} = \frac{1}{4\pi L_{1eff}^{1/2}} \cdot \frac{1}{(C_{TOTAL})^{3/2}} \cdot \frac{dC_{TOTAL}}{dV_{CONT}} \qquad (19)$$

$$= \frac{1}{4\pi L_{1eff}^{1/2}} \cdot \frac{1}{(C_{V1} + C_{M1} + C_P)^{3/2}} \cdot \frac{dC_{V1}}{dV_{CONT}}$$

$$K_{V3} = \frac{1}{4\pi L_{1eff}^{3/2}} \cdot \frac{1}{(C_{TOTAL})^{1/2}} \cdot \frac{dL_{1eff}}{dV_{CONT}} \qquad (20)$$

$$= \frac{1}{4\pi L_{1eff}^{3/2}} \cdot \frac{1}{(C_{TOTAL})^{1/2}} \cdot \frac{\omega^2 M^2 \cdot \left(\frac{C_{M2}}{C_{V2} + C_{M2}}\right)^2}{\left(1 - \omega^2 L_{i2} \cdot \frac{C_{V2} C_{M2}}{C_{V2} + C_{M2}}\right)^2} \cdot \frac{dC_{V2}}{dV_{CONT}}$$

$$= \frac{1}{4\pi} \cdot \frac{(L_{1eff} - L_{i1})^2}{\sqrt{L_{1eff}} \, M^2} \cdot \frac{\sqrt{C_{V1} + C_{M1} + C_P}}{C_{V2}^2} \cdot \frac{dC_{V2}}{dV_{CONT}}$$

KV1 decreases according to increase of the capacitance of CM1. On the other hand, KV3 increases according to increase of the capacitance of CM1, and the magnitude thereof can be adjusted by adjusting $L_{1eff}$ through CM2. Additionally, since adjustment of KV is performed using the variable inductor, it is possible to set the frequency variable range to be wider than that in the second embodiment using a portion of the capacitance constituting CTOTAL.

By using the LC resonant circuit according to the eighth embodiment in an oscillator, an oscillator where fluctuation of the frequency conversion gain KV to the capacitance value of the capacitor bank can be reduced, the frequency variable range is wide, and deterioration of phase noise is reduced can be provided. As a result, when the oscillator is used with a charge pump type PLL circuit, it is possible to suppress increase of charge pump current and to reduce consumption current in the whole of the PLL circuit.

Ninth Embodiment

Figure 14:
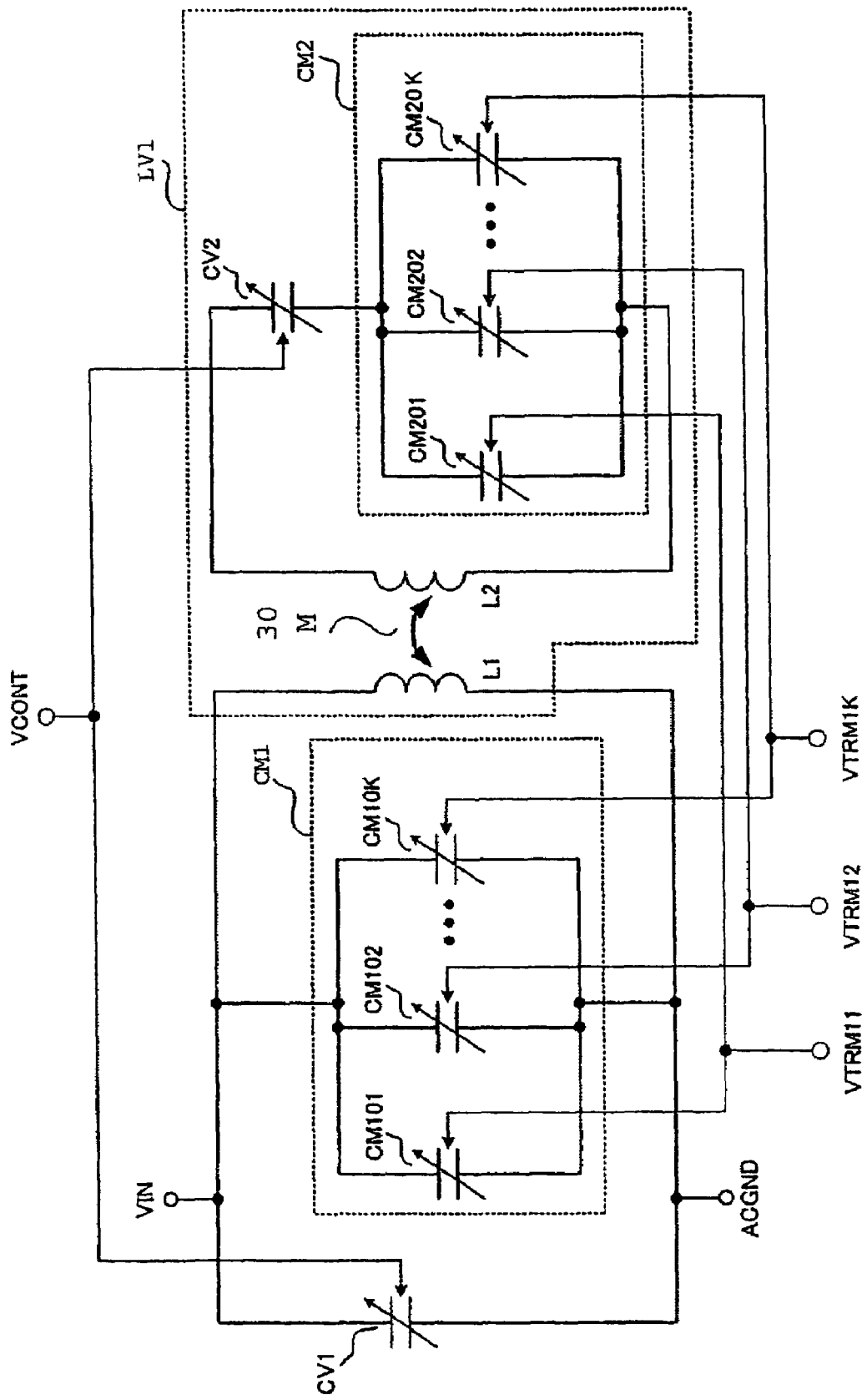
FIG. 14 is a circuit (configuration) diagram for describing an LC resonant circuit according to a ninth embodiment of the present invention.

An LC resonant circuit according to a ninth embodiment of the present invention will be explained with reference to FIG. 14. The LC resonant circuit according to the ninth embodiment includes an inductor L1, an inductor L2 magnetically coupled with the inductor L1 via mutual inductance, fine adjustable capacitors CV1 and CV2, and a capacitor banks CM1 and CM2. A parallel LC resonant circuit is configured by connecting L2, CV2 and CM2 in series and connecting L1, CV1, and CM1 in parallel. CV1 and CV2 are capacitance variable capacitors whose capacitance values can be continuously controlled by control voltages $V_{CONT}$ (hereinafter, it is called variable capacitor). Both of CM1 and CM2 are equally composed of K (K is a positive integer) variable capacitors, respectively, and respective capacitance values of CM1 and CM2 are set to two large and small values according to control voltages VTRM11 to VTRM1K. When setting is performed such that regarding the capacitance values of CM11 to CM1K, CM11 has a minimum capacitance value ($C_{M11}$), CM12 has a capacitance value of $2 \times C_{M11}$, CM13 has a capacitance of $4 \times C_{M11}, \ldots$, and CM1K has a capacitance of $2^K \times C_{M11}$, while, regarding the capacitance values of CM21 to CM2K, CM21 has a minimum capacitance value ($C_{M21}$), CM22 has a capacitance value of $2 \times C_{M21}$, CM23 has a capacitance value of $4 \times C_{M21}, \ldots$, and CM2K has a capacitance value of $2^K \times C_{M21}$, the capacitance values of CM1 and CM2 are stepwise controlled to $2^K$ kinds of capacitance values at equal intervals, which is desirable. A terminal VIN at one end of the LC resonant circuit shown in FIG. 14 is inputted with an AC signal, and a terminal ACGND at the other end is grounded in an AC manner.

Figure 15:
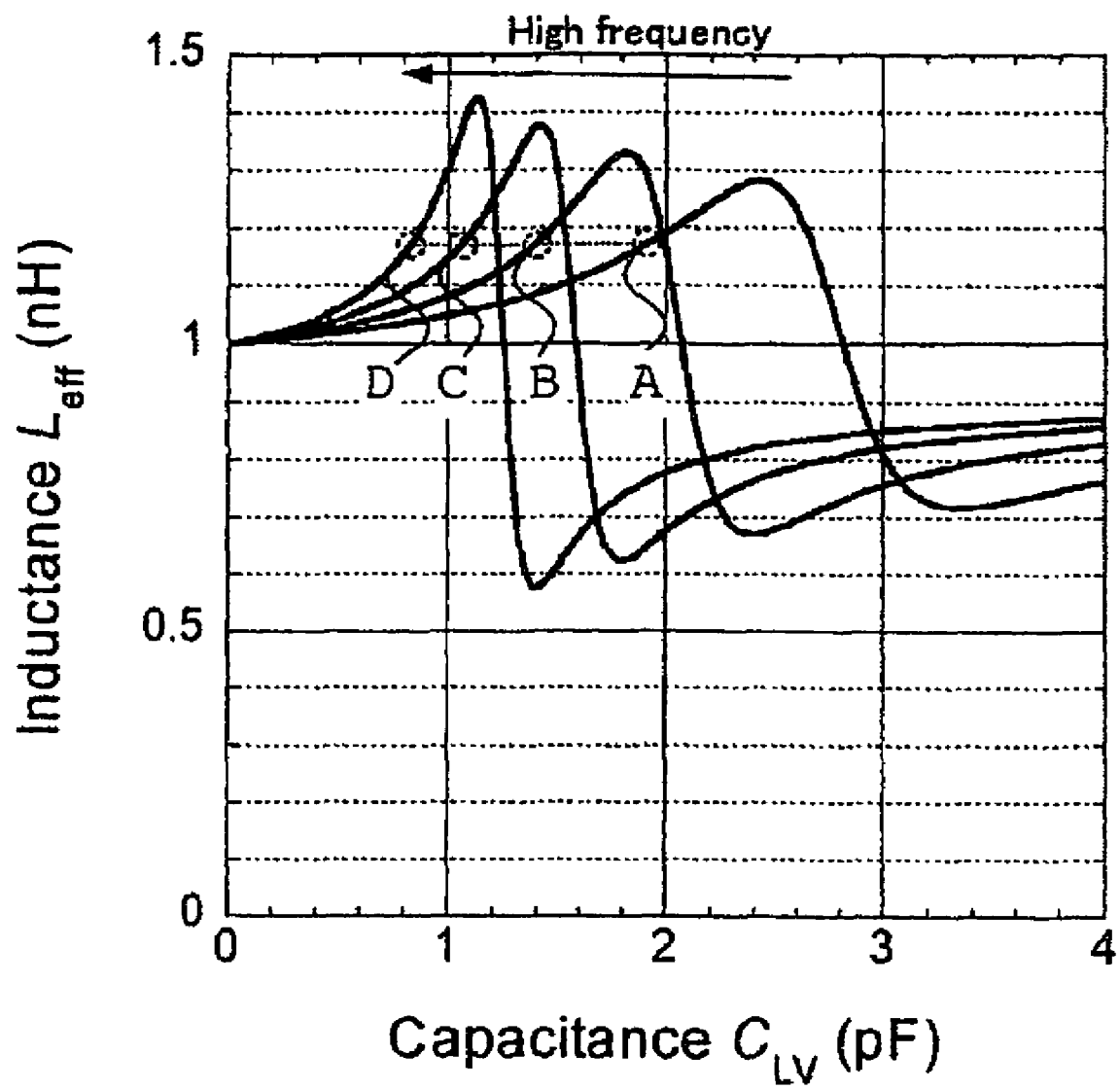
FIG. 15 is a curve diagram for explaining a capacitance value dependency and a frequency dependency of inductance in the variable inductor used in the present invention.

An operation of the oscillator using the LC resonant circuit shown in FIG. 14 will be explained with reference to FIG. 15. FIG. 15 shows dependence of inductance of the variable inductor LV1 to the capacitance value $C_{LV}$ of the series capacitor CLV of CV2 and CM2. The inductance also increases according to increase of the capacitance value $C_{LV}$. However, the inductance decreases according to lowering of the frequency. That is, since the frequency lowers according to increase of the capacitance value of CM1, $L_{1eff}$ also lowers. As a result, since ($L_{1eff}$-$L_{i1}$) lowers and KV3 lowers, such a problem occurs that KV fluctuation becomes large. In order to solve such a problem, it is necessary to increase or decrease the capacitance value of the series capacitor of CV2 and CM2 simultaneously with CM1. This is realized by increasing or decreasing CM2 and CM1 simultaneously. That is, by increasing the capacitance value of CM2 according to increase of CM1 and performing adjustment such that the capacitance value of the series capacitor of CV2 and CM2 reaches point D, point C, point B and point A, $L_{1eff}$ can be made constant regardless of the capacitance values of the capacitor bank CM1 and the capacitor bank CM2, so that fluctuation of KV can be suppressed. Further, by increases $L_{1eff}$ according to lowering of the frequency or suppressing lowering of $L_{1eff}$ due to lowering of the frequency, fluctuation of KV can be suppressed.

By using the LC resonant circuit according to the ninth embodiment in an oscillator, an oscillator where fluctuation of the frequency conversion gain KV to the capacitance value of the capacitor bank can be reduced, the frequency variable range is wide, and deterioration of phase noise is reduced can be provided. As a result, when the oscillator is used with a charge pump type PLL circuit, it is possible to suppress increase of charge pump current and to reduce consumption current in the whole of the PLL circuit.

Tenth Embodiment

Figure 16:
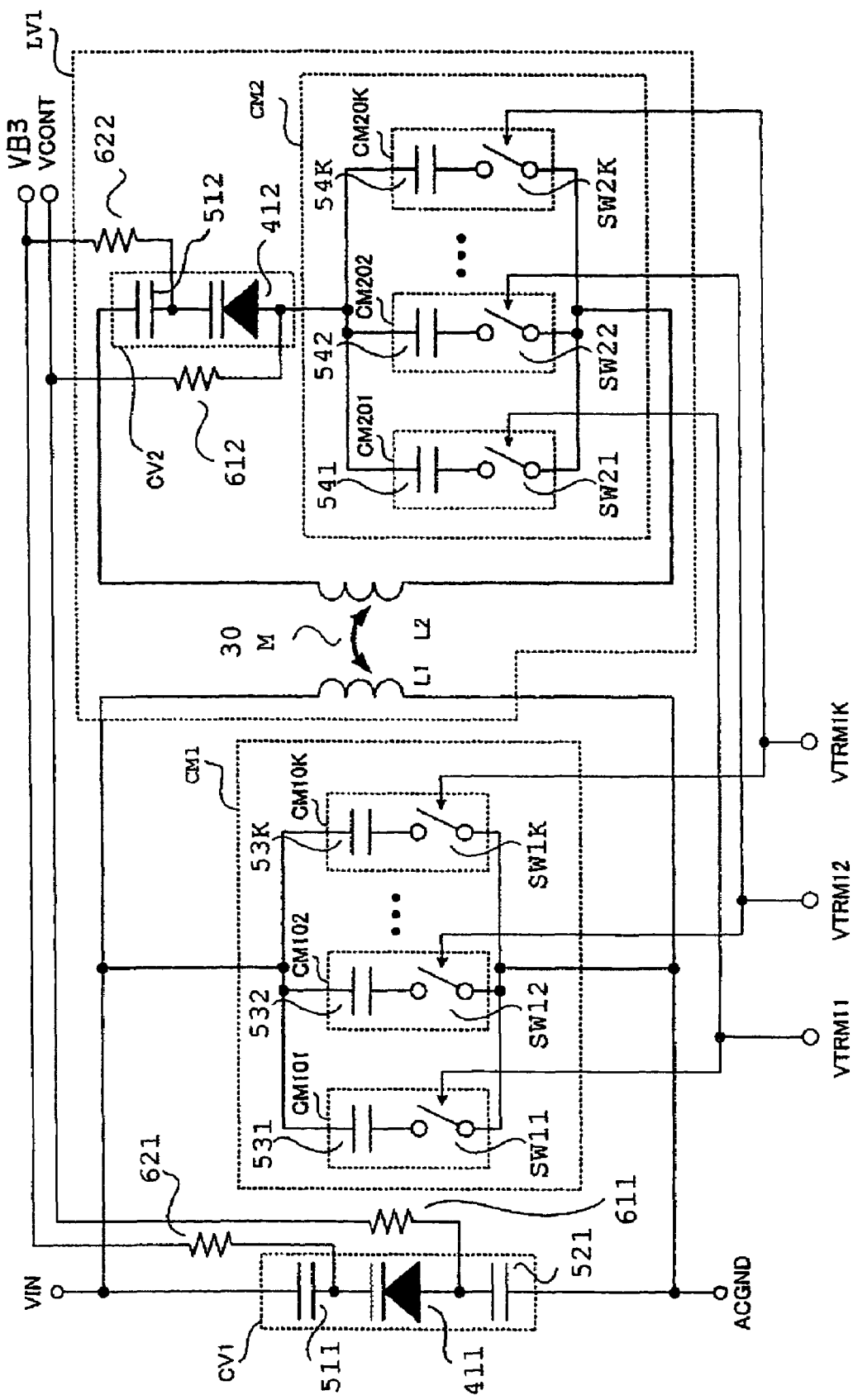
FIG. 16 is a circuit (configuration) diagram for explaining an LC resonant circuit according to a tenth embodiment of the present invention.

FIG. 16 shows an LC resonant circuit according to a tenth embodiment of the present invention. In the LC resonant circuit, the fine adjustable capacitors CV1 and CV2 in the eighth and ninth embodiments are composed of semiconductor p-n junction capacitors 411 and 412. Respective trimming capacitors CM101 to CM10K and CM201 to CM20K are composed of K fixed capacitors 531 to 53K and K fixed capacitors 541 to 54K based upon MIM capacitors that are formed between metal layers through an insulating layer in a semiconductor device and switches SW11 to SW1K and SW21 to SW2K connected to the capacitors in series. The capacitance value is continuously controlled by controlling a voltage applied across the p-n junction capacitor 411 so that the resonant frequency of the LC resonant circuit can be controlled continuously.

Since switching between a large capacitance value and a small capacitance value can be performed by opening or closing the switches, the resonant frequency of the LC resonant circuit can be changed stepwise. A variable capacitor can be realized by using a MOS transistor as the switch in order to obtain a low parasitic resistance and perform switching of a gate-source voltage of the MOS transistor on reaching a threshold voltage. In this case, since capacitance between the gate of the MOS transistor and the substrate or parasitic capacitance between the metal layer of the MIM capacitor and the substrate or the like is present, the capacitance value does not become zero even while the switch is being opened so that slight capacitance remains. However, since the MIM capacitor formed on the semiconductor device has high quality factor and high design precision, it is preferable that the MIM capacitor is used in the capacitor bank in the LC resonant circuit used in the oscillator. A terminal VIN at one end of the LC resonant circuit shown in FIG. 16 is inputted with an AC signal, and a terminal ACGND at the other end is grounded in an AC manner.

In FIG. 16, reference numerals 511, 512, and 521 denote capacitors for blocking direct current, and reference numerals 611, 612, 621, and 622 denote resistors for blocking leakage of high frequency. A fixed bias voltage is applied to a terminal VB3 and the control voltage $V_{CONT}$ is applied to the terminal VCONT. Incidentally, the inductor L1, the p-n junction capacitors, the MIM capacitor, the switch, and peripheral elements can be formed in the same or one semiconductor device in an integrating manner.

By using the LC resonant circuit according to the embodiment in an oscillator, an oscillator where fluctuation of the frequency conversion gain KV to the capacitance value of the capacitor bank can be reduced, the frequency variable range is wide, and deterioration of phase noise is reduced can be provided. As a result, when the oscillator is used with a charge pump type PLL circuit, it is possible to suppress increase of charge pump current and to reduce consumption current in the whole of the PLL circuit.

Eleventh Embodiment

Figure 17:
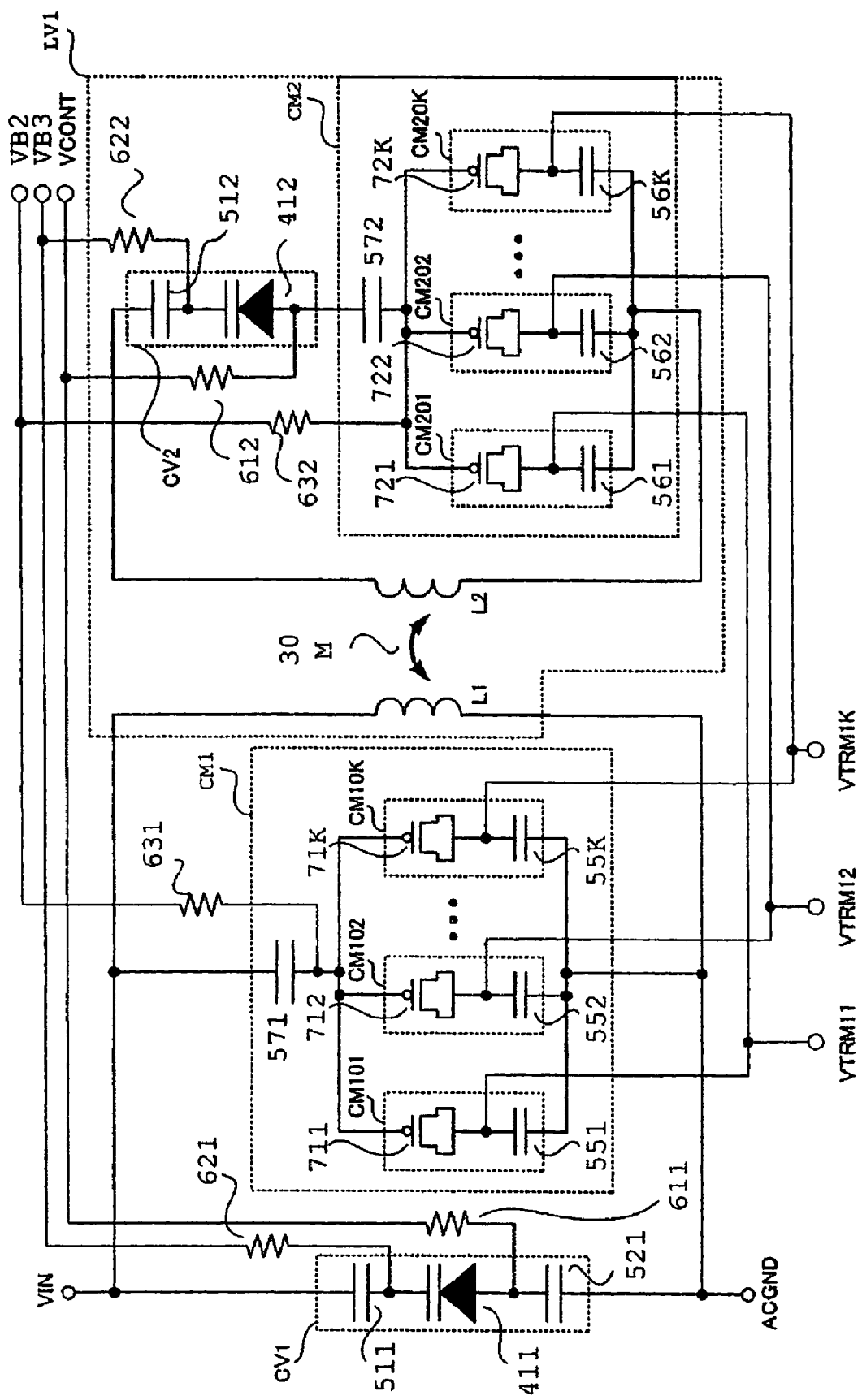
FIG. 17 is a circuit (configuration) diagram for explaining an LC resonant circuit according to an eleventh embodiment of the present invention.

FIG. 17 shows an LC resonant circuit according to an eleventh embodiment of the present invention. In the LC resonant circuit, the fine adjustable capacitors CV1 and CV2 in the eighth to ninth embodiment are composed of semiconductor p-n junction capacitors 411 and 412. Respective trimming capacitors 711 to 71K and 721 to 72K of the capacitor banks CM1 and CM2 are composed of MOS capacitors using gate capacitors of MOS transistors. The capacitance value of the LC resonator is continuously controlled by controlling voltages applied across the p-n junction capacitor 411, so that the resonant frequency of the LC resonant circuit is controlled continuously. Switching between accumulation state and inversion state of the MOS transistors is performed by controlling voltages between the gates and the sources/drains of the MOS capacitors CM101 to CM10K and CM201 to CM20K so that the capacitance value is controlled between two values and the resonant frequency of the LC resonant circuit is controlled stepwise. A terminal VIN at one end of the LC resonant circuit shown in FIG. 17 is inputted with an AC signal, and a terminal ACGND at the other end is grounded in an AC manner.

In FIG. 17, reference numerals 511, 512, 521, 571, 572, 551 to 55K, and 561 to 56K denote capacitors for blocking direct current, and reference numerals 611, 612, 621, and 622 denote resistors for blocking leakage of high frequency. A fixed bias voltage is applied to a terminal VB3, and the control voltage is applied to the terminal VCONT. A fixed bias voltage is applied to a terminal VB2 and the control voltage is applied to terminals VTRM11 to VTRM1K. Incidentally, the inductors L1 and L2, the p-n junction capacitors, the MOS capacitors, and peripheral elements can be formed on the same or one semiconductor device in an integrating manner.

Since the MOS capacitor formed on the semiconductor device has a capacitance value per unit area larger than that of the MIM capacitor, an area of the LC resonant circuit can be reduced. Accordingly, by configuring respective trimming capacitors in the capacitor banks in the fifth embodiment using the MOS capacitors 711 to 71K and 721 to 72K, as shown in FIG. 17, a preferred LC resonant circuit where KV fluctuation is reduced can be realized.

Twelfth Embodiment

Figure 18:
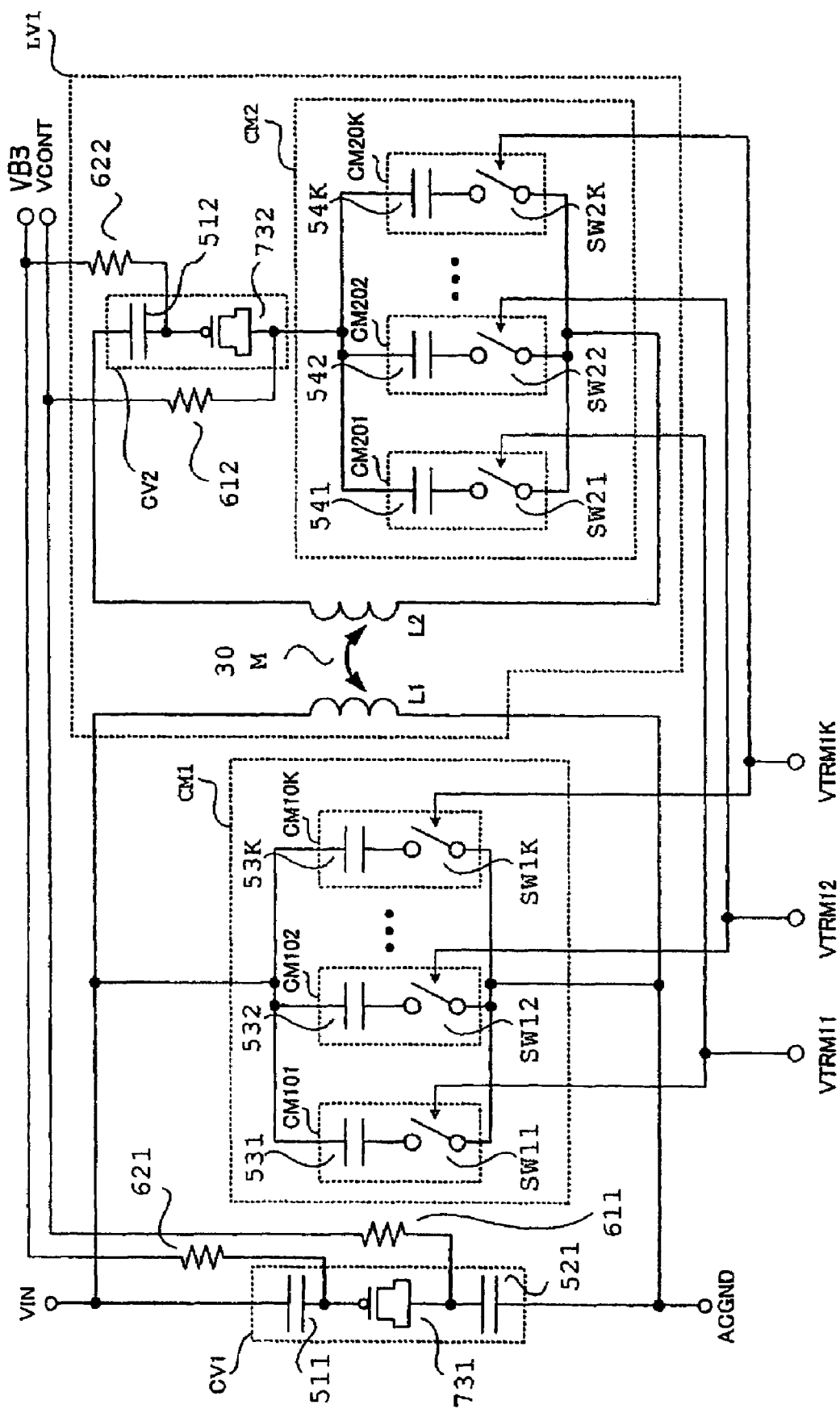
FIG. 18 is a circuit (configuration) diagram for explaining an LC resonant circuit according to a twelfth embodiment of the present invention.

FIG. 18 shows an LC resonant circuit according to a twelfth embodiment of the present invention. In the LC resonant circuit, the fine adjustable capacitors CV1 and CV2 in the eighth and ninth embodiments are composed of MOS capacitors 731 and 732 using gate capacitors of MOS transistors. Respective trimming capacitors CM101 to CM10K and CM201 to CM20K are composed of K fixed capacitors 531 to 53K and K fixed capacitors 541 to 54K based upon MIM capacitors formed between metal layers via an insulating layer in a semiconductor device, and switches SW11 to SW1K and SW21 to SW2K connected to the respective fixed capacitors in series. The capacitance value is controlled continuously by controlling voltages between gates and sources/drains of the MOS capacitors 731 and 732, so that the resonant frequency of the LC resonant circuit can be controlled continuously. Since the capacitance value changing rate of the MOS capacitor is higher than that of the p-n junction capacitor, a wide frequency variable range can be realized by using the MOS capacitor as the fine adjustable capacitor, which is desirable. A terminal VIN at one end of the LC resonant circuit shown in FIG. 18 is inputted with an AC signal, and a terminal ACGND at the other end is grounded in an AC manner.

In FIG. 18, reference numerals 511, 512, and 521 denote capacitor for blocking direct current, and reference numerals 611, 612, 621, and 622 denote resistors for blocking leakage of high frequency. A fixed bias voltage is applied to a terminal VB3 and the control voltage is applied to the terminal VCONT. Incidentally, the inductor L1, the MOS capacitors, the MIM capacitors, the switches, and peripheral elements can be formed in the same or one semiconductor device in an integrating manner.

Thirteenth Embodiment

Figure 19:
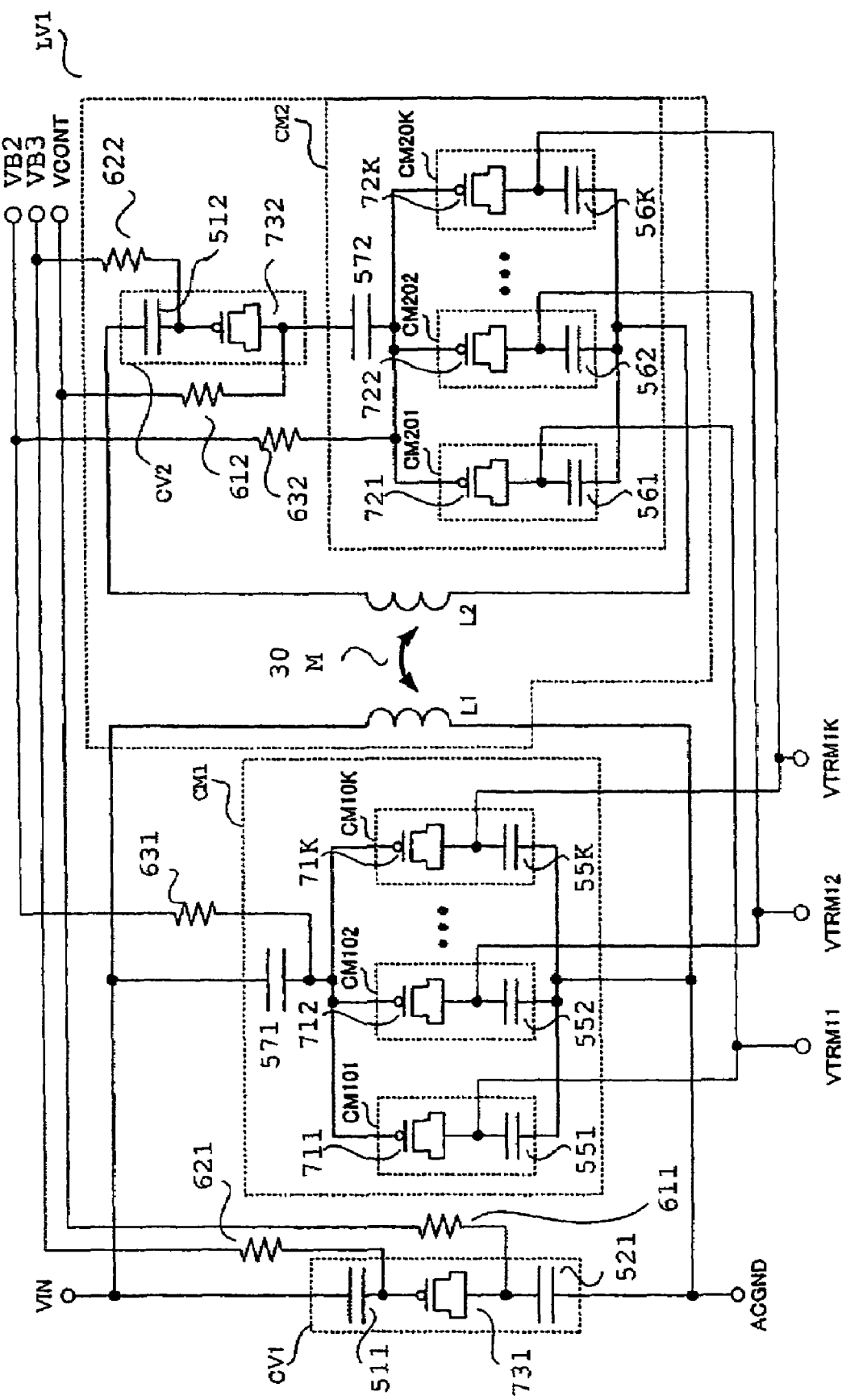
FIG. 19 is a circuit (configuration) diagram for explaining an LC resonant circuit according to a thirteenth embodiment of the present invention.

FIG. 19 shows an LC resonant circuit according to a thirteenth embodiment of the present invention. In the LC resonant circuit, the fine adjustable capacitors CV1 and CV2 in the seventh and eighth embodiments are composed of MOS capacitors using gate capacitors of MOS transistors. Respective trimming capacitors CM101 to CM10K and CM201 to CM20K in the capacitor banks CM1 and CM2 are also composed of MOS capacitors using gate capacitors of MOS transistors. The capacitance value is controlled continuously by controlling voltages between gates and sources/drains of the MOS capacitors 731 and 732, so that the resonant frequency of the LC resonant circuit can be controlled continuously. Switching between accumulation state and inversion state of the MOS transistors is performed by controlling voltages between the gates and the sources/drains of the MOS capacitors 711 to 71K and 721 to 72K so that the capacitance value is controlled between two values and the resonant frequency of the LC resonant circuit is controlled stepwise. Since the MOS capacitor formed on the semiconductor device has a capacitance value per unit area larger than that of the MIM capacitor, an area of the LC resonant circuit can be reduced.

Accordingly, by configuring respective variable capacitors in the seventh embodiment using the MOS capacitors 711 to 71K and 721 to 72K, as shown in FIG. 19, a preferred LC resonant circuit can be realized. A terminal VIN at one end of the LC resonant circuit shown in FIG. 19 is inputted with an AC signal, and a terminal ACGND at the other end thereof is grounded in an AC manner.

In FIG. 19, reference numerals 511, 512, 521, 571, 572, 551 to 55K, and 561 to 56K denote capacitors for blocking direct current, and reference numerals 611, 612, 621, and 622 denote resistors for blocking leakage of high frequency. A fixed bias voltage is applied to the terminal VB3, and the control voltage is applied to the terminal VCONT. A fixed bias voltage is applied to the terminal VB2 and the control voltage is applied to the terminals VTRM11 to VTRM1K. Incidentally, the inductor L1, the MOS capacitors, and peripheral elements can be formed in the same or one semiconductor device in an integrating manner.

Fourteenth Embodiment

Figure 20:
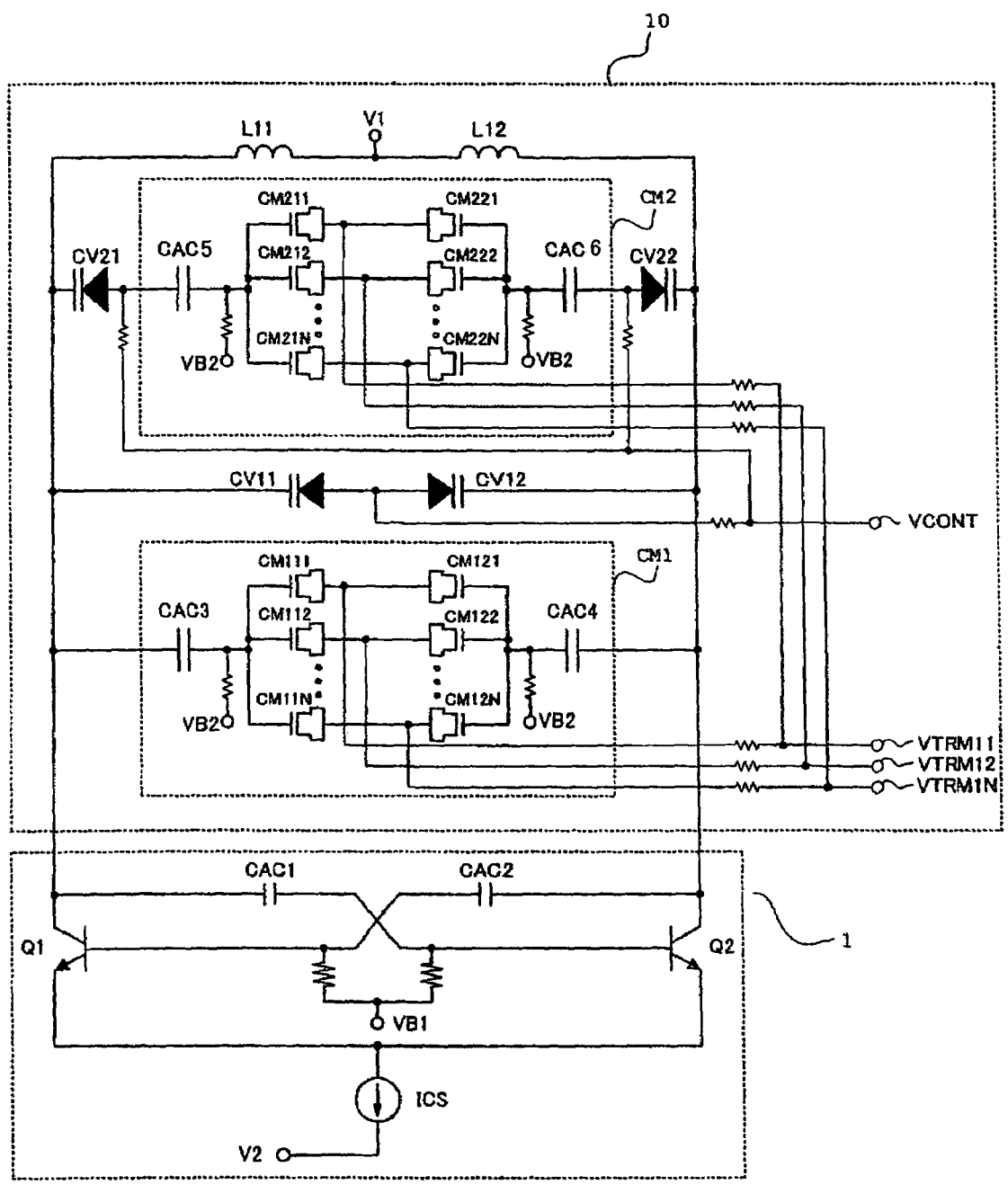
FIG. 20 is a circuit (configuration) diagram for explaining an oscillator according to a fourteenth embodiment of the present invention.

FIG. 20 shows an oscillator according to a fourteenth embodiment of the present invention. The oscillator according to the fourteenth embodiment includes an LC resonant circuit 10 and a negative conductance generating circuit 1. The LC resonant circuit 10 includes inductors L11 and L12 whose one ends are connected to a constant voltage terminal V1, p-n junction capacitors CV11 and CV12 connected to the other ends of the inductors L11 and L12 in parallel, a capacitor bank CM1 composed of MOS capacitors CM111 to CM11N and CM121 to CM12N (N is a positive integer) connected to the other ends of the inductors L11 and L12 in parallel via coupling capacitors CAC3 and CAC4, and a capacitor bank CM2 composed of MOS capacitors CM211 to CM21N and CM221 to CM22N connected to the other ends of the inductors L11 and L12 in parallel via variable capacitance elements CV21 and CV22 that are variable capacitance diodes or the like, and coupling capacitors CAC5 and CAC6.

CV21 and CV22, CAC5 and CAC6, CM211 to CM21N, and CM221 to CM22N are respectively connected in series, and CV11 and CV12 are connected to CM111 to CM11N and CM121 to CM12N (N is a positive integer) in parallel. A fixed bias voltage is applied to a terminal VB2 and control voltages are applied to terminals VTRM11 to VTRM1N.

The negative conductance generating circuit 1 is composed of bipolar transistors Q1 and Q2 of a differential pair whose emitter are common and are connected to a second constant voltage terminal V2 via a constant power source ICS, a capacitor CAC1 whose one end is connected to the collector of the transistor Q1 and whose other end is connected to the base of the transistor Q2, and a capacitor CAC2 whose one end is connected to the collector of the transistor Q2 and whose other end is connected to the base of the transistor Q1. The collectors of the transistor Q1 and the transistor Q2 are connected to the LC resonant circuit 10, and they are supplied with power from the constant voltage terminals V1 and V2 and are supplied with fixed bias voltages from the terminal VB1. The magnitude of KV can be controlled by the above-described configuration, so that fluctuation of KV can be suppressed.

An operation of the oscillator shown in FIG. 20 will be explained.

Since a frequency control voltage $V_{CONT}$ is applied to the frequency control terminal VCONT of the variable capacitor elements CV11, CV12, CV21, and CV22, an oscillation frequency is continuously controlled by the frequency control voltage $V_{CONT}$. Terminals for frequency control of the capacitor banks CM1 and CM2 are connected to common control terminals VTRM11 to VTRM1N, and they are respectively applied with one of two values taken by the frequency control voltage. Thereby, the oscillation frequency is controlled step-wise.

Figure 21:
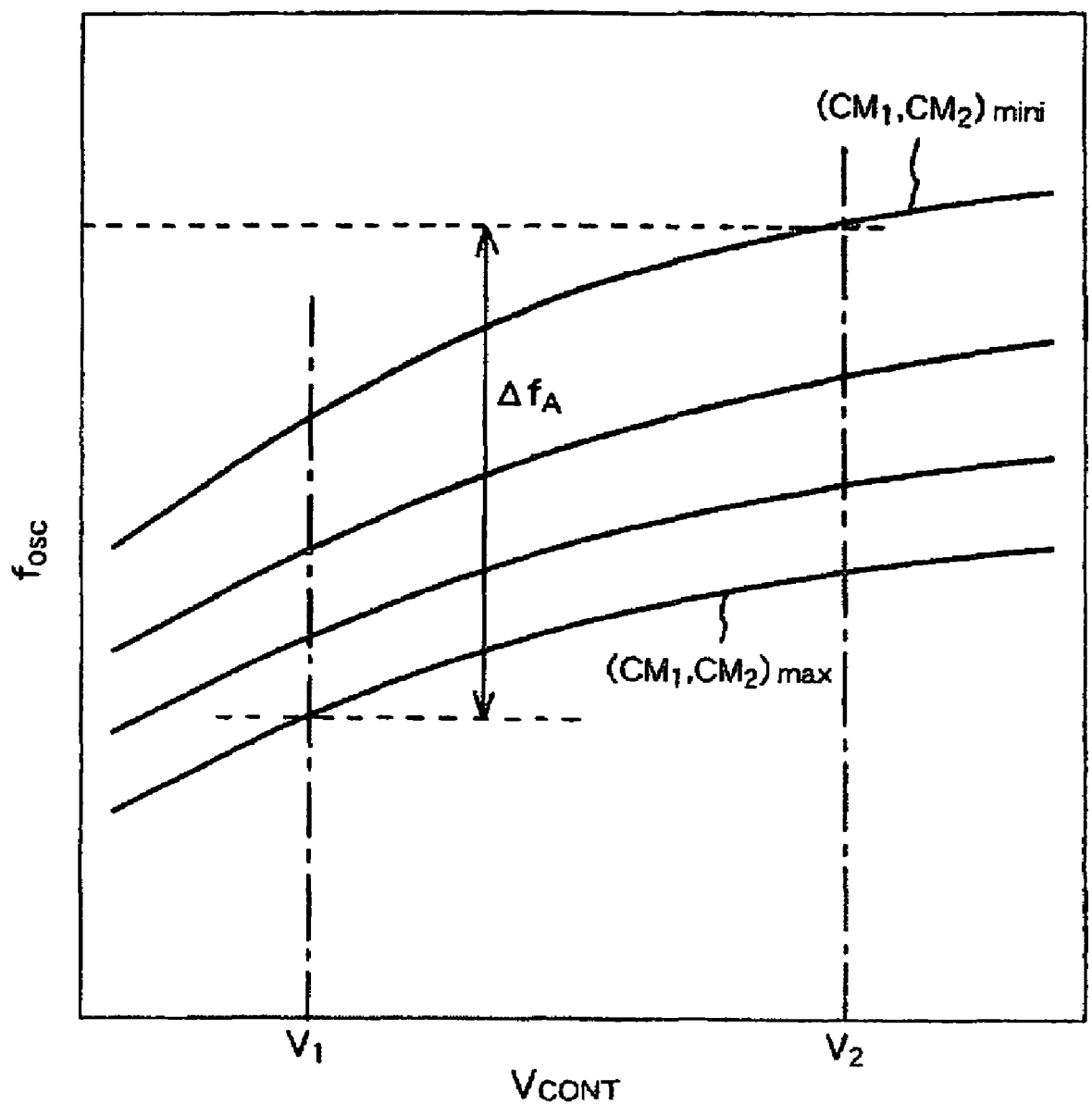
FIG. 21 is a curve diagram for explaining control voltage dependency of an oscillation frequency in the oscillator according to the fourteenth embodiment of the present invention.
Figure 22:
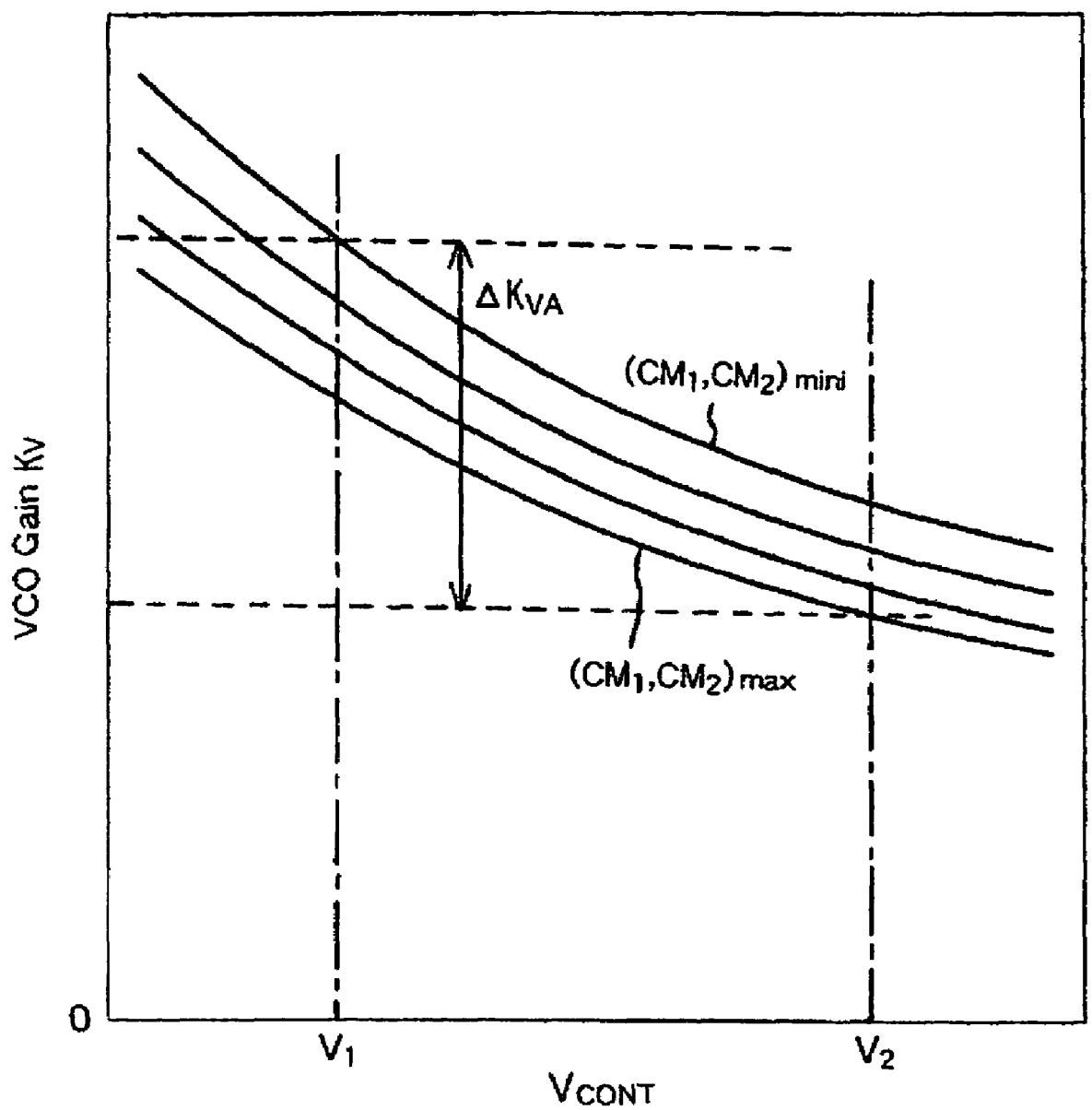
FIG. 22 is a curve diagram for explaining control voltage dependency of a frequency conversion gain according to the fourteenth embodiment.

FIG. 21 is a graph showing control characteristic of oscillation frequency where the number of trimming capacitors configuring a capacitor bank in the oscillator shown in FIG. 20 is 2 (N=2) and FIG. 22 is a graph showing characteristic of KV thereof.

Figure 46:
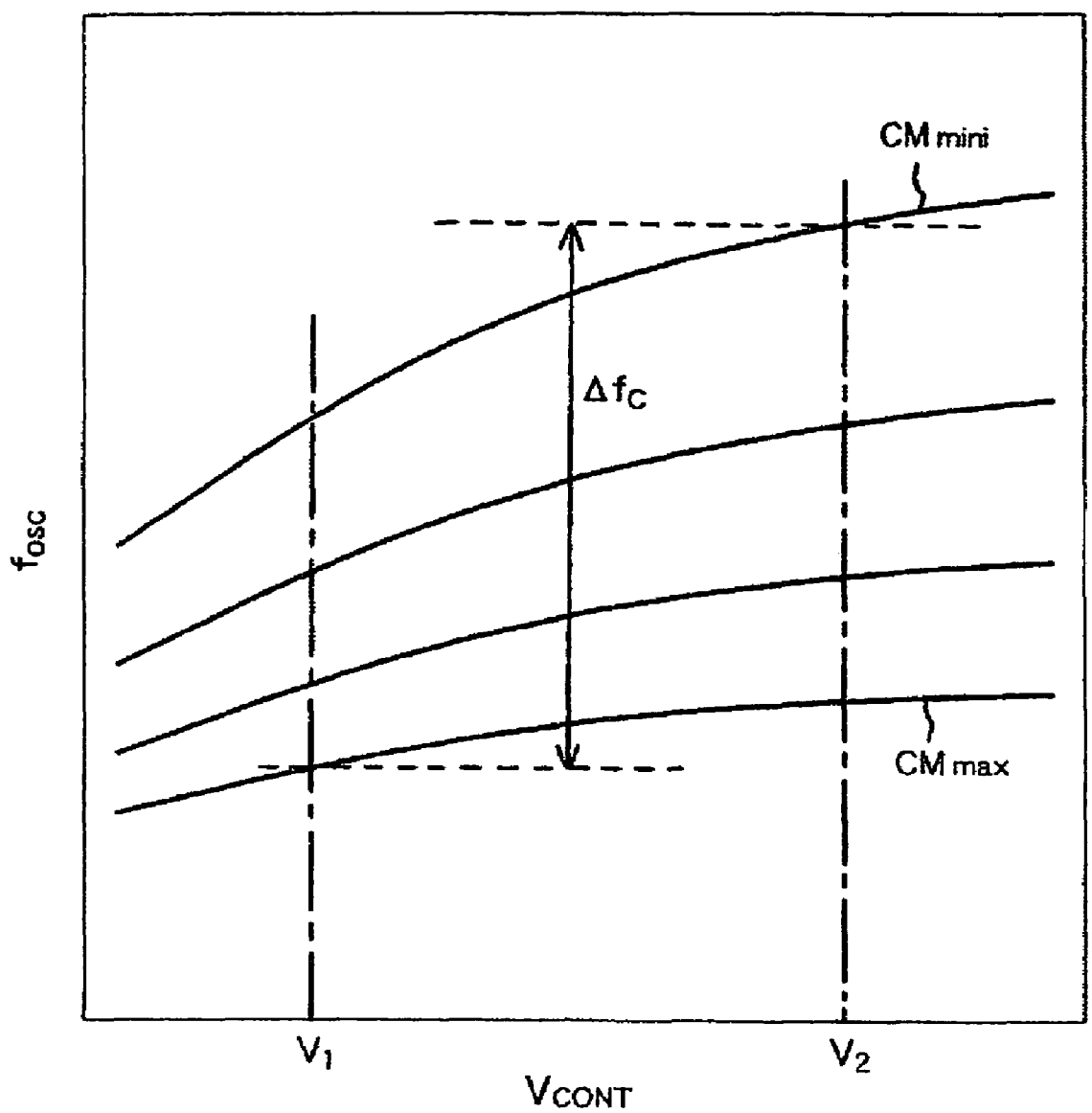
FIG. 46 is a curve diagram for explaining control voltage dependency of an oscillation frequency of the conventional oscillator.

As shown in FIG. 21, a frequency variable range $\Delta f_A$ can be realized in a variable range ($V_1$-$V_2$) of the control voltage $V_{CONT}$ based upon the maximum capacitance value ($C_{M1}$, $C_{M2}$) max and the minimum capacitance value ($C_{M1}$, $C_{M2}$) mini of the trimming capacitor. The range $\Delta f_A$ is slightly smaller than the frequency variable range $\Delta f_C$ in the variable range ($V_1$-$V_2$) of the control voltage $V_{CONT}$ shown in FIG. 46.

Figure 47:
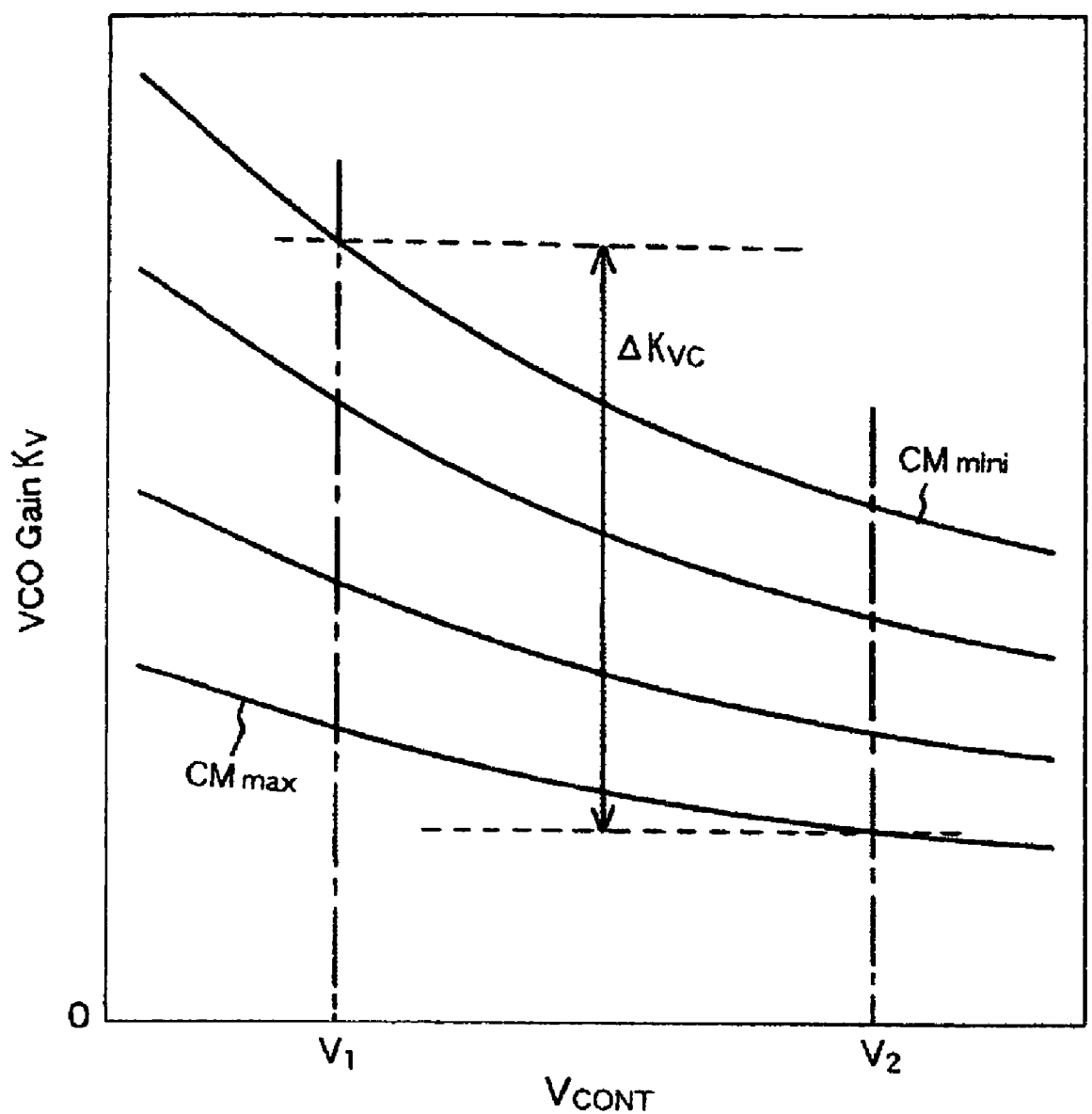
FIG. 47 is a curve diagram for explaining control voltage dependency of a frequency conversion gain of the conventional oscillator.
Figure 48:
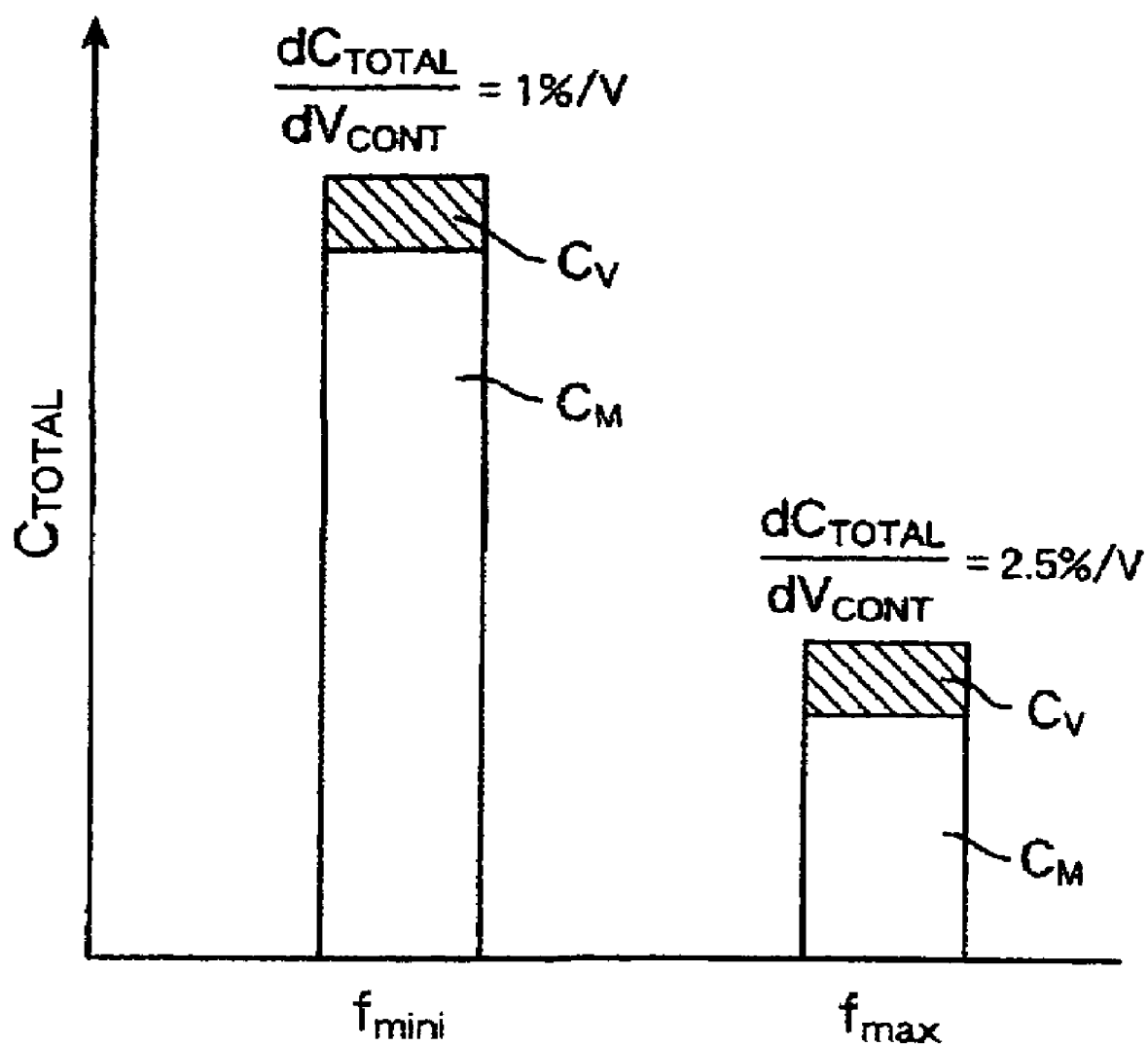
FIG. 48 is a diagram showing a relationship between a ratio of a total capacitance value of an LC resonant type voltage-controlled oscillator (LC-VCO) and total capacitance (=capacitance of a capacitor bank+fine adjustment capacitance) of a resonant circuit in the oscillator shown in FIG. 45.

Next, FIG. 22 is a graph showing a relationship between the control voltage $V_{CONT}$ and the frequency conversion gain (KV) of the oscillator shown in FIG. 20. As shown in FIG. 22, the frequency conversion gain (KV) to the maximum capacitance value ($C_{M1}$, $C_{M2}$) max and the minimum capacitance value ($C_{M1}$, $C_{M2}$) mini of the trimming capacitor fluctuates in the variable range (V1-V2) of the control voltage $V_{CONT}$ by $\Delta K_{VA}$. The $\Delta K_{VA}$ has a fluctuation width considerably smaller than $\Delta K_{VC}$ shown in FIG. 47.

This is because an occupation ratio of the capacitor values of the fine adjustable capacitors CV11 and CV12 to the total capacitance lowers according to increase of the capacitance value of the capacitor bank $C_{M1}$ in the oscillator according to the fourteenth embodiment but the capacitance value of the series capacitors of CV21, CV22, and CM2 becomes large according to increase of the capacitance value of the capacitor bank CM2.

Therefore, the frequency variable range $\Delta f_A$ is slightly smaller than that in the conventional oscillator, but a fluctuation $\Delta f_{VA}$ of $K_V$ can be suppressed. That is, fluctuation of KV becomes small or KV can be made constant in the oscillator according to the fourteenth embodiment.

The oscillator according to the fourteenth embodiment may be an oscillator that can sufficiently endure practical use in a frequency synthesizer used in, for example, RF-IC for WCDMA requiring a wide frequency range of 3.2 GHz to 4.3 GHz for multi-band response or the like. As a result, when the oscillator is used with a charge pump type PLL circuit, it is possible to suppress increase of charge pump current and to reduce consumption current in the whole of the PLL circuit.

Fifteenth Embodiment

Figure 23:
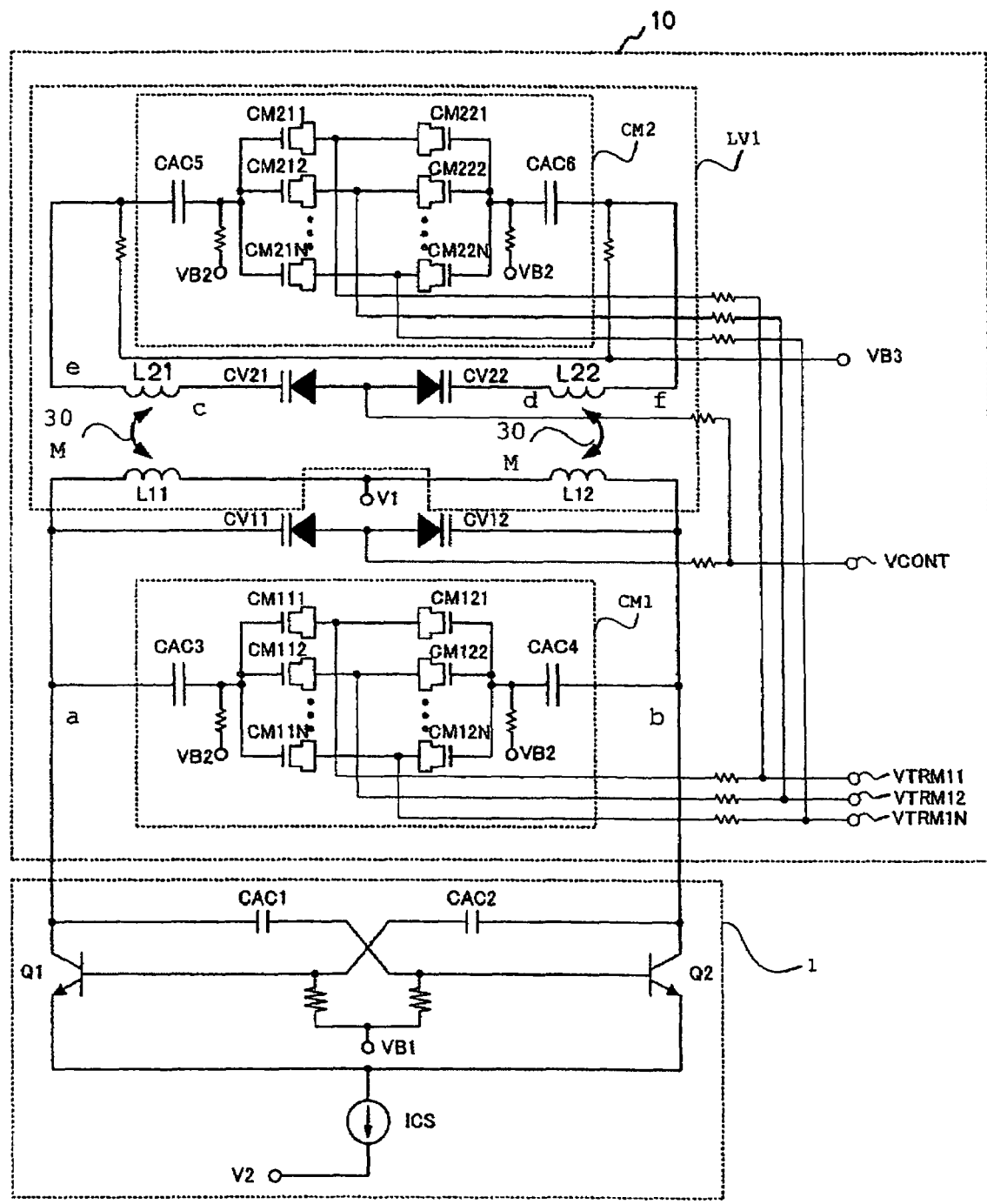
FIG. 23 is a circuit (configuration) diagram for explaining an oscillator according to a fifteenth embodiment of the present invention.

FIG. 23 shows an oscillator according to a fifteenth embodiment of the present invention. The oscillator according to the fifteenth embodiment includes an LC resonant circuit 10 and a negative conductance generating circuit 1. The LC resonant circuit 10 includes inductors L11 and L12 whose one ends are connected to a constant voltage terminal V1, a capacitor bank CM1 composed of MOS capacitors CM111 to CM11N and CM121 to CM12N (N is a positive integer) connected to PN junction capacitors CV11 and CV12 connected to the other ends of the inductors L11 and L12 in parallel via coupling capacitors CAC3 and CAC4, an inductor L21 and an inductor L22 that are magnetically coupled to inductors L11 and L12 respectively via mutual inductance M, PN junction capacitors CV21 and CV22 that are respectively connected to one ends of the inductors L21 and L22, and a capacitor bank CM2 composed of MOS capacitors CM211 to CM21N and CM221 to CM22N connected to the other ends of the inductor L21 and the inductor L22 via coupling capacitors CAC5 and CAC6 in series. A fixed bias voltage is applied to a terminal VB2, and control voltages are applied to terminals VTRM11 to VTRM1N.

The negative conductance generating circuit 1 is composed of bipolar transistors Q1 and Q2 of a differential pair whose emitters are common and are connected to a second constant voltage terminal V2 via a constant current source ICS, a capacitor CAC1 whose one end is connected to the collector of the transistor Q1 and whose other end is connected to the base of the transistor Q2, and a capacitor CAC2 whose one end is connected to the collector of the transistor Q2 and whose other end is connected to the base of the transistor Q1. The collectors of the transistor Q1 and the transistor Q2 are connected to the LC resonant circuit 10, they are supplied with power from the constant voltage terminals V1 and V2 and are supplied with fixed bias voltages from the terminal VB1. The magnitude of KV can be controlled by the above-described configuration, so that fluctuation of KV can be suppressed.

An operation of the oscillator shown in FIG. 23 will be explained.

Since a frequency control voltage is applied to the frequency control terminal VCONT of the variable capacitor elements CV11, CV12, CV21, and CV22, an oscillation frequency is continuously controlled by the frequency control voltage. Terminals for frequency control of the capacitor banks CM1 and CM2 are connected to common control terminals VTRM11 to VTRM1N, and they are respectively applied with frequency control voltage of two values. Thereby, the oscillation frequency is controlled stepwise.

Figure 45:
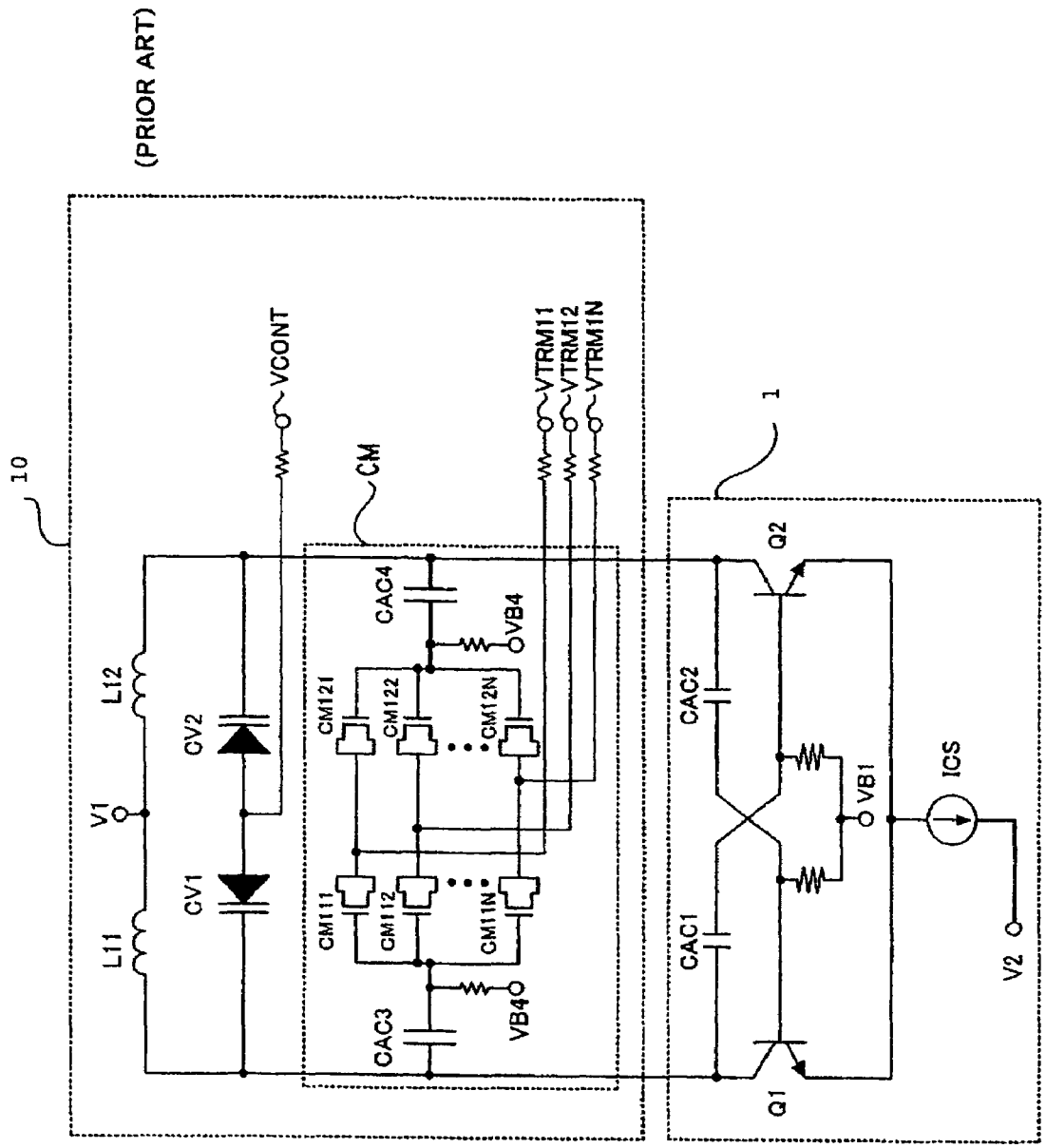
FIG. 45 is a circuit diagram for explaining a conventional oscillator.

An occupation ratio of the capacitor values of the fine adjustable capacitors CV11 and CV12 to the total capacitance lowers according to increase of the capacitance value of the capacitor bank CM1 in the oscillator according to the fifteenth embodiment but the capacitance value of the series capacitors of CV21, CV22, and CM2 becomes large according to increase of the capacitance value of the capacitor bank CM2 so that a changing rate of inductance of a variable inductor composed of L11, L12, L21, L22, CV21, CV22, and CM2 to $V_{CONT}$ becomes large. Therefore, fluctuation of KV becomes smaller than KV in the conventional oscillator shown in FIG. 45 or KV can be kept constant. As a result, when the oscillator is used with a charge pump type PLL circuit, it is possible to suppress increase of charge pump current and to reduce consumption current in the whole of the PLL circuit.

Figure 24:
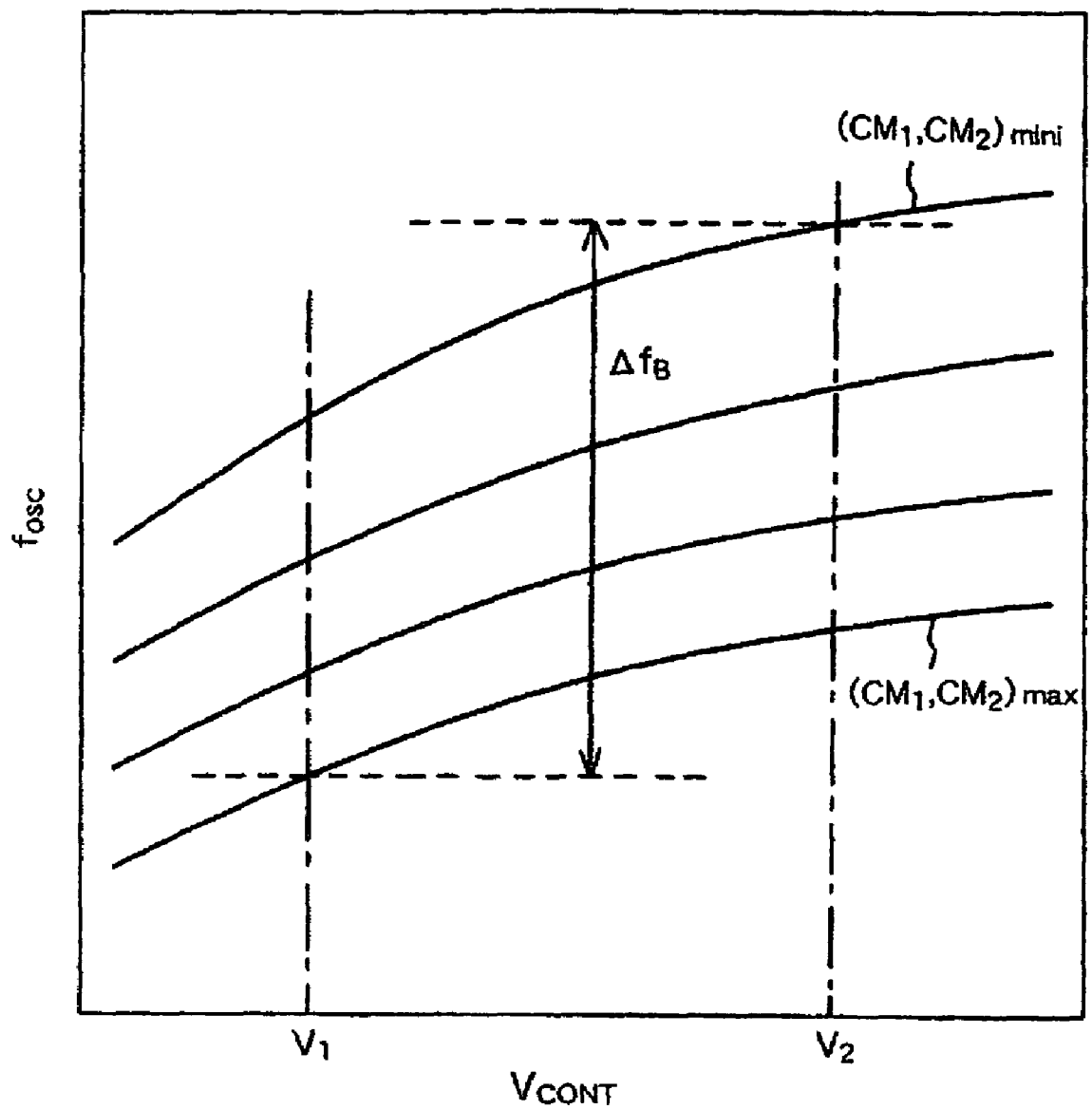
FIG. 24 is a curve diagram for explaining control voltage dependency of an oscillation frequency according to the fifteenth embodiment.
Figure 25:
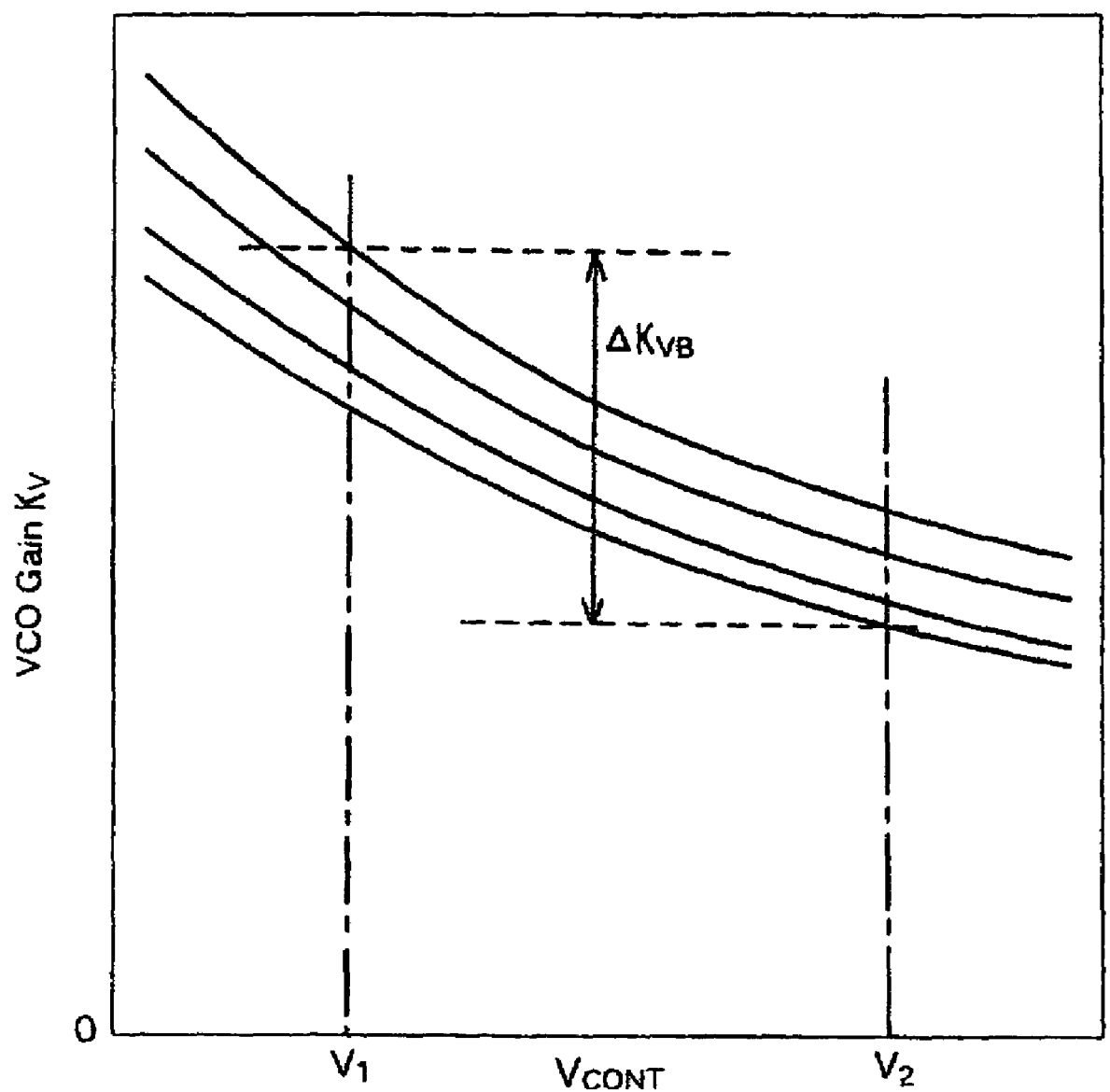
FIG. 25 is a curve diagram for explaining control voltage dependency of a frequency conversion gain according to the fifteenth embodiment.

FIG. 24 is a graph showing control characteristic of an oscillation frequency where the number of trimming capacitors configuring a capacitor bank in the oscillator shown in FIG. 23 is 2 (N=2) and FIG. 25 is a graph showing characteristic of KV thereof. Fluctuation of KV in the oscillator according to fifteenth embodiment can be suppressed as compared with that in the conventional oscillator shown in FIG. 45. Since the oscillator according to the fifteenth embodiment adopting the configuration shown in FIG. 23 takes a method for changing inductance, which is different from the oscillator having the configuration shown in FIG. 20, it is unnecessary to add extra capacitor to the resonant circuit for suppressing the KV fluctuation. Therefore, the fluctuation $\Delta K_{VB}$ of $K_V$ can be suppressed in the variable range $(V_1-V_2)$ of the control voltage $V_{CONT}$ without narrowing the frequency variable range $\Delta f_B$.

Sixteenth Embodiment

Figure 26:
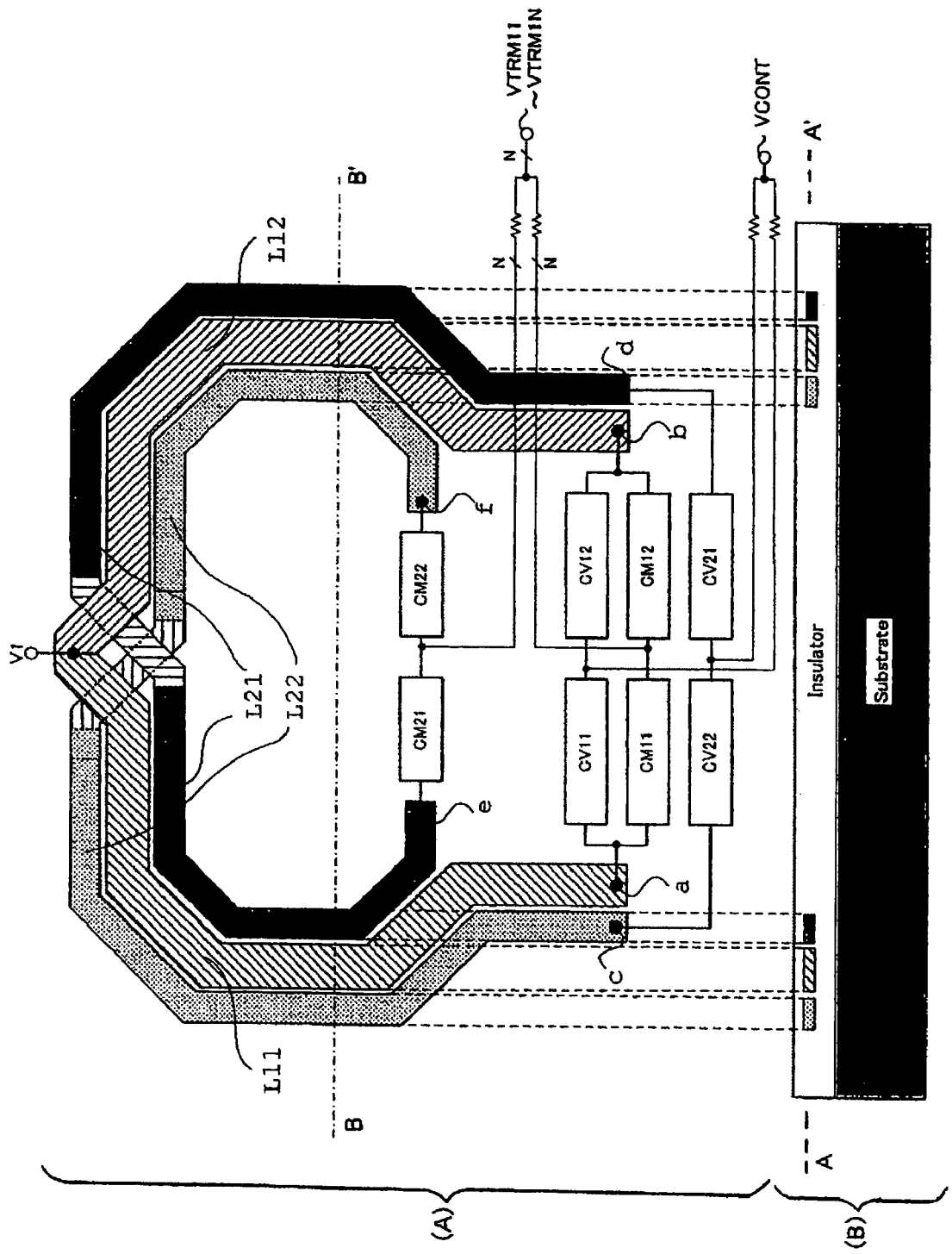
FIG. 26 is a diagram of the oscillator according to the fifteenth embodiment configured on a semiconductor device according to a sixteenth embodiment of the present invention.

FIG. 26 is a diagram showing one example of a semiconductor device where the oscillator according to the fifteenth embodiment has been configured on a semiconductor substrate as a sixteenth embodiment of the present invention. In FIG. 26, the A portion shows a B-B' cross section in a B portion, and the B portion shows an A-A' cross section in the A portion. Inductors L11 and L12 are composed of one winding of inductor whose midpoint is connected to a voltage terminal V1 in an insulator layer 22 formed on the semiconductor substrate 21, and inductors L21 and L22 are composed of one winding of inductor in the insulator layer. L21 and L22 are disposed adjacent to each other outside and outside the inductors L11 and L12, as shown in FIG. 26. Thereby, AC fluxes induced by causing a alternating current to flow in the inductors L11, L12, L21, and L22 interlink so that mutual inductances M act between the inductor L11 and the inductors L21 and L22, and between inductor L12 and the inductors L21 and L22.

Point "a" and "b" in FIG. 26 correspond to points "a" and "b" shown in FIG. 23 (similarly applied to FIG. 28, FIG. 30, and FIG. 32 described later), where a negative conductance generating circuit (NCG) is connected to the fine adjustable capacitor CV11, a capacitor bank CM11 and the fine adjustable capacitor CV12, and a capacitor bank CM12 through the points "a" and "b". Points "c" and "d" in FIG. 26 correspond to points "c" and "d" shown in FIG. 23 (similarly applied to FIG. 28, FIG. 30, and FIG. 32 described later), where the fine adjustable capacitors CV21 and CV22 are connected to the points "c" and "d". Points "e" and "f" in FIG. 26 correspond to points "e" and "f" shown in FIG. 23 (similarly applied to FIG. 28, FIG. 30, and FIG. 32 described later), where capacitor banks CM21 and CM22 are connected to the points "e" and "f". Portions (not shown in sectional view) of the inductors L11 and L12 positioned near the voltage terminal V1 shown in FIG. 26 are formed on insulating layers different in height so as not to contact with each other at a crossing point.

In the configuration shown in FIG. 26, the inductors L11 and L12 may be each composed of a spiral inductor of two or more windings. By making a wire for coil thick when one winding is adopted, resistance of an inductor made from metal is reduced so that the quality factor is raised. When an spiral inductor of two or more windings is used, since mutual inductance is added among a plurality of windings of inductors constituting the spiral inductors, so that inductance can be increased and the quality factor can be raised.

The inductors L21 and L22 may be also inductors of one winding, or they may be spiral inductors of two or more windings. By making a wire for coil thick when one winding is adopted, resistance of an inductor made from metal is reduced so that the quality factor is raised. When an spiral inductor of two or more windings is used, since mutual inductance is added among a plurality of windings of inductors constituting the spiral inductors, so that inductance can be increased and the quality factor can be raised. In addition, mutual inductances between the inductor L11 and the inductors L21 and L22 and between the inductor L12 and the inductors L21 and L22 can be increased and the changing amount of the effective inductance $L_{eff}$ can be made large.

Seventeenth Embodiment

Figure 27:
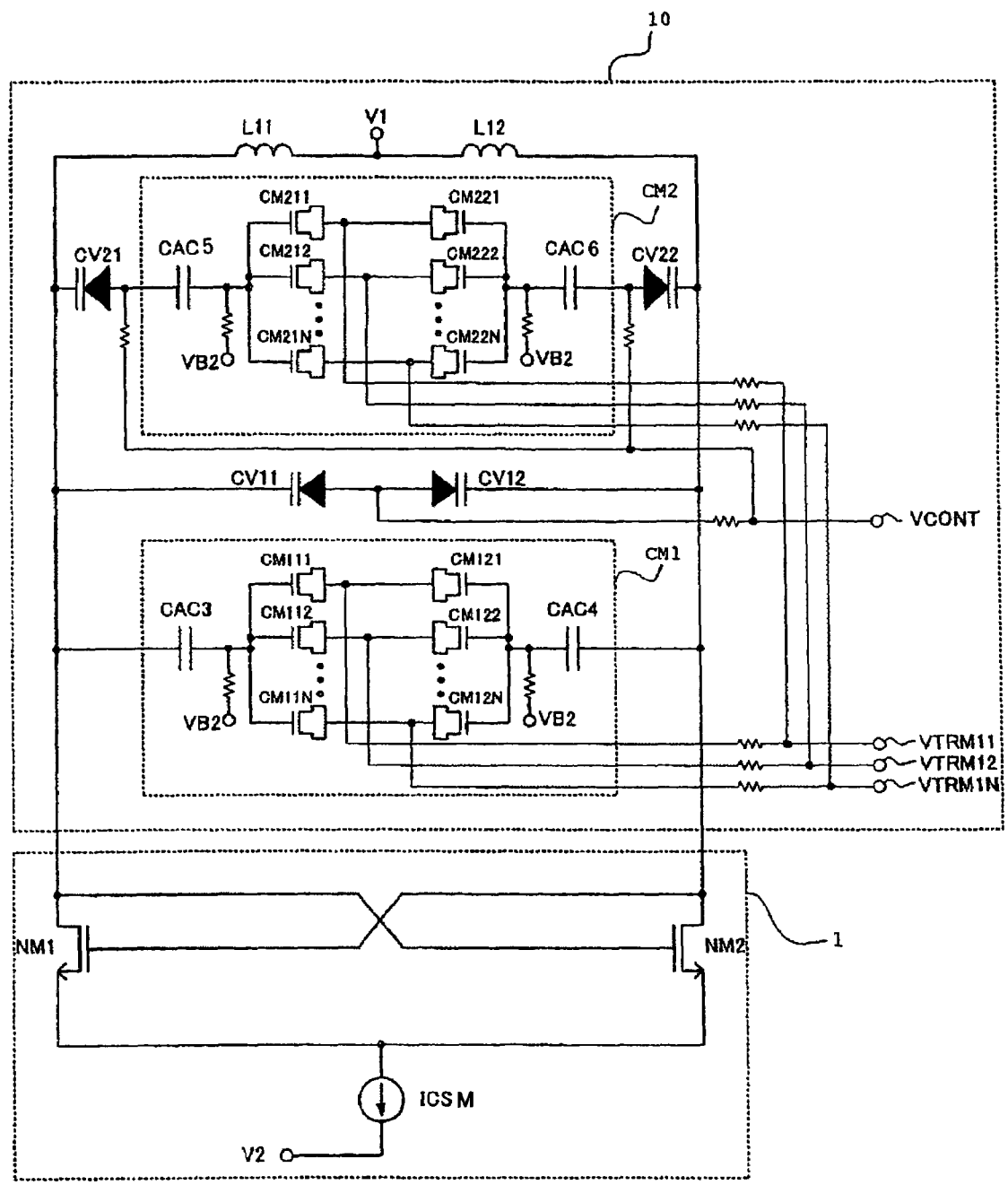
FIG. 27 is a circuit (configuration) diagram for explaining an oscillator according to a seventeenth embodiment of the present invention.

FIG. 27 shows an oscillator according to a seventeenth embodiment of the present invention. The seventeenth embodiment is one example of an oscillator using an LC resonant circuit 10 and a negative conductance generating circuit 1 like the fourteenth embodiment shown in FIG. 20, but MOS transistors are used instead of the bipolar transistors.

The oscillator according to the seventeenth embodiment includes the LC resonant circuit 10 and the negative conductance generating circuit 1. The LC resonant circuit 10 includes inductors L11 and L12 whose one ends are connected to a constant voltage terminal V1, PN junction capacitors CV11 and CV12 connected to the other ends of the inductors L11 and L12 in parallel, a capacitor bank CM1 composed of MOS capacitors CM111 to CM11N and CM121 to CM12N (N is a positive integer) connected to the other ends of the inductors L11 and L12 in parallel via coupling capacitors CAC3 and CAC4, and a capacitor bank CM2 composed of MOS capacitors CM211 to CM21N and CM221 to CM22N connected to the other ends of the inductors L11 and L12 in parallel via variable capacitance elements CV21 and CV22 that are variable capacitance diodes or the like and coupling capacitors CAC5 and CAC6. CV21 and CV22, CAC5 and CAC6, CM211 to CM21N, and CM221 to CM22N are respectively connected in series, and CV11 and CV12 are connected to CM111 to CM11N and CM121 to CM12N (N is a positive integer) in parallel. A fixed bias voltage is applied to a terminal VB2 and control voltages are applied to terminals VTRM11 to VTRM1N.

The negative conductance generating circuit 1 is composed of NMOS transistors NM1 and NM2 of a differential pair whose sources are common and are connected to a second constant voltage terminal V2 via a constant current source ICSM. The gate of the transistor NM1 is connected to the drain of the transistor NM2, while the gate of the transistor NM2 is connected to the drain of the transistor NM1. The drains of the transistor NM1 and the transistor NM2 are connected to the resonant circuit 10, and power is supplied to the circuit 1 from the constant voltage terminals V1 and V2. The magnitude of KV can be controlled by the above-described configuration, so that fluctuation of KV can be suppressed. Moreover, when the oscillator is used with a charge pump type PLL circuit, it is possible to suppress increase of charge pump current and to reduce consumption current in the whole of the PLL circuit.

Since the MOS transistors are used in the oscillator shown in FIG. 27, which is different from the oscillator shown in FIG. 20 where the bipolar transistors are used, the power source voltage can be reduced to about 2.5V when a threshold voltage Vth of the MOS transistor is 0.4V, for example, though the power source voltage required for operation of the oscillator shown in FIG. 20 is 3V.

Eighteenth Embodiment

Figure 28:
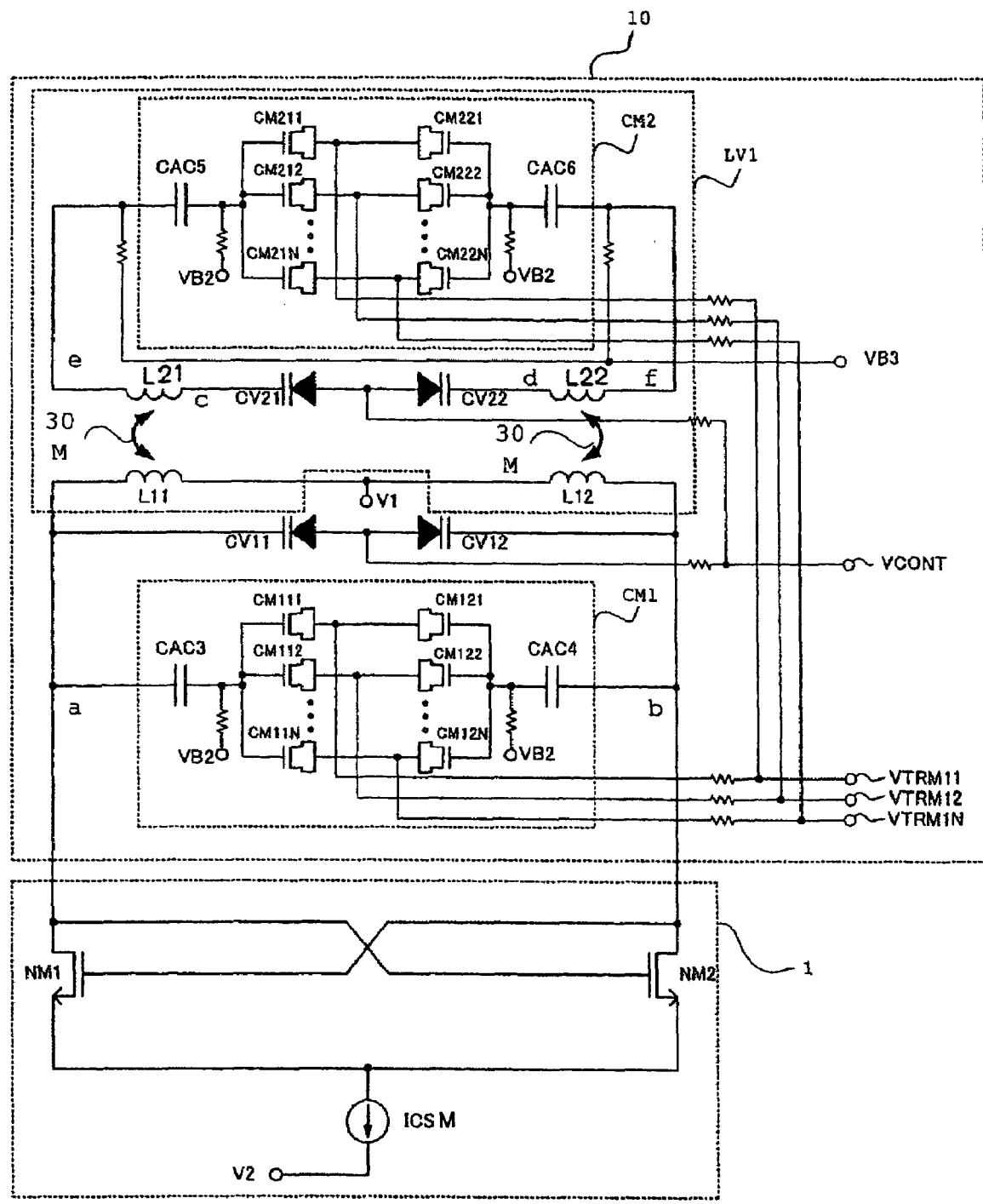
FIG. 28 is a circuit (configuration) diagram for explaining an oscillator according to an eighteenth embodiment of the present invention.

FIG. 28 shows an oscillator according to an eighteenth embodiment of the present invention. The eighteenth embodiment is one example of an oscillator using an LC resonant circuit 10 and a negative conductance generating circuit 1 like the fifteenth embodiment shown in FIG. 23, where MOS transistors are used instead of the bipolar transistors.

The oscillator according to the eighteenth embodiment includes the LC resonant circuit 10 and the negative conductance generating circuit 1. The LC resonant circuit 10 includes inductors L11 and L12 whose one ends are connected to a constant voltage terminal V1, PN junction capacitors CV11 and CV12 connected to the other ends of the inductors L11 and L12 in parallel, a capacitor bank CM1 composed of MOS capacitors CM111 to CM11N and CM121 to CM12N (N is a positive integer) connected to the other ends of the inductors L11 and L12 in parallel via coupling capacitors CAC3 and CAC4, inductors L21 and L22 magnetically coupled to inductors L11 and L12 via mutual inductances M, PN junction capacitors CV21 and CV22 connected to one ends of the inductor L21 and the inductor L22 in series, and a capacitor bank CM2 composed of MOS capacitors CM211 to CM21N and CM221 to CM22N connected to the other ends of the inductor L21 and the inductor L22 via coupling capacitors CAC5 and CAC6 in series. A fixed bias voltage is applied to a terminal VB2, and control voltages are applied to terminals VTRM11 to VTRM1N.

The negative conductance generating circuit 1 is composed of NMOS transistors NM1 and NM2 of a differential pair whose source are common and are connected to a second constant voltage terminal V2 via a constant current source ICSM. The gate of the transistor NM1 is connected to the drain of the transistor NM2, while the gate of the transistor NM2 is connected to the drain of the transistor NM1. The drains of the transistor NM1 and the transistor NM2 are connected to the resonant circuit 10, and power is supplied to the circuit 1 from the constant voltage terminals V1 and V2. The magnitude of KV can be controlled by the above-described configuration, so that fluctuation of KV can be suppressed. Moreover, when the oscillator is used with a charge pump type PLL circuit, it is possible to suppress increase of charge pump current and to reduce consumption current in the whole of the PLL circuit.

Since the MOS transistors are used in the oscillator shown in FIG. 28, which is different from the oscillator using the bipolar transistors shown in FIG. 23, the power source voltage can be reduced to about 2.5V when a threshold voltage Vth of the MOS transistor is 0.4V, for example, though the power source voltage required for operation of the oscillator shown in FIG. 20 is 3V.

Nineteenth Embodiment

Figure 29:
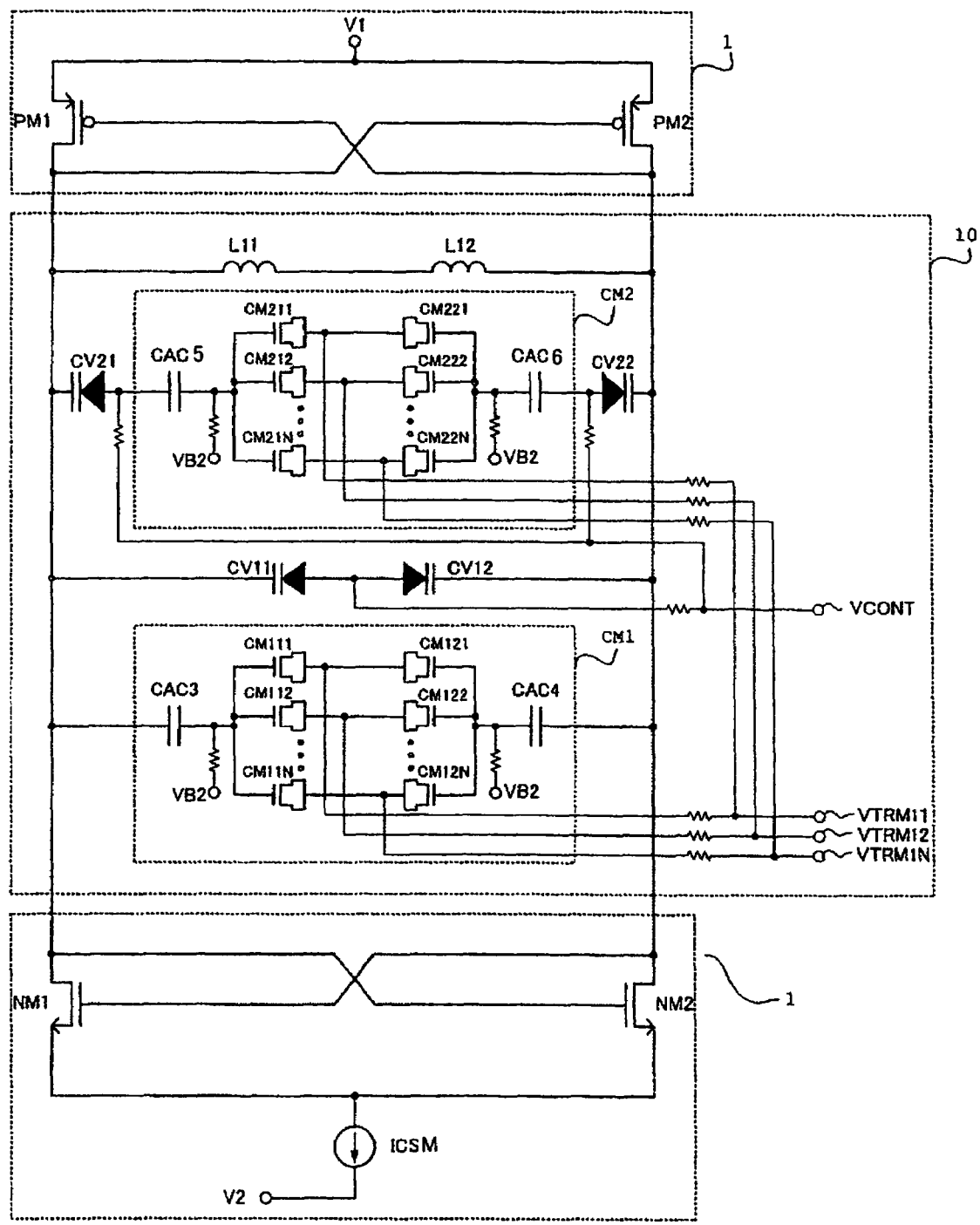
FIG. 29 is a circuit (configuration) diagram for explaining an oscillator according to a nineteenth embodiment of the present invention.

FIG. 29 shows an oscillator according to a nineteenth embodiment of the present invention. The nineteenth embodiment is one example of an oscillator using an LC resonant circuit 10 and negative conductance generating circuit 1 like the seventeenth embodiment shown in FIG. 27, where not only NMOS transistors but also PMOS transistors are used.

The oscillator according to the nineteenth embodiment includes the LC resonant circuit 10 and the negative conductance generating circuits 1. The LC resonant circuit 10 includes inductors L11 and L12 whose one ends are connected to each other, PN junction capacitors CV11 and CV12 connected to the other ends of the inductors L11 and L12 in parallel, a capacitor bank CM1 composed of MOS capacitors CM111 to CM11N and CM121 to CM12N (N is a positive integer) connected to the other ends of the inductors L11 and L12 in parallel via coupling capacitors CAC3 and CAC4, and a capacitor bank CM2 composed of MOS capacitors CM211 to CM21N and CM221 to CM22N connected to variable capacitance elements CV21 and CV22 that are variable capacitance diodes or the like via coupling capacitors CAC5 and CAC6. CV21 and CV22, CAC5 and CAC6, CM211 to CM21N, and CM221 to CM22N are respectively connected in series, and CV11 and CV12 are connected to CM111 to CM11N and CM121 to CM12N (N is a positive integer) in parallel. A fixed bias voltage is applied to a terminal VB2 and control voltages are applied to terminals VTRM11 to VTRM1N.

The negative conductance generating circuit 1 is composed of NMOS transistors NM1 and NM2 of a differential pair whose sources are common and are connected to a second constant voltage terminal V2 via a constant current source ICSM and PMOS transistors PM1 and PM2 of a differential pair whose sources are common and are connected to a first constant voltage terminal V1. The gate of the transistor NM1 is connected to the drain of the transistor NM2, and the gate of the transistor NM2 is connected to the drain of the transistor NM1. The gate of the transistor PM1 is connected to the drain of the transistor PM2, and the gate of the transistor PM2 is connected to the drain of the transistor PM1. The drain of the transistor NM1 is connected to the drain of the transistor PM1, the drain of the transistor NM2 is connected to the drain of the transistor PM2, and each is connected to the resonant circuit 10. The negative conductance generating circuits 1 are supplied with power from the constant voltage terminals V1 and V2. The magnitude of KV can be controlled by the above-described configuration, so that fluctuation of KV can be suppressed. Moreover, when the oscillator is used with a charge pump type PLL circuit, it is possible to suppress increase of charge pump current and to reduce consumption current in the whole of the PLL circuit.

Since the NMOS transistors and the PMOS transistors are used in the oscillator shown in FIG. 29, which is different from the oscillator shown in FIG. 27 where only the NMOS transistors are used, negative conductance generated by the negative conductance generating circuits is made large, so that current consumption can be reduced.

Twentieth Embodiment

Figure 30:
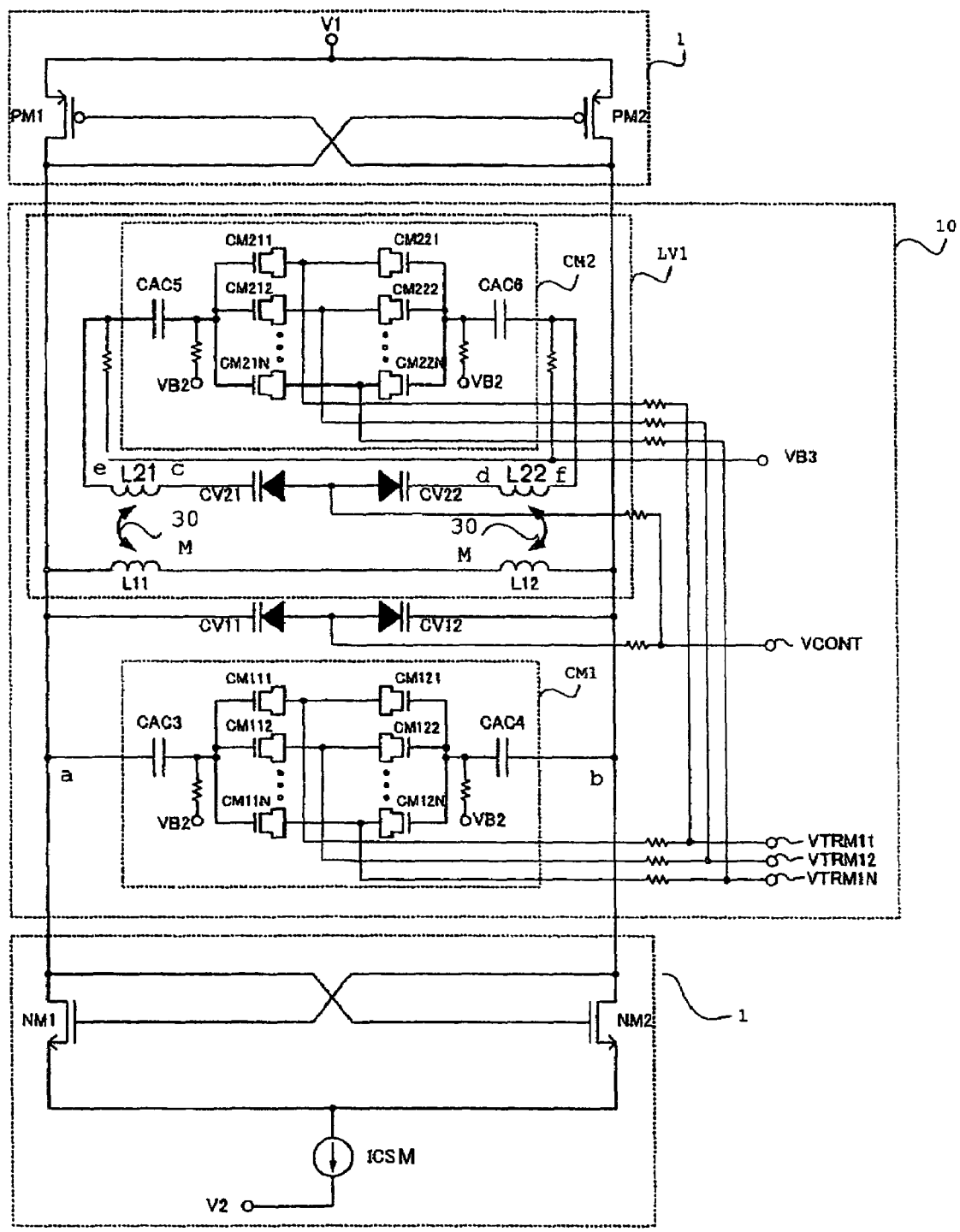
FIG. 30 is a circuit (configuration) diagram for explaining an oscillator according to a twentieth embodiment of the present invention.

FIG. 30 shows an oscillator according to a twentieth embodiment of the present invention. The twentieth embodiment is one example of an oscillator using an LC resonant circuit 10 and negative conductance generating circuit 1 like the eighteenth embodiment shown in FIG. 28, where not only NMOS transistors but also PMOS transistors are used.

The oscillator according to the twentieth embodiment includes the LC resonant circuit 10 and the negative conductance generating circuit 1. The LC resonant circuit 10 includes inductors L11 and L12 whose one ends are connected to each other, PN junction capacitors CV11 and CV12 connected to the other ends of the inductors L11 and L12 in parallel, a capacitor bank CM1 composed of MOS capacitors CM111 to CM11N and CM121 to CM12N (N is a positive integer) connected to the other ends of the inductors L11 and L12 in parallel via coupling capacitors CAC3 and CAC4, inductors L21 and L22 magnetically coupled to inductors L11 and L12 via mutual inductances M, PN junction capacitors CV21 and CV22 connected to one ends of the inductor L21 and the inductor L22 in series, and a capacitor bank CM2 composed of MOS capacitors CM211 to CM21N and CM221 to CM22N connected to the other ends of the inductor L21 and the inductor L22 via coupling capacitors CAC5 and CAC6 in series. A fixed bias voltage is applied to a terminal VB2, and control voltages are applied to terminals VTRM11 to VTRM1N.

The negative conductance generating circuit 1 is composed of NMOS transistors NM1 and NM2 of a differential pair whose sources are common and are connected to a second constant voltage terminal V2 via a constant current source ICSM and PMOS transistors PM1 and PM2 of a differential pair whose sources are common and are connected to a first constant voltage terminal V1. The gate of the transistor NM1 is connected to the drain of the transistor NM2, and the gate of the transistor NM2 is connected to the drain of the transistor NM1. The gate of the transistor PM1 is connected to the drain of the transistor PM2, and the gate of the transistor PM2 is connected to the drain of the transistor PM1. The drain of the transistor NM1 is connected to the drain of the transistor PM1, the drain of the transistor NM2 is connected to the drain of the transistor PM2, and each is connected to the resonant circuit 10. The negative conductance generating circuit 1 is supplied with power from the constant voltage terminals V1 and V2.

Incidentally, the configuration of the semiconductor device where the oscillator according to the twentieth embodiment has been configured on the semiconductor substrate is the same as shown in FIG. 26. However, since voltage terminals are not connected to the inductors L11 and L12, the voltage terminal V1 shown in FIG. 26 may be opened.

The magnitude of KV can be controlled by the above-described configuration, so that fluctuation of KV can be suppressed. Moreover, when the oscillator is used with a charge pump type PLL circuit, it is possible to suppress increase of charge pump current and to reduce consumption current in the whole of the PLL circuit.

Since the NMOS transistors and the PMOS transistors are used in the oscillator shown in FIG. 30, which is different from the oscillator shown in FIG. 28 where only the NMOS transistors are used, negative conductance generated by the negative conductance generating circuit is made large, so that current consumption can be reduced.

Twenty-First Embodiment

Figure 31:
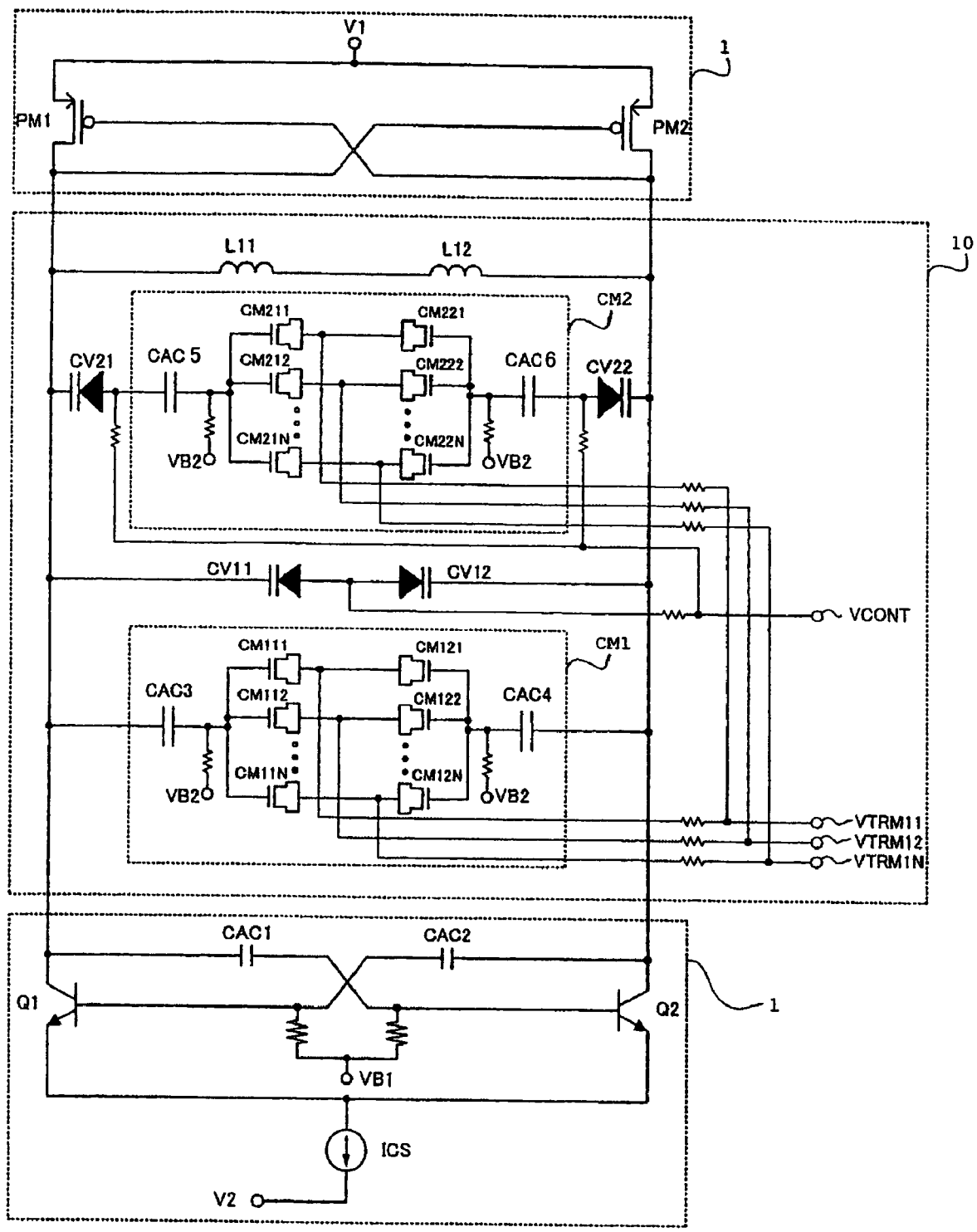
FIG. 31 is a circuit (configuration) diagram for explaining an oscillator according to a twenty-first embodiment of the present invention.

FIG. 31 shows an oscillator according to a twenty-first embodiment of the present invention. The twenty-first embodiment is one example of an oscillator using an LC resonant circuit 10 and a negative conductance generating circuit 1 like the nineteenth embodiment shown in FIG. 29, but bipolar transistors are used instead of the NMOS transistors.

The oscillator according to the twenty-first embodiment includes the LC resonant circuit 10 and the negative conductance generating circuit 1. The LC resonant circuit 10 includes inductors L11 and L12 whose one ends are connected to each other, PN junction capacitors CV11 and CV12 connected to the other ends of the inductors L11 and L12 in parallel, a capacitor bank CM1 composed of MOS capacitors CM111 to CM11N and CM121 to CM12N (N is a positive integer) connected to the other ends of the inductors L11 and L12 in parallel via coupling capacitors CAC3 and CAC4, and a capacitor bank CM2 composed of MOS capacitors CM211 to CM21N and CM221 to CM22N connected to variable capacitance elements CV21 and CV22 that are variable capacitance diodes or the like via coupling capacitors CAC5 and CAC6. CV21 and CV22, CAC5 and CAC6, CM211 to CM21N, and CM221 to CM22N are respectively connected in series, and CV11 and CV12 are connected to CM111 to CM11N and CM121 to CM12N (N is a positive integer) in parallel. A fixed bias voltage is applied to a terminal VB2 and control voltages are applied to terminals VTRM11 to VTRM1N.

The negative conductance generating circuit 1 is composed of bipolar transistors Q1 and Q2 of a differential pair whose emitter are common and which are connected to a second constant voltage terminal V2 via a constant current source ICS, a capacitor CAC1 whose one end is connected to the collector of the transistor Q1 and whose other end is connected to the base of the transistor Q2, a capacitor CAC2 whose one end is connected to the collector of the transistor Q2 and whose other end is connected to the base of the transistor Q1, and PMOS transistors PM1 and PM2 of a differential pair whose sources are common and are connected to a first constant voltage terminal V1. The collector of the transistor Q1 is connected to the drain of the transistor PM1, the collector of the transistor Q2 is connected to the drain of the transistor PM2, and each connected to the resonant circuit 10. Power is supplied from the constant voltage terminals V1 and V2. The magnitude of KV can be controlled by the above-described configuration, so that fluctuation of KV can be suppressed.

Since the bipolar transistor is used instead of the NMOS transistor in the oscillator shown in FIG. 31, which is different from the oscillator shown in FIG. 29 where the NMOS transistor and the PMOS transistor are used, negative conductance generated by the negative conductance generating circuits is made large, so that current consumption can be reduced.

According to the twenty-first embodiment, an oscillator where fluctuation of KV is suppressed, the frequency variable range is wide, and deterioration of phase noise is reduced can be provided. As a result, when the oscillator is used with a charge pump type PLL circuit, it is possible to suppress increase of charge pump current and to reduce consumption current in the whole of the PLL circuit.

Twenty-Second Embodiment

Figure 32:
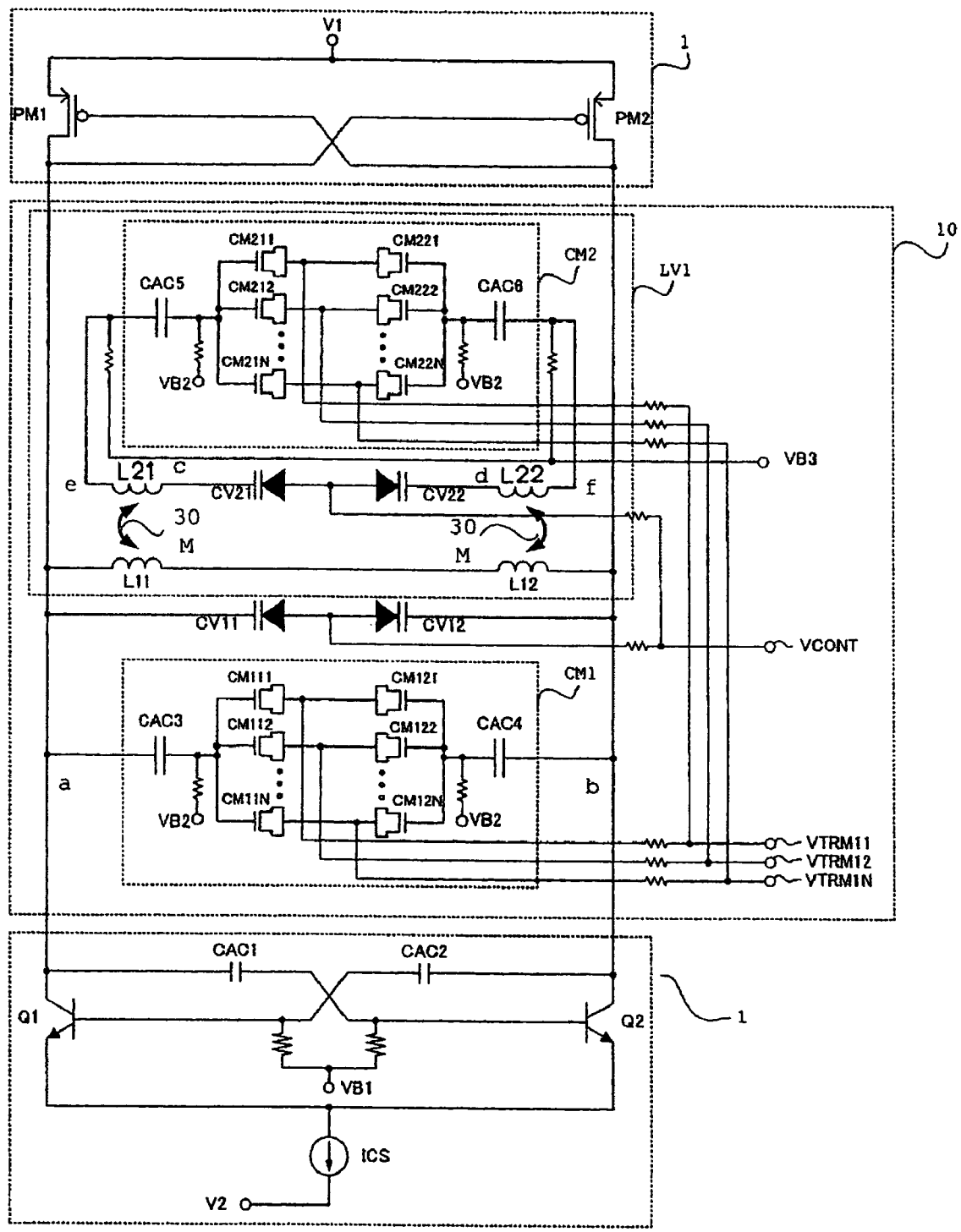
FIG. 32 is a circuit (configuration) diagram for explaining an oscillator according to a twenty-second embodiment of the present invention.

FIG. 32 shows an oscillator according to a twenty-second embodiment of the present invention. The twenty-second embodiment is one example of an oscillator using an LC resonant circuit 10 and a negative conductance generating circuit 1 like the twentieth embodiment shown in FIG. 30, where bipolar transistors are used instead of the NMOS transistors.

The oscillator according to the twenty-second embodiment includes the LC resonant circuit 10 and the negative conductance generating circuits 1. The LC resonant circuit 10 includes inductors L11 and L12 whose one ends are connected to each other, a capacitor bank CM1 composed of MOS capacitors CM111 to CM11N and CM121 to CM12N (N is a positive integer) connected to PN junction capacitors CV11 and CV12 connected to the other ends of the inductors L11 and L12 in parallel via coupling capacitors CAC3 and CAC4, an inductor L21 and an inductor L22 that are magnetically coupled to inductors L11 and L12 via mutual inductances M, PN junction capacitors CV21 and CV22 that are respectively connected to one ends of the inductors L21 and L22, and a capacitor bank CM2 composed of MOS capacitors CM211 to CM21N and CM221 to CM22N connected to the other ends of the inductor L21 and the inductor L22 via coupling capacitors CAC5 and CAC6 in series. A fixed bias voltage is applied to a terminal VB2, and control voltages are applied to terminals VTRM11 to VTRM1N.

The negative conductance generating circuit 1 is composed of bipolar transistors Q1 and Q2 of a differential pair whose emitters are common and which are connected to a second constant voltage terminal V2 via a constant current source ICS, a capacitor CAC1 whose one end is connected to the collector of the transistor Q1 and whose other end is connected to the base of the transistor Q2, a capacitor CAC2 whose one end is connected to the collector of the transistor Q2 and whose other end is connected to the base of the transistor Q1, and PMOS transistors PM1 and PM2 of a differential pair whose sources are common and are connected to a first constant voltage terminal V1. The collector of the transistor Q1 is connected to the drain of the transistor PM1, the collector of the transistor Q2 is connected to the drain of the transistor PM2, and each is connected to the resonant circuit 10. Power is supplied to the oscillator from the constant voltage terminals V1 and V2.

Incidentally, the configuration of the semiconductor device where the oscillator according to the twenty-second embodiment has been configured on the semiconductor substrate is the same as shown in FIG. 26. However, since voltage terminal is not connected to the inductors L11 and L12, the voltage terminal V1 shown in FIG. 26 may be opened.

The magnitude of KV can be controlled by the above-described configuration.

Since the bipolar transistor is used instead of the NMOS transistor in the oscillator shown in FIG. 32, which is different from the oscillator shown in FIG. 30 where the NMOS transistor and the PMOS transistor are used, negative conductance generated by the negative conductance generating circuits is made large, so that current consumption can be reduced.

According to the twenty-second embodiment, an oscillator where fluctuation of KV is suppressed, the frequency variable range is wide, and deterioration of phase noise is reduced can be provided. As a result, when the oscillator is used with a charge pump type PLL circuit, it is possible to suppress increase of charge pump current and to reduce consumption current in the whole of the PLL circuit.

Twenty-Third Embodiment

Figure 33:
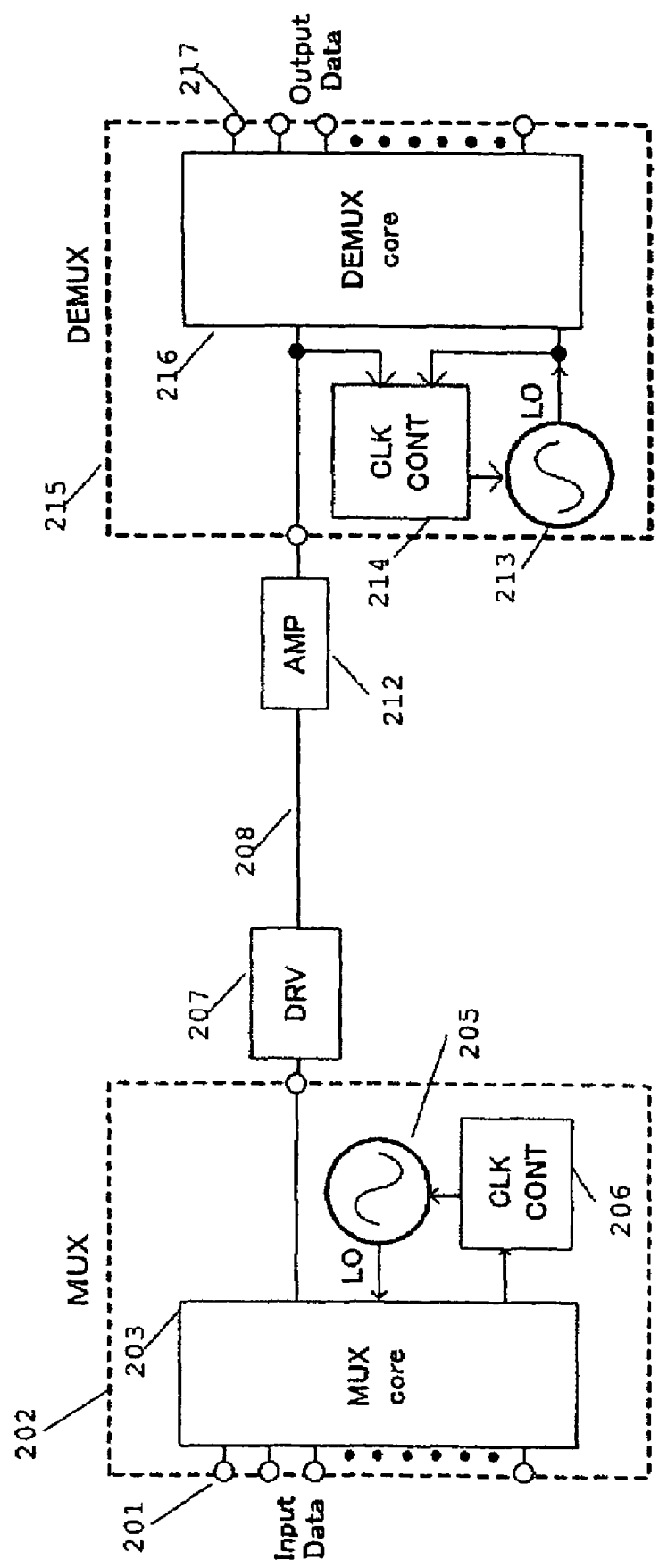
FIG. 33 is a block diagram for explaining a data processing equipment according to a twenty-third embodiment of the present invention.

FIG. 33 shows a data processing equipment including any one of the oscillators according to the fourteenth to twenty-second embodiments as a twenty-third embodiment of the present invention. The data processing equipment according to the twenty-third embodiment is a high-speed serial transmission system. The system is composed of a transmitter that multiplexes a plurality of low-speed signals to output high-speed serial signals, and a receiver that receives the high-speed serial signals to demultiplex the transmitted serial signal to individual signals and output a plurality of low-speed signals obtained by the demultiplexing.

The transmitter includes a multiplexing unit (MUX) that is inputted with a plurality of low-speed signals to output a high-speed serial signal, and a driver (DRV) 207 that amplifies the high-speed serial signal to drive a transmission path 208. The receiver includes an amplifier 212 that amplifies the high-speed signal transmitted via the transmission path 208, and a demultiplexing unit (DEMUX) 215 that demultiplexes the high-speed serial signal to the plurality of low speed signals to output them.

The multiplexing unit 202 is composed of a MUX (Multiplexer) core (MUX CR) 203 that multiplexes a plurality of low-speed signals inputted into a terminal 201 to a high-speed serial signal, a clock control circuit (CLK CONT) 206, and an oscillator 205 of the present invention that produces a reference signal for the MUX core 203.

The demultiplexing unit 215 is composed of a DEMUX (Demultiplexer) core (DEMUX CR) 216 that demultiplexes the high-speed serial signal to a plurality of low speed signals to output them to a terminal 217, a clock control circuit 214, and an oscillator 213 of the present invention that produces a reference signal for the DEMUX core 216.

That is, by using either one of the oscillators according to the fourteenth to twenty-second embodiments as the oscillators 205 and 213, the oscillation variable frequency ranges of the oscillators 205 and 213 can be made wide and fluctuation of the frequency conversion gain KV can be reduced. Therefore, since an allowable range of element variation is expanded, yield is improved so that manufacturing cost of a high-speed serial transmission system can be reduced. In addition, because of the oscillator with reduced fluctuation of KV, fluctuation of loop gain of a phase locked loop (PLL) composed of the clock control circuit (CONT) 206, 214 and the oscillator 205, 213 is reduced, so that current consumption in a circuit required for compensating for a loop gain fluctuation can be reduced and current consumption in the high-speed serial transmission system can be reduced.

Twenty-Fourth Embodiment

Figure 34:
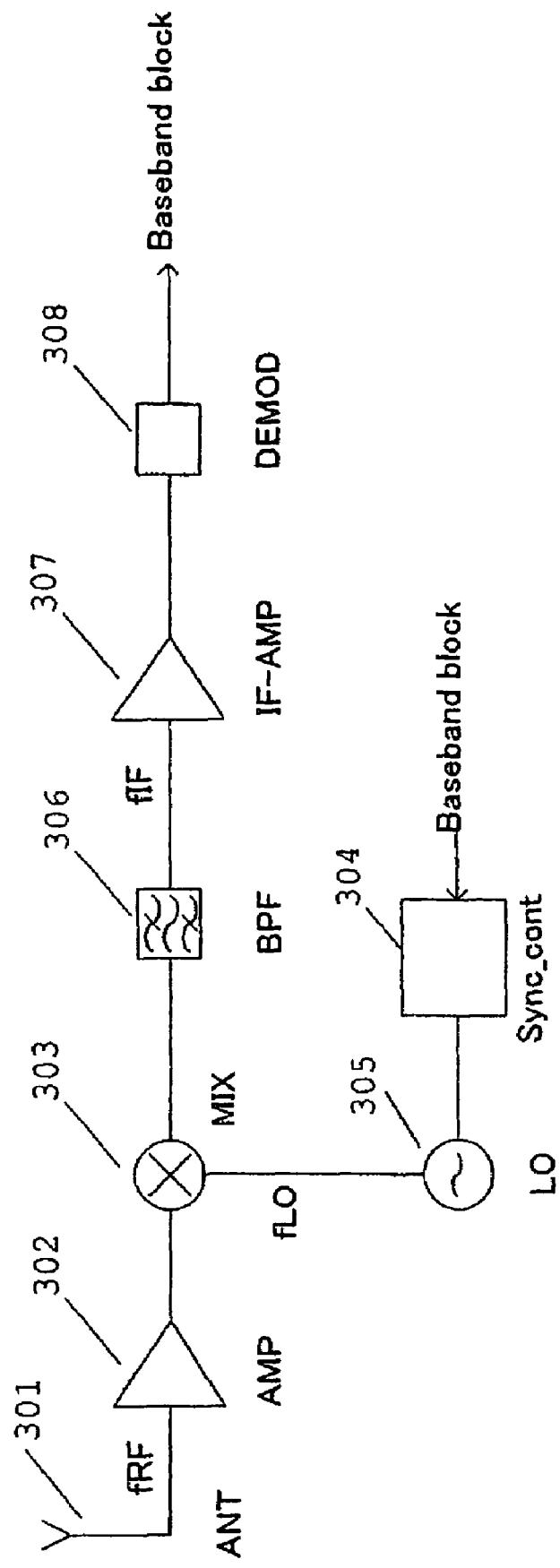
FIG. 34 is a block diagram for explaining a data processing equipment according to a twenty-fourth embodiment of the present invention.

FIG. 34 shows a data processing equipment including any one of the oscillators according to the fourteenth to twenty-second embodiments as a twenty-fourth embodiment of the present invention. The data processing equipment according to the twenty-fourth embodiment is a heterodyne wireless receiver. In FIG. 34, a reception signal received by an antenna 301 is amplified by an amplifying circuit 302 to be inputted into a mixer 303. By using a local oscillation signal outputted from the oscillator 305 of the present invention controlled by an oscillator control circuit (SYNC_CONT) 304 as one of input signals to the mixer 303, a carrier frequency of received signal is lowered at an output of the mixer 303, and a reception signal of intermediate frequency (IF) is obtained. After an unnecessary frequency contained in the IF reception signal is damped (attenuated) by a bandpass filter 306, the IF reception signal is amplified by an IF amplifying circuit 307 to be taken out at a demodulating circuit (DEMOD) 308 as baseband signal. The baseband signal is fed to a baseband circuit (not shown). Note that, a control signal is inputted from the baseband circuit to the oscillator control circuit 304.

By using either one of the oscillators in fourteenth to twenty-second embodiments as the oscillator 305, the oscillation frequency variable range can be made wide, and fluctuation of the frequency conversion gain KV can be reduced. Therefore, since an allowable element variation range becomes wide, the yield is improved, and since a plurality of applications or communication systems can be accommodated, manufacturing cost of a heterodyne wireless receiver can be reduced. Since the oscillator is an oscillator with reduced KV fluctuation, fluctuation of a loop gain of a phase locked loop (PLL) composed of the oscillator control circuit (SYNC_CONT) 304 and the oscillator 305 is reduced so that consumption current in a circuit required for compensating for loop gain fluctuation can be reduced and consumption current in the heterodyne wireless receiver can be reduced.

Twenty-Fifth Embodiment

Figure 35:
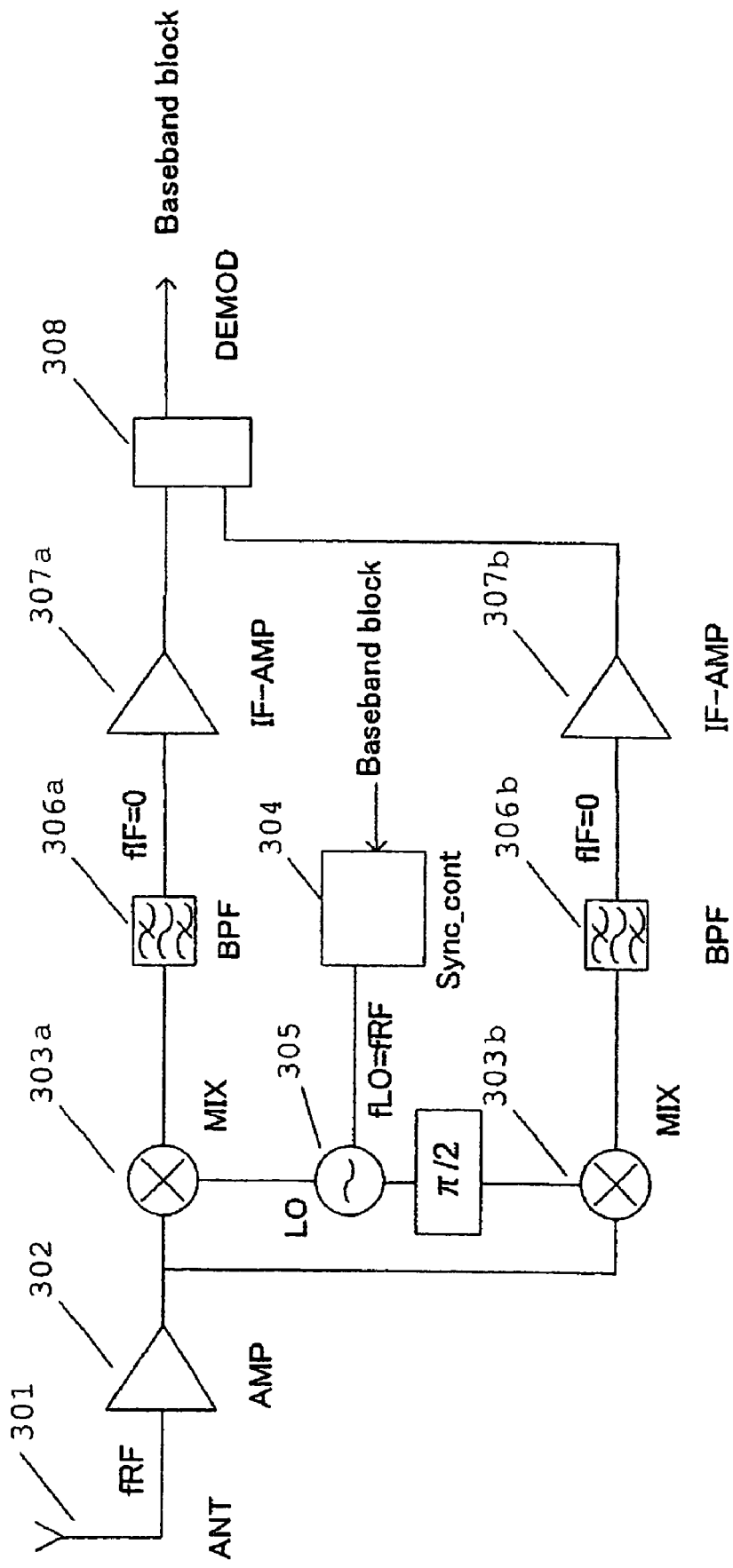
FIG. 35 is a block diagram for explaining a data processing equipment according to a twenty-fifth embodiment of the present invention.

FIG. 35 shows a data processing equipment including any one of the oscillators according to the fourteenth to twenty-second embodiments as a twenty-fifth embodiment of the present invention. The data processing equipment according to the twenty-fifth embodiment is a direct-conversion wireless receiver. A reception signal received by an antenna 301 is amplified by an amplifying circuit 302 to be inputted into two mixers 303a and 303b. A local oscillation signal outputted from the oscillator 305 of the present invention controlled by an oscillator control circuit (SYNC_CONT) 304 is branched to two signals, and the branched signals are imparted with a phase difference of 90° ($\pi/2$) to each other to be inputted into the mixers 303a and 303b, respectively. After carrier frequencies of the reception signals amplified by the amplifying circuit 302 are lowered to zero frequencies by the two mixers 303a, 303b and unnecessary frequency components thereof are damped by bandpass filters 306a and 306b, the reception signals are amplified by amplifying circuits 307a and 307b. Baseband signals are taken out of output signals of the two amplifying circuits 307a and 307b by a demodulating circuit 308. The baseband signals are fed to an external baseband circuit (not shown). A control signal is inputted from the baseband circuit to the oscillator control circuit 304.

By using either of the oscillators in fourteenth to twenty-second embodiments as the oscillator 305, the oscillation frequency variable range can be made wide, and fluctuation of the frequency conversion gain KV can be reduced. Therefore, since an allowable element variation range becomes wide, the yield is improved, and since a plurality of applications or communication systems can be accommodated, manufacturing cost of a direct-conversion wireless receiver can be reduced. Since the oscillator is an oscillator with reduced KV fluctuation, fluctuation of a loop gain of a phase locked loop (PLL) composed of the oscillator control circuit (SYNC_CONT) 304 and the oscillator 305 is reduced so that consumption current in a circuit required for compensating for loop gain fluctuation can be reduced and consumption current in the direct-conversion wireless receiver can be reduced.

Twenty-Sixth Embodiment

Figure 36:
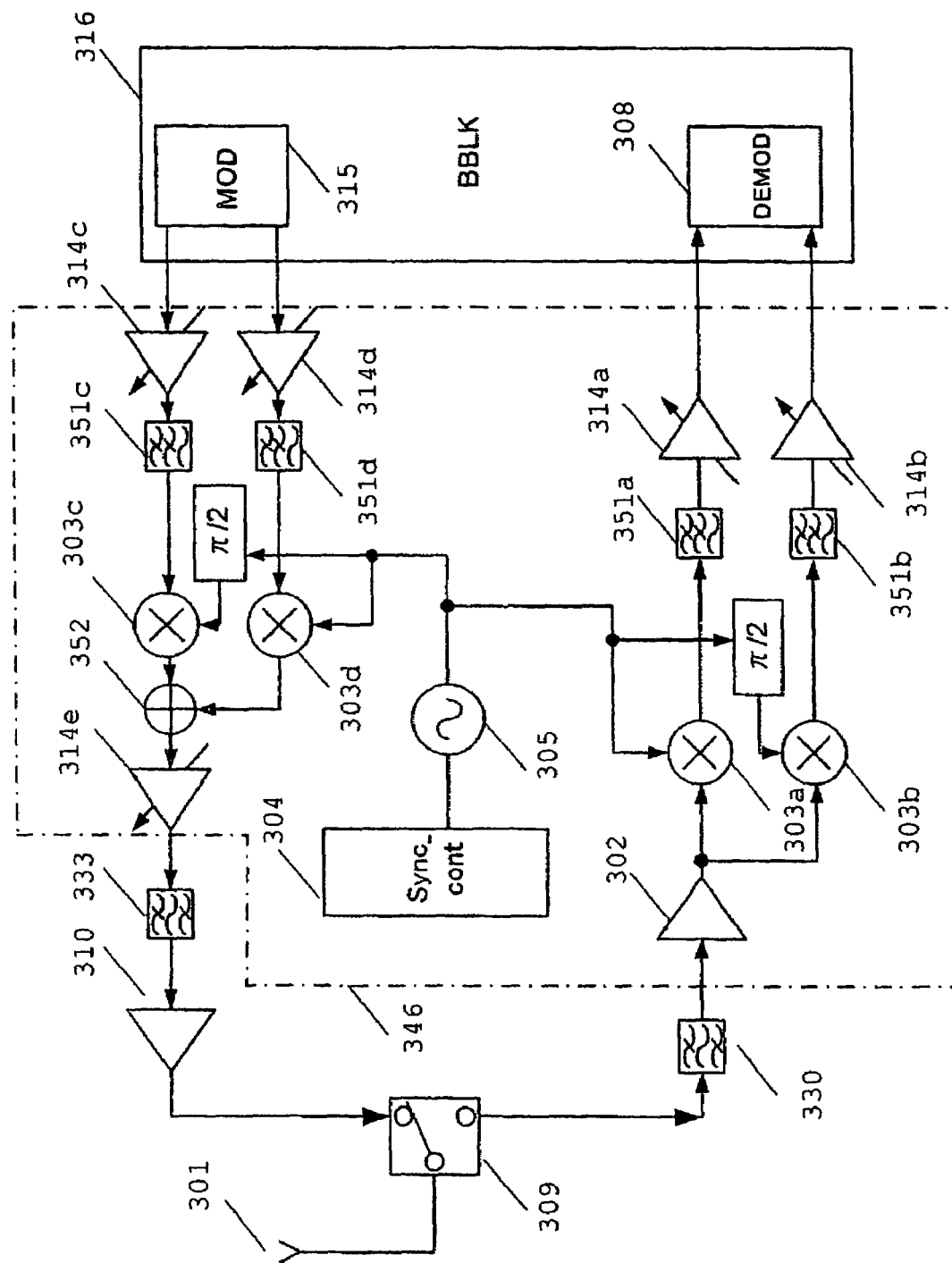
FIG. 36 is a block diagram for explaining a data processing equipment according to a twenty-sixteenth embodiment of the present invention.

FIG. 36 shows a data processing equipment including any one of the oscillators according to the fourteenth to twenty-second embodiments as a twenty-sixth embodiment of the present invention. The data processing equipment according to the twenty-sixth embodiment is a direct-conversion wireless transceiver. Reference numeral 346 denotes RF-IC. At a signal reception time, after an unnecessary frequency component of a reception signal received by an antenna 301 and caused to pass through a switch 309 (SW) is damped by a bandpass filter 330, the reception signal is amplified by a low noise amplifying circuit 302 to be inputted into two mixers 303a and 303b. An RF (Radio Frequency) local oscillation signal outputted from an oscillator 305 of the present invention controlled by an oscillator control circuit 304 is branched to two signals and the two signals are imparted with a phase difference of 90° ($\pi/2$) to each other to be inputted into the mixers 303a and 303b, respectively. After carrier frequencies of the signals inputted in the mixers are lowered to zero frequencies at outputs of the two mixers 303a and 303b and unnecessary frequency components thereof are damped by low frequency pass filters 351a and 351b, the signals are amplified by automatic gain control amplifying circuits 314a and 314b. Outputs of the automatic gain control amplifying circuits 314a and 314b are transmitted to a baseband circuit (BBLK) 316 and are taken out at a demodulating circuit 308 as reception baseband signals.

At a signal transmission time, a transmission baseband signal outputted from the baseband circuit 316 is modulated by a modulating circuit (MOD) 315 to be separated to two signals different in phase by 90°. After two separated signals are amplified by automatic gain control amplifying circuits 314c and 314d and unnecessary frequency components thereof are damped by low frequency pass filters 351c and 351d, the signals are inputted to mixers 303c and 303d, respectively. An RF (Radio Frequency) local oscillation signal outputted from the oscillator 305 of the present invention controlled by an oscillator control circuit 304 is branched to two signals and the two signals are imparted with a phase difference of 90° ($\pi/2$) to each other to be inputted into the mixers 303c and 303d, respectively. Outputs of the two mixers 303c and 303d are added at an adding circuit 352 to be outputted as an RF orthogonal modulation signal. Since the RF orthogonal modulation signal is amplified at an automatic gain control amplifying circuit 314e and an unnecessary frequency component therein is damped by a bandpass filter 333, the signal is amplified by a high output amplifier 310 and is fed to an antenna via a switch 309(SW) to be transmitted.

By using either of the oscillators according to the fourteenth to twenty-second embodiments as the oscillator 305, the oscillation frequency variable range can be made wide, and fluctuation of the frequency conversion gain KV can be reduced. Therefore, since an allowable element variation range is expanded, the yield is improved, and since a plurality of applications or communication systems can be accommodated, manufacturing cost of a direct-conversion wireless receiver can be reduced. Since the oscillator is an oscillator with reduced KV fluctuation, fluctuation of a loop gain of a phase locked loop (PLL) composed of the oscillator control circuit (SYNC_CONT) 304 and the oscillator 305 is reduced so that consumption current in a circuit required for compensating for loop gain fluctuation can be reduced and consumption current in the direct-conversion wireless receiver can be reduced.

Moreover, the LC resonant circuit of the present invention that is suitable for integration is adopted in the oscillator 305. Accordingly, in FIG. 36, a signal reception side of the low noise amplifying circuit 302 to the automatic gain control amplifying circuits 314a and 314b, a signal transmission side of the automatic gain control amplifying circuits 314c and 314d to the automatic gain control amplifying circuit 314e, and a transmission and reception circuit composed of the oscillator 304 and the oscillator 305 can be configured as a semiconductor device formed on the same or one semiconductor substrate, namely, an RF-IC (Radio Frequency Integrated Circuit) easily. Further, the oscillator 305 has a wide oscillation frequency variable range and is reduced in phase noise. Accordingly, the RF-IC is suitably applied to a multi-band/multi-mode wireless transceiver that can accommodate a plurality of communication systems using a plurality of frequency bands alone.

Twenty-Seventh Embodiment

Figure 37:
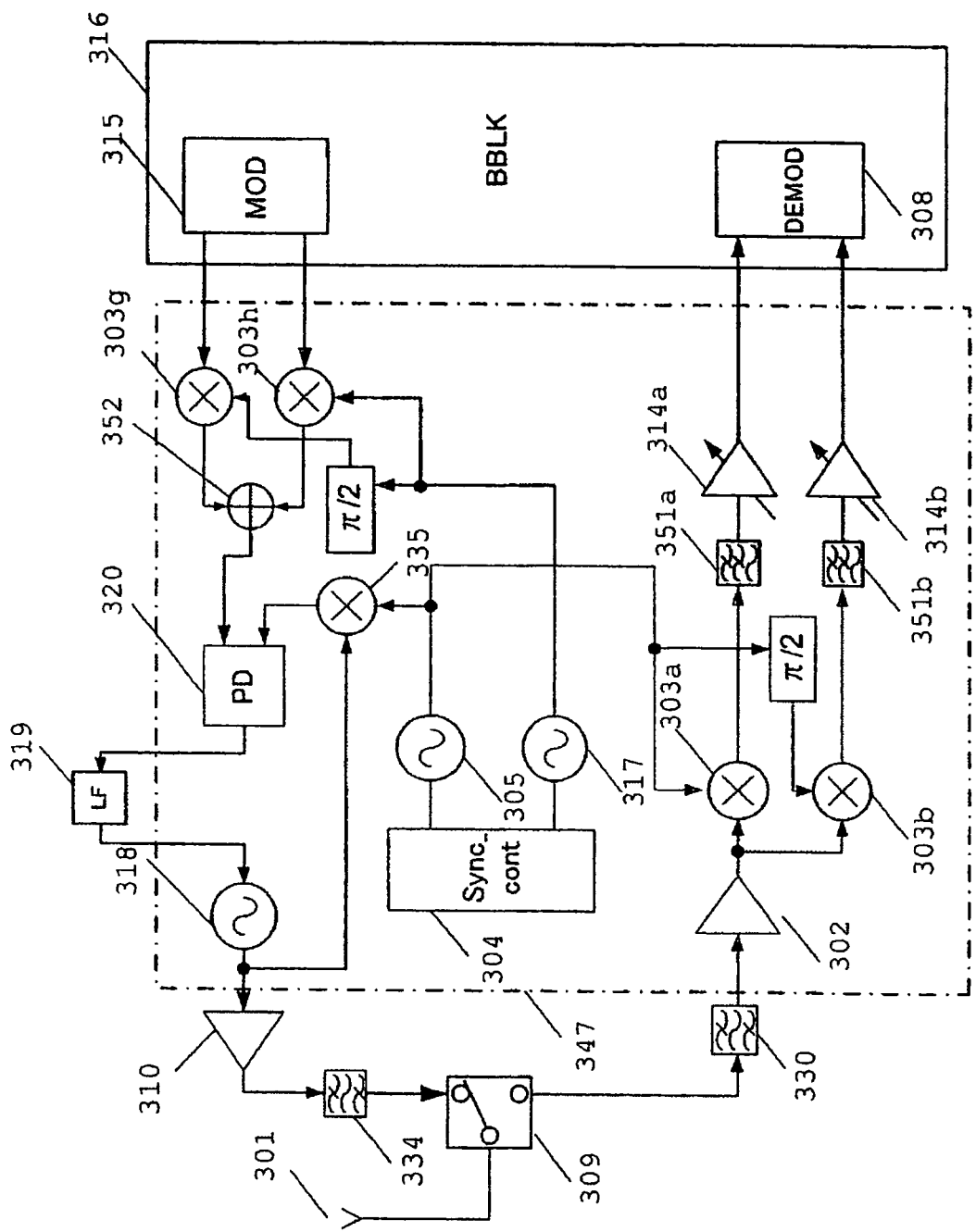
FIG. 37 is a block diagram for explaining a data processing equipment according to a twenty-seventeenth embodiment of the present invention.

FIG. 37 shows a data processing equipment including any one of the oscillators according to the fourteenth to twenty-second embodiments as a twenty-seventh embodiment of the present invention. The data processing equipment according to the twenty-seventh embodiment is a direct-conversion wireless transceiver. At a signal reception time, after an unnecessary frequency component of a reception signal received by an antenna 301 and caused to pass through a switch 309 is damped by a bandpass filter 330, the reception signal is amplified in a low noise amplifying circuit 302 to be inputted into two mixers 303*a* and 303*b*. A local oscillation signal outputted from an oscillator 305 of the present invention controlled by an oscillator control circuit 304 is branched to two signals and the two signals are imparted with a phase difference of 90° ($\pi/2$) to each other to be inputted into the mixers 303*a* and 303*b*, respectively. After carrier frequencies of the signals inputted in the mixers are lowered to zero frequencies at outputs of the two mixers 303*a* and 303*b* and unnecessary frequency components thereof are damped by low frequency pass filters 351*a* and 351*b*, the signals are amplified by automatic gain control amplifying circuits 314*a* and 314*b*. Outputs of the automatic gain control amplifying circuits 314*a* and 314*b* are transmitted to a baseband circuit (BBLK) 316 and are taken out at demodulating circuit 308 as reception baseband signals.

At a signal transmission time, a transmission baseband signal outputted from the baseband circuit 316 is modulated using a modulating circuit 315 to be separated to two signals different in phase by 90°. The two separated signals are inputted into mixers 303*g* and 303*h*. An IF (Intermediate Frequency) local oscillation signal outputted from the oscillator 317 of the present invention controlled by an oscillator control circuit 304 is branched to two signals and the two signals are imparted with a phase difference of 90° ($\pi/2$) to each other to be inputted into the mixers 303*g* and 303*h*, respectively. Outputs of the two mixers 303*g* and 303*h* are added at an adding circuit 352 to be outputted as an IF orthogonal modulation signal. A phase of the IF orthogonal modulation signal is compared with a phase of an output signal of a mixer 335 at a phase comparator (PD) 320. An output signal from the phase comparator 320 is inputted into a frequency control terminal of an oscillator 318 for transmission of the present invention through a loop filter 319. The output signal of the oscillator 318 and the RF local oscillation signal are inputted into the mixer 335, and the output signal of the mixer 335 is inputted into the phase comparator 320, as described above. As a result, an RF orthogonal modulation signal is outputted from the oscillator 318. After the RF orthogonal modulation signal is amplified by a high output amplifier 310 and an unnecessary frequency component therein is damped by a bandpass filter 334, the RF orthogonal modulation signal is fed to an antenna via the switch 309 to be transmitted.

By using either of the oscillators according to the fourteenth to twenty-second embodiments as the oscillators 305, 317, and 318, the oscillation frequency variable range can be made wide, and fluctuation of the frequency conversion gain KV can be reduced. Therefore, since an allowable element variation range is expanded, the yield is improved, and since a plurality of applications or communication systems can be accommodated, manufacturing cost of a direct-conversion wireless transceiver can be reduced. Since the oscillator is an oscillator with reduced KV fluctuation, fluctuation of a loop gain of a phase locked loop (PLL) composed of the oscillator control circuit (SYNC_CONT) 304 and the oscillators 305 and 317 is reduced so that consumption current in a circuit required for compensating for loop gain fluctuation can be reduced and consumption current in the direct-conversion wireless transceiver can be reduced.

Moreover, the LC resonant circuit of the present invention that is suitable for integration is adopted in the oscillators 305, 317, and 318. Accordingly, in FIG. 37, a signal reception side of the low noise amplifying circuit 302 to the automatic gain control amplifying circuits 314*a* and 314*b*, a signal transmission side of the mixers 303*g* and 303*h* to the oscillator 318 except for the loop filter 319, and a transmission and reception circuit composed of the oscillator 304 and the oscillators 305, 317, and 318 can be configured as a semiconductor device formed on the same or one semiconductor substrate, namely, an RF-IC (radio frequency integrated circuit) easily. The oscillators 305, 317, and 318 have a wide oscillation frequency variable range and are reduced in phase noise. Accordingly, the RF-IC is suitably applied to a multi-band/multi-mode wireless transmission/reception device that can accommodate a plurality of communication regulations using a plurality of frequency bands alone.

Twenty-Eighth Embodiment

Figure 38:
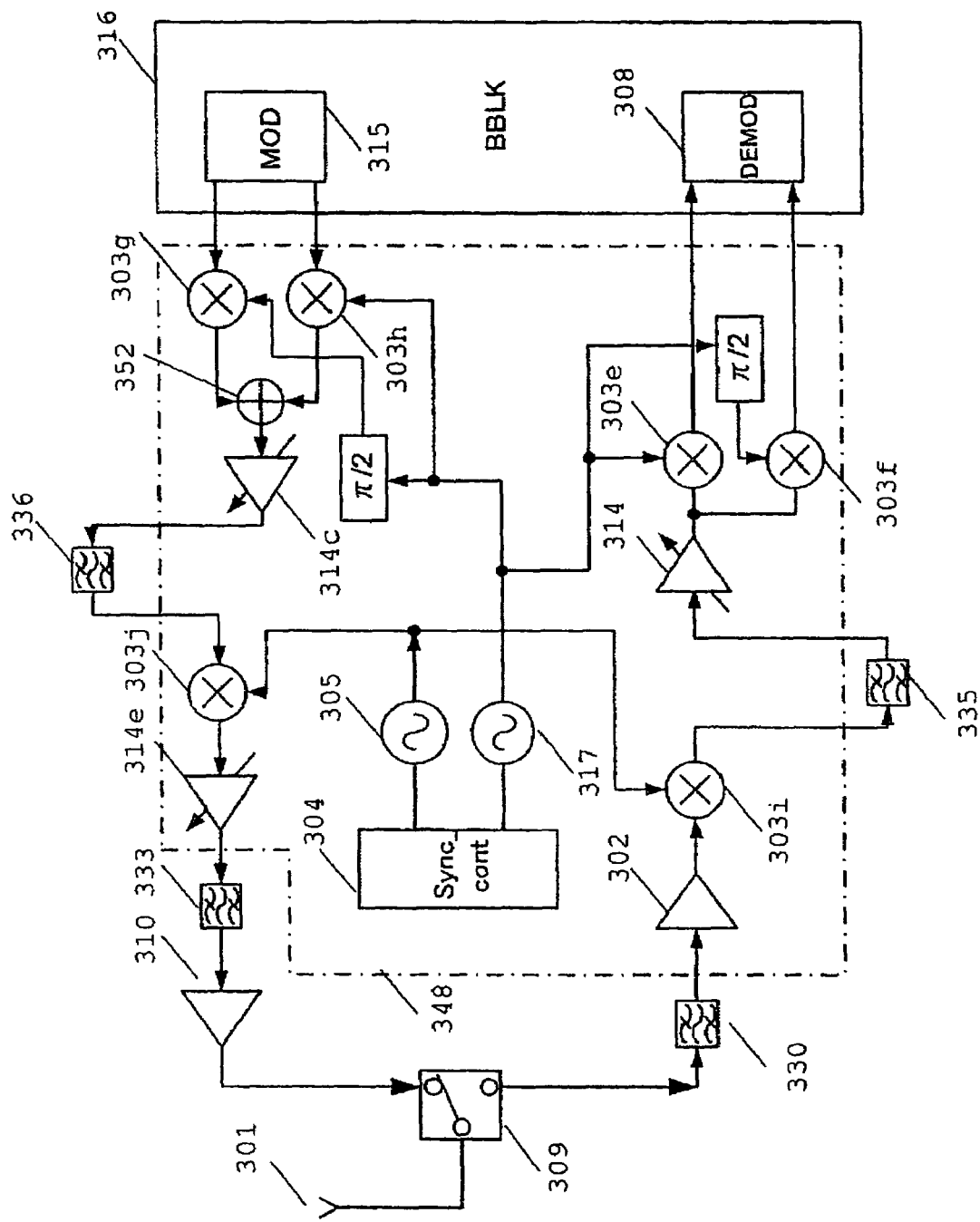
FIG. 38 is a block diagram for explaining a data processing equipment according to a twenty-eighth embodiment of the present invention.

FIG. 38 shows a data processing equipment including any one of the oscillators according to the fourteenth to twenty-second embodiments as a twenty-eighth embodiment of the present invention. The data processing equipment according to the twenty-eighth embodiment is a heterodyne wireless transceiver. At a signal reception time, after an unnecessary frequency component of a reception signal received by an antenna 301 and caused to pass through a switch 309 is damped by a bandpass filter 330, the reception signal is amplified in a low noise amplifying circuit 302 to be inputted into a mixer 303*i*. An RF (Radio Frequency) local oscillation signal outputted from an oscillator 305 of the present invention controlled by an oscillator control circuit 304 is inputted into the mixer 303*i*. A carrier frequency of the reception signal is lowered at an output of the mixer 303*i*, so that a reception signal with an intermediate frequency is obtained. After an unnecessary frequency component in an output signal of the mixer 303*i* is damped by a bandpass filter 335 and the output signal is amplified by an automatic gain control amplifying circuit 314, the output signal is inputted into mixers 303*e* and 303*f*. An IF local oscillation signal outputted from an oscillator 317 of the present invention controlled by an oscillator control circuit 304 is branched to two signals and the two signals are imparted with a phase difference of 90° ($\pi/2$) to each other to be inputted into the mixers 303*e* and 303*f*, respectively. Outputs of the two mixers 303*e* and 303*f* are transmitted to a baseband circuit (BBLK) 316 and are taken out at demodulating circuit 308 as reception baseband signals.

At a signal transmission time, a transmission baseband signal outputted from the baseband circuit 316 is modulated in a modulating circuit (MOD) 315 to be separated to two signals different in phase by 90°. Two separated signals are inputted into mixers 303*g* and 303*h*, respectively. An IF local oscillation signal outputted from the oscillator 317 of the present invention controlled by the oscillator control circuit 304 is branched to two signals and the two signals are imparted with a phase difference of 90° ($\pi/2$) to each other to be inputted into the mixers 303*g* and 303*h*, respectively. Outputs of the two mixers 303*g* and 303*h* are added in an adding circuit 352 to configure an IF orthogonal modulation signal. After the IF orthogonal modulation signal is amplified by an automatic gain control amplifying circuit 314*c* and an unnecessary frequency component therein is damped by a bandpass filter 336, the signal is inputted into a mixer 303*j*. An RF local oscillation signal outputted from the oscillator 305 of the present invention controlled by the oscillator control circuit 304 is inputted into the mixer 303*j*. After an output of the mixer 303*j* is amplified in an automatic gain control amplifying circuit 314e and an unnecessary frequency component therein is damped by a bandpass filter 333, the output is amplified in a high frequency amplifier 310 and it is fed to the antenna via the switch 309 (SW) to be transmitted.

By using either of the oscillators according to the fourteenth to twenty-second embodiments as the oscillators 305 and 317, the oscillation frequency variable range can be made wide, and fluctuation of the frequency conversion gain KV can be reduced. Therefore, since an allowable element variation range is widened, the yield is improved, and since a plurality of applications or communication systems can be accommodated, manufacturing cost of a heterodyne wireless transceiver can be reduced. Since the oscillator is an oscillator with reduced KV fluctuation, fluctuation of a loop gain of a phase locked loop (PLL) composed of the oscillator control circuit (SYNC_CONT) 304 and the oscillators 305 and 317 is reduced so that consumption current in a circuit required for compensating for loop gain fluctuation can be reduced and consumption current in the heterodyne wireless transceiver can be reduced.

Moreover, the LC resonant circuit of the present invention that is suitable for integration is adopted in the oscillators 305 and 317. Accordingly, in FIG. 38, a signal reception side of the low noise amplifying circuit 302 to the mixers 303e and 303f except for the bandpass filter 335, a signal transmission side of the mixers 303g and 303h to the automatic gain control amplifying circuit 314e except for the bandpass filter 336, and a transmission and reception circuit composed of the oscillator 304 and the oscillators 305 and 317 can be configured as a semiconductor device formed on the same or one semiconductor substrate, namely, an RF-IC (Radio Frequency Integrated Circuit) easily. The oscillators 305 and 317 have a wide oscillation frequency variable range and are reduced in phase noise. Accordingly, the RF-IC is suitably applied to, for example, a multi-band/multi-mode wireless transmission/reception device that can accommodate a plurality of communication regulations using a plurality of frequency bands alone.

Twenty-Ninth Embodiment

Figure 39:
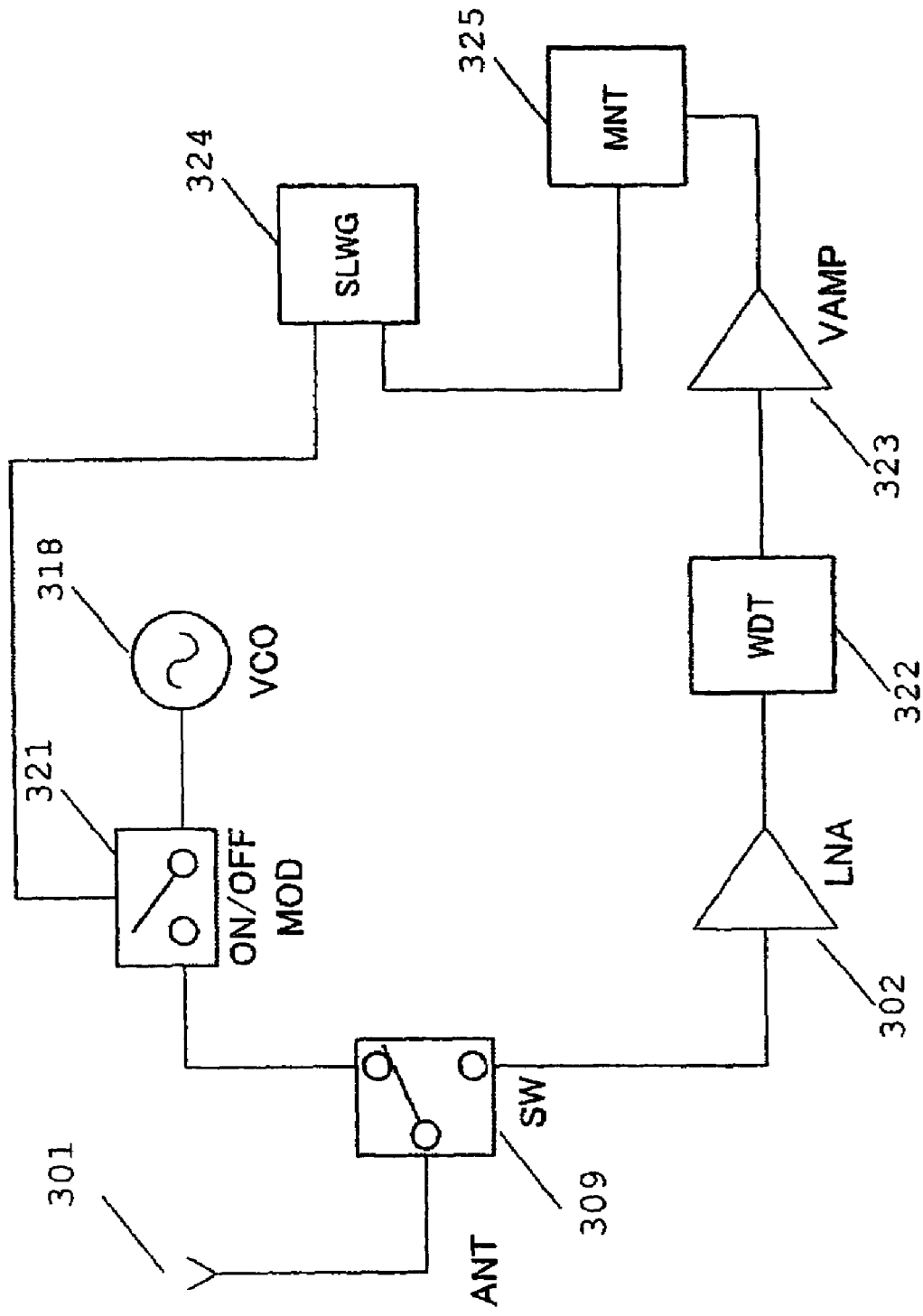
FIG. 39 is a block diagram for explaining a data processing equipment according to a twenty-ninth embodiment of the present invention.

FIG. 39 shows a data processing equipment including any one of the oscillators according to the fourteenth to twenty-second embodiments as a twenty-ninth embodiment of the present invention. The data processing equipment according to the twenty-ninth embodiment is a radio radar transceiver of a pulse radar type. At a signal transmission time, an output signal of an oscillator 318 of the present invention is modulated by an ON/OFF modulator (ON/OFF MOD) 321 opened and closed according to an output of a saw-tooth wave generator (SLWG) 324 to be transmitted from an antenna 301 via a switch 309.

At a signal reception time, a reception signal received by the antenna 301 and caused to pass through the switch 309 is amplified by a low noise amplifying circuit 302 to be detected by a wave detector (WDT) 322. The detected signal is amplified by a video amplifier 323 to be displayed on a screen of a display device (MNT) 325.

By using either of the oscillators according to the fourteenth to twenty-second embodiments as the oscillator 318, the oscillation frequency variable range can be made wide, and fluctuation of the frequency conversion gain KV can be reduced. Therefore, since an allowable element variation range is expanded, the yield is improved, and manufacturing cost of a radio radar wireless transceiver of a pulse radar type can be reduced. Since the oscillator is an oscillator with reduced KV fluctuation, fluctuation of a loop gain of a phase locked loop (PLL) composed of the oscillator control circuit (SYNC_CONT) 304 and the oscillator 318 is reduced so that consumption current in a circuit required for compensating for loop gain fluctuation can be reduced and consumption current in the radio radar transceiver of a pulse radar type can be reduced.

Thirtieth Embodiment

Figure 40:
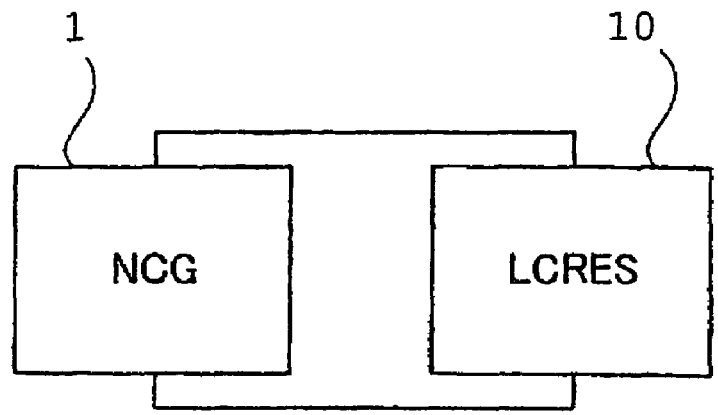
FIG. 40 is a circuit diagram for explaining an LC resonant circuit according to a thirtieth embodiment of the present invention.

An oscillator according to a thirtieth embodiment of the present invention will be explained with FIG. 40. The oscillator according to the thirtieth embodiment is composed of an LC resonant circuit 10 and a negative conductance generating circuit 1. The LC resonant circuit 10 is composed of either one of the LC resonant circuits described in the first to thirteenth embodiments.

In the thirtieth embodiment, an oscillation frequency is approximately defined by a resonant frequency of the LC resonant circuit 10. Energy loss due to a parasitic resistance component in the LC resonant circuit 10 is compensated for by the negative conductance generating circuit 1, so that power of an output signal of the oscillator is approximately defined and stability of oscillation is defined based upon negative conductance generated by the negative conductance generating circuit 1. According to the operations, oscillation output of the oscillator is obtained. By using either one of the LC resonant circuit described the first to thirteenth embodiments as the LC resonant circuit 10, fluctuation of KV can be suppressed.

Thirty-First Embodiment

Figure 41:
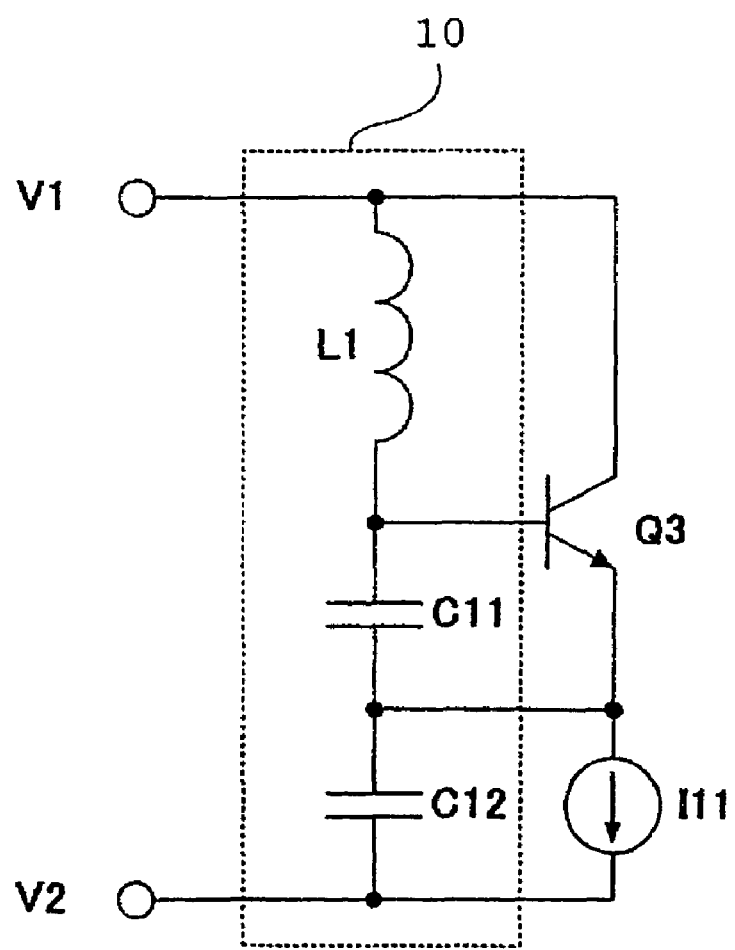
FIG. 41 is a circuit diagram for explaining an LC resonant circuit according to a thirty-first embodiment of the present invention.

An oscillator according to a thirty-first embodiment of the present invention will be explained with FIG. 41. The oscillator according to the thirty-first embodiment is configured as a well-known Colpitts oscillator. In the thirty-first embodiment, an LC resonant circuit 10 including L1, C11, and C12 is configured to include either one of the LC resonant circuits described in the first to thirteenth embodiments. That is, the LC resonant circuit includes a bipolar transistor Q3 whose collector is connected to a first constant voltage terminal V1 and whose emitter is connected to a second constant voltage terminal V2 via a constant current source I11, a capacitor C11 whose one end is connected to the base of the transistor Q3 and whose other end is connected to the emitter of the transistor Q3, a capacitor C12 whose one end is connected to the emitter of the transistor Q3 and whose other end is connected to the second constant voltage terminal V2, and an inductor L1 whose one end is connected to the base of the transistor Q3 and whose other end is connected to the constant voltage terminal V1.

Since the LC resonant circuit 10 including L1, C11, and C12 is configured to include either one of the LC resonant circuits described in the first to thirteenth embodiments, fluctuation of KV due to a capacitance value of the capacitor bank can be suppressed or KV can be made constant regardless of the capacitance value of the capacitor bank.

In the thirty-first embodiment, an oscillation frequency is approximately defined by a resonant frequency of the resonant circuit based upon capacitance of the inductor L1 and the capacitors C11 and C12 connected in series. The negative conductance generating circuit 1 is formed by operation of the transistor to the resonant circuit.

Since the oscillator is of a single phase, such a merit is obtained that consumption current is reduced.

Thirty-Second Embodiment

Figure 42:
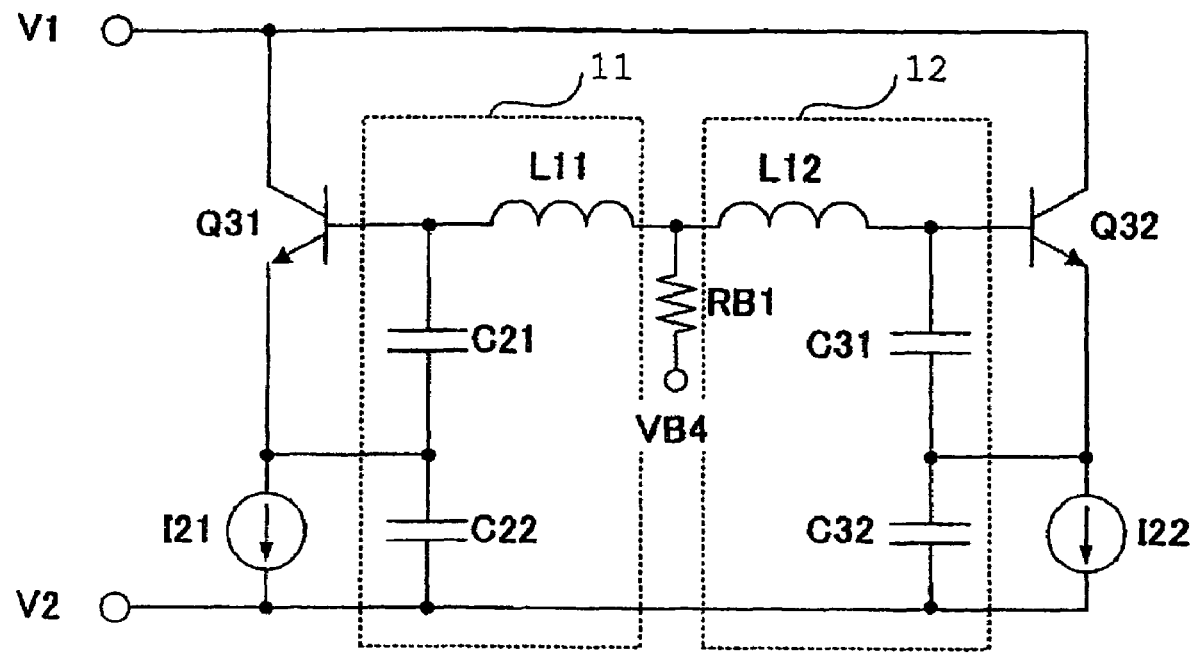
FIG. 42 is a circuit diagram for explaining an oscillator according to a thirty-second embodiment of the present invention.

FIG. 42 shows an oscillator according to a thirty-second embodiment of the present invention. The oscillator according to the thirty-second embodiment is configured as a well-known Colpitts oscillator of a differential type. In the thirty-second embodiment, a half configuration of the differential type oscillator includes a bipolar transistor Q31 whose collector is connected to a first constant voltage terminal V1 and whose emitter is connected to a second constant voltage terminal V2 via a first constant current source I21, a capacitor C21 whose one end is connected to the base of Q31 and whose other end is connected to the emitter of the transistor Q31, a capacitor C22 whose one end is connected to the emitter of the transistor Q31 and whose other end is connected to the second constant voltage terminal V2 of the transistor Q31, and an inductor L11.

The other half for the differential type oscillator includes a bipolar transistor Q32 whose collector is connected to the first constant voltage terminal V1, whose emitter is connected to the second constant voltage terminal V2 via a second constant current source I22 and whose size is equal to that of the transistor Q31, a capacitor C31 whose one end is connected to the base of the transistor Q32, whose other end is connected to the emitter of the transistor Q32 and whose capacitance value is equal to that of the capacitor C21, a capacitor C32 whose one end is connected to the emitter of the transistor Q32, whose other end is connected to the second constant voltage terminal V2 and whose capacitance value is equal to that of the capacitor C22, and an inductor L12 which is connected to the base of the transistor Q32 and whose inductance is equal to that of L11.

The inductors L11 and L12 whose one ends are connected to the bases of the transistors Q31 and Q32 are connected to a common point at the other ends thereof, and the common point is connected to a terminal VB4 inputted with a fixed bias voltage via a resistor RB1.

The LC resonant circuit 11 composed of L11, C21, and C22, and the LC resonant circuit 12 composed of L12, C31, and C32 are configured to include either of the LC resonant circuits described in the first to thirteenth embodiments. Therefore, fluctuation of KV due to a capacitance value of the capacitor bank can be suppressed or KV can be made constant regardless of the capacitance value of the capacitor bank. Since the oscillator shown in FIG. 42 is of the differential type, consumption current is larger than that in the single phase Colpitts oscillator shown in FIG. 41, but a stable oscillation frequency to the power source voltage can be obtained.

Thirty-Third Embodiment

Figure 43:
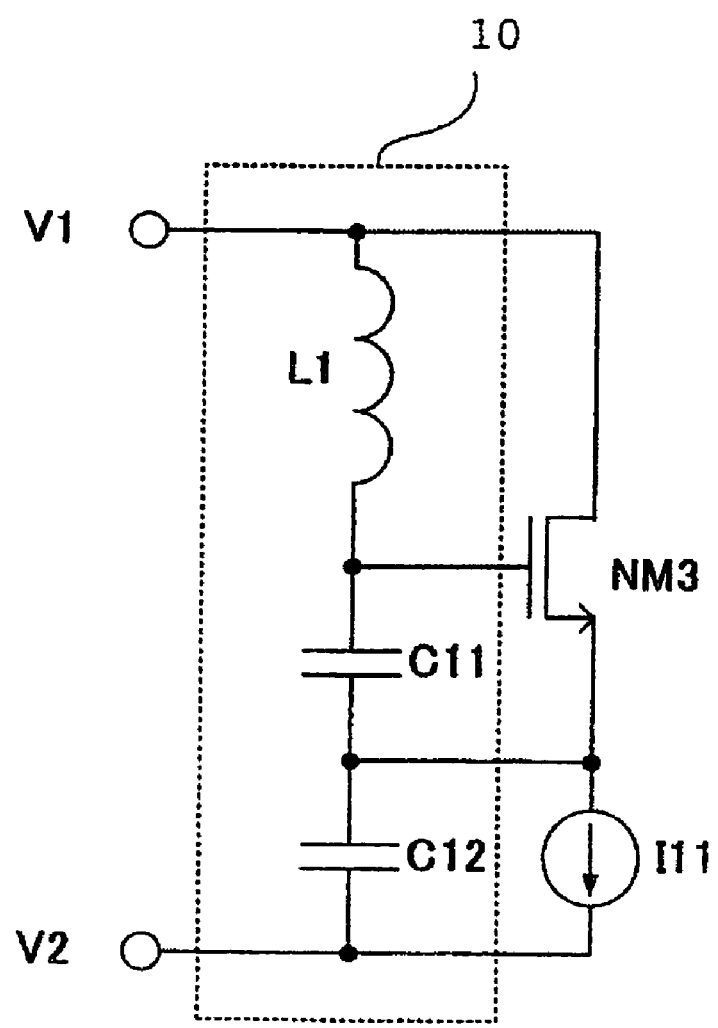
FIG. 43 is a circuit diagram for explaining an oscillator according to a thirty-third embodiment of the present invention.

An oscillator according to a thirty-third embodiment of the present invention is described in FIG. 43. The thirty-third embodiment is one example of a Colpitts oscillator like the thirty-first embodiment shown in FIG. 41, where a MOS transistor is used instead of the bipolar transistor. The oscillator according to the thirty-third embodiment includes an NMOS transistor NM3 whose drain is connected to a first constant voltage terminal V1 and whose source is connected to a second constant voltage terminal V2 via a constant current source I11, a capacitor C11 whose one end is connected to the gate of the transistor NM3 and whose other end is connected to the source of the transistor NM3, a capacitor C12 whose one end is connected to the source of the transistor NM3 and whose other end is connected to the second constant voltage terminal V2, and an inductor L1 whose one end is connected to the gate of the transistor NM3 and whose other end is connected to a first constant voltage terminal V1.

The LC resonant circuit composed of L1, C11, and C12 is configured to include either one of the LC resonant circuits described in the first to thirteenth embodiments. Therefore, fluctuation of KV due to a capacitance value of the capacitor bank can be suppressed or KV can be made constant regardless of the capacitance value of the capacitor bank.

In the thirty-third embodiment, an oscillation frequency is approximately defined by a resonant frequency of the resonant circuit based upon capacitance of the inductor L1 and the capacitors C11 and C12 connected in series. The negative conductance generating circuit 1 is formed by operation of the transistor to the resonant circuit. Since the oscillator shown in FIG. 43 is of a single phase, such a merit can be obtained that consumption current is small. Further, since the MOS transistor is used in the oscillator according to the thirty-third embodiment, which is different from the oscillator shown in FIG. 41 where the bipolar transistor is used, the power source voltage can be reduced to about 2.5V when a threshold voltage Vth of the MOS transistor is 0.4V, for example, though the power source voltage required for operation of the oscillator shown in FIG. 41 is 3V.

Thirty-Fourth Embodiment

Figure 44:
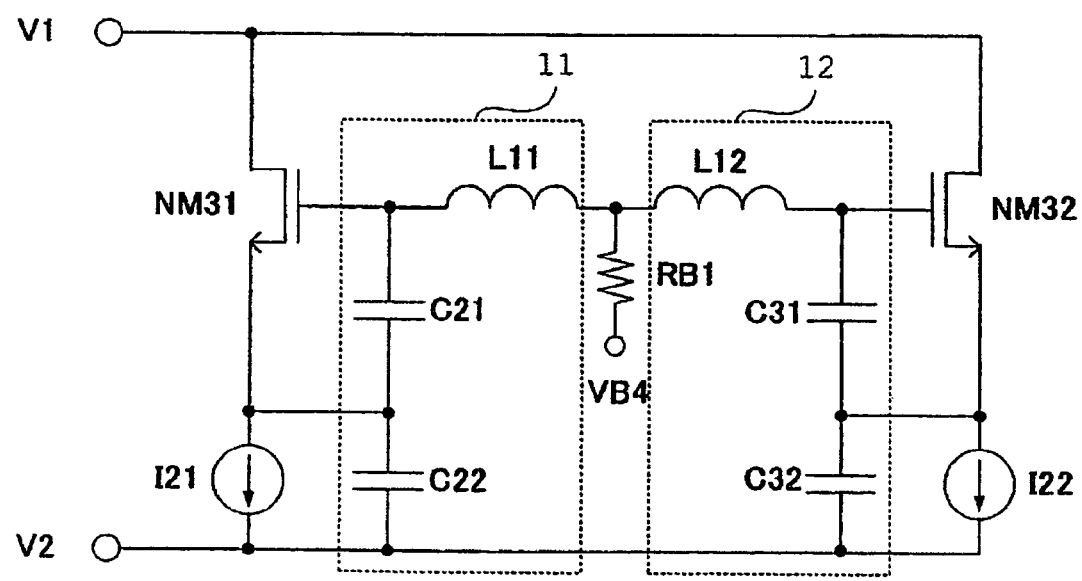
FIG. 44 is a circuit diagram for explaining an oscillator according to a thirty-fourth embodiment of the present invention.

An oscillator according to a thirty-fourth embodiment of the present invention is described in FIG. 44. The thirty-fourth embodiment is one example of a Colpitts oscillator of a differential type like the thirty-second embodiment shown in FIG. 42, where a MOS transistor is used instead of the bipolar transistor. In the thirty-fourth embodiment, a half configuration for the differential type oscillator includes an NMOS transistor NM31 whose drain is connected to a first constant voltage terminal V1 and whose source is connected to a second constant voltage terminal V2 via a first constant current source I21, a capacitor C21 whose one end is connected to the gate of the transistor NM31 and whose other end is connected to the source of the transistor NM31, a capacitor C22 whose one end is connected to the source of the transistor NM31 and whose other end is connected to the second constant voltage terminal V2 of NM31, and an inductor L11 connected to the gate of the transistor NM31.

The remaining half for the differential type includes an NMOS transistor NM32 whose drain is connected to the first constant voltage terminal V1, whose source is connected to the second constant voltage terminal V2 via the second constant current source I22, and whose size is equal to that of the transistor NM31, a capacitor C31 whose one terminal is connected to the gate of the transistor NM32, whose other end is connected to the source of the transistor NM32, and whose capacitance value is equal to that of the capacitor C21, a capacitor C32 whose one end is connected to the source of the transistor NM32, whose other end is connected to the second constant voltage terminal V2, and whose capacitance value is equal to that of the capacitor C22, and an inductor L12 connected to the base of the transistor NM32. The inductors L11 and L12 whose one ends are connected to the gates of transistors NM31 and NM32, respectively, are connected to a common point at their other ends, and the common point is connected to a terminal VB4 inputted with a fixed bias voltage VB4 via a resistor RB1.

The LC resonant circuit 11 composed of L11, C21, and C22, and the LC resonant circuit 12 composed of L12, C31, and C32 are configured to include either of the LC resonant circuits described in the first to thirteenth embodiments. Therefore, fluctuation of KV due to a capacitance value of the capacitor bank can be suppressed or KV can be made constant regardless of the capacitance value of the capacitor bank. Since the oscillator shown in FIG. 44 is of the differential type, consumption current is larger than that in the single phase Colpitts oscillator shown in FIG. 43, but a stable oscillation frequency to the power source voltage can be obtained. Since the MOS transistor are used in the oscillator according to the thirty-fourth embodiment, which is different from the oscillator shown in FIG. 42 where the bipolar transistor is used, the power source voltage can be reduced to about 2.5V when a threshold voltage Vth of the MOS transistor is 0.4V, for example, though the power source voltage required for operation of the oscillator shown in FIG. 42 is 3V.

Thirty-Fifth Embodiment

Note that it is not that the effects of the present invention obtained according to the fourteenth to thirty-fourth embodiments are achieved only when the bipolar transistor is used in the elementary circuit and when the MOS transistor is used therein, but it goes without saying that similar effects can be obtained even if a field effect transistor, a heterojunction bipolar transistor, or a high electron mobility transistor is used instead of the bipolar transistor or the MOS transistor and similar effects can be obtained even if exchange between P type semiconductor and N type semiconductor in the device is performed.

Representative ones of the present invention described above are described below.

An LC resonant circuit of the present invention includes: a parallel capacitor having a first capacitor bank composed of a plurality of variable capacitors which are connected in parallel and whose capacitance values vary from small to large value according to a first control signal and a first fine adjustable capacitor which is a variable capacitor whose capacitance value varies according to a second control signal; a series capacitor having a second capacitor bank composed of a plurality of variable capacitors which are connected in parallel and whose capacitance values vary from small to large value according to a third control signal and a second fine adjustable capacitor which is a variable capacitor whose capacitance value varies according to the second control signal; and an inductor. The LC resonant circuit controls changing rate of a resonant frequency to the second control signal by controlling the capacitance value of the second capacitor bank. Since the changing rate of the resonant frequency can be controlled using a capacitance element with reduced loss, a quality factor higher than that of the conventional art can be obtained. The capacitor element can be obtained easily in a semiconductor device, where practical utility is high.

The oscillator of the present invention is an oscillator that comprises an LC resonant circuit including an inductor and a capacitor and a negative conductance generating circuit that is connected to the LC resonant circuit and generates negative conductance, and that outputs a signal with a frequency approximately defined by a resonant frequency of the resonant circuit, where the LC resonant circuit is the LC resonant circuit of the present invention described above. By using the LC resonant circuit with a high quality factor of the present invention, an oscillator where fluctuation of a frequency conversion gain is reduced and phase noise is low can be obtained.

A semiconductor device of the present invention is a semiconductor device where an oscillator is formed on a substrate, where an inductor of an LC resonant circuit comprises a pair of inductors magnetically coupling a first variable capacitor and a second variable capacitor via mutual inductance, the pair of inductors comprised a first inductor and a second inductor, the first inductor is composed of one winding of an inductor whose midpoint is connected to a voltage terminal in an insulating layer formed on the substrate, the pair of inductors are composed of one winding of inductor in the insulating layer, the second inductor is disposed adjacent to inside and outside of the pair of inductors, and AC magnetic fields induced by causing an alternating current to flow in both the inductors causes interlinkage so that mutual inductance M serves.

A data processing equipment of the present invention comprises: a low noise amplifier that amplifies a reception signal received by an antenna; a mixer that converts a frequency of an output signal of the low noise amplifier; an oscillator that generates a local oscillation signal for frequency conversion to output the same to the mixer; a demodulating circuit that takes a reception baseband signal from the output signal of the mixer; a modulator that converts a baseband signal to be transmitted to output two signals orthogonal to each other; an orthogonal modulator that outputs the two signals outputted from the modulator by using the local oscillation signal outputted by the oscillator as an orthogonal modulation signal; a power amplifier that amplifies the orthogonal modulation signal; and a switch that supplies the reception signal from the antenna to the low noise amplifier at a signal reception time and supplies the orthogonal modulation signal outputted from the power amplifier to the antenna at a signal transmission time, wherein the oscillator is the oscillator of the present invention using the LC resonator of the present invention. The data processing equipment of the present invention can accommodate a plurality of communication systems or applications by using an oscillator where phase noise is low, a frequency conversion gain is small, and a frequency variable range is wide.

<Preferred Embodiments of the Second Technique>

Embodiments of the invention of the second technique will be explained in detail below with reference to the drawings. In FIG. 49 to FIG. 87 for describing embodiments, same or similar members are attached with same reference numerals, and repetitive explanation thereof is omitted.

Hereinafter, a voltage-controlled oscillator (hereinafter, called "oscillator" simply) of the present invention and a data processing equipment using the same will be further explained referring to several embodiments shown in the drawings. In the following, first to twelfth embodiments are directed to a technique of an oscillator of the present invention (control on negative conductance according to an oscillation frequency), thirteenth to twenty-fourth embodiments are directed to another technique of the oscillator of the present invention (control on effective impedance of a resonant circuit according to an oscillation frequency), and twenty-fifth to thirty-first embodiments are directed to a technique of a data processing equipment using the oscillator of the present invention.

First Embodiment

A first embodiment of the present invention for realizing an oscillator that can achieve a wide band and low phase noise characteristic at a low current. The oscillator of the first embodiment includes a negative conductance generating circuit (NGG) 11 and a resonant circuit (RES) 21. The negative conductance generating circuit 11 is a circuit that is included in a gain generating circuit that generates a gain required for oscillation, for generating a negative current gain, namely, negative conductance to AC voltage. The resonant circuit 21 is a circuit that can vary a resonant frequency according to a frequency control signal group.

The resonant circuit 21 includes a frequency control terminal group fCONT composed of frequency control terminals that can control at least one resonant frequency, and it can change an oscillation frequency according to a control signal inputted in fCONT. The negative conductance generating circuit 11 includes a negative conductance control terminal group GCONT composed of at least one negative conductance control terminal for controlling negative conductance, and it can change negative conductance generated by the negative conductance generating circuit 11 according to a control signal inputted into GCONT.

Figure 49:
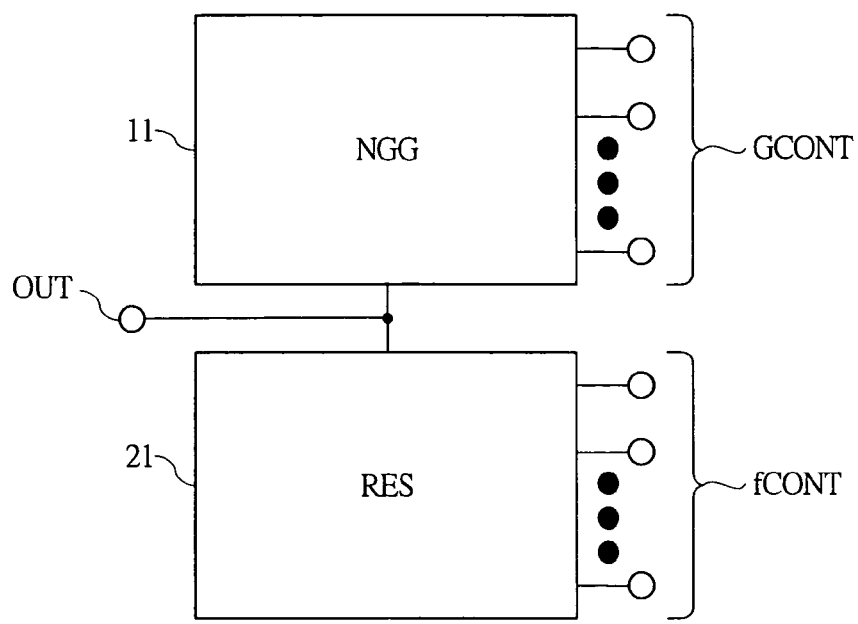
FIG. 49 is a circuit configuration diagram of a voltage-controlled oscillator according to a first embodiment of the present invention.

By adopting the configuration shown in FIG. 49, an oscillator that can suppress fluctuation of an oscillation amplitude at terminal OUTPUT caused by frequency change and can achieve a low phase noise characteristic in a wide band can be realized.

Second Embodiment

A second embodiment for realizing an oscillator that can achieve a wide band and low phase noise characteristic at a low current will be explained with reference to FIG. 50. The second embodiment includes a negative conductance generating circuit 11, a resonant circuit 21, and a signal processing circuit (LOG) 31. The resonant circuit 21 includes a frequency coarse adjustment terminal group fCOARSE composed of frequency control terminals that can control at least one resonant frequency stepwise and a frequency fine adjustment terminal fFINE that can control a resonant frequency continuously, and it can change an oscillation frequency stepwise according to control signal group inputted into fCOARSE and can change the oscillation frequency continuously according to a control signal inputted into fFINE. The negative conductance generating circuit 11 includes a negative conductance control terminal group GCONT composed of at least one negative conductance control terminal for controlling negative conductance, and it can control negative conductance generated by the negative conductance generating circuit 11 according to a control signal inputted into the GCONT. The signal processing circuit 31 is inputted with at least one signal group of control signal groups inputted into fCOARSE to convert the same into a signal group for controlling at least one negative conductance and output the same. An output signal of the signal processing circuit 31 is inputted into GCONT so that the negative conductance of the negative conductance generating circuit 11 is controlled.

Figure 50:
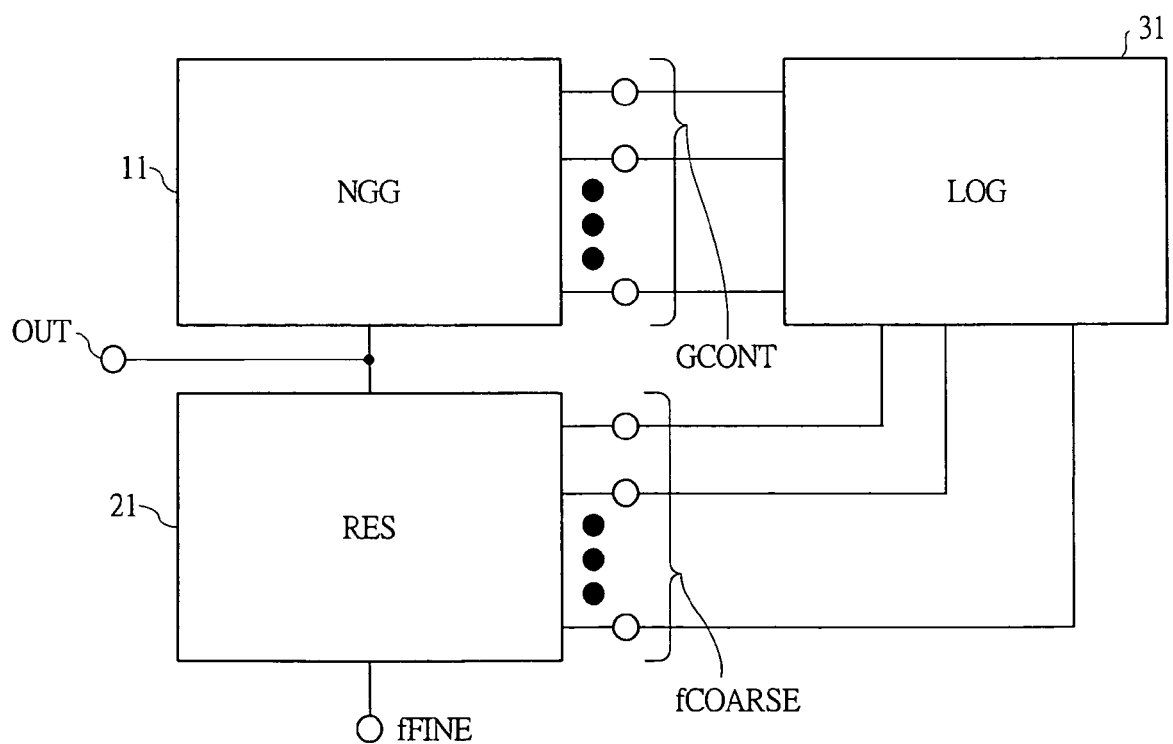
FIG. 50 is a circuit configuration diagram of a voltage-controlled oscillator according to a second embodiment of the present invention.

By adopting the configuration shown in FIG. 50, an oscillator that can control negative conductance according to stepwise change of an oscillation frequency and can achieve low phase noise characteristic in a wide band can be realized. Since the configuration shown in FIG. 50 can process a frequency control signal to automatically control negative conductance linking the frequency, the number of control terminals can be reduced as compared with the configuration shown in FIG. 49.

Third Embodiment

A third embodiment for realizing an oscillator that can achieve a wide band and low phase noise characteristic at a low current will be explained with reference to FIG. 51. In the oscillator according to the third embodiment, the resonant circuit 21 in the second embodiment is composed of a parallel circuit including a series circuit of inductors L1 and L2, capacitor banks CB1 and CB2 that can control a resonant frequency stepwise according to control signal groups inputted into frequency coarse adjustment terminal group fCOARSE, and frequency fine adjustable capacitors CV1 and CV2 that can control a resonant frequency continuously according to a control signal inputted into the frequency fine adjustment terminal fFINE.

Figure 51:
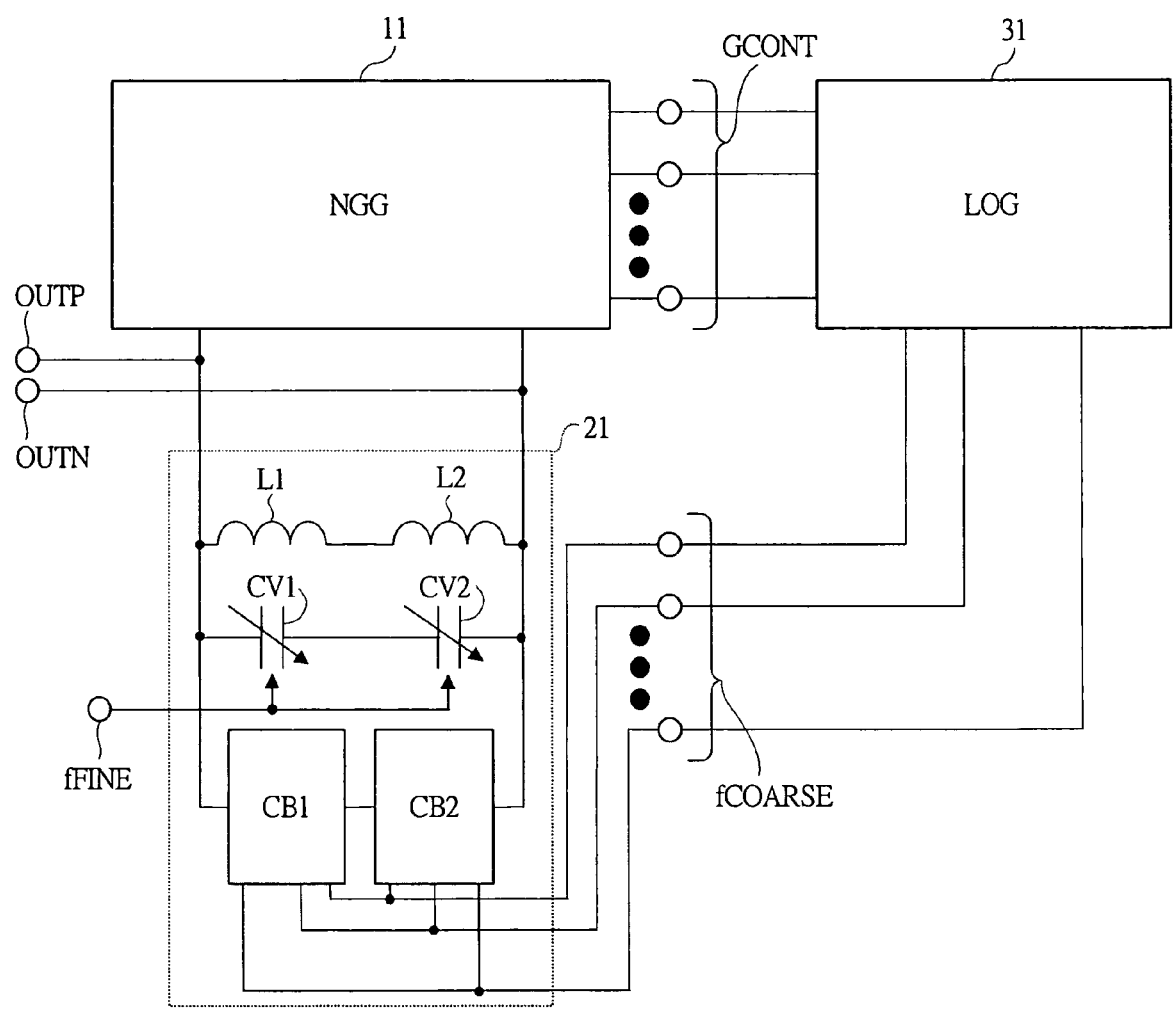
FIG. 51 is a circuit configuration diagram of a voltage-controlled oscillator according to a third embodiment of the present invention.

By adopting the configuration shown in FIG. 51, an oscillator that can achieve band expansion using the capacitor banks, can control negative conductance generated by the negative conductance generating circuit 11 according to stepwise change of the oscillation frequency, and achieve low phase noise characteristic in a wide band can be realized. Moreover, by configuring the resonant circuit 21 using the inductors and the capacitors, the resonant circuit 21 together with the negative conductance generating circuit 11 can be integrated on the same or one substrate.

Fourth Embodiment

A fourth embodiment for realizing an oscillator that can achieve a wide band and low phase noise characteristic at a low current will be explained with reference to FIG. 52. In the oscillator according to the fourth embodiment, the resonant circuit 21 in the second embodiment is composed of a parallel circuit including a series circuit of variable inductors LV1 and LV2 that can control inductance stepwise according to a control signal group inputted into the frequency coarse adjustment terminal group fCOARSE, and frequency fine adjustable capacitors CV1 and CV2 that can control a resonant frequency continuously according to a control signal inputted into the frequency fine adjustment terminal fFINE.

Figure 52:
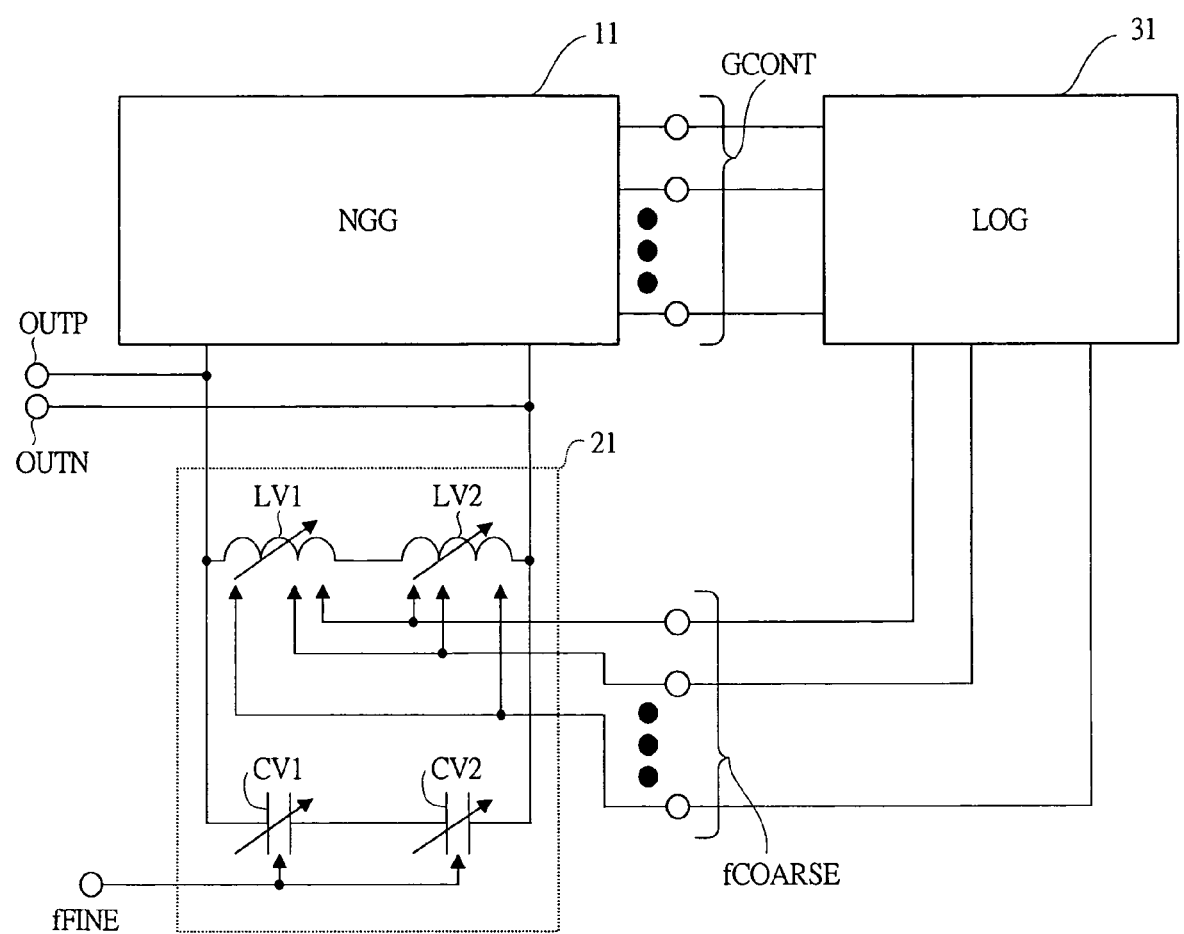
FIG. 52 is a circuit configuration diagram of a voltage-controlled oscillator according to a fourth embodiment of the present invention.

By adopting the configuration shown in FIG. 52, an oscillator that can achieve band expansion using the variable inductors, can control negative conductance generated by the negative conductance generating circuit 11 according to stepwise change of the oscillation frequency, and achieve low phase noise characteristic in a wide band can be realized. By configuring the resonant circuit 21 using the inductors and the capacitors, the resonant circuit 21 together with the negative conductance generating circuit 11 can be integrated on the same or one substrate.

Fifth Embodiment

A fifth embodiment for realizing an oscillator that can achieve a wide band and a low phase noise characteristic at a low current will be explained with reference to FIG. 53. In the oscillator according to the fifth embodiment, the resonant circuit 21 in the second embodiment is composed of a parallel circuit including a series circuit of variable inductors LV1 and LV2 that can control inductance stepwise according to a control signal group inputted into a frequency coarse adjustment terminal group fCOARSE2, capacitor banks CB1 and CB2 that can control a capacitance value stepwise according to a control signal group inputted into a frequency coarse adjustment terminal group fCOARSE1, and frequency fine adjustable capacitors CV1 and CV2 that can control a capacitance value continuously according to a control signal inputted into the frequency fine adjustment terminal fFINE.

Figure 53:
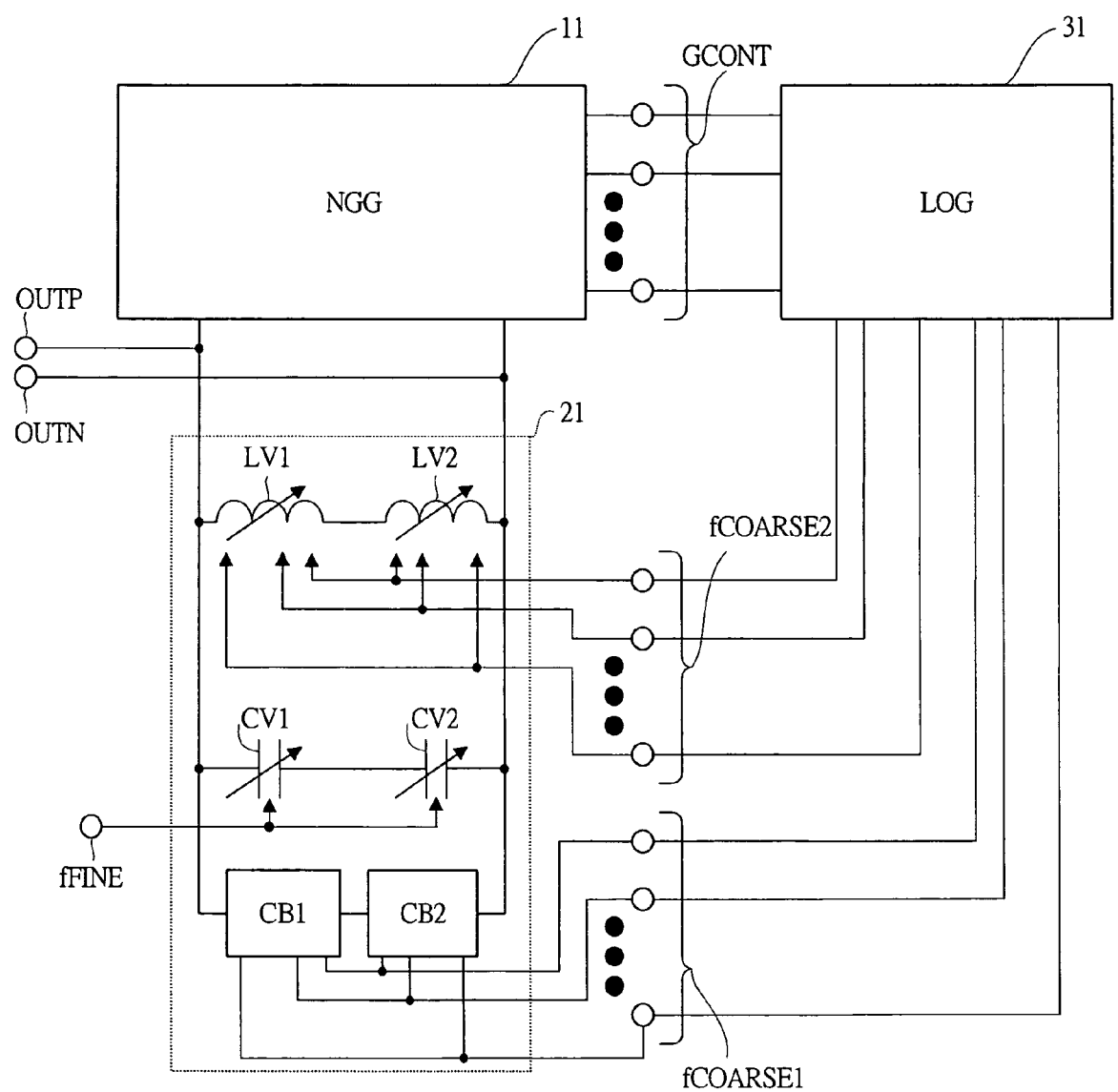
FIG. 53 is a circuit configuration diagram of a voltage-controlled oscillator according to a fifth embodiment of the present invention.

By adopting the configuration shown in FIG. 53, an oscillator that can achieve band expansion using the variable inductors and the capacitor banks, can control negative conductance generated by the negative conductance generating circuit 11 according to stepwise change of the oscillation frequency, and achieve a low phase noise characteristic in a wide band can be realized. By using both the capacitor banks and the variable inductors in the fifth embodiment, the frequency variable range can be expanded as compared with the third embodiment and the fourth embodiment. By configuring the resonant circuit 21 using the inductors and the capacitors, the resonant circuit 21 together with the negative conductance generating circuit 11 can be integrated on the same or one substrate.

Sixth Embodiment

A sixth embodiment for realizing an oscillator that can achieve a wide band and low phase noise characteristic at a low current will be explained with reference to FIG. 54. In the oscillator according to the sixth embodiment, the negative conductance generating circuit 11 in the second embodiment to the fifth embodiment is composed of a parallel circuit including a negative conductance generating unit NGPM1 formed by cross-coupled PMOS transistors PM1 and PM2 and a negative conductance generating unit NGB1 formed by cross-coupled NPN transistors Q1 and Q2 of a bipolar junction transistor (BJT) via capacitance-coupling capacitors C1 and C2, and a current source CS1 of a power source circuit, and it also includes a negative conductance control terminal group GCONT for controlling negative conductance generated by NGPM1.

In the negative conductance generating circuit 11, both source electrodes of the PMOS transistors PM1 and PM2 are commonly connected to a voltage terminal V1, a drain electrode of the PMOS transistor PM1 is connected to a gate electrode of the PMOS transistor PM2, and a drain electrode of the PMOS transistor PM2 is connected to a gate electrode of the PMOS transistor PM1. Both emitter electrodes of NPN transistors Q1 and Q2 are commonly connected to a voltage terminal V2 via the current source CS1, a collector electrode of the NPN transistor Q1 is connected to a base electrode of the NPN transistor Q2 via the capacitor C1, and a collector electrode of the NPN transistor Q2 is connected to a base electrode of the NPN transistor Q1 via the capacitor C2. The drain electrode of the PMOS transistor PM1 is connected to the collector electrode of the NPN transistor Q1 and is also connected to an electrode (output terminal OUTN side) of the resonant circuit 21, and the drain electrode of the PMOS transistor PM2 is connected to the collector electrode of the NPN transistor Q2 and is also connected to an electrode (output terminal OUTP side) of the resonant circuit 21.

Figure 54:
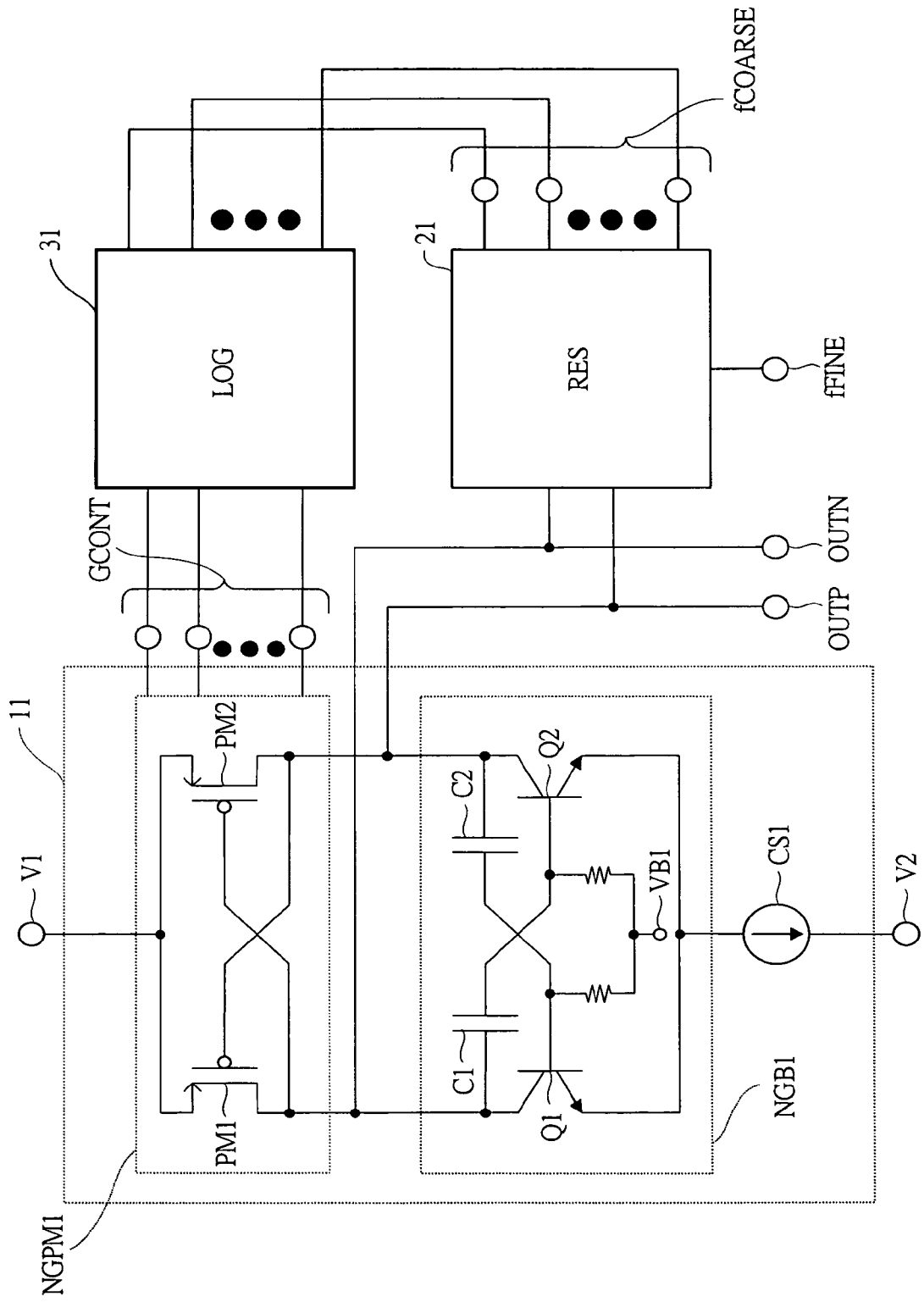
FIG. 54 is a circuit configuration diagram of a voltage-controlled oscillator according to a sixth embodiment of the present invention.

By adopting the configuration shown in FIG. 54, since negative conductance generated by the negative conductance generating circuit 11 can be automatically controlled in a state that a bias current caused to flow in BJT is set near a current value minimizing a noise index according to an oscillation frequency, an oscillator that can reduce fluctuation of an oscillation amplitude and can achieve low phase noise characteristic in a wide band can be realized.

Seventh Embodiment

A seventh embodiment for realizing an oscillator that can achieve a wide band and low phase noise characteristic at a low current will be explained with reference to FIG. 55. In the oscillator according to the seventh embodiment, the variable negative conductance generating unit NGPM1 of the negative conductance generating circuit 11 according to the sixth embodiment is composed of 2×K negative conductance control PMOS transistors PMS11 to PMS1K and PMS21 to PMS2K, and switches SW111 to SW11K and SW121 to SW12K, SW211 to SW21K and SW221 to SW22K for turning ON/OFF gate biases of the respective PMOS transistors for negative conductance control in addition to PM1 and PM2.

In the variable negative conductance generating unit NGPM1, the negative conductance control PMOS transistors PMS11 to PMS1K are connected between a drain electrode and a source electrode of the PMOS transistor PM1, the switches SW111 to SW11K are connected between gate electrodes and drain electrodes of the negative conductance control PMOS transistors PMS11 to PMS1K, and the switches SW121 to SW12K are connected between the gate electrodes and source electrodes of the negative conductance control PMOS transistors PMS11 to PMS1K. The negative conductance control PMOS transistors PMS21 to PMS2K are connected between a drain electrode and a source electrode of the PMOS transistor PM2, the switches SW211 to SW21K are connected between gate electrodes and drain electrodes of the negative conductance control PMOS transistors PMS21 to PMS2K, and the switches SW221 to SW22K are connected between the gate electrodes and source electrodes of the negative conductance control PMOS transistors PMS21 to PMS2K. Each of the switches SW111 to SW11K, SW121 to SW12K, SW211 to SW21K, and SW221 to SW22K is opened and closed by each of control signals inputted into the negative conductance control terminal group GCONT.

An operation of the seventh embodiment will be explained. When SW121 to SW12K and SW221 to SW22K are opened and SW111 to SW11K and SW211 to SW21K are closed, the gate voltages of the PMS11 to PMS1K and PMS21 to PMS2K are respectively biased to the gate voltages of PM2 and PM1 so that alternating currents are caused to flow in PMS11 to PMS1K and PMS21 to PMS2K. As a result, amplitudes of alternating currents flowing in PM1 and PM2 are reduced. Since PMS11 to PMS1K and PMS21 to PMS2K are not cross-coupled to each other so that negative conductance is not generated, negative conductance is reduced due to decrease of amplitudes of alternating currents flowing in PM1 and PM2. On the contrary, when SW121 to SW12K and SW221 to SW22K are closed and SW111 to SW11K and SW211 to SW21K are opened, gate voltages of PMS11 to PMS1K and PMS21 to PMS2K become equal to source voltages so that no alternating current flows in PMS11 to PMS1K and PMS21 to PMS2K. As a result, amplitudes of alternating currents flowing in PM1 and PM2 is increased and negative conductance generated by PM1 and PM2 is increased. By opening and closing the switches, alternating currents flowing in PM1 and PM2 can be controlled so that negative conductance can be controlled.

Figure 55:
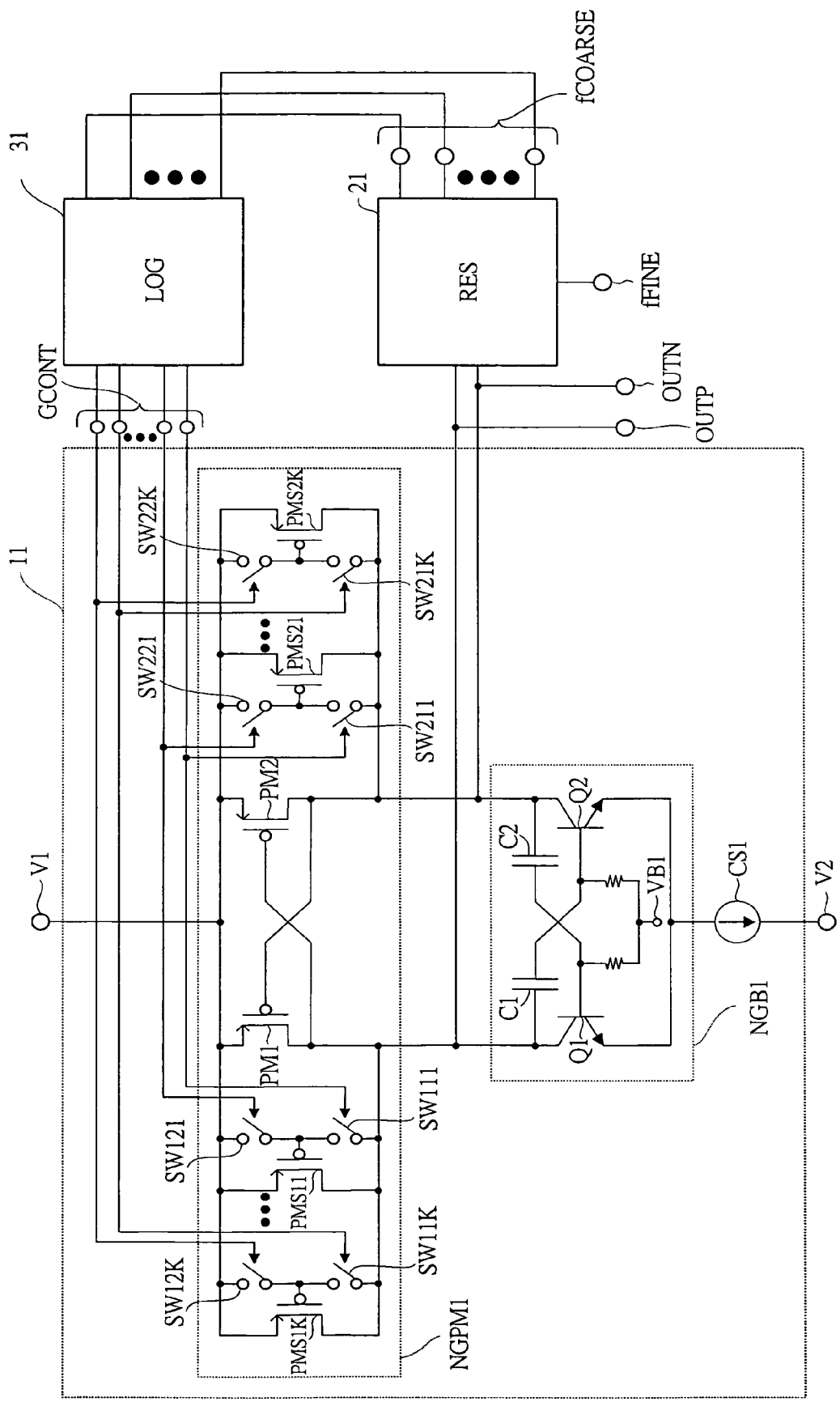
FIG. 55 is a circuit configuration diagram of a voltage-controlled oscillator according to a seventh embodiment of the present invention.

In FIG. 55, by setting gate lengths of PMS11 to PMS1K and PMS21 to PMS2K to be equal to gate lengths of PM1 and PM2, a ratio of values of alternating currents flowing in PMS11 to PMS1K and PMS21 to PMS2K can be determined according to a gate width ratio, which is desirable. By setting gate widths of PMS11 to PMS1K and PMS21 to PMS2K to W1 to W1×$2^K$, $2^K$ different negative conductances can be generated, which is desirable.

By adopting the configuration shown in FIG. 55, since negative conductance generated by the negative conductance generating circuit 11 is decreased according to rising of an oscillation frequency, negative conductance generated by the negative conductance generating circuit 11 can be automatically controlled in a state that a bias current caused to flow in BJT is set near a current value minimizing a noise index according to an oscillation frequency, so that an oscillator that can reduce fluctuation of an oscillation amplitude and can achieve low phase noise characteristic in a wide band can be realized.

Eighth Embodiment

An eighth embodiment for realizing an oscillator that can achieve a wide band and low phase noise characteristic at a low current will be explained with reference to FIG. 56. In the oscillator according to the eighth embodiment, the switches SW111 to SW11K, SW121 to SW12K, SW211 to SW21K, and SW221 to SW22K in the seventh embodiment are composed of PMOS transistors SWPM111 to SWPM11K, SWPM121 to SWPM12K, SWPM211 to SWPM21K, and SWPM221 to SWPM22K, respectively. Voltage signals inputted into the gates of SWPM111 to SWPM11K and SWPM211 to SWPM21K respectively are inputted into the gates of SWPM211 to SWPM21K and SWPM221 to SWPM22K via an inverter.

When voltage signals with low (Low) level are inputted into the gates of SWPM111 to SWPM11K and SWPM211 to SWPM21K, SWPM111 to SWPM11K and SWPM211 to SWPM21K are turned ON, and gate voltages at PMS11 to PMS1K and PMS21 to PMS2K are biased to gate voltages of PM2 and PM1 so that alternating currents are caused to flow in PMS11 to PMS1K and PMS21 to PMS2K. As a result, currents flowing in PM1 and PM2 are reduced. Since PMS11 to PMS1K and PMS21 to PMS2K are not cross-coupled, negative conductance is not generated, so that negative conductance is reduced due to decrease of currents flowing in PM1 and PM2. On the contrary, when voltage signals with high (High) level are inputted into the gates of SWPM111 to SWPM11K and SWPM211 to SWPM21K, SWPM111 to SWPM11K and SWPM211 to SWPM21K are turned OFF and SWPM121 to SWPM12K and SWPM221 to SWPM22K are turned ON, so that the gate voltages of PMS11 to PMS1K and PMS21 to PMS2K become equal to the source voltages so that no alternating current flows in PMS11 to PMS1K and PMS21 to PMS2K. As a result, currents flowing in PM1 and PM2 are increased so that negative conductance generated by PM1 and PM2 is increased. By turning the switch PMOS transistors ON/OFF, alternating currents flowing in PM1 and PM2 can be controlled so that negative conductance can be controlled.

Figure 56:
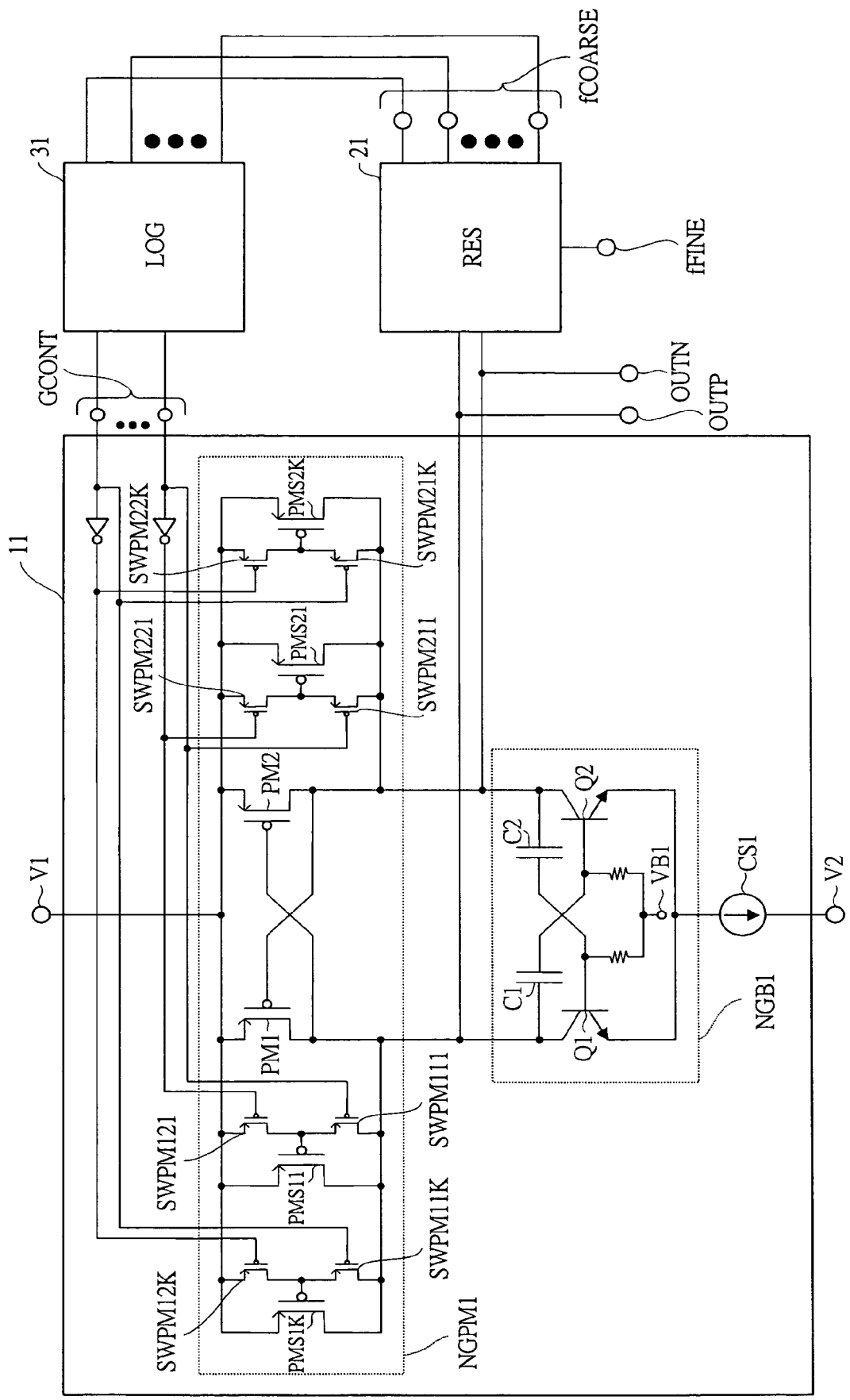
FIG. 56 is a circuit configuration diagram of a voltage-controlled oscillator according to an eighth embodiment of the present invention.

In FIG. 56, by setting gate lengths of PMS11 to PMS1K and PMS21 to PMS2K to be equal to gate lengths of PM1 and PM2, a ratio of values of alternating currents flowing in PMS11 to PMS1K and PMS21 to PMS2K can be determined according to a gate width ratio, which is desirable. By setting gate widths of PMS11 to PMS1K and PMS21 to PMS2K to W1 to W1×$2^K$, $2^K$ different negative conductances can be generated, which is desirable.

By adopting the configuration shown in FIG. 56, since negative conductance generated by the negative conductance generating circuit 11 can be automatically adjusted in a state that a bias current caused to flow in BJT is set near a current value minimizing a noise index according to an oscillation frequency, an oscillator that can reduce fluctuation of an oscillation amplitude and can achieve low phase noise characteristic in a wide band can be realized. By using the PMOS transistor as the switch, the switch can be integrated on a substrate on which the oscillator is disposed.

Ninth Embodiment

A ninth embodiment for realizing an oscillator that can achieve a wide band and low phase noise characteristic at a low current will be explained with reference to FIG. 57. In the oscillator according to the ninth embodiment, the variable negative conductance generating unit NGPM1 of the negative conductance generating circuit 11 according to the sixth embodiment is composed of 2×K negative conductance control diodes D11 to D1K and D21 to D2K, and switches SW311 to SW31K, SW411 to SW41K, for turning the respective negative conductance control diodes ON/OFF in addition to PM1 and PM2.

In the variable negative conductance generating unit NGPM1, a series circuit of the negative conductance control diodes D11 to D1K and switches SWP311 to SWP31K is connected between a drain electrode and a source electrode of the PMOS transistor PM1 in parallel. A series circuit of the negative conductance control diodes D21 to D2K and switches SW411 to SW41K is connected between a drain electrode and a source electrode of the PMOS transistor PM2 in parallel. Each of the switches SW311 to SW31K and SW411 to SW41K is opened and closed by each of control signals inputted into the negative conductance control terminal group. (GCONT)

An operation of the ninth embodiment will be explained. When SW311 to SW31K and SW411 to SW41K are closed, cathode voltages of D11 to D1K and D21 to D2K are respectively biased to the gate voltages of PM2 and PM1 so that alternating currents are caused to flow in D11 to D1K and D21 to D2K. As a result, currents flowing in PM1 and PM2 are decreased. Since D11 to D1K and D21 to D2K do not generate negative conductance, negative conductance is decreased due to decrease of currents flowing in PM1 and PM2. On the contrary, when SW311 to SW31K and SW411 to SW41K are opened, since the cathode voltages of D11 to D1K and D21 to D2K are put in opened states, no alternating current flows in D11 to D1K and D21 to D2K. As a result, alternating currents flowing in PM1 and PM2 are increased so that negative conductance generated by PM1 and PM2 is increased. By opening and closing the switches, alternating currents flowing in PM1 and PM2 can be controlled so that negative conductance can be controlled.

Figure 57:
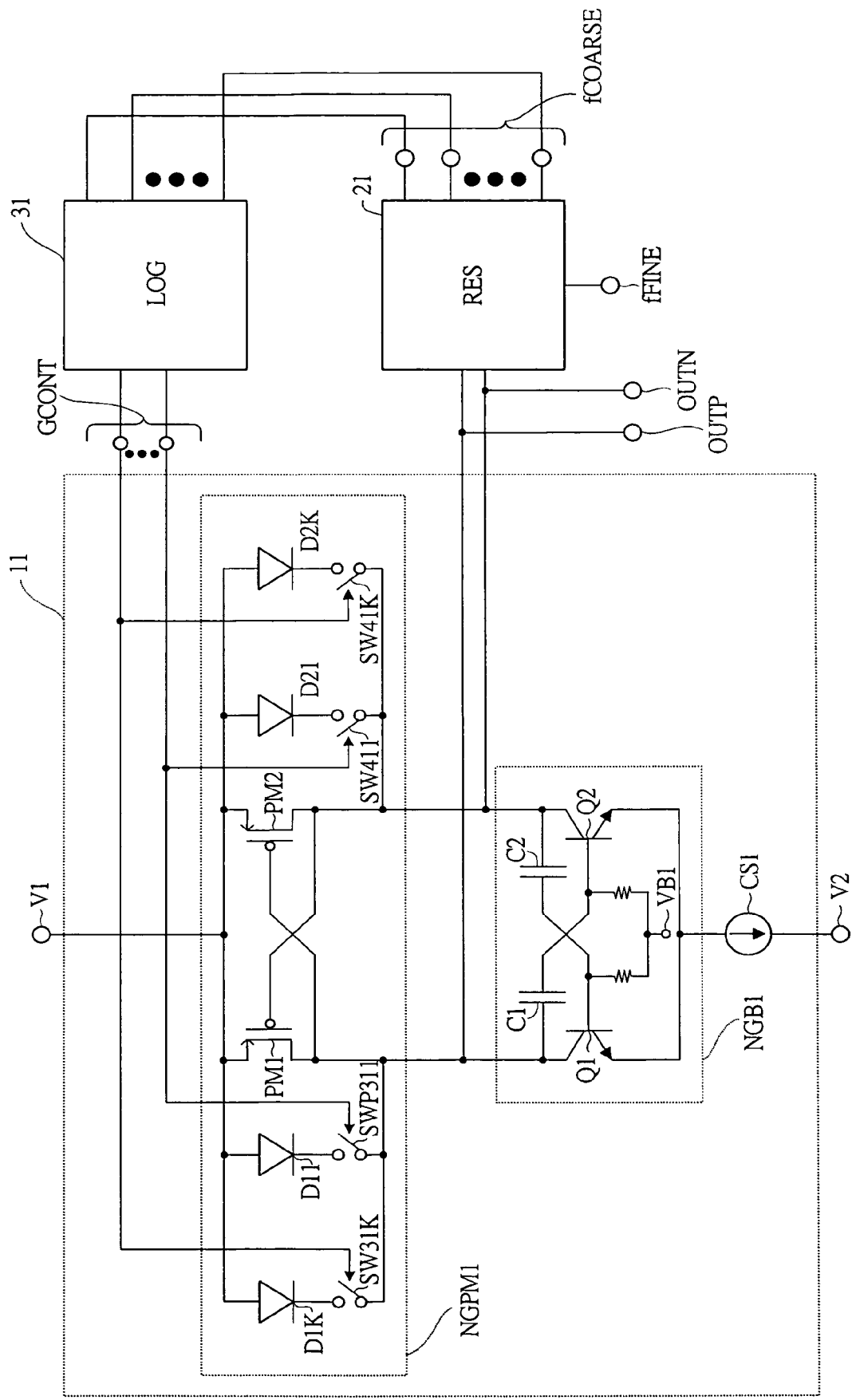
FIG. 57 is a circuit configuration diagram of a voltage-controlled oscillator according to a ninth embodiment of the present invention.

In FIG. 57, by setting p-n junction areas of D1 to D1K and D21 to D2K to S1 to S1×$2^K$, respectively, $2^K$ different negative conductances can be generated, which is desirable.

By adopting the configuration shown in FIG. 57, since negative conductance generated by the negative conductance generating circuit 11 can be automatically adjusted in a state that a bias current caused to flow in BJT is set near a current value minimizing a noise index according to an oscillation frequency, an oscillator that can reduce fluctuation of an oscillation amplitude and can achieve low phase noise characteristic in a wide band can be realized.

Tenth Embodiment

A tenth embodiment for realizing an oscillator that can achieve a wide band and low phase noise characteristic at a low current will be explained with reference to FIG. 58. In the oscillator according to the tenth embodiment, the switches SW311 to SW31K and SW411 to SW41K in the ninth embodiment are respectively composed of PMOS transistors SWPM311 to SWPM31K and SWPM411 to SWPM41K.

When voltage signals with low (Low) level are inputted into the gates of the SWPM311 to SWPM31K and SWPM411 to SWPM41K, SWPM311 to SWPM31K and SWPM411 to SWPM41K are turned ON, and cathode voltages of D11 to D1K and D21 to D2K are respectively biased the gate voltages of PM2 and PM1, so that alternating currents are caused to flow in D11 to D1K and D21 to D2K. As a result, currents flowing in PM1 and PM2 are decreased. Since D11 to D1K and D21 to D2K do not generate negative conductance, negative conductance is decreased due to decrease of currents flowing in PM1 and PM2. On the contrary, when voltage signals with high (High) level are inputted into the gates of SWPM311 to SWPM31K and SWPM411 to SWPM41K, since SWPM311 to SWPM31K and SWPM411 to SWPM41K are turned OFF, the cathode voltages of D11 to D1K and D21 to D2K are opened so that no alternating current is caused to flow in D11 to D1K and D21 to D2K. As a result, currents flowing in PM1 and PM2 are increased so that negative conductance generated by PM1 and PM2 is increased. By turning the switch PMOS transistors ON/OFF, alternating currents flowing in PM1 and Pm2 can be controlled so that negative conductance can be controlled.

Figure 58:
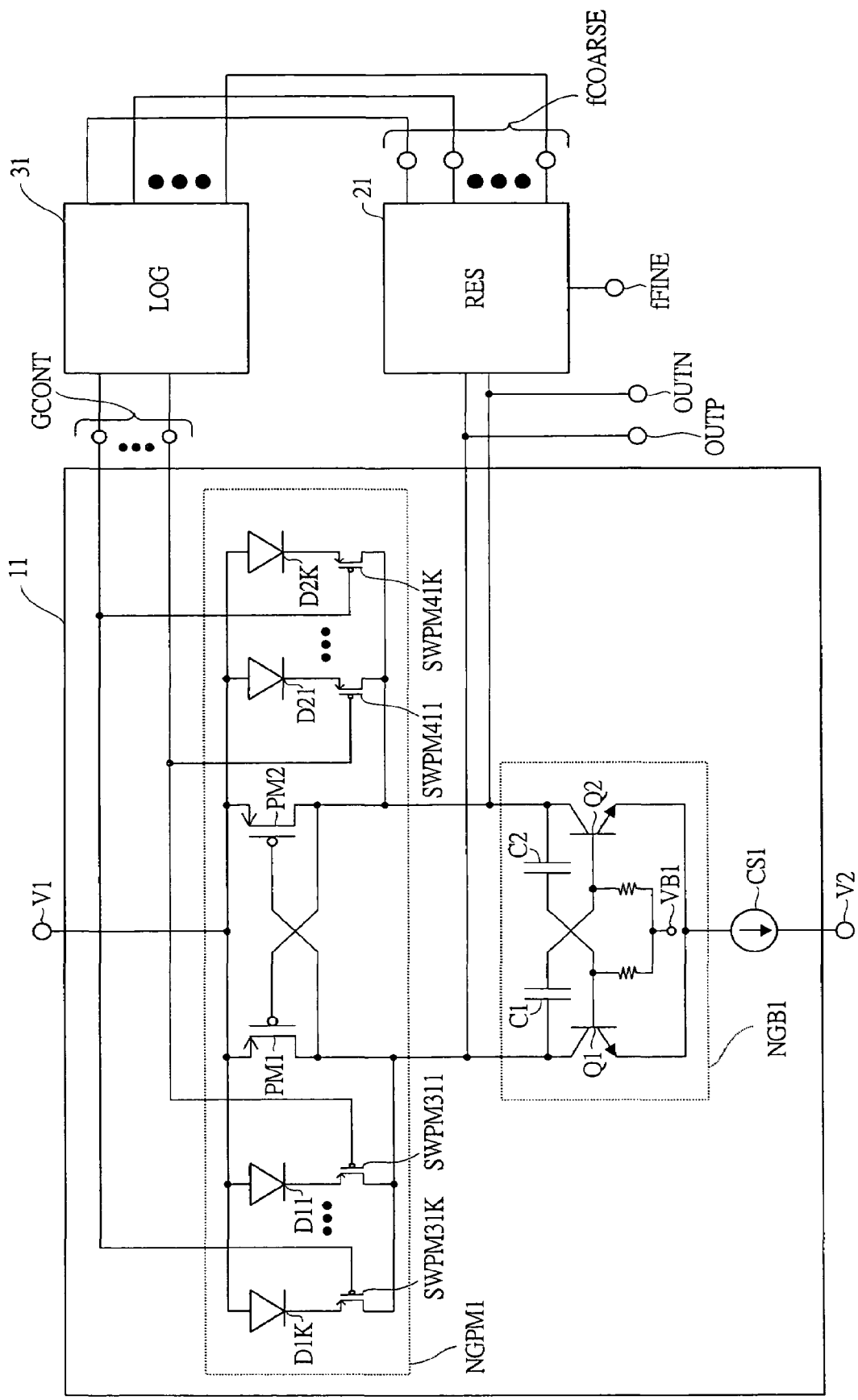
FIG. 58 is a circuit configuration diagram of a voltage-controlled oscillator according to a tenth embodiment of the present invention.

In FIG. 58, by setting p-n junction areas of D11 to D1K and D21 to D2K to S1 to S1×$2^K$, respectively, $2^K$ different negative conductances can be generated, which is desirable.

By adopting the configuration shown in FIG. 58, since negative conductance generated by the negative conductance generating circuit 11 can be automatically adjusted in a state that a bias current caused to flow in BJT is set near a current value minimizing a noise index according to an oscillation frequency, an oscillator that can reduce fluctuation of an oscillation amplitude and can achieve low phase noise characteristic in a wide band can be realized. By using the PMOS transistor as the switch, the switch can be integrated on a substrate on which the oscillator is disposed.

Eleventh Embodiment

An eleventh embodiment for realizing an oscillator that can achieve a wide band and low phase noise characteristic at a low current will be explained with reference to FIG. 59. In the oscillator according to the eleventh embodiment, the variable negative conductance generating unit NGPM1 of the negative conductance generating circuit 11 according to the sixth embodiment is composed of 2×K negative conductance control resistors R11 to R1K and R21 to R2K, and switches SW311 to SW31K, and SW411 to SW41K for turning the respective negative conductance control resistors ON/OFF in addition to PM1 and PM2.

In the variable negative conductance generating unit NGPM1, a series circuit of the negative conductance control resistors R11 to R1K and the switches SW311 to SW31K is connected between a drain electrode and a source electrode of the PMOS transistor PM1 in parallel. A series circuit of the negative conductance control resistors R21 to R2K and the switches SW411 to SW41K is connected between a drain electrode and a source electrode of the PMOS transistor PM2 in parallel. Each of the switches SW311 to SW31K and SW411 to SW41K is opened and closed according to each of control signals inputted into the negative conductance control terminal group GCONT.

An operation of the eleventh embodiment will be explained. when SW311 to SW31K and SW411 to SW41K are closed, voltages at terminals (one ends) of R11 to R1K and R21 to R2K that are not connected to V1 are biased to the gate voltages of PM2 and PM1 so that alternating currents are cause to flow in R11 to R1K and R21 to R2K. As a result, currents flowing in PM1 and PM2 are decreased. Since negative conductance is not generated at R11 to R1K and R21 to R2K, negative conductance is decreased due to decrease of currents flowing in PM1 and PM2. On the contrary, when SW311 to SW31K and SW411 to SW41K are opened, voltages at terminals (one ends) of R11 to R1K and R21 to R2K that are not connected to V1 become equal to the voltage of V1, so that no alternating current flows in R11 to R1K and R21 to R2K. As a result, alternating currents flowing in PM1 and PM2 are increased, so that negative conductance generated by PM1 and PM2 is increased. By opening and closing the switches, alternating currents flowing in PM1 and PM2 can be controlled so that negative conductance can be controlled.

Figure 59:
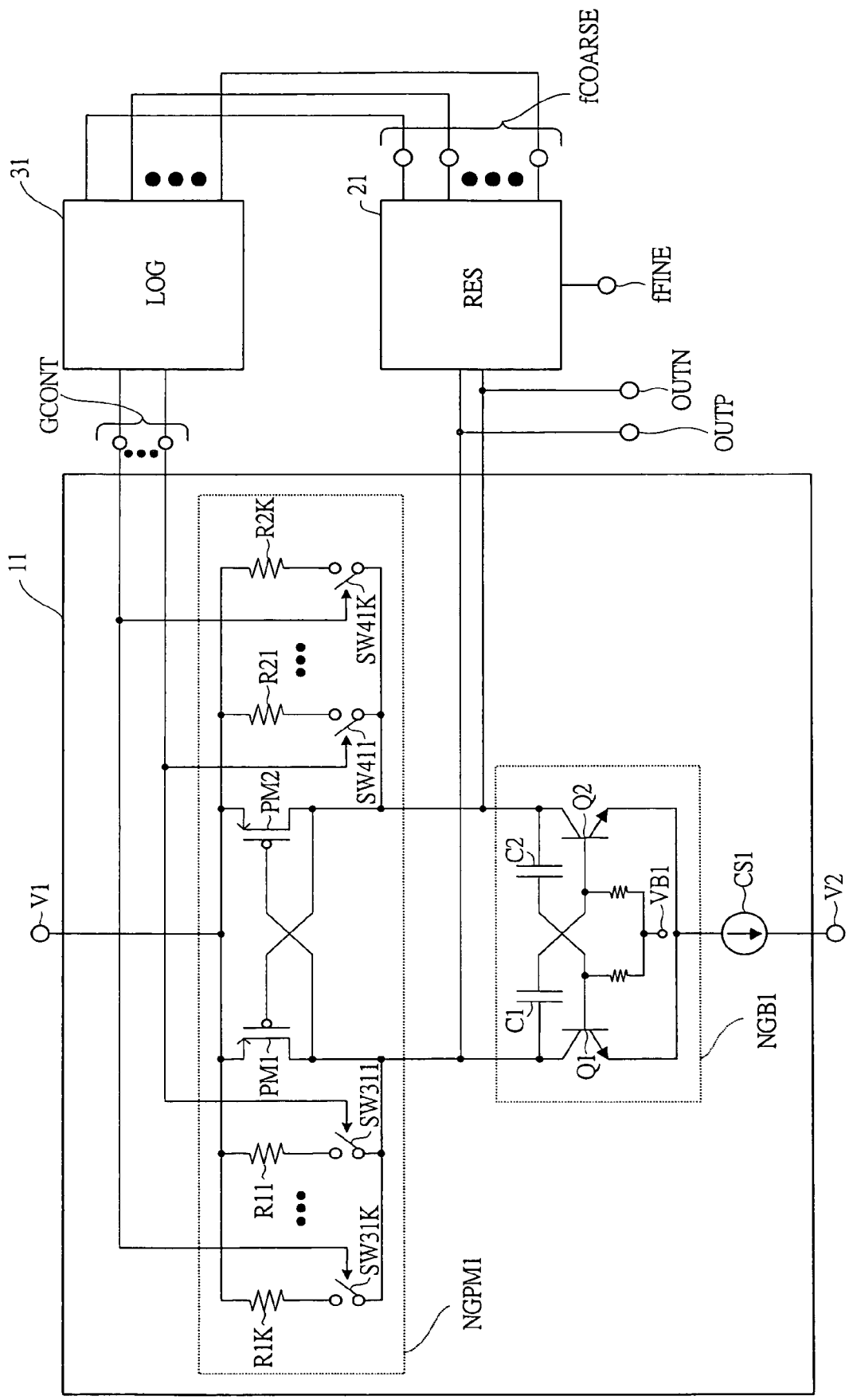
FIG. 59 is a circuit configuration diagram of a voltage-controlled oscillator according to an eleventh embodiment of the present invention.

In FIG. 59, by setting resistance values of R11 to R1K and R21 to R2K to R1 to R1×$2^K$, $2^K$ different negative conductances can be generated, which is desirable.

By adopting the configuration shown in FIG. 59, since negative conductance generated by the negative conductance generating circuit 11 can be automatically adjusted in a state that a bias current caused to flow in BJT is set near a current value minimizing a noise index according to an oscillation frequency, an oscillator that can reduce fluctuation of an oscillation amplitude and can achieve low phase noise characteristic in a wide band can be realized.

Twelfth Embodiment

A twelfth embodiment for realizing an oscillator that can achieve a wide band and low phase noise characteristic at a low current will be explained with reference to FIG. 60. In the oscillator according to the twelfth embodiment, the switches SW311 to SW31K and SW411 to SW41K in the eleventh embodiment are respectively composed of PMOS transistors SWPM311 to SWPM31K and SWPM411 to SWPM41K.

When voltage signals with low (Low) level are inputted into the gates of SWPM311 to SWPM31K and SWPM411 to SWPM41K, SWPM311 to SWPM31K and SWPM411 to SWPM41K are turned ON and voltages at terminals (one ends) of R11 to R1K and R21 to R2K that are not connected to V1 are respectively biased to the gate voltages of PM2 and PM1 so that alternating currents are caused to flow in R11 to R1K and R21 to R2K. As a result, currents flowing in PM1 and PM2 are decreased. Since R11 to R1K and R21 to R2K do not generate negative conductance, negative conductance is decreased due to decrease of currents flowing in PM1 and PM2. On the contrary, when voltage signals with high (High) level are inputted into the gates of SWPM311 to SWPM31K and SWPM411 to SWPM41K, SWPM311 to SWPM31K and SWPM411 to SWPM41K are turned OFF, so that voltages at terminals (one ends) of R11 to R1K and R21 to R2K that are not connected to V1 become equal to the voltage of V1 and no alternating current flows in R11 to R1K and R21 to R2K. As a result, currents flowing in PM1 and PM2 are increased so that negative conductance generated by PM1 and PM2 is increased. By turning the switch PMOS transistors ON/OFF, alternating currents flowing in PM1 and PM2 can be controlled so that negative conductance can be controlled.

Figure 60:
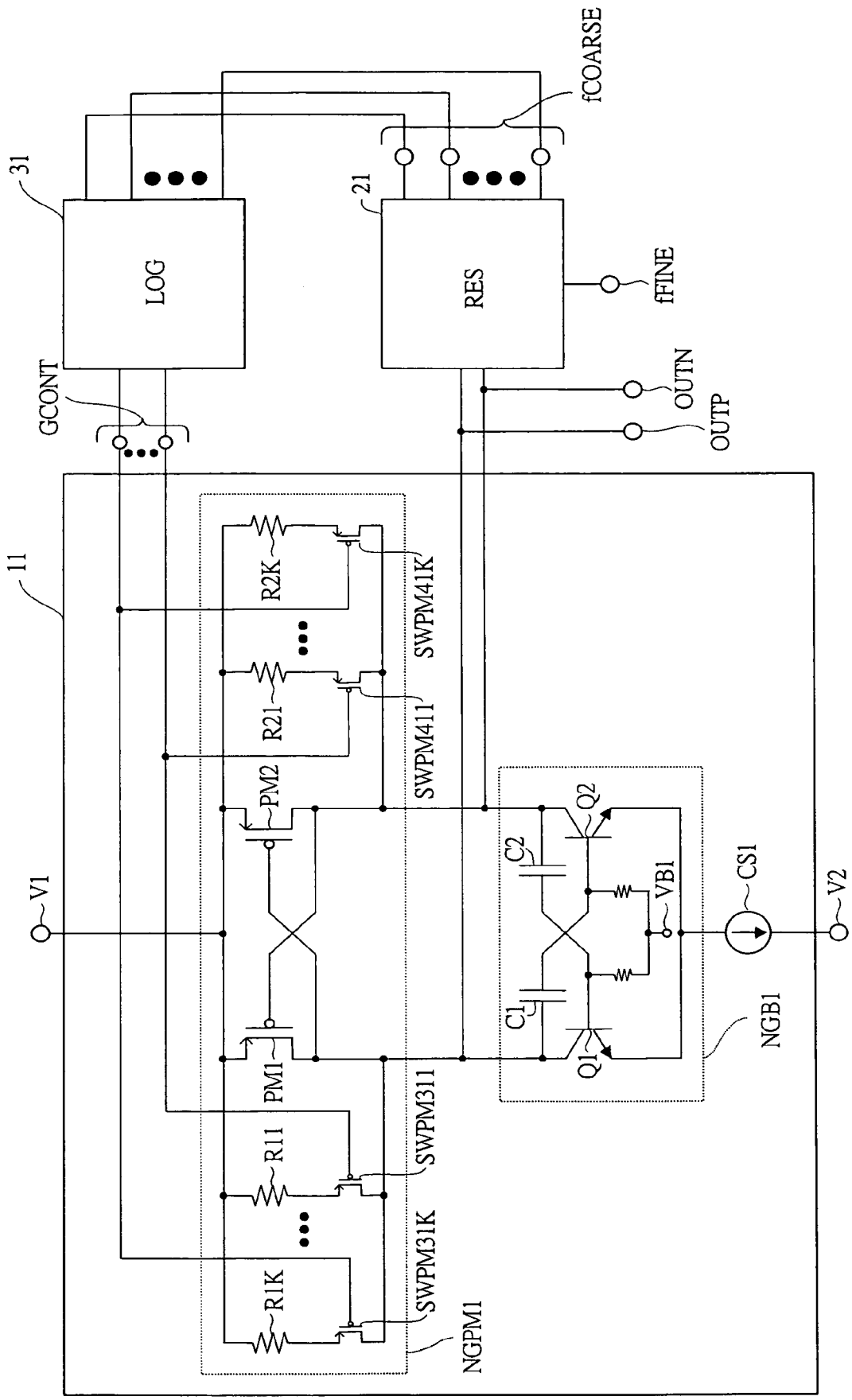
FIG. 60 is a circuit configuration diagram of a voltage-controlled oscillator according to a twelfth embodiment of the present invention.

In FIG. 60, by setting resistance values of R11 to R1K and R21 to R2K to R1 to R1×$2^K$, $2^K$ different negative conductances can be generated, which is desirable.

By adopting the configuration shown in FIG. 60, since negative conductance generated by the negative conductance generating circuit 11 can be automatically adjusted in a state that a bias current caused to flow in BJT is set near a current value minimizing a noise index according to an oscillation frequency, an oscillator that can reduce fluctuation of an oscillation amplitude and can achieve low phase noise characteristic in a wide band can be realized. By using the PMOS transistor as the switch, the switch can be integrated on a substrate on which the oscillator is disposed.

Thirteenth Embodiment

A thirteenth embodiment for realizing an oscillator that can achieve a wide band and low phase noise characteristic at a low current will be explained with reference to FIG. 61. The oscillator according to the thirteenth embodiment is composed of a negative conductance generating circuit (NGG) 12, a resonant circuit (RES) 22, and an impedance control circuit (ZCONT) 40. The negative conductance generating circuit 12 is a circuit that is included in a gain generating circuit that generates a gain required for oscillation, for generating a negative current gain namely, negative conductance to AC voltage. The resonant circuit 22 is a circuit that can vary a resonant frequency according to a frequency control signal group. The impedance control circuit 40 is a circuit which includes an impedance control terminal group inputted with an impedance control signal group for controlling an impedance of the resonant circuit and whose output terminal is connected to the resonant circuit.

The resonant circuit 22 includes a frequency control terminal group fCONT composed of frequency control terminals that can control at least one resonant frequency, and it can change an oscillation frequency according to a control signal inputted into fCONT. The impedance control circuit 40 includes an impedance control terminal group ZTUNE composed of at least one impedance control terminal for controlling impedance of the resonant circuit 22, and it can change effective impedance according to a control signal inputted into ZTUNE without changing a resonant frequency of the resonant circuit 22.

Figure 61:
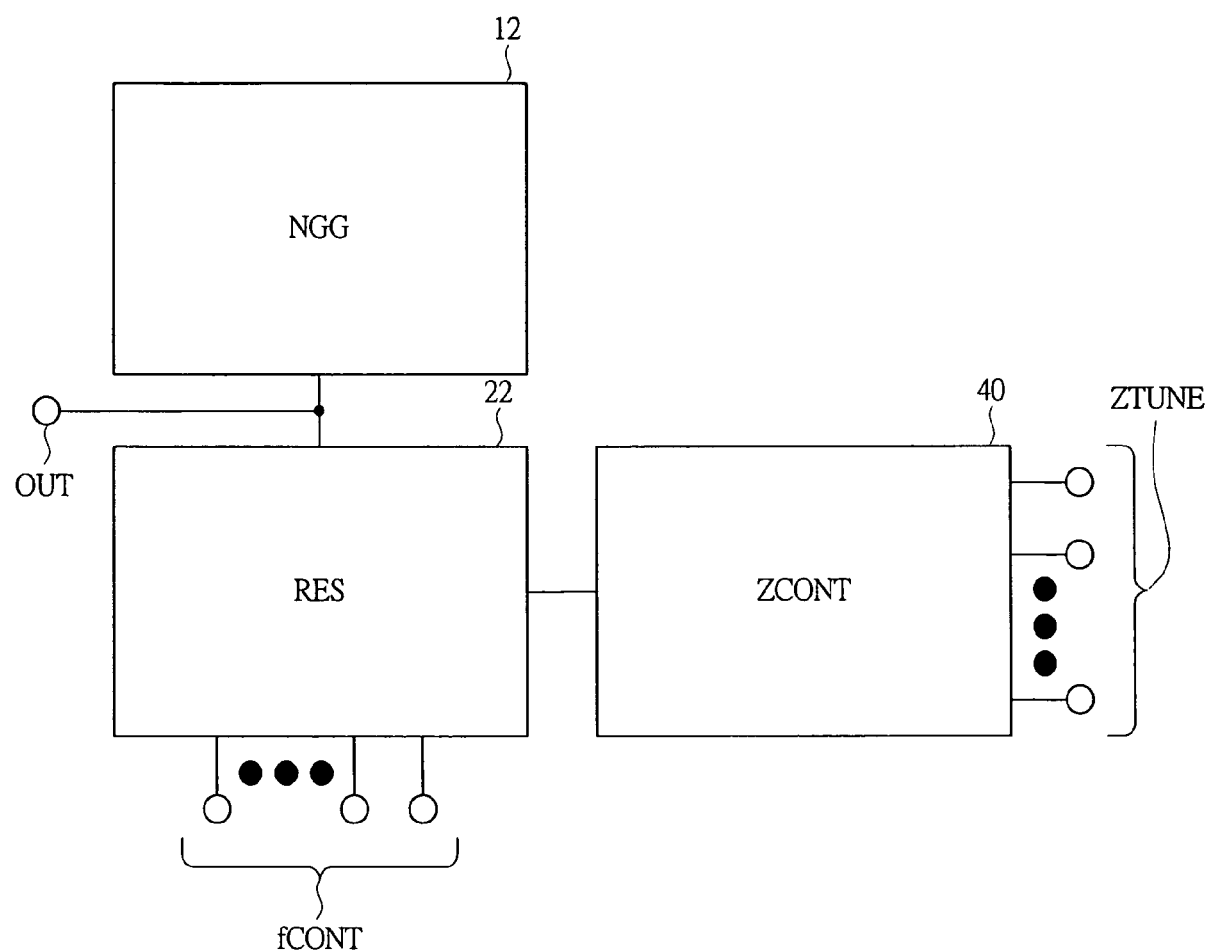
FIG. 61 is a circuit configuration diagram of a voltage-controlled oscillator according to a thirteenth embodiment of the present invention.

By adopting the configuration shown in FIG. 61, fluctuation of an oscillation amplitude at an output terminal OUT due to frequency change can be suppressed so that an oscillator that can achieve low phase noise characteristic in a wide band can be realized.

Fourteenth Embodiment

A fourteenth embodiment for realizing an oscillator that can achieve a wide band and low phase noise characteristic at a low current will be explained with reference to FIG. 62. The oscillator according to the fourteenth embodiment is composed of a negative conductance generating circuit 12, a resonant circuit 22, an impedance control circuit 40, and a signal processing circuit (LOG) 32. The resonant circuit 22 includes a frequency coarse adjustment terminal group fCOARSE composed of frequency control terminals that can control at least resonant frequency stepwise and a frequency fine adjustment terminal fFINE that can control a resonant frequency continuously, and it can change an oscillation frequency stepwise according to control signal group inputted into fCOARSE and can change the oscillation frequency continuously according to a control signal inputted into fFINE. The impedance control circuit 40 includes an impedance control terminal group ZTUNE composed of at least one impedance control terminal for controlling impedance of the resonant circuit 22, and it can change effective impedance according to a control signal inputted into ZTUNE without changing a resonant frequency of the resonant circuit 22. The signal processing circuit 32 is inputted with at least one signal group of control signal groups inputted into fCOARSE to convert the same into a signal group for controlling at least one impedance of the resonant circuit and output the same. An output signal of the signal processing circuit 32 is inputted into ZTUNE so that the impedance of the resonant circuit 22 is controlled.

Figure 62:
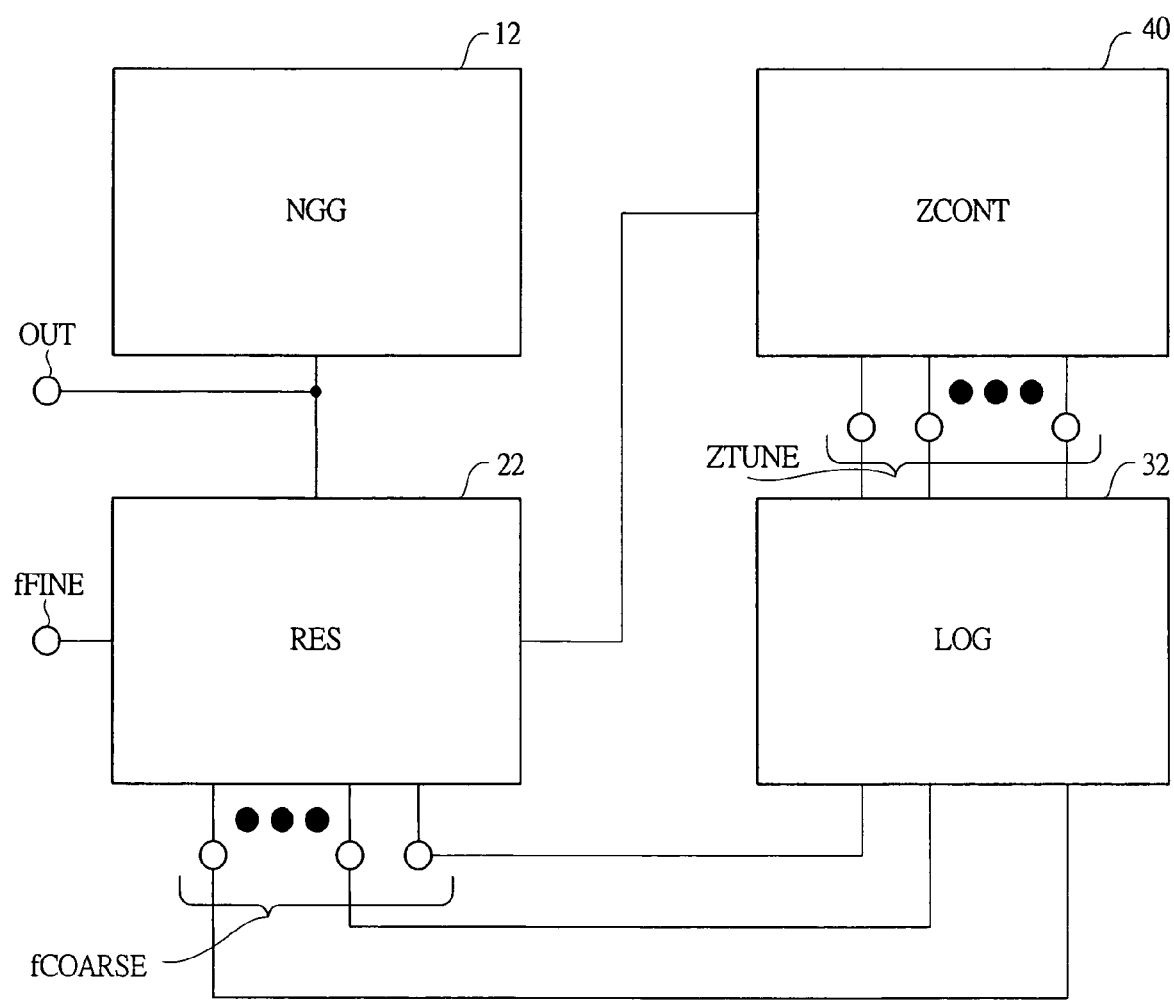
FIG. 62 is a circuit configuration diagram of a voltage-controlled oscillator according to a fourteenth embodiment of the present invention.

By adopting the configuration shown in FIG. 62, the impedance of the resonant circuit 22 can be controlled according to stepwise change of an oscillation frequency, so that an oscillator that can achieve low phase noise characteristic in a wide band can be realized. In the configuration shown in FIG. 62, since a frequency control signal is processed and effective impedance of the resonant circuit 22 can be automatically controlled linking a frequency, the number of control terminals can be reduced as compared with the case shown in FIG. 61.

Fifteenth Embodiment

A fifteenth embodiment for realizing an oscillator that can achieve a wide band and low phase noise characteristic at a low current will be explained with reference to FIG. 63. In the oscillator according to the fifteenth embodiment, the resonant circuit in the fourteenth embodiment is composed of a parallel circuit including a series circuit of inductors L1 and L2, capacitor banks CB1 and CB2 whose resonant frequencies can be controlled stepwise according to a control signal group inputted into a frequency coarse adjustment terminal group fCOARSE and frequency fine adjustable capacitors CV1 and CV2 whose resonant frequencies can be controlled continuously according to a control signal inputted into a frequency fine adjustment terminal fFINE, where a contact point between the inductors L1 and L2 is an impedance control terminal ZTUNE, and effective impedance of the resonant circuit 22 is controlled by a control signal inputted into ZTUNE.

Figure 63:
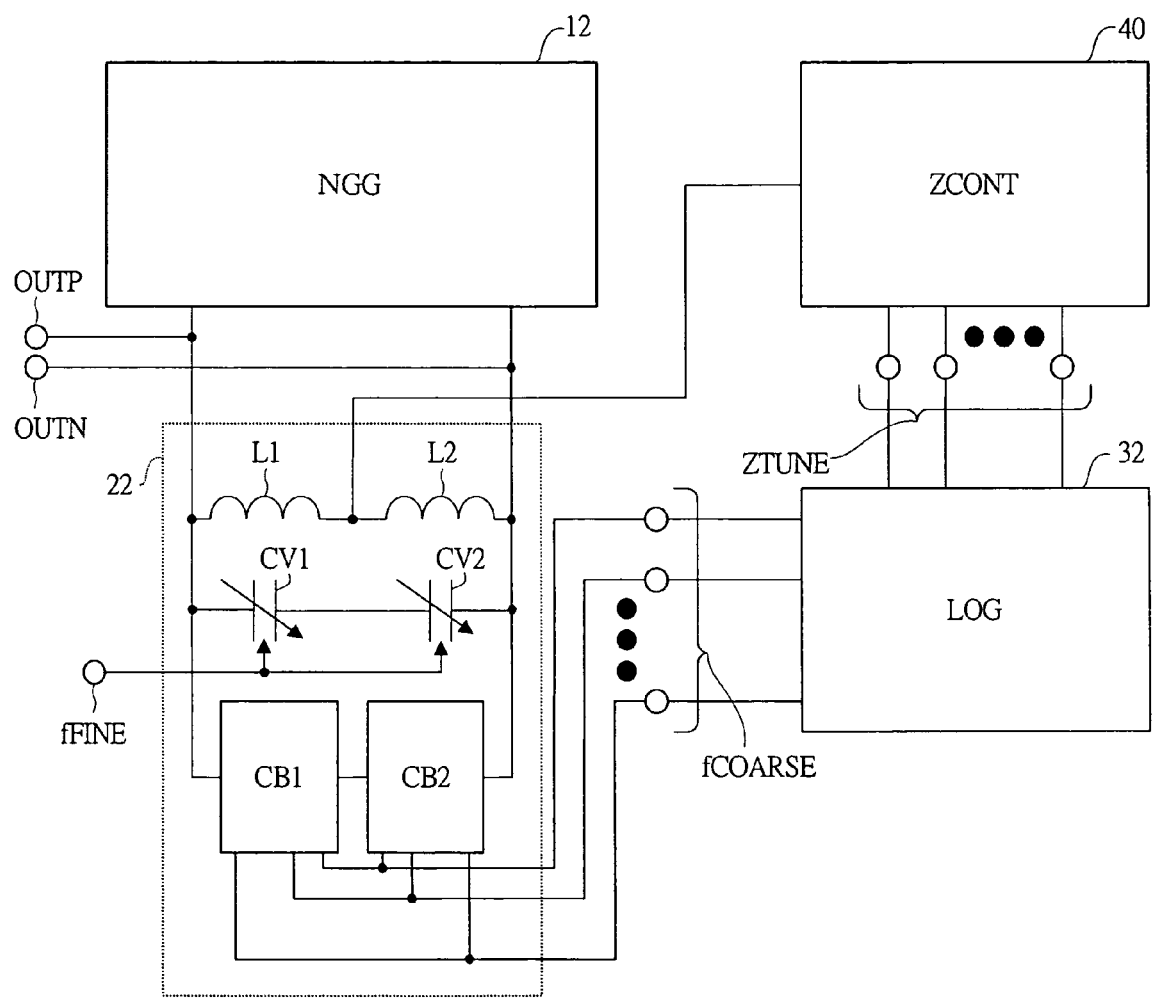
FIG. 63 is a circuit configuration diagram of a voltage-controlled oscillator according to a fifteenth embodiment of the present invention.

By adopting the configuration shown in FIG. 63, an oscillator that can achieve band expansion using the capacitance banks, can control impedance of the resonant circuit 22 according to stepwise change of the oscillation frequency, and can achieve low phase noise characteristic in a wide band can be realized. By configuring the resonant circuit 22 using the inductor and the capacitor, the resonant circuit 22 can be integrated on a substrate on which the negative conductance generating circuit 12 is disposed.

Sixteenth Embodiment

A sixteenth embodiment for realizing an oscillator that can achieve a wide band and low phase noise characteristic at a low current will be explained with reference to FIG. 64. In the oscillator according to the sixteenth embodiment, the resonant circuit 22 in the fourteenth embodiment is composed of a parallel circuit including a series circuit of variable inductors LV1 and LV2 whose inductances can be controlled stepwise according to a control signal group inputted into a frequency coarse adjustment terminal group fCOARSE and frequency fine adjustable capacitors CV1 and CV2 whose resonant frequencies can be controlled continuously according to a control signal inputted into a frequency fine adjustment terminal fFINE, where a contact point between the variable inductors LV1 and LV2 is an impedance control terminal ZTUNE, and effective impedance of the resonant circuit 22 is controlled by a control signal inputted into ZTUNE.

Figure 64:
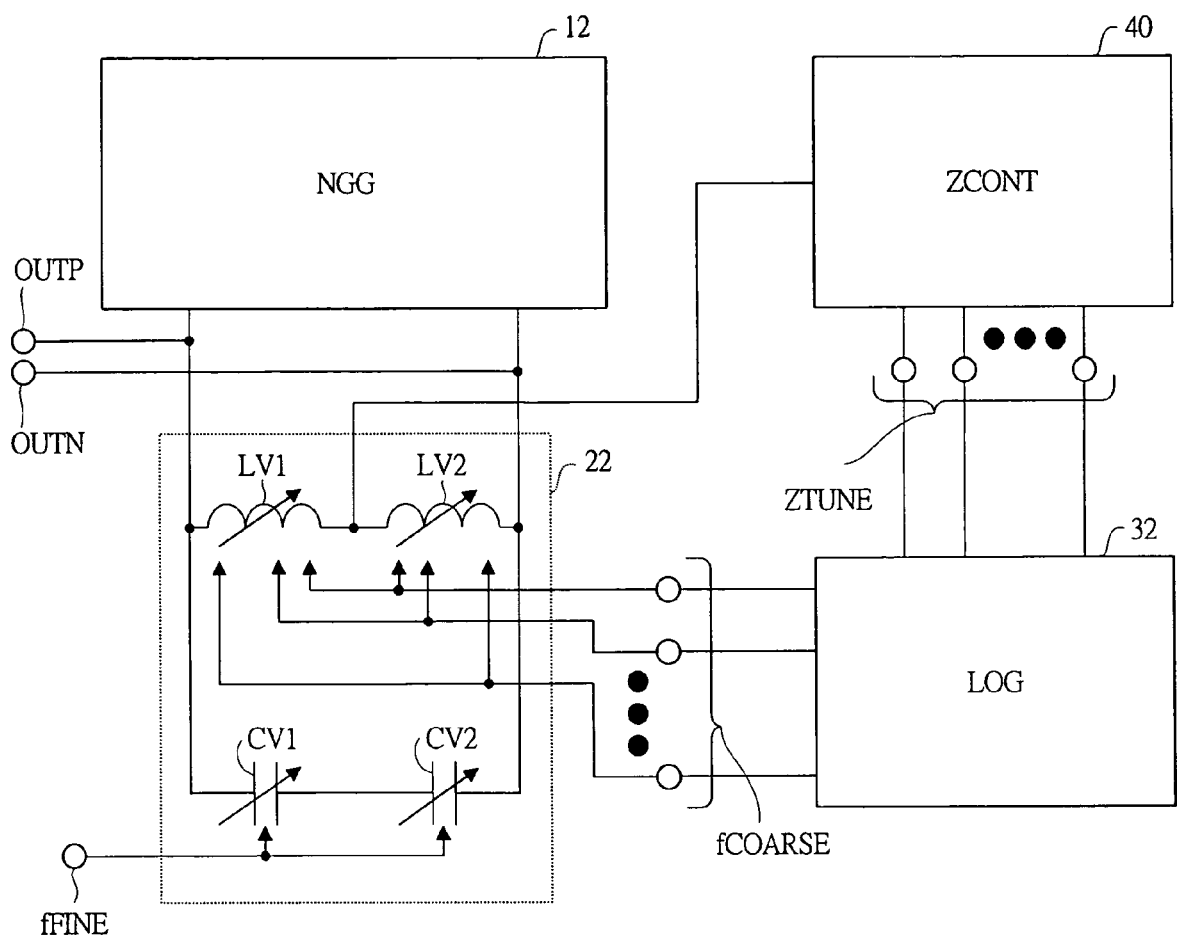
FIG. 64 is a circuit configuration diagram of a voltage-controlled oscillator according to a sixteenth embodiment of the present invention.

By adopting the configuration shown in FIG. 64, an oscillator that can achieve band expansion using the variable inductors, can control impedance of the resonant circuit 22 according to stepwise change of the oscillation frequency, and can achieve low phase noise characteristic in a wide band can be realized. By configuring the resonant circuit 22 using the inductor and the capacitor, the resonant circuit 22 can be integrated on a substrate on which the negative conductance generating circuit 12 is disposed.

Seventeenth Embodiment

A seventeenth embodiment for realizing an oscillator that can achieve a wide band and low phase noise characteristic at a low current will be explained with reference to FIG. 65. In the oscillator according to the seventeenth embodiment, the resonant circuit 22 in the fourteenth embodiment is composed of a parallel circuit including a series circuit of variable inductors LV1 and LV2 whose inductances can be controlled stepwise according to a control signal group inputted into a frequency coarse adjustment terminal group fCOARSE2, capacitor banks CB1 and CB2 whose capacitance values can be controlled stepwise according to a control signal group inputted into a frequency coarse adjustment terminal group fCOARSE1, and frequency fine adjustable capacitors CV1 and CV2 whose capacitance values can be controlled continuously according to a control signal inputted into a frequency fine adjustment terminal fFINE, where a contact point between the variable inductors LV1 and LV2 is the impedance control terminal ZTUNE and effective impedance of the resonant circuit is controlled by a control signal inputted into ZTUNE.

Figure 65:
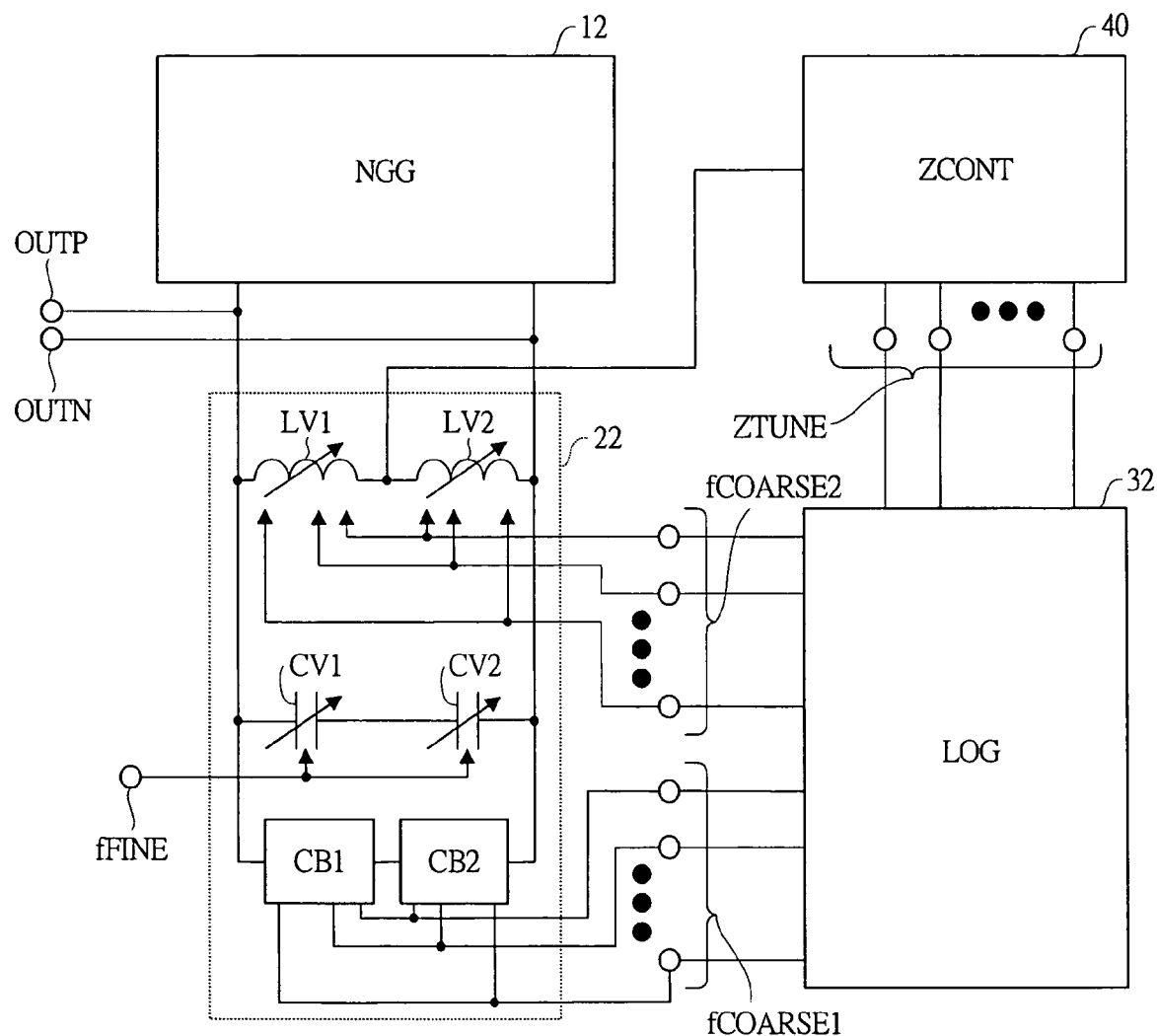
FIG. 65 is a circuit configuration diagram of a voltage-controlled oscillator according to a seventeenth embodiment of the present invention.

By adopting the configuration shown in FIG. 65, an oscillator that can achieve band expansion using the variable inductors and the capacitor banks, can control impedance of the resonant circuit 22 according to stepwise change of the oscillation frequency, and can achieve low phase noise characteristic in a wide band can be realized. By using both the capacitor banks and the variable capacitors in the seventeenth embodiment, the frequency variable range can be expanded as compared with the fifteenth embodiment and the sixteenth embodiment. By configuring the resonant circuit 22 using the inductor and the capacitor, the resonant circuit 22 together with the negative conductance generating circuit 12 can be integrated on the same or one substrate.

Eighteenth Embodiment

An eighteenth embodiment for realizing an oscillator that can achieve a wide band and a low phase noise characteristic at a low current will be explained with reference to FIG. 66. In the oscillator according to the eighteenth embodiment, the negative conductance generating circuit 12 in the fifteenth embodiment to the seventeenth embodiment is composed of a parallel circuit of a first negative conductance generating unit NGPM2 obtained by cross-coupled a PMOS transistors PM1 and PM2 and a negative conductance generating unit NGB1 obtained by cross-coupled NPN transistors Q1 and Q2 of bipolar junction transistor (BJT) via capacitance-coupling capacitors C1 and C2, and a current source CS1 of a current source circuit. The signal processing circuit 32 is inputted with at least one signal group of control signal groups inputted into fCOARSE to convert the signal group to at least one signal group for controlling effective impedance of the resonant circuit and output the same. The output signal from the signal processing circuit 32 is inputted into ZTUNE so that effective impedance of the resonant circuit 22 is controlled. The resonant circuit 22 is composed of inductors L1 and L2 (which may be variable inductors), and frequency fine adjustable capacitors CV1 and CV2 (which may be constant capacitors).

In the negative conductance generating unit NGPM2, source electrodes of the PMOS transistors PM1 and PM2 are commonly connected to a voltage terminal V1, a drain electrode of the PMOS transistor PM1 is connected to a gate electrode of the PMOS transistor PM2, and a drain electrode of the PMOS transistor PM2 is connected to a gate electrode of the PMOS transistor PM1. Emitter electrodes of the NPN transistors Q1 and Q2 are commonly connected to a voltage terminal V2 via the current source CS1, a collector electrode of the NPN transistor Q1 is connected to a base electrode of the NPN transistor Q2 via the capacitor C1, and a collector electrode of the NPN transistor Q2 is connected to a base electrode of the NPN transistor Q1 via the capacitor C2. A drain electrode of the PMOS transistor PM1 is connected to a collector electrode of the NPN transistor Q1 and is connected to an electrode (output terminal OUTP side) of the resonant circuit, and a drain electrode of the PMOS transistor PM2 is connected to a collector electrode of the NPN transistor Q2 and is connected to an electrode (output terminal OUTN side) of the resonant circuit 22.

Figure 66:
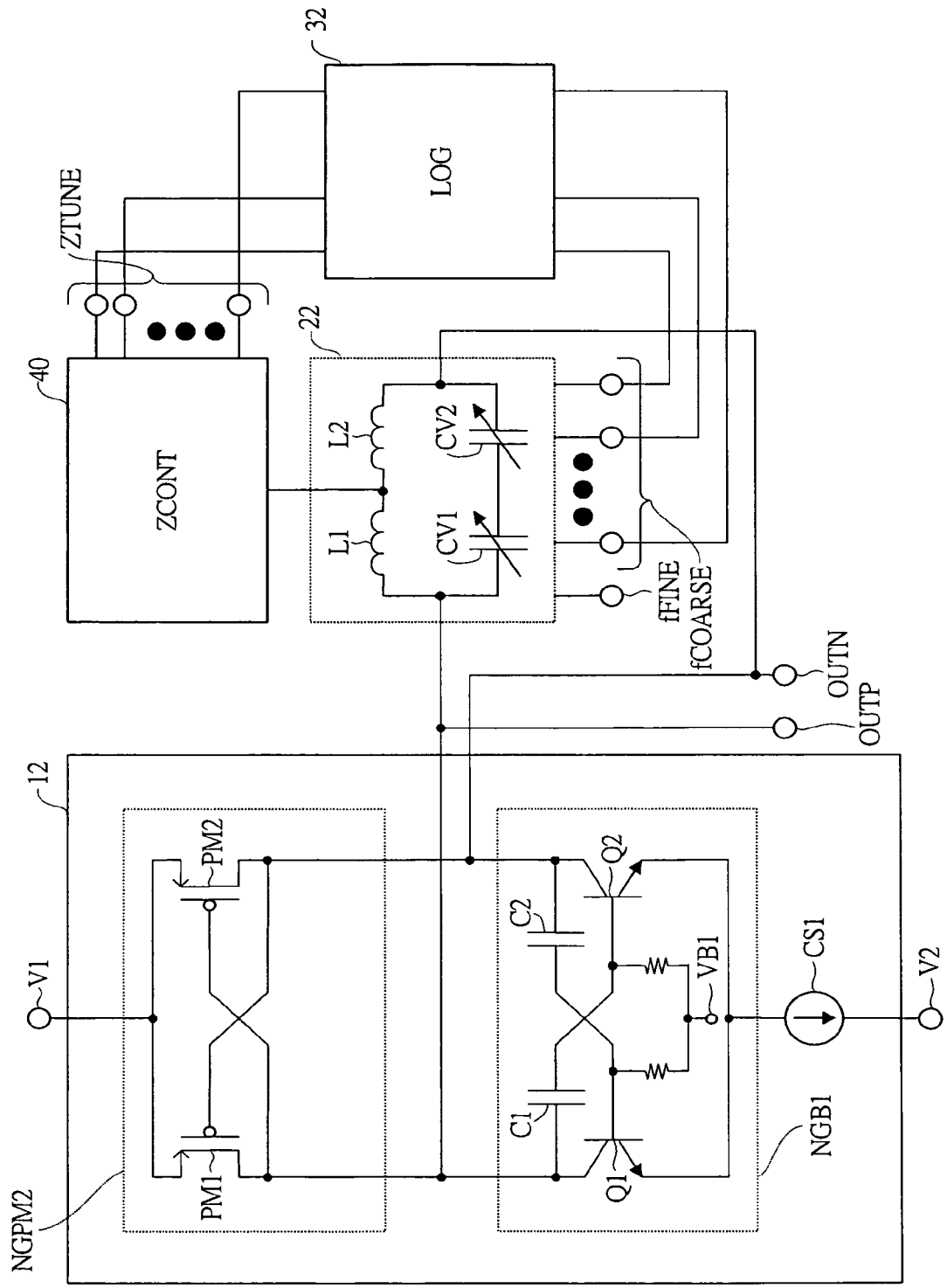
FIG. 66 is a circuit configuration diagram of a voltage-controlled oscillator according to an eighteenth embodiment of the present invention.

By adopting the configuration shown in FIG. 66, since impedance of the resonant circuit 22 can be automatically adjusted in a state that a bias current caused to flow in BJT is set near a current value minimizing a noise index according to stepwise change of an oscillation frequency, an oscillator that can reduce fluctuation of an oscillation amplitude and can achieve low phase noise characteristic in a wide band can be realized. Moreover, in the eighteenth embodiment for reducing fluctuation of an oscillation amplitude, since a signal for controlling the impedance of the resonant circuit 22 is inputted into a midpoint between the inductors L1 and L2 disposed in an AC manner, a parasitic capacitance can be reduced as compared with that in the first embodiment to the twelfth embodiment, so that a band expansion can be realized, which is desirable.

Nineteenth Embodiment

A nineteenth embodiment for realizing an oscillator of the present invention that can achieve a wide band and a low phase noise characteristic at a low current will be explained with reference to FIG. 67. In the oscillator according to the nineteenth embodiment, the impedance control circuit 40 in the eighteenth embodiment is composed of K impedance control PMOS transistors PMS31 to PMS3K and switches SW511 to SW51K and SW521 to SW52K for turning gate biases of the respective impedance control PMOS transistors ON/OFF.

In the impedance control circuit 40, source electrodes of the impedance control PMOS transistors PMS31 to PMS3K are commonly connected to a voltage terminal V1, and drain electrodes thereof are commonly connected to an impedance control terminal of the resonant circuit 22. The switches SW511 to SW51K are connected between respective gate electrodes and respective drain electrodes of the impedance control PMOS transistors PMS31 to PMS3K, and the switches SW521 to SW52K are connected between respective gate electrodes and respective source electrodes of the impedance control PMOS transistors PMS31 to PMS3K. Each of the switches SW511 to SW51K and SW521 to SW52K is opened and closed by each of control signals inputted into impedance control terminals ZTUNE.

An operation of the oscillator according to the nineteenth embodiment will be explained in detail. A case of K=2 is considered below for simplification. When SW511 and SW512 are closed and SW521 and SW522 are opened, the drains of PMS31 and PMS32 are opened. Since a contact point between the inductors L1 and L2 is grounded in AC manner and the impedance control circuit 40 does not influence the resonant circuit 22, the oscillator according to the nineteenth embodiment operates in the same manner as a conventional PMOS/BJT oscillator. When a current value of the current source CS1 is set to ICS and impedance of the resonant circuit 22 is set to ZRES, the oscillation amplitude is expressed as follows:

$$ZRES \times ICS \tag{Equation 1}$$

On the contrary, when SW511 and SW512 are opened and SW521 and SW522 are closed, the gate voltages of PMS31 and PMS32 are biased to direct current gate voltages of PM2 and PM1 via the inductors L1 and L2 of the resonant circuit 22. Since the contact point between the inductors L1 and L2 is grounded in AC manner, direct currents corresponding to gate bias voltages flow in PMS31 and PMS32. As a result, alternating currents flowing in PM1 and PM2 decrease. When the current value of the current source CS1 is set to ICS and the gate voltage of the PM2 is set to the maximum value, a value of a current flowing in PM1, a value of a current flowing in PMS31, and a value of a current flowing in PMS32 are equal, then currents of ICS/3 flow in PM1, PMS31, and PMS32, respectively. As a result, a current of ICS/3 flows in L1 of the resonant circuit 22 and a current of ICS flows in L2. Thereby, when the impedance of the resonant circuit 22 is set to ZRES, the oscillation amplitude is expressed as follows:

$$(ZRES/2) \times (ICS/3) + (ZRES/2) \times (ICS) = \frac{2}{3} \times ZRES \times ICS \quad \text{(Equation 2)}$$

Thereby, the oscillation amplitude can be reduced to $\frac{2}{3}$ of (Equation 1).

At this time, effective impedance of the resonant circuit 22 can be regarded as $\frac{2}{3} \times ZRES$. That is, by opening/closing the switches to control direct currents flowing in PMS31 and PMS32, effective impedance of the resonant circuit 22 can be controlled.

Figure 67:
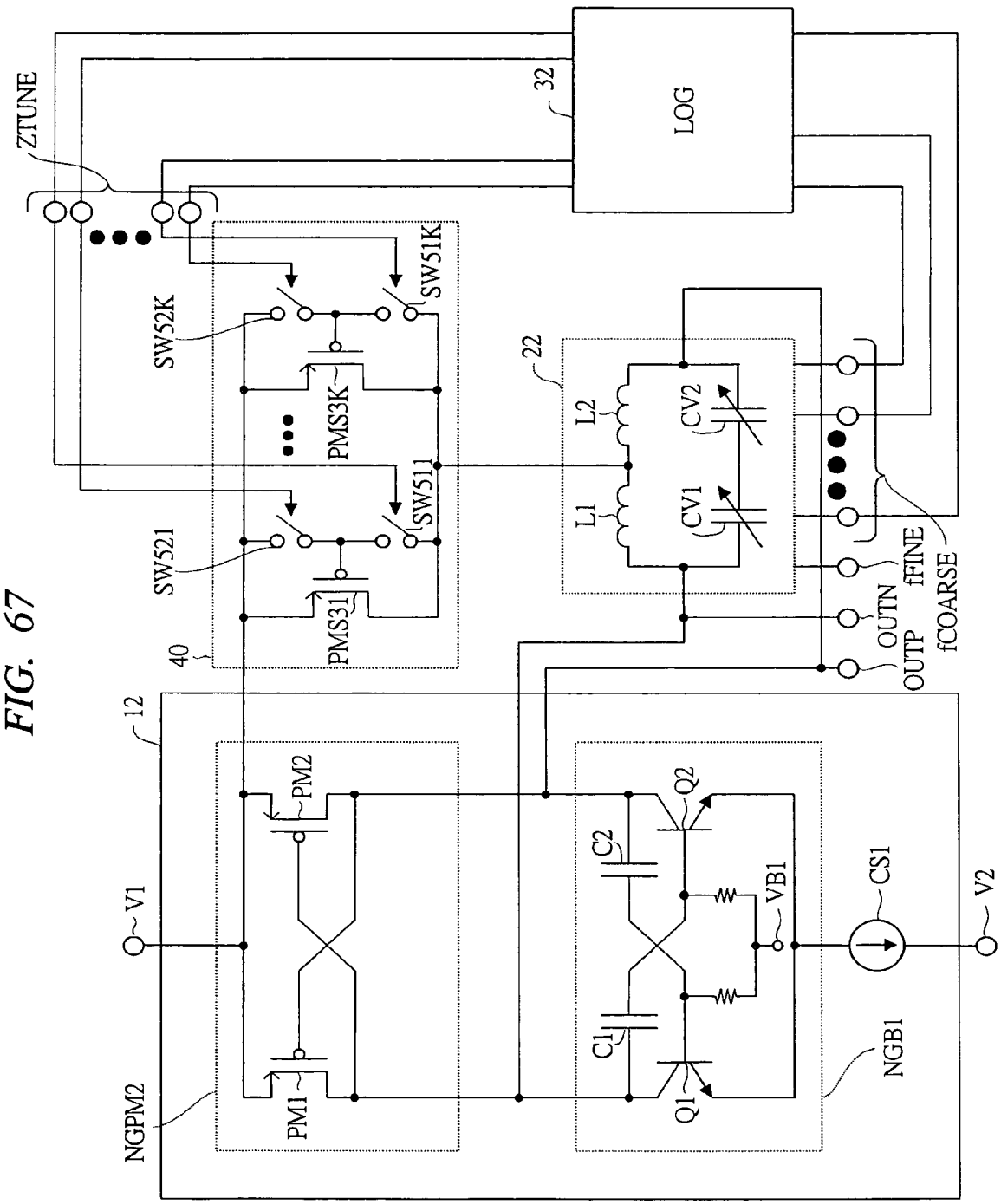
FIG. 67 is a circuit configuration diagram of a voltage-controlled oscillator according to a nineteenth embodiment of the present invention.

In FIG. 67, by setting gate lengths of PMS31 to PMS3K to be equal to gate lengths of PM1 and PM2, a ratio of values of alternating currents flowing in PMS31 to PMS3K and PM1 to PM2 can be determined according to a gate width ratio, which is desirable. By setting gate widths of PMS31 to PMS3K to W1 to $W1 \times 2^K$, $2^K$ different effective impedances of the resonant circuit 22 can be set, which is desirable.

Figure 87:
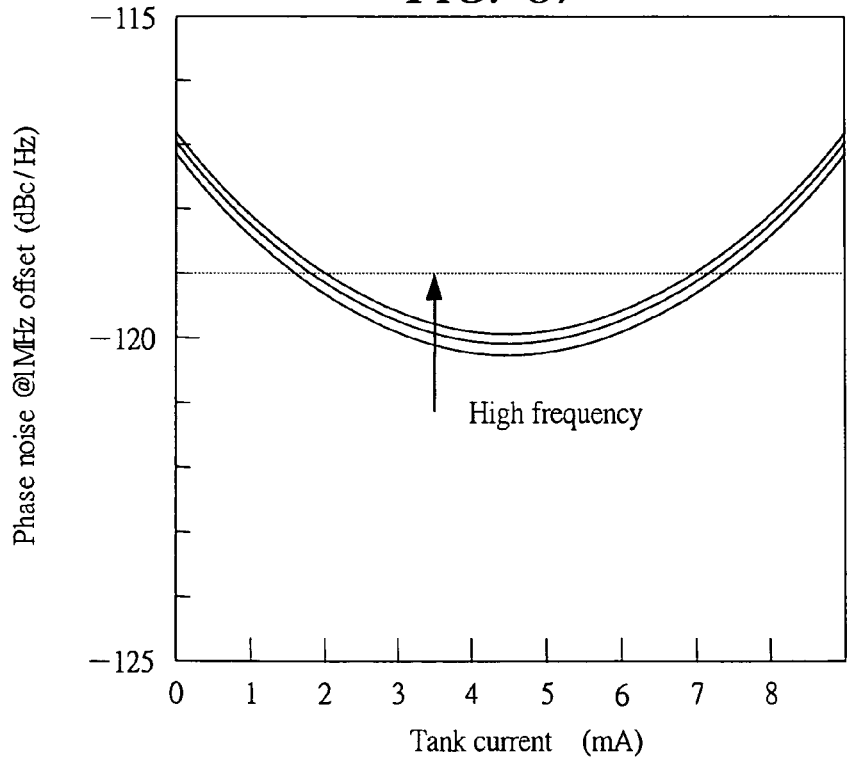
FIG. 87 is a curve diagram for explaining bias current dependency of phase index in the oscillator according to the nineteenth embodiment of the present invention.

By adopting the configuration shown in FIG. 67, since impedance of the resonant circuit 22 can be controlled in a state that a bias current caused to flow in BJT is set near a current value minimizing a noise index according to stepwise change of an oscillation frequency, an oscillator that can reduce fluctuation of an oscillation amplitude and can achieve low phase noise characteristic in a wide band can be realized. FIG. 87 shows a current dependency of phase noise in the oscillator according to the nineteenth embodiment. In the oscillator according to the nineteenth embodiment, a phase noise characteristic lower than the phase noise characteristic in the conventional oscillator (FIG. 84 and FIG. 85) is developed over the whole frequency. Thus, the effects or advantages of the present invention are confirmed.

Twentieth Embodiment

A twentieth embodiment for realizing an oscillator that can achieve a wide band and low phase noise characteristic at a low current will be explained with reference to FIG. 68. In the oscillator according to the twentieth embodiment, the switches SW511 to SW51K and SW521 to SW52K in the impedance control circuit 40 in the nineteenth embodiment are respectively composed of PMOS transistors SWPM511 to SWPM51K and SWPM521 to SWPM52K. Voltage signals inputted into the gates of SWPM511 to SWPM51K are respectively inputted into the gates of the SWPM521 to SWPM52K via an inverter.

Figure 68:
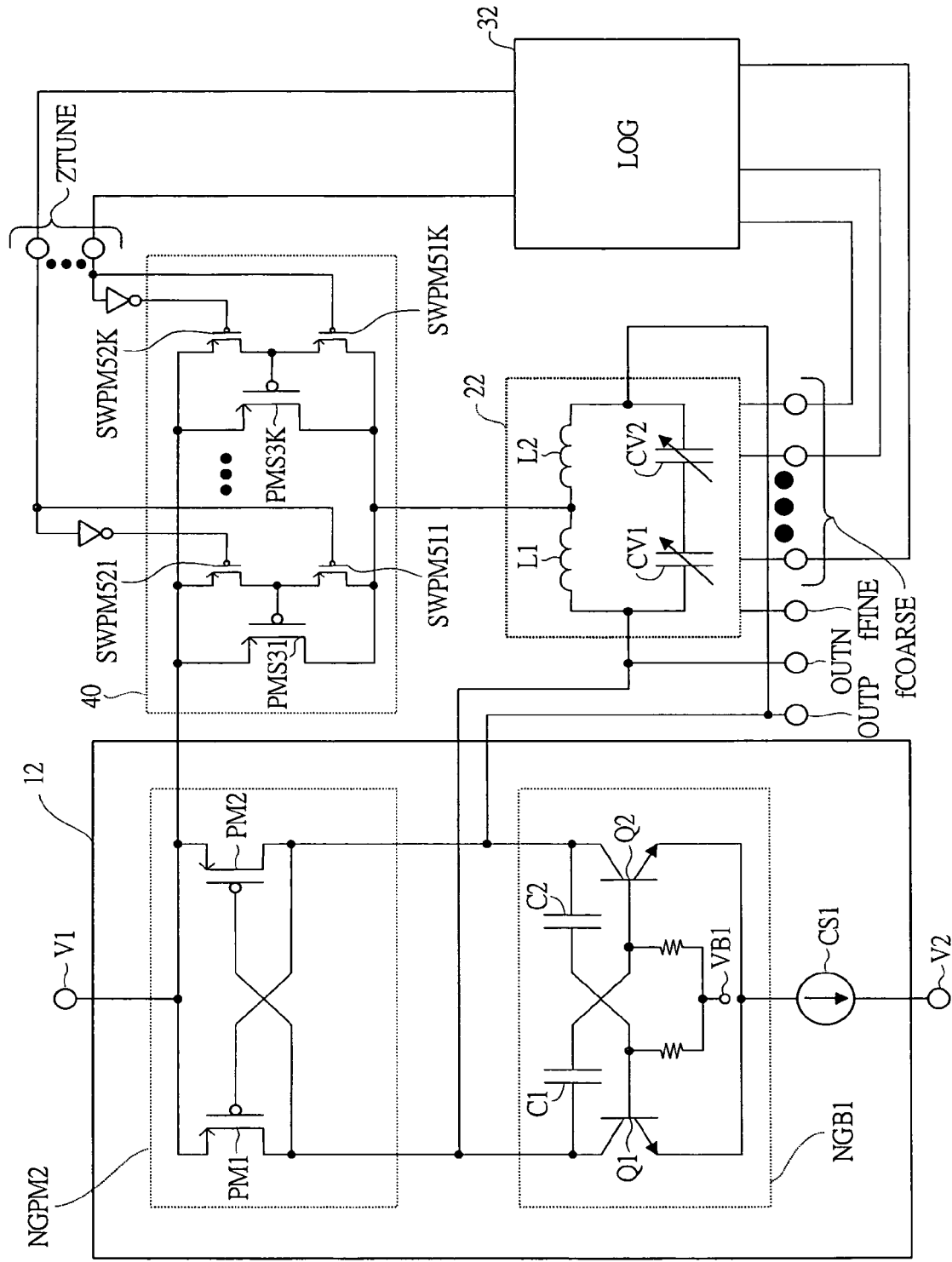
FIG. 68 is a circuit configuration diagram of a voltage-controlled oscillator according to a twentieth embodiment of the present invention.

By adopting the configuration shown in FIG. 68, since effective impedance of the resonant circuit 22 can be automatically adjusted in a state that a bias current caused to flow in BJT is set near a current value minimizing a noise index according to an oscillation frequency, an oscillator that can reduce fluctuation of an oscillation amplitude and can achieve low phase noise characteristic in a wide band can be realized. By using the PMOS transistor as the switch, the switch can be integrated on a substrate on which the oscillator is disposed.

Twenty-First Embodiment

A twenty-first embodiment for realizing an oscillator that can achieve a wide band and low phase noise characteristic at a low current will be explained with reference to FIG. 69. In the oscillator according to the twenty-first embodiment, the impedance control circuit 40 according to the eighteenth embodiment includes K impedance control diodes D31 to D3K and switches SW611 to SW61K for turning the respective impedance control diodes ON/OFF.

In the impedance control circuit 40, the anodes of the impedance control diodes D31 to D3K are commonly connected to a voltage terminal V1, and the cathodes thereof are commonly connected to an impedance control terminal of the resonant circuit 22 via the switches SW611 to SW61K. Series circuits of the impedance control diodes D31 to D3K and the switches SW611 to SW61K are connected in parallel. Each of the switches SW611 to SW61K is opened and closed by each of control signals inputted into the impedance control terminals ZTUNE.

An operation of the twenty-first embodiment is explained. When SW611 to SW61K are closed, cathode voltage of the D31 to D3K are biased to the gate voltages of PM2 and PM1 via the inductors L1 and L2, so that direct currents are caused to flow in D31 to D3K. As a result, currents flowing in PM1 and PM2 are decreased. Since D31 to D3K do not generate negative conductance, effective impedance of the resonant circuit 20 as well as negative conductance is decreased according to decrease of currents flowing in PM1 and PM2. On the contrary, when SW611 to SW61K are opened, since cathode voltages of D31 to D3K are opened, so that no direct current flows in D31 to D3K. As a result, alternating currents flowing in PM1 and PM2 are increased, effective impedance of the resonant circuit 22 as well as negative conductance generated by PM1 and PM2 is increased. That is, by opening/closing the switches to control direct currents flowing in D31 to D3K, effective impedance of the resonant circuit 22 can be controlled.

Figure 69:
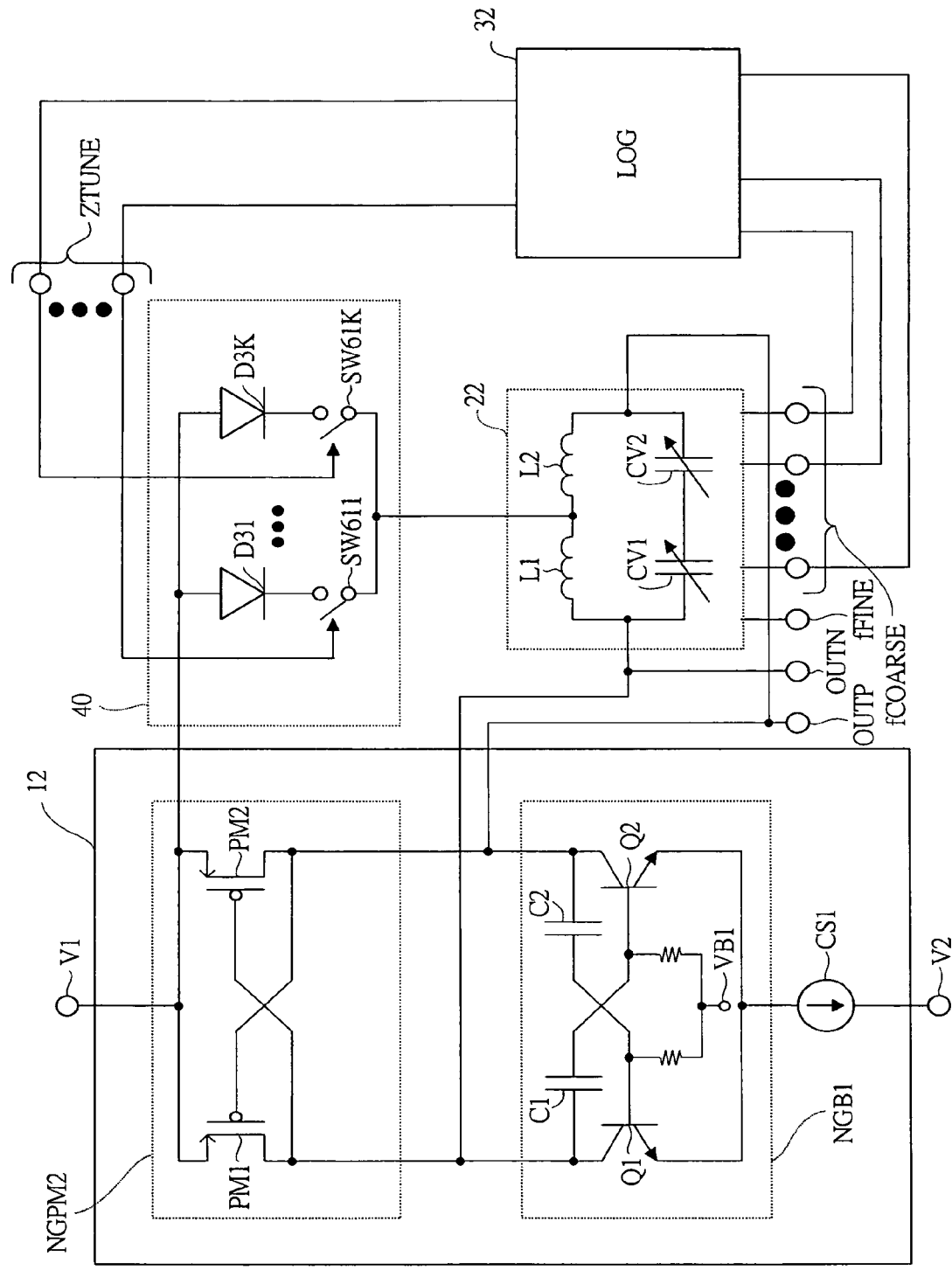
FIG. 69 is a circuit configuration diagram of a voltage-controlled oscillator according to a twenty-first embodiment of the present invention.

In FIG. 69, by setting p-n junction areas of D31 to D3K to S1 to $S1 \times 2^K$, respectively, $2^K$ different effective impedances of the resonant circuit 22 can be generated, which is desirable.

By adopting the configuration shown in FIG. 69, since effective impedance of the resonant circuit 22 can be automatically adjusted in a state that a bias current caused to flow in BJT is set near a current value minimizing a noise index according to an oscillation frequency, an oscillator that can reduce fluctuation of an oscillation amplitude and can achieve low phase noise characteristic in a wide band can be realized.

Twenty-Second Embodiment

A twenty-second embodiment for realizing an oscillator that can achieve a wide band and low phase noise characteristic at a low current will be explained with reference to FIG. 70. In the oscillator according to the twenty-second embodiment, the switches SW611 to SW61K in the impedance control circuit 40 in the twenty-first embodiment are composed of PMOS transistors SWPM611 to SWPM61K, respectively.

Figure 70:
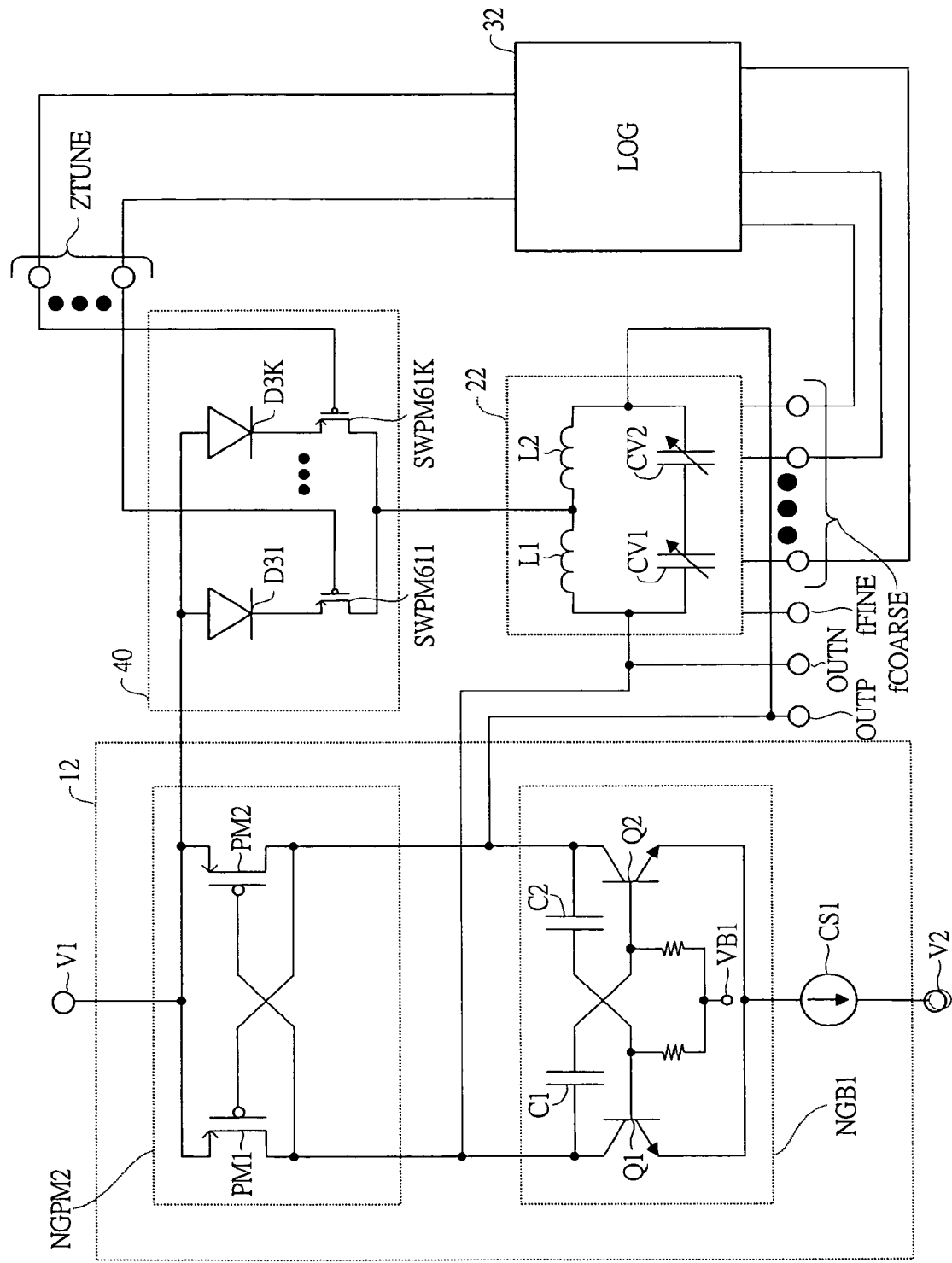
FIG. 70 is a circuit configuration diagram of a voltage-controlled oscillator according to a twenty-second embodiment of the present invention.

By adopting the configuration shown in FIG. 70, since effective impedance of the resonant circuit 22 can be automatically adjusted in a state that a bias current caused to flow in BJT is set near a current value minimizing a noise index according to an oscillation frequency, an oscillator that can reduce fluctuation of an oscillation amplitude and can achieve low phase noise characteristic in a wide band can be realized. By using the PMOS transistor as the switch, the switch can be integrated on a substrate on which the oscillator is disposed.

Twenty-Third Embodiment

A twenty-third embodiment for realizing an oscillator that can achieve a wide band and low phase noise characteristic at a low current will be explained with reference to FIG. 71. In the oscillator according to the twenty-third embodiment, the impedance control circuit 40 according to the eighteenth embodiment is composed of K (K is a positive integer) impedance control resistors R31 to R3K, and switches SW611 to SW61K for turning the respective impedance control resistors ON/OFF.

In the impedance control circuit 40, one ends of the impedance control resistors R31 to R3K are commonly connected to a voltage terminal V1, and the other ends thereof are commonly connected to an impedance control terminal of the resonant circuit 22 via the switches SW611 to SW61K. Series circuits of the impedance control resistors R31 to R3K and the switches SW611 to SW61K are connected in parallel. Each of the switches SW611 to SW61K is opened/closed by each of control signals inputted into the impedance control terminals ZTUNE.

An operation of the twenty-third embodiment will be explained. When SW611 to SW61K are closed, electrodes (one ends) of R31 to R3K that are not connected to V1 are biased to the gate voltages of PM2 and PM1 via the inductors L1 and L2, so that direct currents are caused to flow in R31 to R3K. As a result, currents flowing in PM1 and PM2 are decreased. Since R31 to R3K do not generate negative conductance, effective impedance of the resonant circuit 22 as well as negative conductance is decreased according to decrease of currents flowing in PM1 and PM2. On the contrary, when SW611 to SW61K are opened, since the electrodes (one ends) of R31 to R3K that are not connected to V1 are open, no direct current flows in R31 to R3K. As a result, alternating currents flowing in PM1 and PM2 are increased so that effective impedance of the resonant circuit 22 as well as negative conductance generated by PM1 and PM2 is increased. That is, by opening/closing the switches to control direct currents flowing in R31 to R3K, the effective impedance of the resonant circuit 22 can be controlled.

Figure 71:
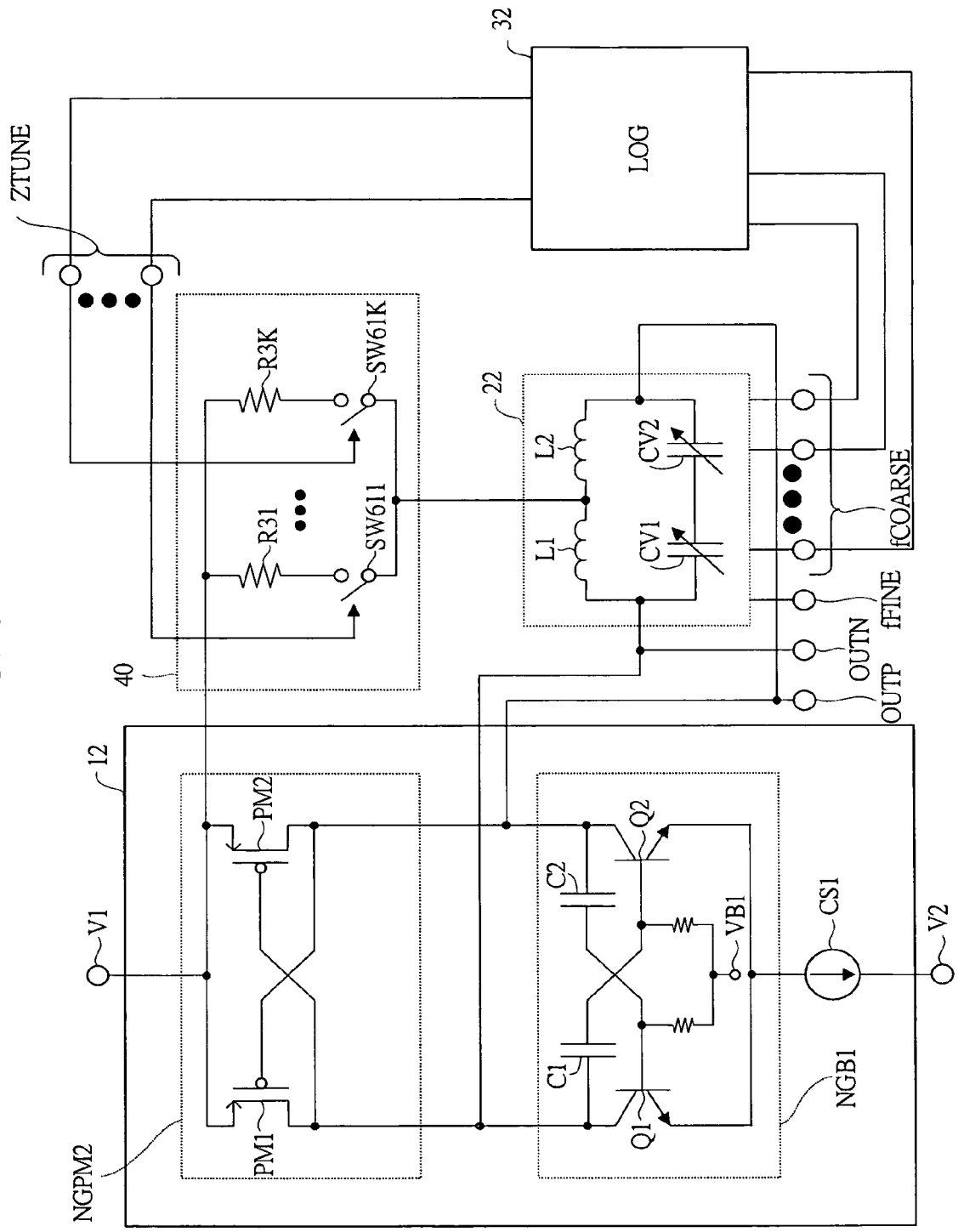
FIG. 71 is a circuit configuration diagram of a voltage-controlled oscillator according to a twenty-third embodiment of the present invention.

In FIG. 71, by setting the resistance values of R31 to R3K to R1 to R1/$2^K$, respectively, $2^K$ different effective impedances of the resonant circuit 22 can be set, which is desirable.

By adopting the configuration shown in FIG. 71, since effective impedance of the resonant circuit 22 can be automatically adjusted in a state that a bias current caused to flow in BJT is set near a current value minimizing a noise index according to an oscillation frequency, an oscillator that can reduce fluctuation of an oscillation amplitude and can achieve low phase noise characteristic in a wide band can be realized.

Twenty-Fourth Embodiment

A twenty-fourth embodiment for realizing an oscillator that can achieve a wide band and low phase noise characteristic at a low current will be explained with reference to FIG. 72. In the oscillator according to the twenty-fourth embodiment, the switches SW611 to SW61K in the impedance control circuit 40 in the twenty-third embodiment are composed of PMOS transistors SWPM611 to SWPM61K, respectively.

Figure 72:
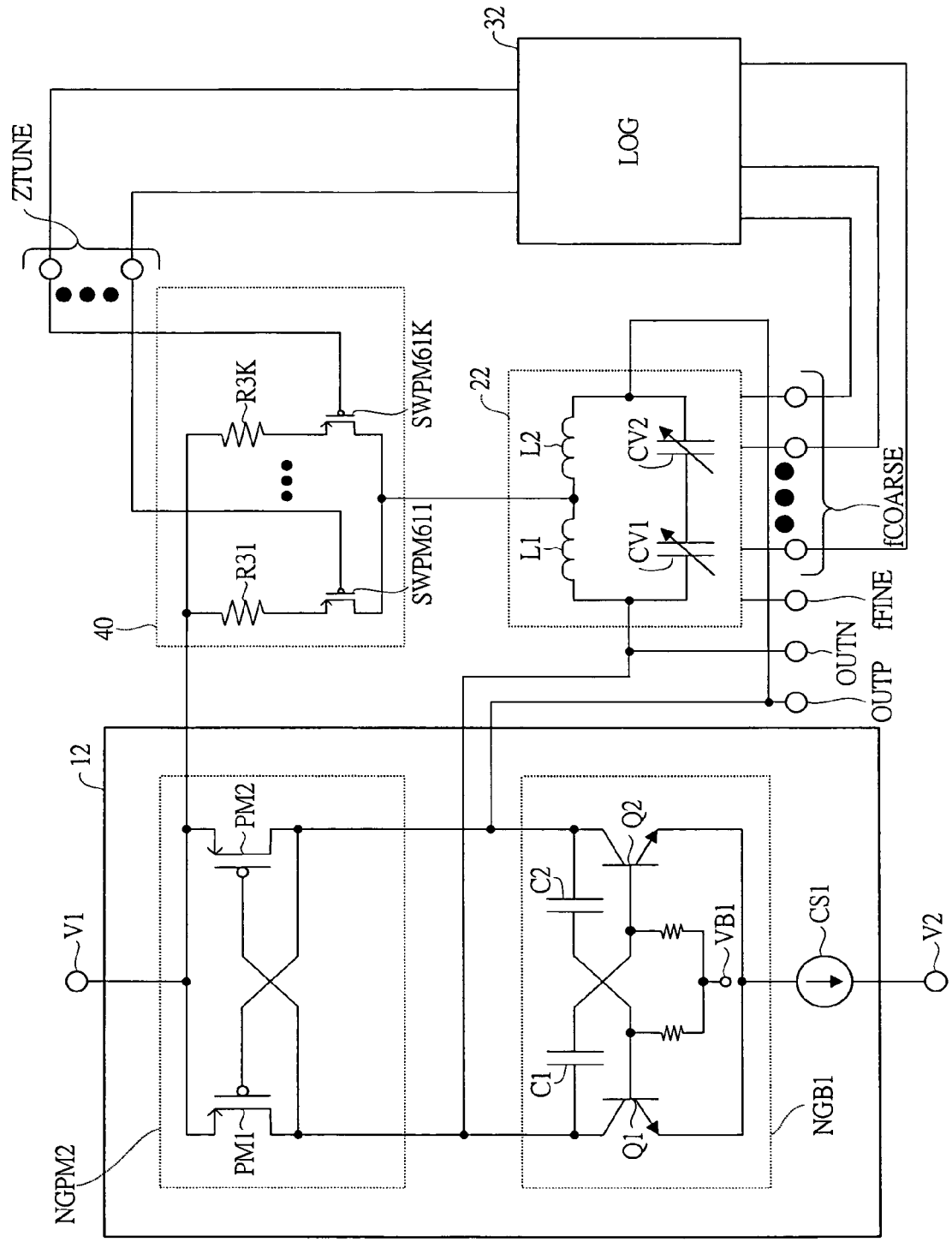
FIG. 72 is a circuit configuration diagram of a voltage-controlled oscillator according to a twenty-fourth embodiment of the present invention.

By adopting the configuration shown in FIG. 72, since effective impedance of the resonant circuit 22 can be automatically adjusted in a state that a bias current caused to flow in BJT is set near a current value minimizing a noise index according to an oscillation frequency, an oscillator that can reduce fluctuation of an oscillation amplitude and can achieve low phase noise characteristic in a wide band can be realized. Moreover, by using the PMOS transistor as the switch, the switch can be integrated on a substrate on which the oscillator is disposed.

Twenty-Fifth Embodiment

Figure 73:
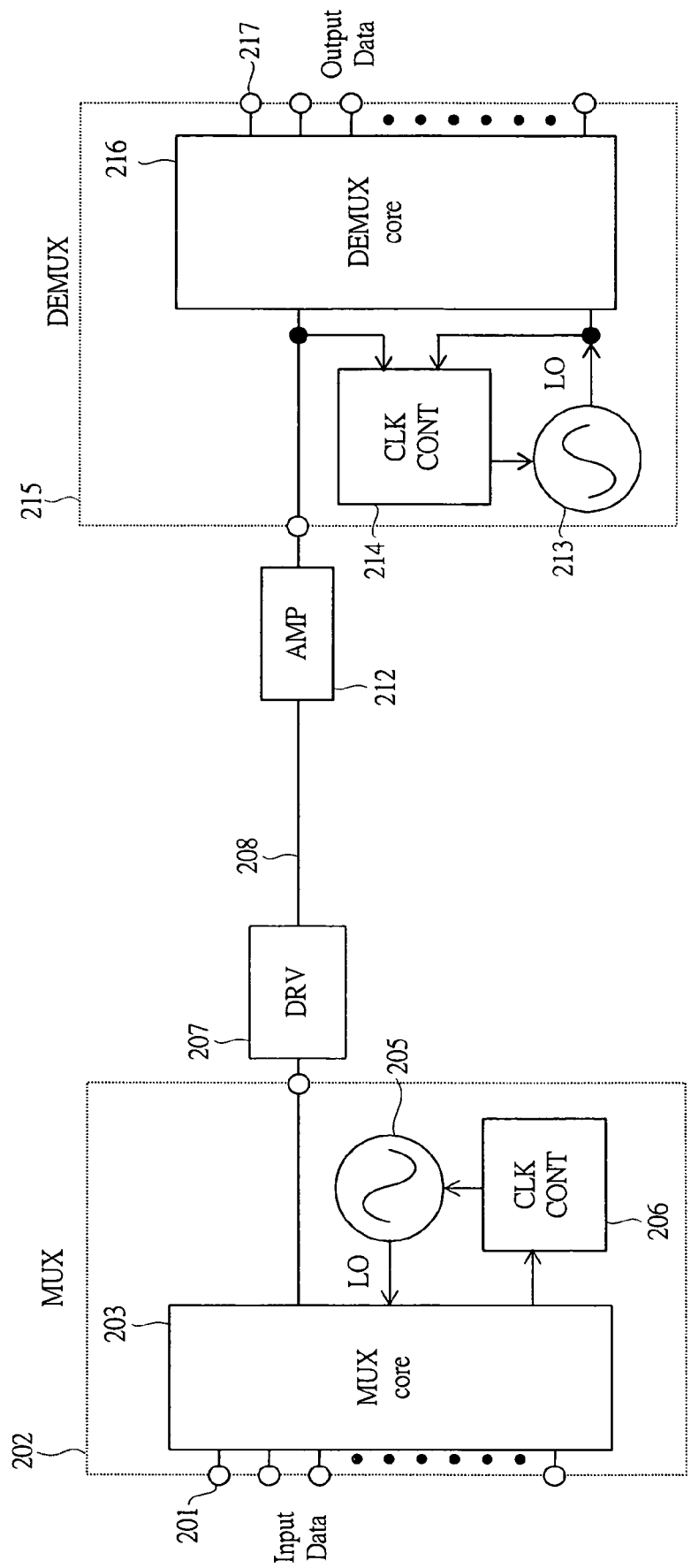
FIG. 73 is a block diagram of a data processing equipment according to a twenty-fifth embodiment of the present invention.

FIG. 73 shows a twenty-fifth embodiment of a data processing equipment including an oscillator of the present invention. The data processing equipment according to the twenty-fifth embodiment is a high-speed serial transmission system. The high-speed serial transmission system is composed of a transmitter that multiplexes a plurality of low-speed signals to output a high-speed serial signal, and a receiver that receives the high-speed serial signal to demultiplex the serial signal to individual signals and output a plurality of low-speed signals obtained by demultiplexing.

The transmitter includes a multiplexer (MUX) 202 that is inputted with a plurality of low speed signals to output a high-speed serial signal, and a driver (DRV) 207 that amplifies the high-speed serial signal to drive a transmission line 208. The receiver includes an amplifier (AMP) 212 that amplifies the high speed signal transmitted via the transmission line 208 and a demultiplexer (DEMUX) 215 that separates the high-speed signal to a plurality of low-speed signals to output them.

The multiplexer 202 includes a MUX core circuit (MUX core) 203 that multiplexes a plurality of low-speed signals (input data) inputted into a terminal 201 to a high-speed serial signal, a clock control circuit (CLK CONT) 206, and an oscillator 205 of the present invention that generates a reference signal (LO) for the MUX core circuit 203.

The demultiplexer 215 includes a DEMUX core circuit (DEMUX core) 216 that demultiplexes a high-speed serial signal to a plurality of low speed signals (output data) to output them to a terminal 217, a clock control circuit (CLK CONT) 214, and an oscillator 213 of the present invention that generates a reference signal (LO) for the DEMUX core circuit 216.

In the twenty-fifth embodiment, by using either of the oscillators according to the first embodiment to the twenty-fourth embodiment as the oscillators 205 and 213, the oscillation frequency variable ranges of the oscillators 205 and 213 are band-expanded and phase noise can be reduced at a low current. Therefore, since an allowable element variation range is expanded by the band-expansion, yield is improved and manufacturing cost of a high-speed serial transmission system can be reduced, and since jitter of clock can be reduced owing to lowering of phase noise, data transmission error can be reduced. Moreover, since the oscillator according to the twenty-fifth embodiment is an oscillator with reduced consumption current, consumption current in a high-speed serial transmission system can be reduced.

Twenty-Sixth Embodiment

Figure 74:
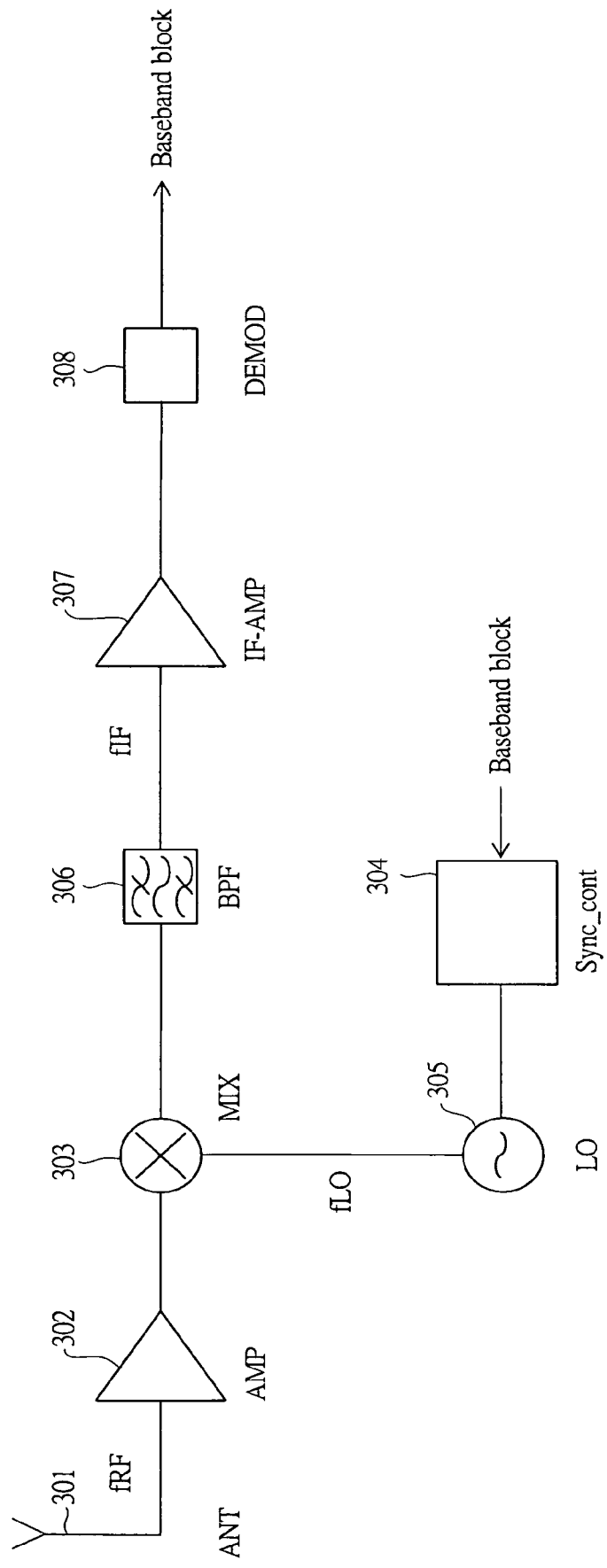
FIG. 74 is a block diagram of a data processing equipment according to a twenty-sixth embodiment of the present invention.

FIG. 74 shows a twenty-sixth embodiment of a data processing equipment including an oscillator of the present invention. The data processing equipment according to the twenty-sixth embodiment is a heterodyne wireless receiver. In FIG. 74, a reception signal (fRF) received by an antenna (ANT) 301 is amplified by a low noise amplifying circuit (AMP) 302 to be inputted into a mixer (MIX) 303. By using a local oscillation signal (fLO) outputted from the oscillator (LO) 305 of the present invention controlled by an oscillator control circuit (Sync_cont) 304 as one of input signals to the mixer 303, a carrier frequency of a reception signal is lowered at an output of the mixer 303, and an intermediate frequency (IF) reception signal is obtained. After an unnecessary frequency contained in the IF reception signal is damped by a bandpass filter (BPF) 306 (fIF), the IF reception signal is amplified by an IF amplifying circuit (IF-AMP) 307 to be taken out at a demodulating circuit (DEMOD) 308 as baseband signal. The baseband signal is fed to a baseband circuit (Baseband block: not shown). A control signal is inputted from the baseband circuit to the oscillator control circuit 304.

In the twenty-sixth embodiment, by using either of the oscillators according to the first embodiment to the twenty-fourth embodiment as the oscillator 305, the oscillation frequency variable range of the oscillator 305 can be band-expanded and phase noise can be reduced at a low current. Therefore, since an allowable element variation range is expanded by the band-expansion, a yield is improved and since a plurality of applications or communication systems can be accommodated, it is not only reducing manufacturing cost of a heterodyne wireless receiver but also EVM (error vector magnitude) of reception can be reduced according to lowering of phase noise. Since the oscillator according to the twenty-fifth embodiment is an oscillator with reduced consumption current, consumption current in the high speed serial transmission system can be reduced.

Twenty-Seventh Embodiment

Figure 75:
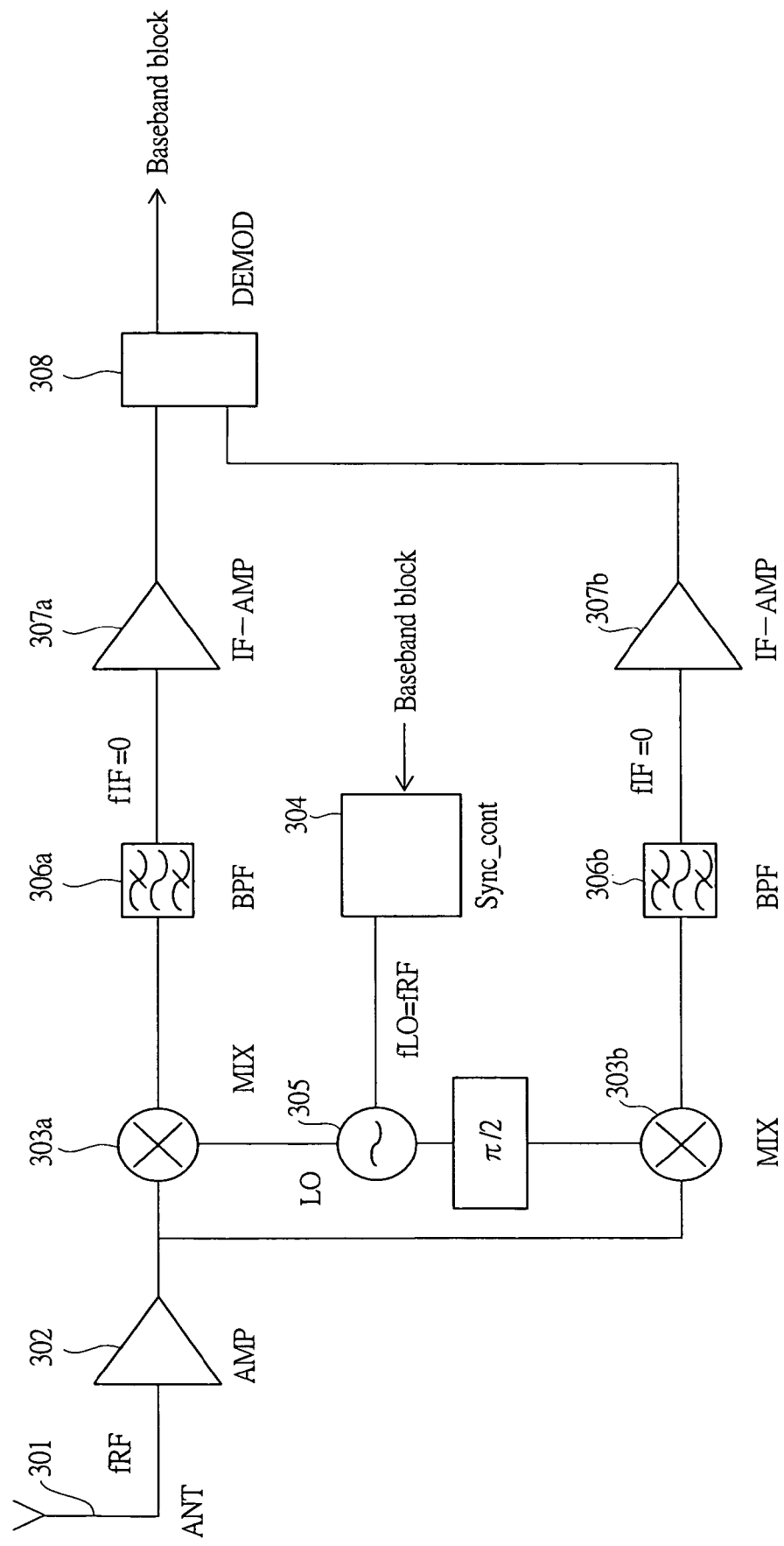
FIG. 75 is a block diagram of a data processing equipment according to a twenty-seventh embodiment of the present invention.

FIG. 75 shows a twenty-seventh embodiment of a data processing equipment including an oscillator of the present invention. The data processing equipment according to the twenty-seventh embodiment is a direct-conversion wireless receiver. A reception signal received by an antenna 301 is amplified by a low noise amplifying circuit 302 to be inputted into two mixers 303a and 303b. A local oscillation signal outputted from an oscillator 305 of the present invention controlled by an oscillator control circuit 304 is branched to two signals, and the branched signals are imparted with a phase difference of 90° (π/2) to each other to be inputted into the mixers 303a and 303b, respectively. After carrier frequencies of the reception signals amplified by the amplifying circuit 302 are lowered to zero frequencies at outputs of the two mixers 303a and 303b and unnecessary frequency components thereof are damped by bandpass filters 306a and 306b, the reception signals are amplified by IF amplifying circuits 307a and 307b. Baseband signals are taken out of output signals of the two amplifying circuits 307a and 307b by a demodulating circuit 308. The baseband signals are fed to an external baseband circuit (not shown). A control signal is inputted from the baseband circuit to the oscillator control circuit 304.

In the twenty-sixth embodiment, by using either of the oscillators according to the first embodiment to the twenty-fourth embodiment as the oscillator 305, the oscillation frequency variable range of the oscillator 305 can be band-expanded and phase noise can be reduced at a low current. Therefore, since an allowable element variation range is expanded by the band-expansion, a yield is improved and since a plurality of applications or communication systems can be accommodated, it is not only manufacturing cost of a direct-conversion wireless receive but also EVM of reception can be reduced according to lowering of phase noise. Moreover, since the oscillator according to the twenty-sixth embodiment is an oscillator with reduced consumption current, consumption current in the direct-conversion wireless transceiver can be reduced.

Twenty-Eighth Embodiment

Figure 76:
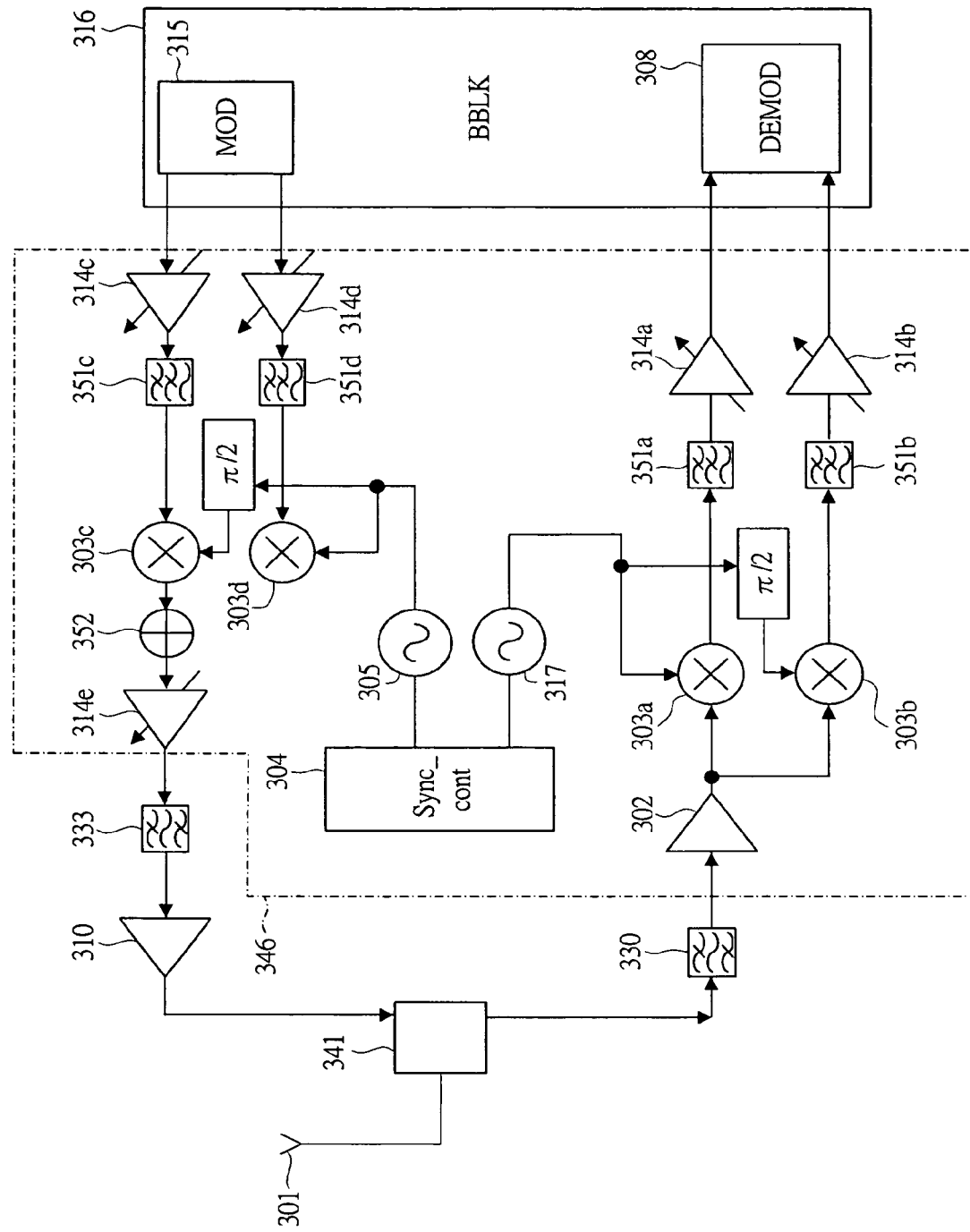
FIG. 76 is a block diagram of a data processing equipment according to a twenty-eighth embodiment of the present invention.

FIG. 76 shows a twenty-eighth embodiment of a data processing equipment including an oscillator of the present invention. The data processing equipment according to the twenty-eighth embodiment is a direct-conversion wireless transceiver. At a signal reception time, after an unnecessary component in a reception signal passing through an antenna circuit (a switch in case of GSM, a duplexer in case of W-CDMA) is damped by a bandpass filter 330, the reception signal is amplified by a low noise amplifying circuit 302 to be inputted into two mixers 303a and 303b. An RF (radio frequency) local oscillation signal outputted by an oscillator 317 of the present invention controlled by an oscillator control circuit 304 is branched to two signals, and the branched signals are imparted with a phase difference of 90°(π/2) to each other to be inputted into the mixers 303a and 303b, respectively. After carrier frequencies of the signals are lowered to zero frequency at outputs of the mixers 303a and 303b and unnecessary components thereof are damped by low frequency pass filters 351a and 351b, the signals are amplified by automatic gain control amplifying circuits 314a and 314b. Outputs of the automatic gain control amplifying circuits 314a and 314b are transmitted to a baseband circuit (BBLK) 316 and are taken at a demodulating circuit 308 as reception baseband signals.

At a signal transmission time, a transmission baseband signal outputted from the baseband circuit 316 is modulated by a modulating circuit (MOD) 315 to be separated to two signals different in phase by 90°. After the two separated signals are amplified by automatic gain control amplifying circuits 314c and 314d and unnecessary frequency components thereof are damped by low frequency pass filters 351c and 351d, the two signals are inputted into mixers 303c and 303d constituting an orthogonal modulator. An RF local oscillation signal outputted from the oscillator 305 of the present invention controlled by the oscillator control circuit 304 is branched to two signals, and the branched signals are imparted with a phase difference of 90° (π/2) to each other to be inputted into the mixers 303c and 303d, respectively. Outputs of two mixers 303c and 303d are added by an adding circuit 352 to constitute an RF orthogonal modulation signal. After the RF orthogonal modulation signal is amplified by an automatic gain control amplifying circuit 314e and an unnecessary frequency component thereof is damped by a bandpass filter 333, the RF orthogonal modulation signal is amplified by a high output amplifier 310 that is a power amplifier to be fed to the antenna 301 via the antenna circuit 341 for transmission.

In the twenty-eighth embodiment, by using either of the oscillators according to the first embodiment to the twenty-fourth embodiment as the oscillators 305 and 317, the oscillation frequency variable ranges of the oscillators can be band-expanded and phase noise can be reduced at a low current. Therefore, since an allowable element variation range is expanded by the band-expansion, a yield is improved and since a plurality of applications or communication systems can be accommodated, it is not only manufacturing cost of a direct-conversion wireless transceiver but also EVM of transmission and reception can be reduced according to lowering of phase noise. Since the oscillator according to the twenty-eighth embodiment is an oscillator with reduced consumption current, consumption current in the direct-conversion wireless transceiver can be reduced.

In addition, an LC resonant circuit suitable for integration is adopted in the oscillator 305. Accordingly, in FIG. 76, a reception side of the low noise amplifying circuit 302 to the automatic gain control amplifying circuits 314a and 314b, a transmission side of the automatic gain control amplifying circuits 314c and 314d to the automatic gain control amplifying circuit 314e, and the transmission and reception circuit including the oscillator control circuit 304 and the oscillator 305 can be easily configured as a semiconductor device formed on one semiconductor substrate, namely, RF-IC (RF-integrated circuit) 346. The oscillator 305 has a wide oscillation frequency variable range and is reduced in phase noise. Accordingly, the RF-IC 346 is suitably applied to, for example, a multi-band/multi-mode wireless transceiver that can accommodate a plurality of communication systems using a plurality of frequency bands alone.

Twenty-Ninth Embodiment

Figure 77:
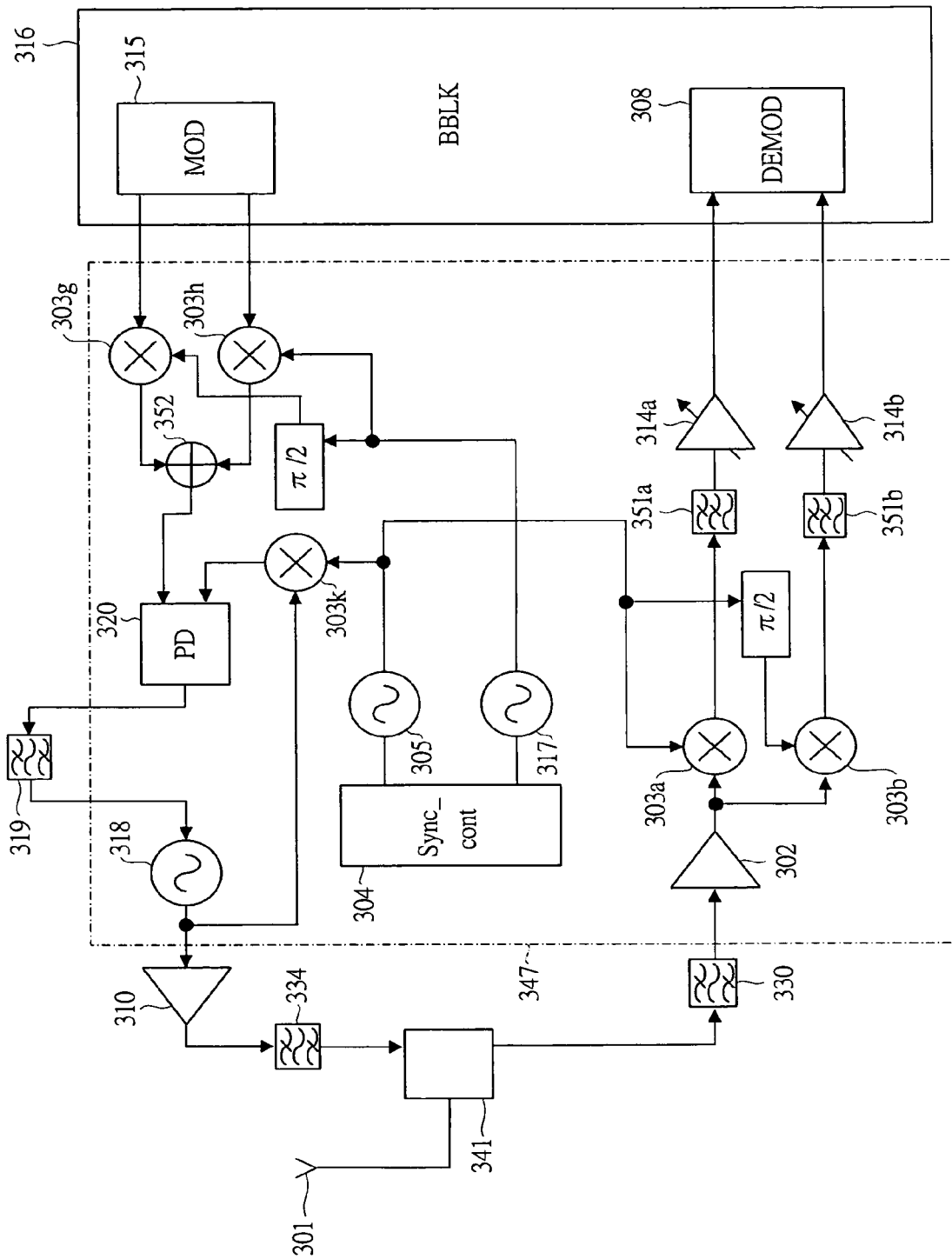
FIG. 77 is a block diagram of a data processing equipment according to a twenty-ninth embodiment of the present invention.

FIG. 77 shows a twenty-ninth embodiment of a data processing equipment including an oscillator of the present invention. The data processing equipment according to the twenty-ninth embodiment is a direct-conversion wireless transceiver. At a signal reception time, after an unnecessary frequency component in a reception signal that was received by an antenna 301 and passed through an antenna circuit 341 is damped by a bandpass filter 330, the reception signal is amplified by a low noise amplifying circuit 302 to be inputted into two mixers 303a and 303b. A local oscillation signal outputted by an oscillator 305 of the present invention controlled by an oscillator control circuit 304 is branched to two signals, and the branched signals are imparted with a phase difference of 90° ($\pi/2$) to each other to be inputted into the mixers 303a and 303b, respectively. After carrier frequencies of the signals are lowered to zero frequency at outputs of the mixers 303a and 303b and unnecessary components therein are damped by low frequency pass filters 351a and 351b, the signals are amplified by automatic gain control amplifying circuits 314a and 314b. Outputs of the automatic gain control amplifying circuits 314a and 314b are transmitted to a baseband circuit 316 and are taken at a demodulating circuit 308 as reception baseband signals.

At a signal transmission time, a transmission baseband signal outputted from the baseband circuit is modulated by a modulating circuit 315 to be separated to two signals different in phase by 90°. Two separated signals are inputted into mixers 303g and 303h, respectively. An IF local oscillation signal outputted from the oscillator 317 of the present invention controlled by the oscillator control circuit 304 is branched to two signals, and the branched signals are imparted with a phase difference of 90° ($\pi/2$) to each other to be inputted into the mixers 303g and 303h, respectively. Outputs of two mixers 303g and 303h are added by an adding circuit 352 to constitute an IF orthogonal modulation signal. The IF orthogonal modulation signal is phase-compared with an output signal of a mixer 303k by a phase comparator (PD) 320. An output signal of the phase comparator 320 is inputted into a frequency control terminal of a transmission oscillator 318 of the present invention through a loop filter 319. The output signal of the oscillator 318 and the RF orthogonal modulation signal of the oscillator 305 are inputted into the mixer 303k and the output signal of the mixer 303k is inputted into the phase comparator 320 like the above. As a result, the RF orthogonal modulation signal is outputted from the oscillator 318. After the RF orthogonal modulation signal is amplified by a high output amplifier 310 and an unnecessary frequency component thereof is damped by a bandpass filter 334, the signal is fed to the antenna 301 via the antenna circuit 341 for transmission.

In the twenty-ninth embodiment, by using either of the oscillators according to the first embodiment to the twenty-fourth embodiment as the oscillators 305, 317, and 318, the oscillation frequency variable ranges of the oscillators can be band-expanded and phase noise can be reduced at a low current. Therefore, since an allowable element variation range is expanded by the band-expansion, a yield is improved and since a plurality of applications or communication systems can be accommodated, it is not only manufacturing cost of a direct-conversion wireless transceiver but also EVM of transmission and reception can be reduced according to lowering of phase noise. Since the oscillator according to the twenty-eighth embodiment is an oscillator with reduced consumption current, consumption current in a direct-conversion wireless transceiver can be reduced.

Moreover, an LC resonant circuit suitable for integration is adopted in the oscillators 305, 317, and 318. Accordingly, in FIG. 77, a reception side of the low noise amplifying circuit 302 to the automatic gain control amplifying circuits 314a and 314b, a transmission side of the mixers 303g and 303h to the oscillator 318 except for the loop filter 319, and the transmission and reception circuit including the oscillator control circuit 304 and the oscillators 305, 317, and 318 can be easily configured as a semiconductor device formed on one semiconductor substrate, namely, RF-IC 347. The oscillators 305, 317, and 318 have a wide oscillation frequency variable range and are reduced in phase noise. Accordingly, the RF-IC 347 is suitably applied to, for example, a multi-band/multi-mode wireless transceiver that can accommodate a plurality of communication systems using a plurality of communication regulations alone.

Thirtieth Embodiment

Figure 78:
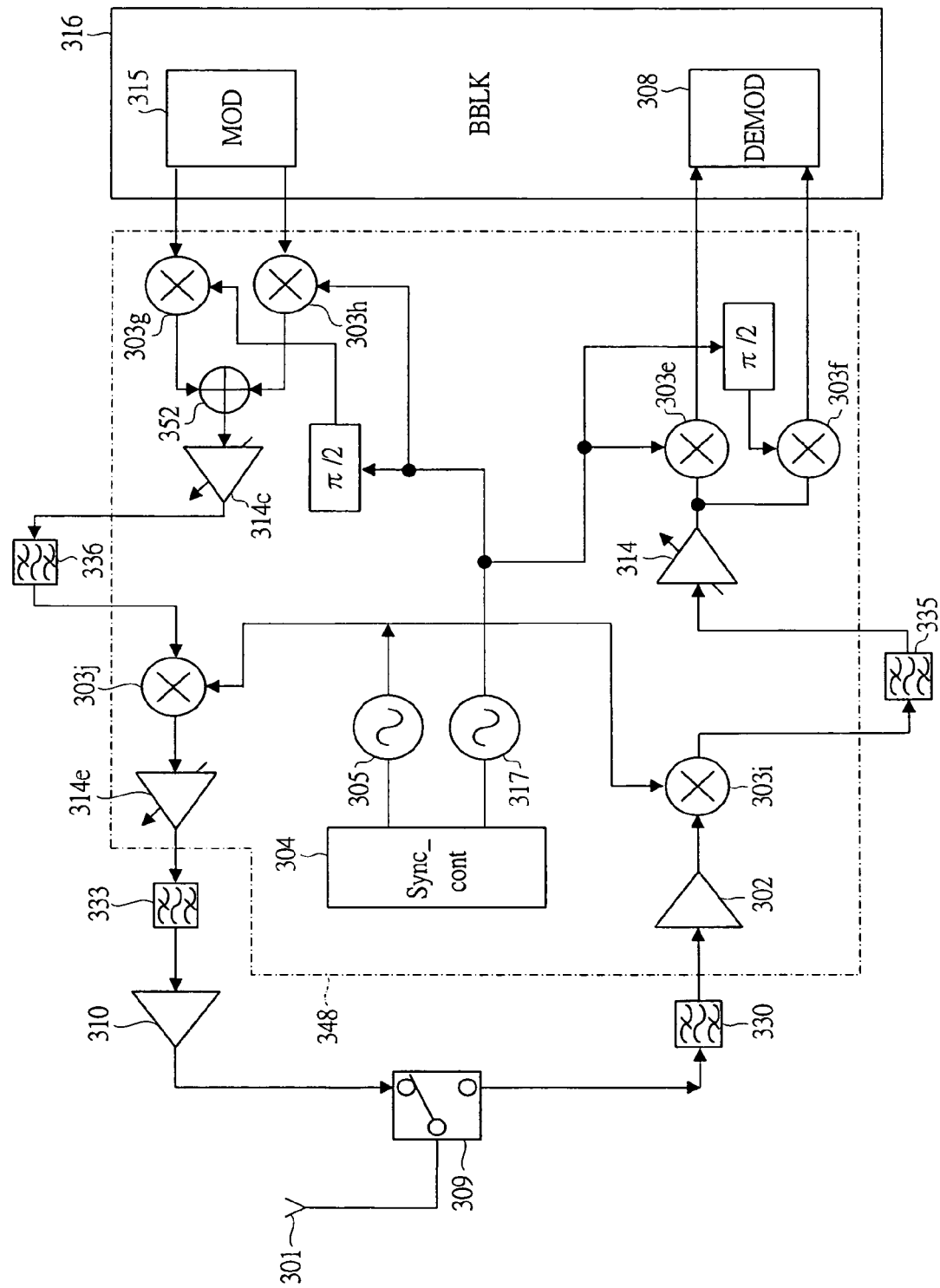
FIG. 78 is a block diagram of a data processing equipment according to a thirtieth embodiment of the present invention.

FIG. 78 shows a thirtieth embodiment of a data processing equipment including the oscillator of the present invention. The data processing equipment according to the thirtieth embodiment is a heterodyne wireless transceiver. At a signal reception time, an unnecessary frequency component of a reception signal that was received by an antenna 301 and passed through a switch 309 is damped by a bandpass filter 330, the reception signal is amplified by a low noise amplifying circuit 302 to be inputted into a mixer 303i. An RF local oscillation signal outputted by an oscillator 305 of the present invention controlled by an oscillator control circuit 304 is inputted into the mixer 303i. The carrier frequency is lowered at an output of the mixer 303i so that a reception signal with an intermediate frequency is obtained. After an unnecessary frequency component in an output signal of the mixer 303i is damped by a bandpass filter 335 and the output signal is amplified by an automatic gain control amplifying circuit 314, the output signal is inputted into two mixers 303e and 303f. An IF local oscillation signal outputted from an oscillator 317 of the present invention controlled by the oscillator control circuit 304 is branched to two signals, and the branched signals are imparted with a phase difference of 90° ($\pi/2$) to each other to be inputted into the mixers 303g and 303h, respectively. Outputs of the two mixers 303e and 303f are transmitted to a baseband circuit 316 and are taken out as reception baseband signals by a demodulating circuit 308.

At a signal transmission time, a transmission baseband signal outputted from the baseband circuit 316 is modulated by a modulating circuit (MOD) 315 to be separated to two signals different in phase by 90°. Two separated signals are inputted into mixers 303g and 303h, respectively. An IF local oscillation signal outputted from the oscillator 317 of the present invention controlled by the oscillator control circuit 304 is branched to two signals, and the branched signals are imparted with a phase difference of 90° (π/2) to each other to be inputted into the mixers 303g and 303h, respectively. Outputs of two mixers 303g and 303h are added by an adding circuit 352 to constitute an IF orthogonal modulation signal. After the IF orthogonal modulation signal is amplified by an automatic gain control amplifying circuit 314c and an unnecessary frequency component therein is damped by a bandpass filter 336, the signal is inputted into a mixer 303j. An RF local oscillation signal outputted by the oscillator 305 of the present invention controlled by the oscillator control circuit 304 is inputted into the mixer 303j. After an output of the mixer 303j is amplified by an automatic gain control amplifying circuit 314e and an unnecessary component therein is damped by a bandpass filter 333, the output is amplified by a high output amplifier 310 to be fed to the antenna 301 via the switch 309 for transmission.

In the thirtieth embodiment, by using either of the oscillators according to the first embodiment to the twenty-fourth embodiment as the oscillators 305 and 317, the oscillation frequency variable ranges of the oscillators can be band-expanded and phase noise can be reduced at a low current. Therefore, since an allowable element variation range is expanded by the band-expansion, a yield is improved and since a plurality of applications or communication systems can be accommodated, it is not only manufacturing cost of a heterodyne type wireless transceiver but also EVM of transmission and reception can be reduced according to lowering of phase noise. Since the oscillator according to the thirtieth embodiment is an oscillator with reduced consumption current, consumption current in the heterodyne wireless transceiver can be reduced.

Moreover, an LC resonant circuit suitable for integration is adopted in the oscillators 305 and 317. Accordingly, in FIG. 78, a signal reception side of the low noise amplifying circuit 302 to the mixers 303e and 303f except for the bandpass filter 335, a signal transmission side of the mixers 303g and 303h to the automatic gain control amplifying circuit 314e except for the bandpass filter 336, and the transmission and reception circuit including the oscillator control circuit 304 and the oscillators 305 and 317 can be easily configured as a semiconductor device formed on one semiconductor substrate, namely, RF-IC 348. The oscillators 305 and 317 have a wide oscillation frequency variable range and are reduced in phase noise. Accordingly, the RF-IC 348 is suitably applied to, for example, a multi-band/multi-mode wireless transceiver that can accommodate a plurality of communication systems using a plurality of frequency bands alone.

Thirty-First Embodiment

Figure 79:
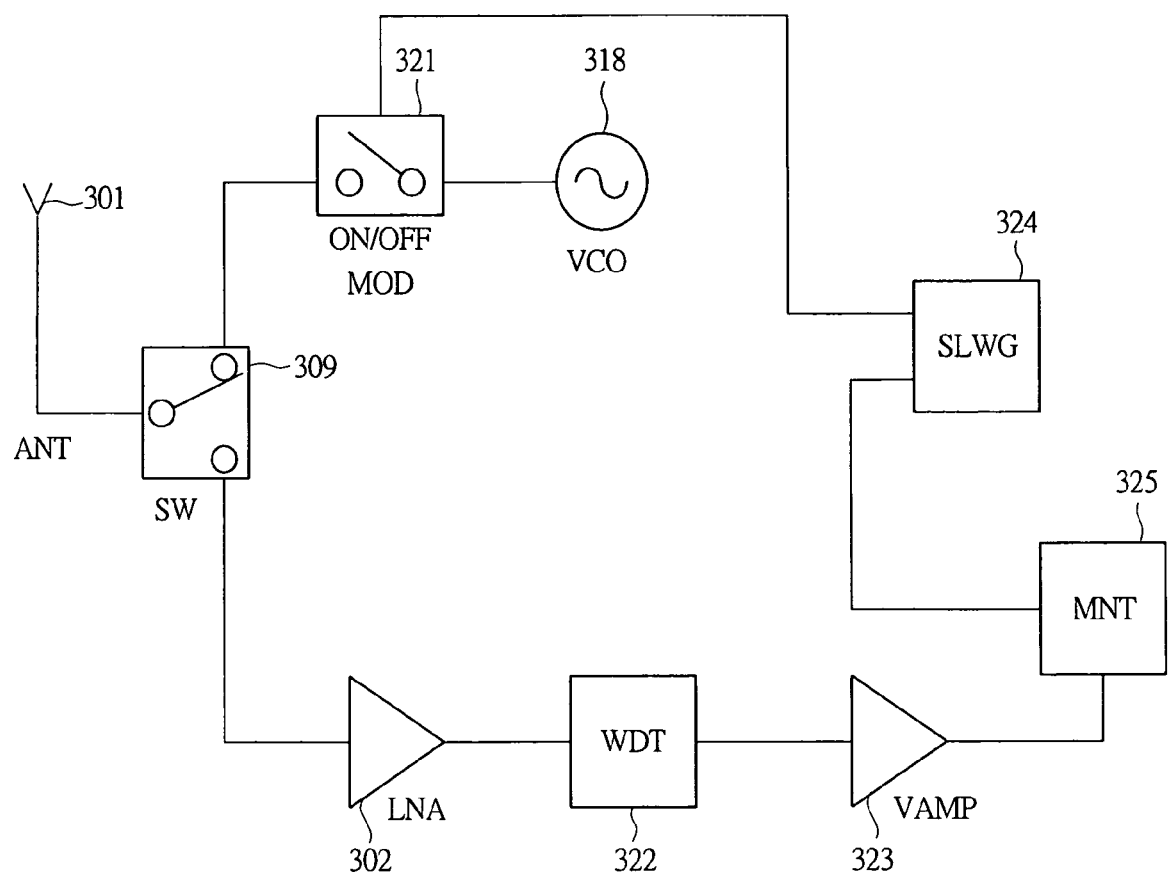
FIG. 79 is a block diagram of a data processing equipment according to a thirty-first embodiment of the present invention.
Figure 80:
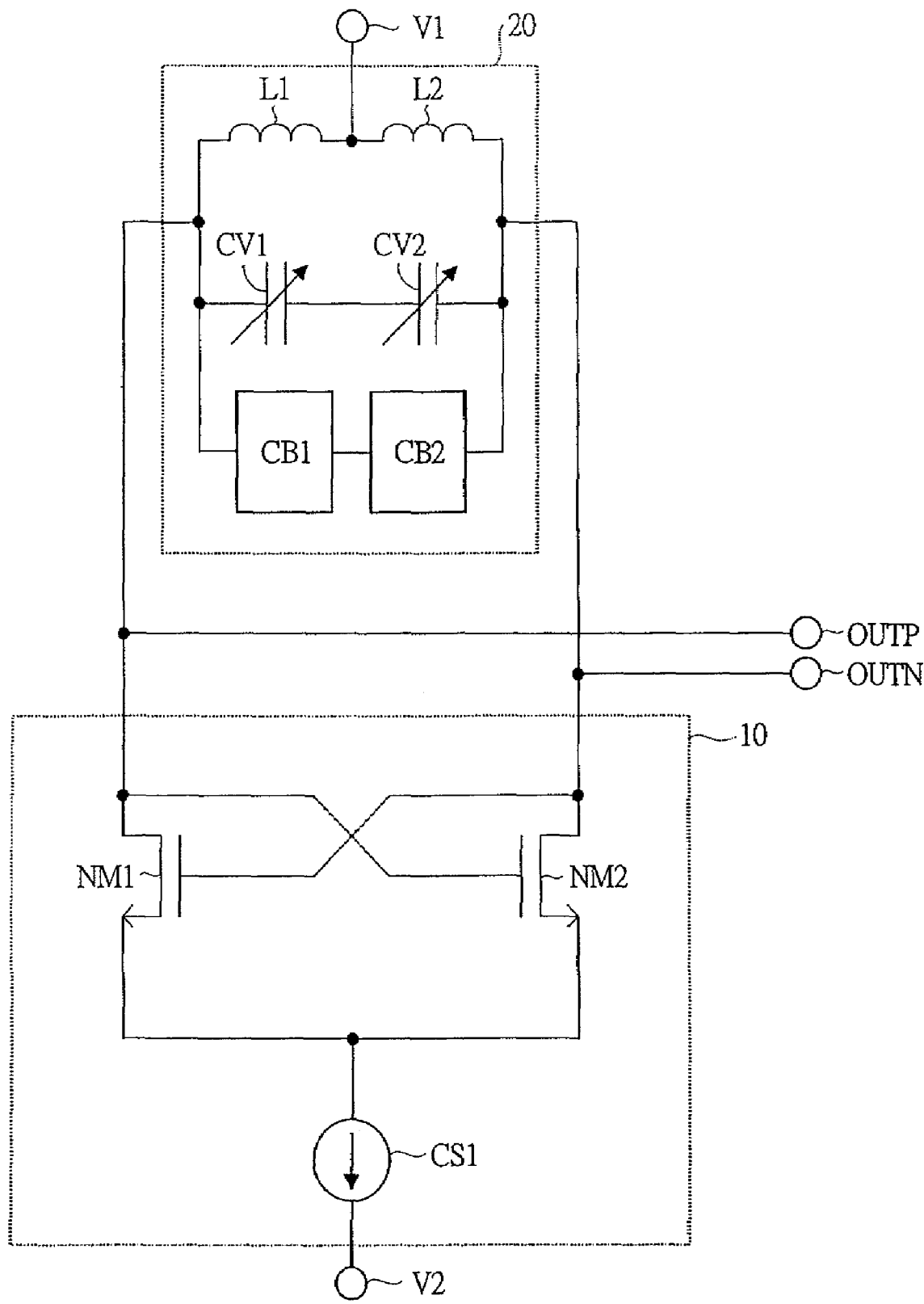
FIG. 80 is a circuit diagram for explaining a conventional oscillator.
Figure 81:
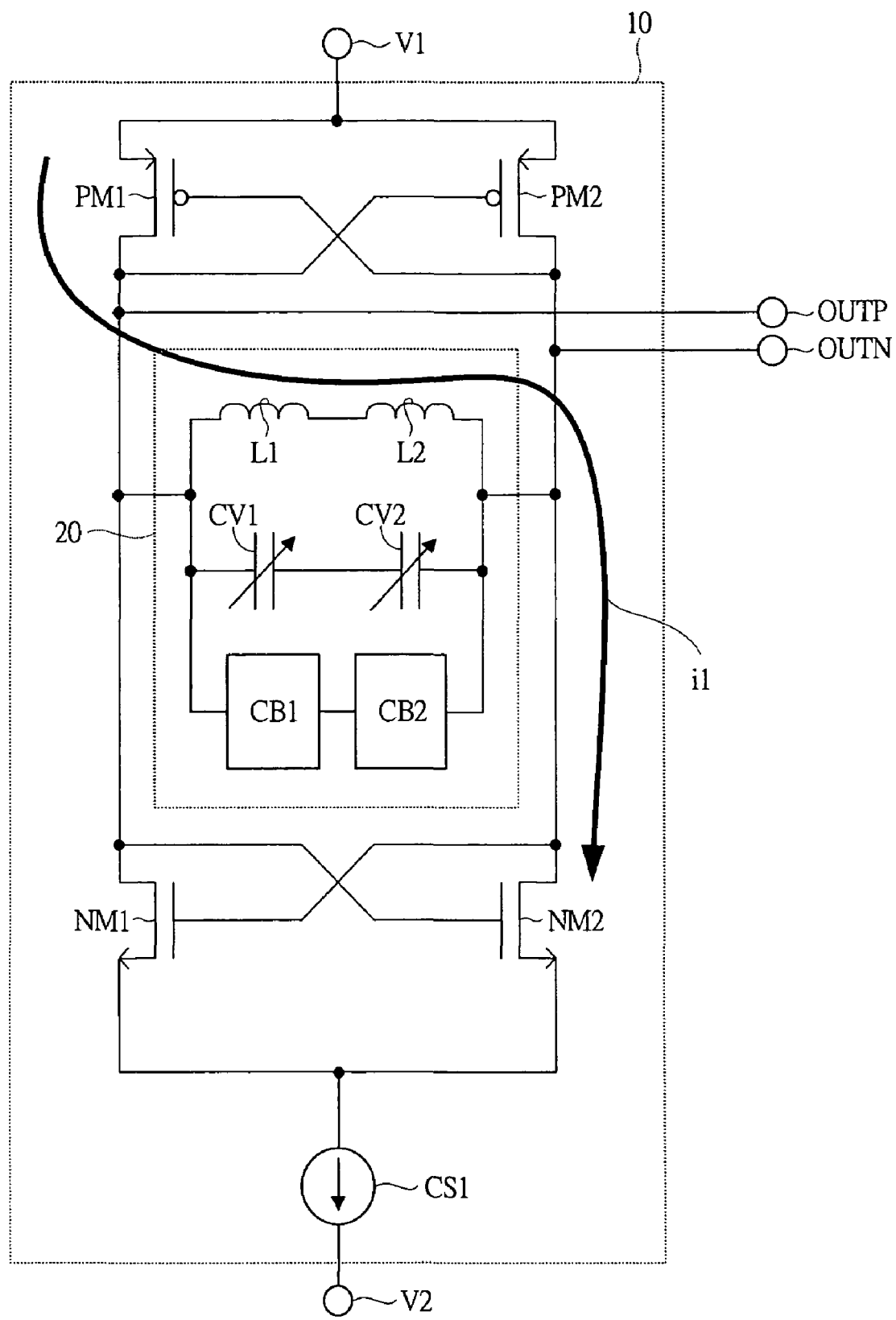
FIG. 81 is a circuit diagram for explaining a conventional oscillator.
Figure 82:
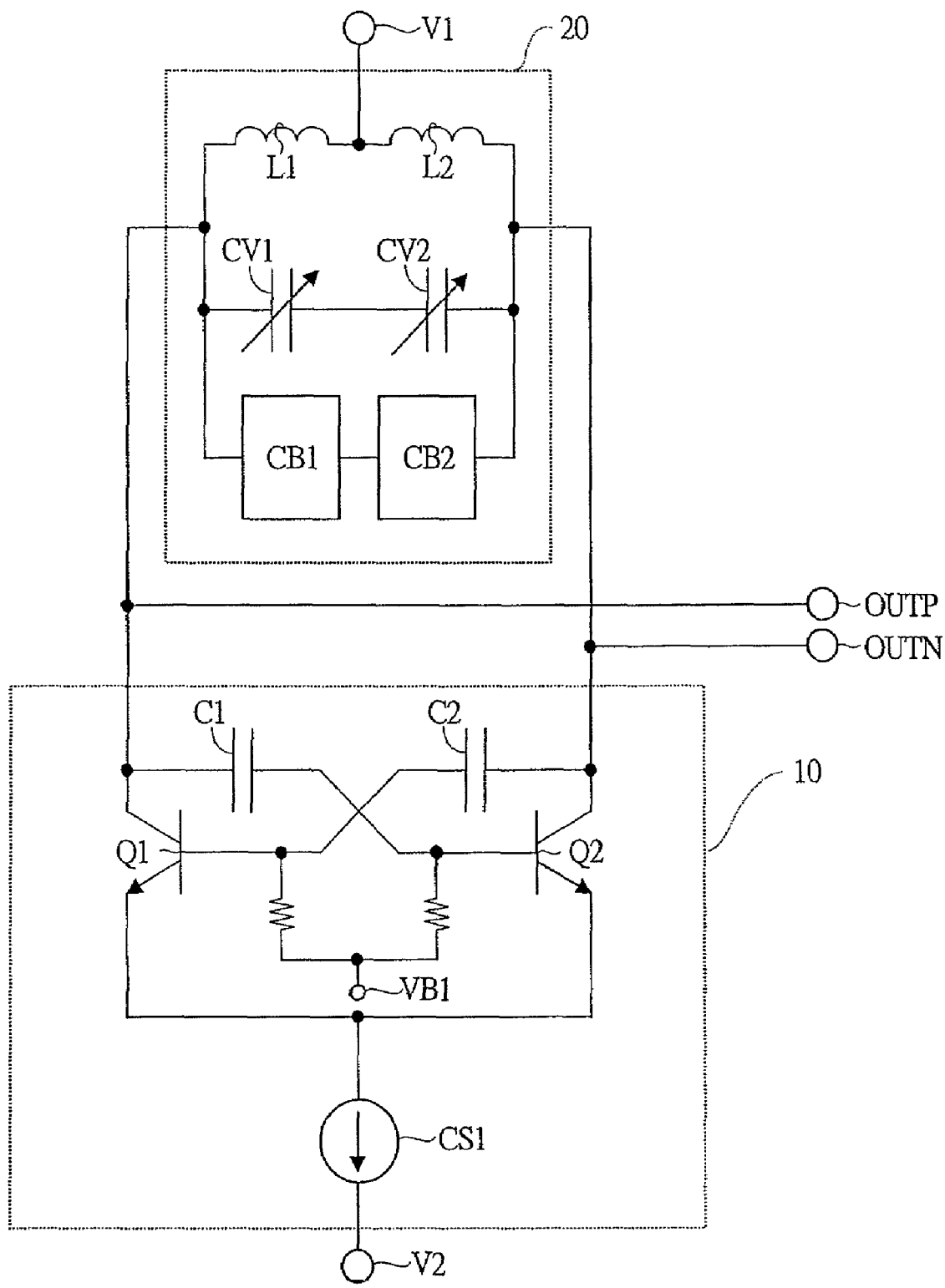
FIG. 82 is a circuit diagram for explaining a conventional oscillator.
Figure 83:
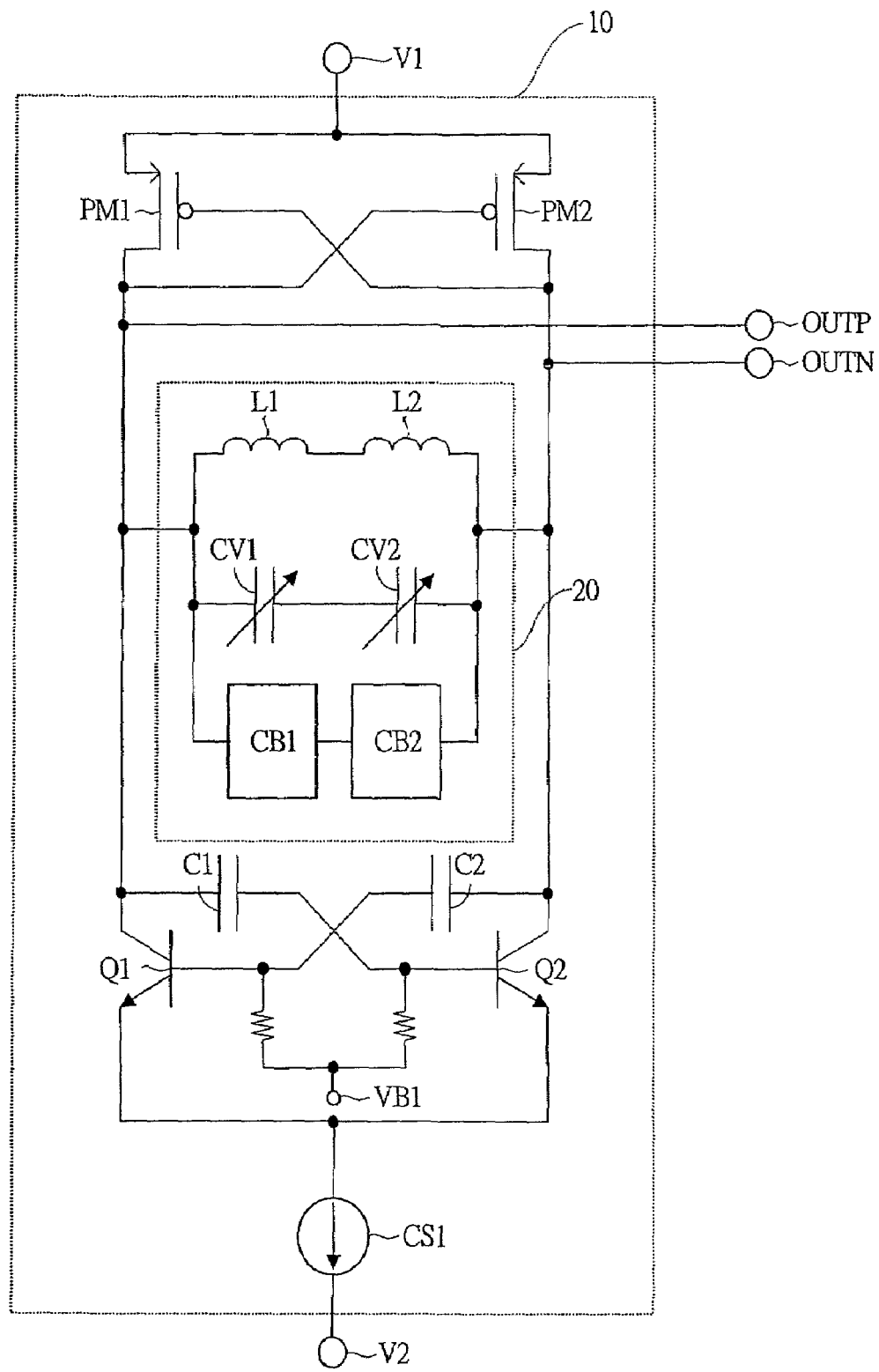
FIG. 83 is a circuit diagram for explaining a conventional oscillator.
Figure 84:
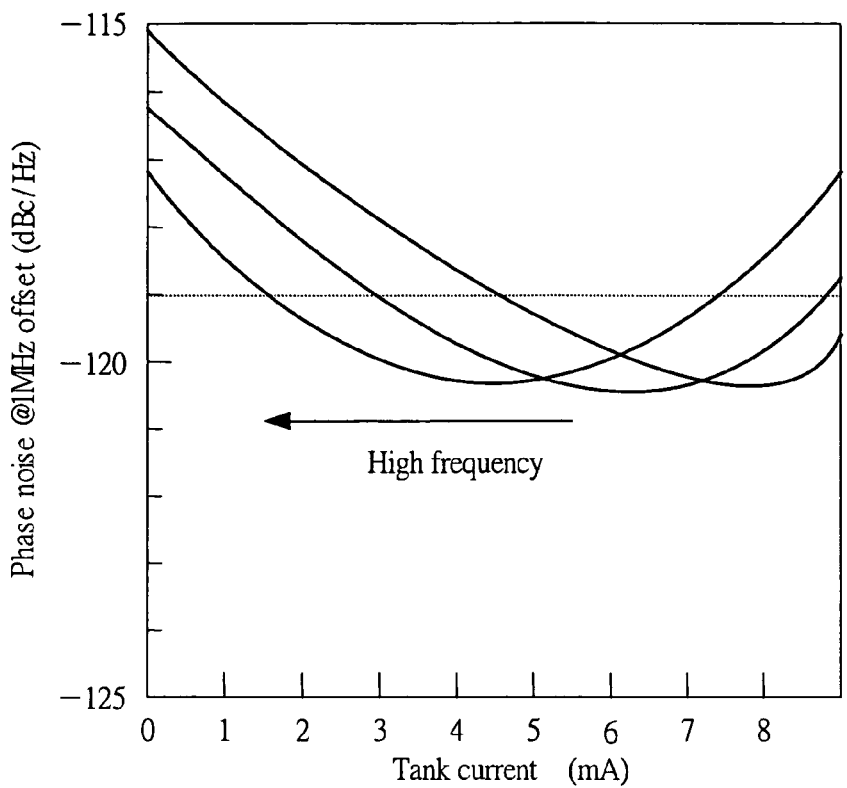
FIG. 84 is a curve diagram for explaining phase noise characteristic in a conventional oscillator.
Figure 85:
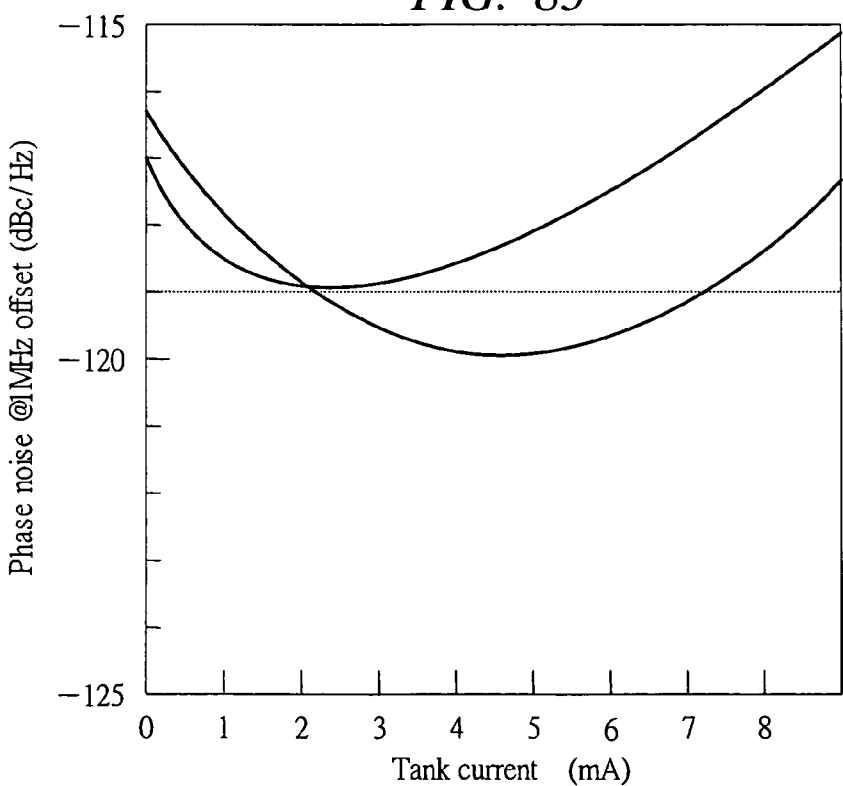
FIG. 85 is a curve diagram for explaining phase noise characteristic in a conventional oscillator.
Figure 86:
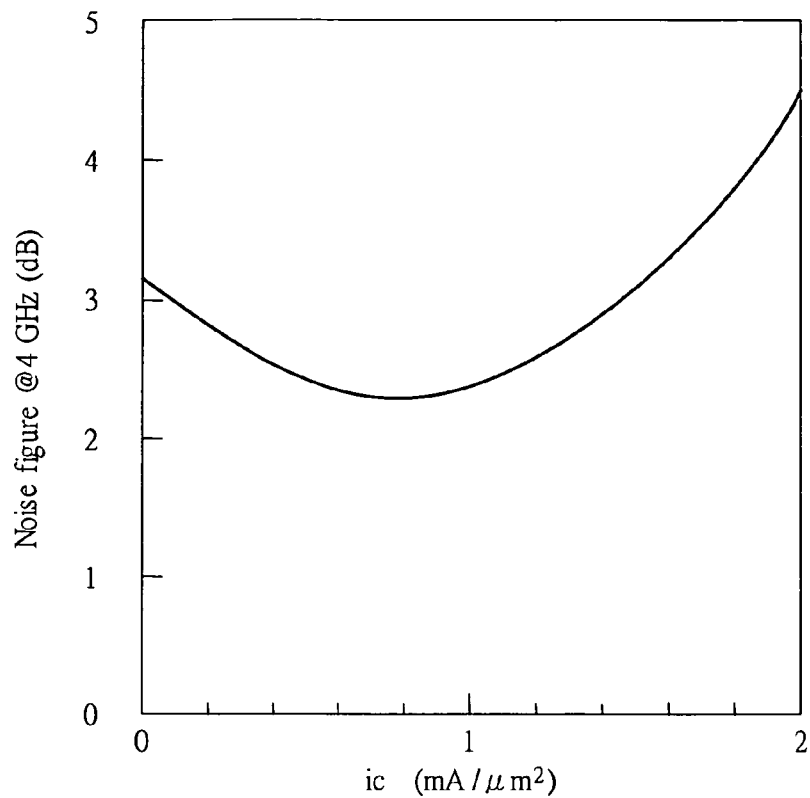
FIG. 86 is a curve diagram for explaining collector current dependency of noise index in a conventional bipolar transistor.

FIG. 79 shows a thirty-first embodiment of a data processing equipment including an oscillator of the present invention. The data processing equipment according to the thirty-first embodiment is a wireless radar transceiver of a pulse radar type. At a signal transmission time, an output signal of an oscillator (VCO) 318 of the present invention is modulated by an ON/OFF modulator (ON/OFF MOD) 321 opened and closed according to an output of a saw-tooth wave generator (SLWG) 324 to be transmitted from an antenna (ANT) 301 via a switch 309.

At a signal reception time, a reception signal received by the antenna 301 and caused to pass through the switch 309 is amplified by a low noise amplifying circuit 302 to be detected by a wave detector (WDT) 322. The detected signal is amplified by a video amplifier (VAMP) 323 to be displayed on a screen of a display device (MNT) 325.

In the thirty-first embodiment, by using either of the oscillators according to the first embodiment to the twenty-fourth embodiment as the oscillator 318, the oscillation frequency variable ranges of the oscillators can be band-expanded and phase noise can be reduced at a low current. Therefore, since an allowable element variation range is expanded by the band-expansion, a yield is improved and since a plurality of applications or communication systems can be accommodated, it is not only reduction of manufacturing cost of a wireless radar transceiver of a pulse radar type is achieved but also a purity of transmission signal and sensitivity of reception can be improved according to lowering of phase noise. Since the oscillator according to the thirty-first embodiment is an oscillator with reduced consumption current, consumption current in the wireless radar transceiver of a pulse radar type can be reduced.

It is not that the effects of the present invention obtained according to the first to thirty-first embodiments are achieved only when the bipolar transistor is used in the elementary circuit and when the MOS transistor is used therein, but it goes without saying that similar effects can be obtained even if a field effect transistor, a heterojunction bipolar transistor, or a high electron mobility transistor is used instead of the bipolar transistor or the MOS transistor and similar effects can be obtained even if exchange between the P type semiconductor and the N type semiconductor in the device is performed.

In the foregoing, the invention made by the inventors of the present invention has been concretely described based on the embodiments. However, it is needless to sat that the present invention is not limited to the foregoing embodiments and various modifications and alternations can be made within the scope of the present invention.

The present invention is effective in use for a voltage-controlled oscillator for obtaining low phase noise characteristic at a low current in a wide band, and a data processing equipment using the same, such as a high-speed serial transmission system, a heterodyne type wireless receiver, a direct-conversion wireless receiver, a direct-conversion wireless transceiver, a heterodyne type wireless transceiver, or a wireless radar transceiver of a pulse radar type.

What is claimed is:

1. An oscillator comprising:
   first and second power source voltage terminals of parallel capacitors; first and second power source voltage terminals of series capacitors;
   an inductor connected between the first power source voltage terminal of parallel capacitors and the second power source voltage terminal of parallel capacitors;
   a parallel capacitor including a first capacitor bank composed of variable capacitors which are connected in parallel and whose capacitance values vary from small to large value according to a first control signal group and a first fine adjustable capacitor whose capacitance value varies according to a second control signal, the first capacitor bank and the first fine adjustable capacitor being connected to each other in parallel between the first power source voltage terminal of parallel capacitors and the second power source voltage terminal of parallel capacitors; and
   a series capacitor including a second capacitor bank composed of variable capacitors which are connected in parallel and whose capacitor values vary from small to large value according to a third control signal group and a second fine adjustable capacitor whose capacitance value varies according to the second control signal, the second capacitor bank and the second fine adjustable capacitor being connected to each other in series between the first power source voltage terminal of series capacitors and the second power source voltage terminal of series capacitors.

2. The oscillator according to claim 1,
wherein the parallel capacitor is configured such that an occupation ratio of a capacitance value of the first fine adjustable capacitor in the total capacitance that is the sum of capacitance values of the parallel capacitors and the series capacitors lowers according to increase of a capacitance value of the first capacitor bank and a changing rate of the total capacitance to the second control signal decreases, and
the series capacitor is configured such that an occupation ratio of a capacitance value of the second fine adjustable capacitor in the total capacitance increases according to increase of a capacitance value of the second capacitor bank and a changing rate of the total capacitance to the second control signal increases.

3. The oscillator according to claim 1,
wherein when a capacitance value of the second fine adjustable capacitor is represented as $C_{V2}$ and a capacitance value of the first capacitor bank is represented as $C_{M1}$,
a total capacitance value $C_{TOTAL}$ that is the total capacitance value including capacitance values of the parallel capacitor and the series capacitor is approximated by $(C_{V2}+C_{M1})$.

4. The oscillator according to claim 1,
wherein the parallel capacitor, the series capacitor, and the inductor are connected in parallel, and
the parallel capacitor, the series capacitor, and the inductor have terminals whose one ends grounded in AC manner and the other ends inputted with AC signals.

5. The oscillator according to claim 1,
wherein the third control signal group is synchronized with the first control signal group, and the capacitance value of the first capacitor bank and the capacitance value of the second capacitor bank change simultaneously according to the first and third signals.

6. The oscillator according to claim 1,
wherein the parallel capacitor and the inductor are connected in parallel,
the parallel capacitor and the inductor have terminals whose one ends grounded in AC manner and the other ends inputted with an alternating current signal, and
the series capacitor is connected to a second inductor that is magnetically coupled to the inductor via mutual inductance in series.

7. The oscillator according to claim 1,
wherein the first fine adjustable capacitor and the second fine adjustable capacitor are semiconductor pn junction capacitors, and the second control signal is applied across both ends of the pn junction capacitors.

8. The oscillator according to claim 1,
wherein the first fine adjustable capacitor and the second fine adjustable capacitor are MOS capacitors based on MOS transistors, and
the second control signal is applied between the gate and the source/drain of the MOS transistors.

9. The oscillator according to claim 1,
wherein each of the plurality of variable capacitors constituting the first capacitor bank and the second capacitor bank is each of MOS capacitors based on MOS transistors, and the first and third control signal groups independently inputted for the plurality of MOS capacitors are applied between the gates and the sources/drains of the MOS transistors.

10. The oscillator according to claim 1,
wherein each of the plurality of variable capacitors is composed of a fixed capacitor and a switch connected to the fixed capacitor in series,
opening/closing of the switch is controlled by the first and third control signal groups independently inputted to the plurality of variable capacitors, and
a capacitance value of each of the plurality of variable capacitors varies from small to large value according to opening/closing of the switch.

11. The oscillator according to claim 1,
further comprising
a negative conductance generating circuit connected to a resonant circuit including the inductor, the parallel capacitor, and the series capacitor, for generating negative conductance,
wherein
a frequency of a signal to be outputted is determined based upon a resonant frequency of the resonant circuit and stability of oscillation is determined based upon negative conductance generated by the negative conductance generating circuit.

12. The oscillator according to claim 11,
wherein the parallel capacitor is configured such that an occupation ratio of a capacitance value of the first fine adjustable capacitor in the total capacitance that is the sum of capacitance values of the parallel capacitor and the series capacitor lowers according to increase of a capacitance value of the first capacitor bank and a changing rate of the total capacitance to the second control signal decreases, and
the series capacitor is configured such that an occupation ratio of a capacitance value of the second fine adjustable capacitor in the total capacitance increases according to increase of a capacitance value of the second capacitor bank and a changing rate of the total capacitance to the second control signal increases.

13. The oscillator according to claim 11,
wherein a first capacitor is connected between a first electrode and a second electrode of a transistor, a second capacitor is connected between a third electrode and the second electrode of the transistor, and an inductor is connected between the third electrode and the second electrode, and
the negative conductance generating circuit is formed between the third electrode and the second electrode.

14. The oscillator according to claim 11,
wherein the negative conductance generating circuit is constituted by mutually connecting an input terminal of one transistor of two transistors and an output terminal of the other transistor, mutually connecting ground terminals of the one transistor and the other transistor, and connecting a constant current source to a connecting point of the ground terminals.

15. An oscillator comprising a variable capacitor and an inductor,
wherein the variable capacitor has a first variable capacitor including a first capacitor bank whose capacitance value changes according to a control signal and whose frequency conversion gain increases according to increase of the capacitance value of the first capacitor bank, and a second variable capacitor connected to the first variable capacitor in parallel and including a second capacitor bank whose capacitance value changes according to a control signal and whose frequency conversion gain decreases according to increase of the capacitance value of the second capacitor bank, wherein the first variable capacitor includes a parallel capacitor comprising the first capacitor bank and a first fine adjustable capacitor, the second variable capacitor includes a series capacitor comprising the second capacitor bank and a second fine adjustable capacitor, and a capacitance value changing rate of the series capacitor according to lowering of a resonant frequency becomes larger than a capacitance value changing rate of the parallel capacitor according to lowering of an oscillation frequency.

16. A data processing equipment comprising:
an oscillator;
a low noise amplifier that amplifies a reception signal received by an antenna;
a modulator that modulates a baseband signal to be transmitted to output two signals orthogonal to each other;
an orthogonal modulator that is inputted with the two orthogonal signals to output an orthogonal modulation signal using a local oscillation signal outputted from the oscillator;
a power amplifier that amplifies the orthogonal modulation signal; and
a switch that supplies the reception signal from the antenna to the low noise amplifier at a time of signal reception and supplies the orthogonal modulation signal outputted from the power amplifier to the antenna at a time of signal transmission,
wherein the oscillator comprises:
first and second power source voltage terminals of parallel capacitor; first and second power source voltage terminals of series capacitor;
an inductor connected between the first power source voltage terminal of parallel capacitor and the second power source voltage terminal of parallel capacitor;

a parallel capacitor composed of a first capacitor bank including variable capacitors which are connected in parallel and whose capacitor values vary from small to large value according to a first control signal group and a first fine adjustable capacitor whose capacitance value varies according to a second control signal, the first capacitor bank and the first fine adjustable capacitor being connected to each other in parallel between the first power source voltage terminal of parallel capacitor and the second power source voltage terminal of parallel capacitor; and a series capacitor composed of a second capacitor bank including variable capacitors which are connected in parallel and whose capacitor values vary from small to large value according to a third control signal group and a second fine adjustable capacitor whose capacitance value varies according to the second control signal, the second capacitor bank and the second fine adjustable capacitor being connected to each other in series between the first power source voltage terminal of series capacitor and the second power source voltage terminal of series capacitor.

17. The data processing equipment according to claim 16, wherein the parallel capacitor is configured such that an occupation ratio of a capacitance value of the first fine adjustable capacitor in the total capacitance that is the sum of capacitance values of the parallel capacitor and the series capacitor lowers according to increase of a capacitance value of the first capacitor bank and a changing rate of the total capacitance to the second control signal decreases, and the series capacitor is configured such that an occupation ratio of a capacitance value of the second fine adjustable capacitor in the total capacitance increases according to increase of a capacitance value of the second capacitor bank and a changing rate of the total capacitance to the second control signal increases.

18. The data processing equipment according to claim 16, wherein the oscillator, the low noise amplifier, the modulator, and the orthogonal modulator together are formed on a single semiconductor device.

* * * * *